US012004357B2

(12) United States Patent
Wan et al.

(10) Patent No.: US 12,004,357 B2
(45) **Date of Patent: *Jun. 4, 2024**

(54) CROSS-POINT MAGNETORESISTIVE RANDOM MEMORY ARRAY AND METHOD OF MAKING THEREOF USING SELF-ALIGNED PATTERNING

(71) Applicant: SANDISK TECHNOLOGIES LLC, Addison, TX (US)

(72) Inventors: Lei Wan, San Jose, CA (US); Jordan Katine, Mountain View, CA (US); Tsai-Wei Wu, San Jose, CA (US); Chu-Chen Fu, San Ramon, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 179 days.

This patent is subject to a terminal disclaimer.

(21) Appl. No.: 17/654,768

(22) Filed: Mar. 14, 2022

(65) Prior Publication Data

US 2022/0199686 A1 Jun. 23, 2022

Related U.S. Application Data

(60) Continuation-in-part of application No. 17/477,958, filed on Sep. 17, 2021, now Pat. No. 11,631,716, (Continued)

(51) Int. Cl.
*G11C 11/00* (2006.01)
*H10B 61/00* (2023.01)
(Continued)

(52) U.S. Cl.
CPC ............ *H10B 61/10* (2023.02); *H10N 50/01* (2023.02); *H10N 50/80* (2023.02)

(58) Field of Classification Search
CPC ..................................................... H10B 61/10
See application file for complete search history.

(56) References Cited

U.S. PATENT DOCUMENTS 7,474,723 B2 1/2009 Oyama
7,502,211 B2 3/2009 Gill
(Continued)

FOREIGN PATENT DOCUMENTS

JP 5585212 B2 9/2014
KR 20130129046 A 11/2013
(Continued)

OTHER PUBLICATIONS

U.S. Appl. No. 17/654,760, filed Mar. 2022, Wan et al.*
(Continued)

*Primary Examiner* — Pho M Luu
(74) *Attorney, Agent, or Firm* — THE MARBURY LAW GROUP PLLC

(57) ABSTRACT

A memory device includes a cross-point array of magnetoresistive memory cells. Each magnetoresistive memory cell includes a vertical stack of a selector-containing pillar structure and a magnetic tunnel junction pillar structure. The lateral spacing between neighboring pairs of magnetoresistive memory cells may be smaller along a first horizontal direction than along a second horizontal direction, and a dielectric spacer or a tapered etch process may be used to provide a pattern of an etch mask for patterning first electrically conductive lines underneath the magnetoresistive memory cells. Alternatively, a resist layer may be employed to pattern first electrically conductive lines underneath the cross-point array. Alternatively, a protective dielectric liner may be provided to protect selector-containing pillar structures during formation of the magnetic tunnel junction pillar structures.

20 Claims, 116 Drawing Sheets

Related U.S. Application Data which is a division of application No. 16/666,967, filed on Oct. 29, 2019, now Pat. No. 11,152,425, application No. 17/654,768, filed on Mar. 14, 2022 is a continuation-in-part of application No. 17/590,561, filed on Feb. 1, 2022, now Pat. No. 11,765,911, which is a continuation of application No. 16/401,172, filed on May 2, 2019, now Pat. No. 11,271,035, application No. 17/654,768, filed on Mar. 14, 2022 is a continuation-in-part of application No. 17/354,541, filed on Jun. 22, 2021, now Pat. No. 11,882,706, which is a division of application No. 16/460,820, filed on Jul. 2, 2019, now Pat. No. 11,056,534.

(60) Provisional application No. 62/867,590, filed on Jun. 27, 2019.

(51) Int. Cl.
*H10N 50/01* (2023.01)
*H10N 50/80* (2023.01)

(56) References Cited

U.S. PATENT DOCUMENTS

| | | | |
|---|---|---|---|
| 7,733,685 | B2 | 6/2010 | Scheuerlein et al. |
| 9,252,362 | B2 | 2/2016 | Pio |
| 9,542,987 | B2 | 1/2017 | Naik et al. |
| 9,768,229 | B2 | 9/2017 | Braganca et al. |
| 9,830,966 | B2 | 11/2017 | Mihajlovic et al. |
| 10,229,723 | B1 | 3/2019 | Choi et al. |
| 10,249,683 | B1 | 4/2019 | Lille et al. |
| 10,381,551 | B1 | 8/2019 | Lille |
| 10,553,783 | B2 | 2/2020 | Lille |
| 10,726,892 | B2 | 7/2020 | Le et al. |
| 10,788,547 | B2 | 9/2020 | Kalitsov et al. |
| 10,797,227 | B2 | 10/2020 | Le et al. |
| 10,811,596 | B2 | 10/2020 | Le et al. |
| 10,862,022 | B2 | 12/2020 | Le et al. |
| 11,056,534 | B2 | 7/2021 | Wan et al. |
| 11,152,425 | B2 | 10/2021 | Wan et al. |
| 11,271,035 | B2 | 3/2022 | Wan et al. |
| 11,271,036 | B2 | 3/2022 | Lille et al. |
| 2005/0105325 | A1* | 5/2005 | Haneda ................... G11C 11/15 365/154 |
| 2005/0220150 | A1 | 10/2005 | Oyama |
| 2009/0290406 | A1 | 11/2009 | Xia et al. |
| 2009/0290409 | A1 | 11/2009 | Xia et al. |
| 2010/0054027 | A1 | 3/2010 | Xia |
| 2010/0110776 | A1 | 5/2010 | Yoon et al. |
| 2011/0267874 | A1 | 11/2011 | Ryu et al. |
| 2013/0201757 | A1 | 8/2013 | Li et al. |
| 2013/0215675 | A1 | 8/2013 | Ryu et al. |
| 2015/0357376 | A1 | 12/2015 | Seo et al. |
| 2016/0225423 | A1 | 8/2016 | Naik et al. |
| 2017/0047510 | A1 | 2/2017 | Chen et al. |
| 2017/0117027 | A1 | 4/2017 | Braganca et al. |
| 2017/0117323 | A1 | 4/2017 | Braganca et al. |
| 2017/0125078 | A1 | 4/2017 | Mihjlovic et al. |
| 2018/0366642 | A1 | 12/2018 | Yang et al. |
| 2019/0013353 | A1 | 1/2019 | Lee et al. |
| 2019/0027201 | A1 | 1/2019 | Petti et al. |
| 2019/0080738 | A1 | 3/2019 | Choi et al. |
| 2019/0172871 | A1 | 6/2019 | Yang et al. |
| 2019/0207088 | A1 | 7/2019 | Schabes et al. |
| 2019/0287592 | A1 | 9/2019 | Matsunami |
| 2020/0006633 | A1 | 1/2020 | Lille |
| 2020/0220068 | A1* | 7/2020 | Hashemi ................ H10B 61/00 |
| 2020/0342926 | A1 | 10/2020 | Katine et al. |
| 2020/0350364 | A1 | 11/2020 | Wan et al. |
| 2020/0411589 | A1 | 12/2020 | Wan et al. |
| 2021/0126052 | A1 | 4/2021 | Wan et al. |
| 2021/0313392 | A1 | 10/2021 | Wan et al. |
| 2021/0408114 | A1 | 12/2021 | Lille et al. |

FOREIGN PATENT DOCUMENTS

| | | | |
|---|---|---|---|
| WO | WO 2019/005162 | A1 | 1/2019 |
| WO | WO 2019/005172 | A1 | 1/2019 |
| WO | WO 2019/139774 | A1 | 7/2019 |
| WO | WO 2020/222883 | A1 | 11/2020 |

OTHER PUBLICATIONS

Notification of Transmittal of the International Search Report and Written Opinion of the International Search Authority for International Patent Application No. PCT/US2019/068899, mailed Apr. 26, 2020, 12 pages.

Notification of Transmittal of the International Search Report and Written Opinion of the International Search Authority for International Patent Application No. PCT/US2020/023707, mailed Jul. 28, 2020, 10 pages.

Kim, Y. et al. "Multilevel Spin-Orbit Torque MRAMs," IEEE Transactions on Electron Devices, vol. 62, No. 2, pp. 561-568, (2015).

U.S. Appl. No. 17/654,760, filed Mar. 14, 2022, SanDisk Technologies LLC.

U.S. Appl. No. 17/654,762, filed Mar. 14, 2022, SanDisk Technologies LLC.

U.S. Appl. No. 17/654,773, filed Mar. 14, 2022, SanDisk Technologies LLC.

U.S. Appl. No. 17/654,777, filed Mar. 14, 2022, SanDisk Technologies LLC.

U.S. Appl. No. 17/654,781, filed Mar. 14, 2022, SanDisk Technologies LLC.

USPTO Office Communication, Non-Final Office Action for U.S. Appl. No. 17/354,541, mailed Jun. 2, 2023, 19 pages.

* cited by examiner

CROSS-POINT MAGNETORESISTIVE RANDOM MEMORY ARRAY AND METHOD OF MAKING THEREOF USING SELF-ALIGNED PATTERNING

RELATED APPLICATIONS

This application is a continuation-in-part (CIP) application of U.S. application Ser. No. 17/477,958 filed on Sep. 17, 2021, which is a divisional application of U.S. application Ser. No. 16/666,967 filed on Oct. 29, 2019. Further, this application is a CIP application of U.S. application Ser. No. 17/590,561 filed on Feb. 1, 2022, which is a continuation application of U.S. application Ser. No. 16/401,172 filed on May 2, 2019. In addition, this application is a CIP application of U.S. application Ser. No. 17/354,541 filed on Jun. 22, 2021, which is a divisional application of U.S. application Ser. No. 16/460,820 filed on Jul. 2, 2019, which claims priority from U.S. Provisional Application Ser. No. 62/867,590 filed on Jun. 27, 2019. Each of the above-referenced applications are incorporated herein by reference in their entirety.

FIELD

The present disclosure relates generally to the field of magnetic memory devices, and particularly to cross-point MRAM arrays and methods of manufacturing the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

Spin-orbit-torque (SOT) MRAM devices use switching of magnetization direction of a free magnetic layer by injection of an in-plane current in an adjacent conductive layer, which is referred to as a spin-orbit-torque (SOT) layer. Unlike the STT MRAM devices in which the electrical current is injected along a direction perpendicular to magnetic tunnel junction, the write operation is performed by flowing an electrical current through the SOT layer parallel to the magnetic tunnel junction. The read operation of a SOT memory cell is performed by passing electrical current through the magnetic tunnel junction of the SOT memory cell.

SUMMARY

According to an aspect of the present disclosure, a memory array is provided, which comprises: first electrically conductive lines laterally extending along a first horizontal direction and having a respective variable width along a second horizontal direction that varies along the first horizontal direction; a two-dimensional array of selector-containing pillar structures located over the first electrically conductive lines and including a respective selector element; a two-dimensional array of magnetic tunnel junction (MTJ) pillar structures located over the two-dimensional array of selector-containing pillar structures and including a respective magnetic tunnel junction (MTJ); and second electrically conductive lines laterally extending along the second horizontal direction and overlying the two-dimensional array of MTJ pillar structures.

According to another aspect of the present disclosure, a method of forming a memory device is provided, which comprises: forming a first electrically conductive layer over a substrate; forming a two-dimensional array of selector-containing pillar structures including a respective selector element over the first electrically conductive layer; forming dielectric spacers around the two-dimensional array of selector-containing pillar structures, wherein each of the dielectric spacers laterally surrounds a respective row of selector-containing pillar structures that are arranged along a first horizontal direction, and the dielectric spacers are laterally spaced from each other along a second horizontal direction; patterning the first electrically conductive layer into first electrically conductive lines by transferring a pattern of lengthwise sidewalls of the dielectric spacers through the first electrically conductive layer; forming a two-dimensional array of magnetic tunnel junction (MTJ) pillar structures over the two-dimensional array of selector-containing pillar structures; and forming second electrically conductive lines laterally extending along the second horizontal direction over the two-dimensional array of MTJ pillar structures.

According to yet another aspect of the present disclosure, a method of forming a memory device is provided, which comprises: forming a first electrically conductive layer over a substrate; forming selector-level material layers over the first electrically conductive layer; forming a two-dimensional array of selector-containing pillar structures including a respective selector element by patterning the selector-level material layers employing one or more pattern transfer processes; patterning the first electrically conductive layer into first electrically conductive lines laterally extending along a first horizontal direction and laterally spaced apart along a second horizontal direction after performing at least one pattern transfer process among the one or more pattern transfer processes; forming dielectric fill material portions between rows of selector-containing pillar structures arranged along the first horizontal direction or between columns of selector-containing pillar structures arranged along the second horizontal direction, wherein top surfaces of the dielectric fill material portions are formed within a horizontal plane including top surfaces of the two-dimensional array of selector-containing pillar structures; forming a two-dimensional array of magnetic tunnel junction (MTJ) pillar structures over the two-dimensional array of selector-containing pillar structures; and forming second electrically conductive lines laterally extending along the second horizontal direction over the two-dimensional array of MTJ pillar structures.

According to still another aspect of the present disclosure, a memory array is provided, which comprises: first electrically conductive lines laterally extending along a first horizontal direction and laterally spaced apart along a second horizontal direction; rows of selector-magnetic tunnel junction (selector-MTJ) assemblies located on a respective one of the first electrically conductive lines, wherein each of the selector-MTJ assemblies comprises a respective row of magnetic tunnel junctions (MTJs) and a respective row of selector-containing pillar structures that are arranged along the first horizontal direction, and a lateral spacing between neighboring pairs of selector-containing pillar structures that are laterally spaced apart along the first horizontal direction is less than a lateral spacing between neighboring pairs of selector-containing pillar structures that are laterally spaced apart along the second horizontal direction; and second electrically conductive lines laterally extending along the second horizontal direction and overlying a respective column of the selector-MTJ assemblies.

According to even another aspect of the present disclosure, a method of forming a memory device is provided, which comprises: forming a first electrically conductive layer, magnetic-tunnel-junction-level (MTJ-level) material layers that include magnetic tunnel junction material layers, and selector-level material layers over a substrate; forming a two-dimensional array of discrete patterned resist material portions over the selector-level material layers, wherein a first nearest-neighbor spacing along a first horizontal direction of the two-dimensional array of discrete patterned resist material portions is less than a second nearest-neighbor spacing along a second horizontal direction of the two-dimensional array of discrete patterned resist material portions; and transferring a pattern in the two-dimensional array of discrete patterned resist material portions through the selector material layers, the magnetic tunnel junction material layers, and the first electrically conductive layer such that physically exposed surfaces of remaining portions of the MTJ-level material layers are formed with taper angles, wherein patterned portions of the selector-level material layers comprise a two-dimensional array of selector-containing pillar structures including a respective selector element, patterned portions of the MTJ-level material layers comprise a two-dimensional array of magnetic tunnel junction (MTJ) pillar structures, and patterned portions of the first electrically conductive layer comprise first electrically conductive lines that laterally extend along the first horizontal direction and laterally spaced apart from each other along the second horizontal direction.

According to aspect of the present disclosure, a method of forming a memory device is provided, which comprises: forming a first electrically conductive layer over a substrate; forming a two-dimensional array of memory cells over the first electrically conductive layer, wherein each of the memory cells comprises a vertical stack including a magnetic tunnel junction pillar structure and a selector-containing pillar structure; coating a continuous resist layer over the two-dimensional array of memory cells such that the continuous resist layer comprises a horizontally-extending planar resist layer overlying the first electrically conductive layer, a two-dimensional array of tubular resist portions laterally surrounding the two-dimensional array of memory cells, and a two-dimensional array of capping resist portions overlying the two-dimensional array of memory cells; patterning the continuous resist layer into discrete resist material portions by lithographic exposure and development, wherein the horizontally-extending planar resist layer is divided into a plurality of horizontally-extending planar resist portions having a respective pair of lengthwise edges laterally extending along a first horizontal direction and adjoined to a respective set of at least one tubular resist portion; and patterning the first electrically conductive layer into a plurality of first electrically conductive lines by etching portions of the first electrically conductive layer that are not covered by the discrete resist material portions.

According to another aspect of the present disclosure, a memory device is provided, which comprises: first electrically conductive lines laterally extending along a first horizontal direction, laterally spaced apart from each other along a second horizontal direction, and located over a substrate; a two-dimensional array of memory cells located over the first electrically conductive lines, wherein each of the memory cells comprises a vertical stack including a magnetic tunnel junction pillar structure and a selector-containing pillar structure, and each of the first electrically conductive lines contacts a respective row of memory cells arranged along the first horizontal direction; discrete resist material portions having a tubular configuration and laterally surrounds a respective one of the memory cells; second electrically conductive lines contacting top surfaces of a respective subset of the memory cells; and a dielectric matrix layer laterally surrounding the two-dimensional array of discrete resist material portions.

According to yet another aspect of the present disclosure, a memory device is provided, which comprises: first electrically conductive lines laterally extending along a first horizontal direction and laterally spaced apart from each other along a second horizontal direction; a two-dimensional array of selector-containing pillar structures located over the first electrically conductive lines, wherein each of the first electrically conductive lines contacts a respective row of selector-containing pillar structures of the two-dimensional array of selector-containing pillar structures; a protective dielectric liner comprising a two-dimensional array of tubular dielectric liner portions laterally surrounding the two-dimensional array of selector-containing pillar structures; a two-dimensional array of magnetic tunnel junction pillar structures located above the two-dimensional array of selector-containing pillar structures; and second electrically conductive lines laterally extending along the second horizontal direction, laterally spaced apart from each other along the first horizontal direction, and located over the two-dimensional array of magnetic tunnel junction pillar structures.

According to still another aspect of the present disclosure, a method of forming a memory device includes forming a two-dimensional array of selector-containing pillar structures over first electrically conductive lines which extend in a first horizontal direction; depositing a layer stack including a continuous reference layer, a continuous nonmagnetic tunnel barrier layer, and a continuous free layer over the two-dimensional array of selector-containing pillar structures; patterning the layer stack into a two-dimensional array of magnetic tunnel junction pillar structures; and forming second electrically conductive lines over the two-dimensional array of magnetic tunnel junction pillar structures.

BRIEF DESCRIPTION OF THE DRAWINGS

FIG. 3A is a top-down view, FIG. 3B is a vertical cross-sectional view along the vertical plane B-B' of FIG. 3A, and FIG. 3C is a vertical cross-sectional view along the vertical plane C-C' of FIG. 3A.

FIG. 4A is a top-down view, FIG. 4B is a vertical cross-sectional view along the vertical plane B-B' of FIG. 4A, and FIG. 4C is a vertical cross-sectional view along the vertical plane C-C' of FIG. 4A.

FIG. 5A is a top-down view, FIG. 5B is a vertical cross-sectional view along the vertical plane B-B' of FIG. 5A, and FIG. 5C is a vertical cross-sectional view along the vertical plane C-C' of FIG. 5A.

FIG. 6A is a top-down view, FIG. 6B is a vertical cross-sectional view along the vertical plane B-B' of FIG. 6A, and FIG. 6C is a vertical cross-sectional view along the vertical plane C-C' of FIG. 6A.

FIG. 7A is a top-down view, FIG. 7B is a vertical cross-sectional view along the vertical plane B-B' of FIG. 7A, and FIG. 7C is a vertical cross-sectional view along the vertical plane C-C' of FIG. 7A.

FIG. 8A is a top-down view, FIG. 8B is a vertical cross-sectional view along the vertical plane B-B' of FIG. 8A, FIG. 8C is a vertical cross-sectional view along the vertical plane C-C' of FIG. 8A, and FIG. 8D is a horizontal cross-sectional view of the first exemplary structure along the horizontal plane D-D' of FIGS. 8B and 8C.

FIG. 9A is a top-down view, FIG. 9B is a vertical cross-sectional view along the vertical plane B-B' of FIG. 9A, and FIG. 9C is a vertical cross-sectional view along the vertical plane C-C' of FIG. 9A.

FIG. 9D is a top-down view, FIG. 9E is a vertical cross-sectional view along the vertical plane E-E' of FIG. 9D, and FIG. 9F is a vertical cross-sectional view along the vertical plane E-E' of FIG. 9D.

FIG. 10A is a top-down view, FIG. 10B is a vertical cross-sectional view along the vertical plane B-B' of FIG. 10A, and FIG. 10C is a vertical cross-sectional view along the vertical plane C-C' of FIG. 10A.

FIG. 11A is a top-down view, FIG. 11B is a vertical cross-sectional view along the vertical plane B-B' of FIG. 11A, and FIG. 11C is a vertical cross-sectional view along the vertical plane C-C' of FIG. 11A.

FIG. 12A is a top-down view, FIG. 12B is a vertical cross-sectional view along the vertical plane B-B' of FIG. 12A, and FIG. 12C is a vertical cross-sectional view along the vertical plane C-C' of FIG. 12A.

FIG. 13A is a top-down view, FIG. 13B is a vertical cross-sectional view along the vertical plane B-B' of FIG. 13A, and FIG. 13C is a vertical cross-sectional view along the vertical plane C-C' of FIG. 13A.

FIG. 14A is a top-down view, FIG. 14B is a vertical cross-sectional view along the vertical plane B-B' of FIG. 14A, and FIG. 14C is a vertical cross-sectional view along the vertical plane C-C' of FIG. 14A.

FIG. 15A is a top-down view, FIG. 15B is a vertical cross-sectional view along the vertical plane B-B' of FIG. 15A, and FIG. 15C is a vertical cross-sectional view along the vertical plane C-C' of FIG. 15A.

FIG. 16A is a top-down view, FIG. 16B is a vertical cross-sectional view along the vertical plane B-B' of FIG. 16A, and FIG. 16C is a vertical cross-sectional view along the vertical plane C-C' of FIG. 16A.

FIG. 17A is a top-down view, FIG. 17B is a vertical cross-sectional view along the vertical plane B-B' of FIG. 17A, and FIG. 17C is a vertical cross-sectional view along the vertical plane C-C' of FIG. 17A.

FIG. 18A is a top-down view, FIG. 18B is a vertical cross-sectional view along the vertical plane B-B' of FIG. 18A, FIG. 18C is a vertical cross-sectional view along the vertical plane C-C' of FIG. 18A.

FIG. 19A is a top-down view, FIG. 19B is a vertical cross-sectional view along the vertical plane B-B' of FIG. 19A, and FIG. 19C is a vertical cross-sectional view along the vertical plane C-C' of FIG. 19A.

FIG. 20A is a top-down view, FIG. 20B is a vertical cross-sectional view along the vertical plane B-B' of FIG. 20A, and FIG. 20C is a vertical cross-sectional view along the vertical plane C-C' of FIG. 20A.

FIG. 21A is a top-down view, FIG. 21B is a vertical cross-sectional view along the vertical plane B-B' of FIG. 21A, and FIG. 21C is a vertical cross-sectional view along the vertical plane C-C' of FIG. 21A.

FIG. 22A is a top-down view, FIG. 22B is a vertical cross-sectional view along the vertical plane B-B' of FIG. 22A, and FIG. 22C is a vertical cross-sectional view along the vertical plane C-C' of FIG. 22A.

FIG. 23A is a top-down view, FIG. 23B is a vertical cross-sectional view along the vertical plane B-B' of FIG. 23A, and FIG. 23C is a vertical cross-sectional view along the vertical plane C-C' of FIG. 23A.

FIG. 24A is a top-down view, FIG. 24B is a vertical cross-sectional view along the vertical plane B-B' of FIG. 24A, and FIG. 24C is a vertical cross-sectional view along the vertical plane C-C' of FIG. 24A.

FIG. 25A is a top-down view, FIG. 25B is a vertical cross-sectional view along the vertical plane B-B' of FIG. 25A, and FIG. 25C is a vertical cross-sectional view along the vertical plane C-C' of FIG. 25A.

FIG. 26A is a top-down view, FIG. 26B is a vertical cross-sectional view along the vertical plane B-B' of FIG. 26A, and FIG. 26C is a vertical cross-sectional view along the vertical plane C-C' of FIG. 26A.

FIG. 27A is a top-down view, FIG. 27B is a vertical cross-sectional view along the vertical plane B-B' of FIG. 27A, and FIG. 27C is a vertical cross-sectional view along the vertical plane C-C' of FIG. 27A.

FIG. 28A is a top-down view, FIG. 28B is a vertical cross-sectional view along the vertical plane B-B' of FIG. 28A, and FIG. 28C is a vertical cross-sectional view along the vertical plane C-C' of FIG. 28A.

FIG. 29A is a top-down view, FIG. 29B is a vertical cross-sectional view along the vertical plane B-B' of FIG. 29A, and FIG. 29C is a vertical cross-sectional view along the vertical plane C-C' of FIG. 29A.

FIG. 30A is a top-down view, FIG. 30B is a vertical cross-sectional view along the vertical plane B-B' of FIG. 30A, and FIG. 30C is a vertical cross-sectional view along the vertical plane C-C' of FIG. 30A.

FIG. 31A is a top-down view, FIG. 31B is a vertical cross-sectional view along the vertical plane B-B' of FIG. 31A, and FIG. 31C is a vertical cross-sectional view along the vertical plane C-C' of FIG. 31A.

FIG. 32A is a top-down view, FIG. 32B is a vertical cross-sectional view along the vertical plane B-B' of FIG. 32A, and FIG. 32C is a vertical cross-sectional view along the vertical plane C-C' of FIG. 32A.

FIG. 33A is a top-down view, FIG. 33B is a vertical cross-sectional view along the vertical plane B-B' of FIG. 33A, and FIG. 33C is a vertical cross-sectional view along the vertical plane C-C' of FIG. 33A.

FIG. 34A is a top-down view, FIG. 34B is a vertical cross-sectional view along the vertical plane B-B' of FIG. 34A, and FIG. 34C is a vertical cross-sectional view along the vertical plane C-C' of FIG. 34A.

FIG. 35A is a top-down view, FIG. 35B is a vertical cross-sectional view along the vertical plane B-B' of FIG. 35A, and FIG. 35C is a vertical cross-sectional view along the vertical plane C-C' of FIG. 35A.

FIG. 36A is a top-down view, FIG. 36B is a vertical cross-sectional view along the vertical plane B-B' of FIG. 36A, and FIG. 36C is a vertical cross-sectional view along the vertical plane C-C' of FIG. 36A.

FIG. 37A is a top-down view, FIG. 37B is a vertical cross-sectional view along the vertical plane B-B' of FIG. 37A, and FIG. 37C is a vertical cross-sectional view along the vertical plane C-C' of FIG. 37A.

FIG. 38A is a top-down view, FIG. 38B is a vertical cross-sectional view along the vertical plane B-B' of FIG. 38A, and FIG. 38C is a vertical cross-sectional view along the vertical plane C-C' of FIG. 38A.

FIG. 39A is a top-down view, FIG. 39B is a vertical cross-sectional view along the vertical plane B-B' of FIG. 39A, and FIG. 39C is a vertical cross-sectional view along the vertical plane C-C' of FIG. 39A.

FIG. 40A is a top-down view, FIG. 40B is a vertical cross-sectional view along the vertical plane B-B' of FIG. 40A, and FIG. 40C is a vertical cross-sectional view along the vertical plane C-C' of FIG. 40A.

FIG. 41A is a top-down view, FIG. 41B is a vertical cross-sectional view along the vertical plane B-B' of FIG. 41A, and FIG. 41C is a vertical cross-sectional view along the vertical plane C-C' of FIG. 41A.

FIG. 42A is a top-down view, FIG. 42B is a vertical cross-sectional view along the vertical plane B-B' of FIG. 42A, and FIG. 42C is a vertical cross-sectional view along the vertical plane C-C' of FIG. 42A.

FIG. 43A is a top-down view, FIG. 43B is a vertical cross-sectional view along the vertical plane B-B' of FIG. 43A, and FIG. 43C is a vertical cross-sectional view along the vertical plane C-C' of FIG. 43A.

FIG. 44A is a top-down view, FIG. 44B is a vertical cross-sectional view along the vertical plane B-B' of FIG. 44A, and FIG. 44C is a vertical cross-sectional view along the vertical plane C-C' of FIG. 44A.

FIG. 45A is a top-down view, FIG. 45B is a vertical cross-sectional view along the vertical plane B-B' of FIG. 45A, and FIG. 45C is a vertical cross-sectional view along the vertical plane C-C' of FIG. 45A.

FIG. 46A is a top-down view, FIG. 46B is a vertical cross-sectional view along the vertical plane B-B' of FIG. 46A, and FIG. 46C is a vertical cross-sectional view along the vertical plane C-C' of FIG. 46A.

FIG. 47A is a top-down view, FIG. 47B is a vertical cross-sectional view along the vertical plane B-B' of FIG. 47A, FIG. 47C is a vertical cross-sectional view along the vertical plane C-C' of FIG. 47A, and FIG. 47D is a horizontal cross-sectional view along the horizontal plane D-D' of FIGS. 47B and 47C.

FIG. 48A is a top-down view, FIG. 48B is a vertical cross-sectional view along the vertical plane B-B' of FIG. 48A, and FIG. 48C is a vertical cross-sectional view along the vertical plane C-C' of FIG. 48A.

FIG. 49A is a top-down view, FIG. 49B is a vertical cross-sectional view along the vertical plane B-B' of FIG. 49A, and FIG. 49C is a vertical cross-sectional view along the vertical plane C-C' of FIG. 49A.

FIG. 50A is a top-down view, FIG. 50B is a vertical cross-sectional view along the vertical plane B-B' of FIG. 50A, and FIG. 50C is a vertical cross-sectional view along the vertical plane C-C' of FIG. 50A.

FIG. 51A is a top-down view, FIG. 51B is a vertical cross-sectional view along the vertical plane B-B' of FIG. 51A, FIG. 51C is a vertical cross-sectional view along the vertical plane C-C' of FIG. 51A, and FIG. 51D is a horizontal cross-sectional view along the horizontal plane D-D' of FIGS. 51B and 51C.

FIG. 52A is a top-down view, FIG. 52B is a vertical cross-sectional view along the vertical plane B-B' of FIG. 52A, and FIG. 52C is a vertical cross-sectional view along the vertical plane C-C' of FIG. 52A.

FIG. 53A is a top-down view, FIG. 53B is a vertical cross-sectional view along the vertical plane B-B' of FIG. 53A, and FIG. 53C is a vertical cross-sectional view along the vertical plane C-C' of FIG. 53A.

FIG. 54A is a top-down view, FIG. 54B is a vertical cross-sectional view along the vertical plane B-B' of FIG. 54A, and FIG. 54C is a vertical cross-sectional view along the vertical plane C-C' of FIG. 54A.

FIG. 55A is a top-down view, FIG. 55B is a vertical cross-sectional view along the vertical plane B-B' of FIG. 55A, and FIG. 55C is a vertical cross-sectional view along the vertical plane C-C' of FIG. 55A.

FIG. 56A is a top-down view, FIG. 56B is a vertical cross-sectional view along the vertical plane B-B' of FIG. 56A, and FIG. 56C is a vertical cross-sectional view along the vertical plane C-C' of FIG. 56A.

FIG. 57A is a top-down view, FIG. 57B is a vertical cross-sectional view along the vertical plane B-B' of FIG. 57A, and FIG. 57C is a vertical cross-sectional view along the vertical plane C-C' of FIG. 57A.

FIG. 58A is a top-down view, FIG. 58B is a vertical cross-sectional view along the vertical plane B-B' of FIG. 58A, and FIG. 58C is a vertical cross-sectional view along the vertical plane C-C' of FIG. 58A.

FIG. 59A is a top-down view, FIG. 59B is a vertical cross-sectional view along the vertical plane B-B' of FIG. 59A, and FIG. 59C is a vertical cross-sectional view along the vertical plane C-C' of FIG. 59A.

FIG. 60A is a top-down view, FIG. 60B is a vertical cross-sectional view along the vertical plane B-B' of FIG. 60A, and FIG. 60C is a vertical cross-sectional view along the vertical plane C-C' of FIG. 60A.

FIG. 61A is a top-down view, FIG. 61B is a vertical cross-sectional view along the vertical plane B-B' of FIG. 61A, FIG. 61C is a vertical cross-sectional view along the vertical plane C-C' of FIG. 61A, and FIG. 61D is a horizontal cross-sectional view along the horizontal plane D-D' of FIGS. 61B and 61C.

FIG. 62A is a top-down view, FIG. 62B is a vertical cross-sectional view along the vertical plane B-B' of FIG. 62A, and FIG. 62C is a vertical cross-sectional view along the vertical plane C-C' of FIG. 62A.

FIG. 63A is a top-down view, FIG. 63B is a vertical cross-sectional view along the vertical plane B-B' of FIG. 63A, and FIG. 63C is a vertical cross-sectional view along the vertical plane C-C' of FIG. 63A.

FIG. 64A is a top-down view, FIG. 64B is a vertical cross-sectional view along the vertical plane B-B' of FIG. 64A, and FIG. 64C is a vertical cross-sectional view along the vertical plane C-C' of FIG. 64A.

FIG. 65A is a top-down view, FIG. 65B is a vertical cross-sectional view along the vertical plane B-B' of FIG. 65A, and FIG. 65C is a vertical cross-sectional view along the vertical plane C-C' of FIG. 65A.

FIG. 66A is a top-down view, FIG. 66B is a vertical cross-sectional view along the vertical plane B-B' of FIG. 66A, and FIG. 66C is a vertical cross-sectional view along the vertical plane C-C' of FIG. 66A.

FIG. 67A is a top-down view, FIG. 67B is a vertical cross-sectional view along the vertical plane B-B' of FIG. 67A, and FIG. 67C is a vertical cross-sectional view along the vertical plane C-C' of FIG. 67A.

FIG. 68A is a top-down view, FIG. 68B is a vertical cross-sectional view along the vertical plane B-B' of FIG. 68A, and FIG. 68C is a vertical cross-sectional view along the vertical plane C-C' of FIG. 68A.

FIG. 69A is a top-down view, FIG. 69B is a vertical cross-sectional view along the vertical plane B-B' of FIG. 69A, and FIG. 69C is a vertical cross-sectional view along the vertical plane C-C' of FIG. 69A.

FIG. 70A is a top-down view, FIG. 70B is a vertical cross-sectional view along the vertical plane B-B' of FIG. 70A, and FIG. 70C is a vertical cross-sectional view along the vertical plane C-C' of FIG. 70A.

FIG. 71A is a top-down view, FIG. 71B is a vertical cross-sectional view along the vertical plane B-B' of FIG. 71A, and FIG. 71C is a vertical cross-sectional view along the vertical plane C-C' of FIG. 71A.

FIG. 72A is a top-down view, FIG. 72B is a vertical cross-sectional view along the vertical plane B-B' of FIG. 72A, and FIG. 72C is a vertical cross-sectional view along the vertical plane C-C' of FIG. 72A.

FIG. 73A is a top-down view, FIG. 73B is a vertical cross-sectional view along the vertical plane B-B' of FIG. 73A, and FIG. 73C is a vertical cross-sectional view along the vertical plane C-C' of FIG. 73A.

FIG. 74A is a top-down view, FIG. 74B is a vertical cross-sectional view along the vertical plane B-B' of FIG. 74A, and FIG. 74C is a vertical cross-sectional view along the vertical plane C-C' of FIG. 74A.

FIG. 75A is a top-down view, FIG. 75B is a vertical cross-sectional view along the vertical plane B-B' of FIG. 75A, and FIG. 75C is a vertical cross-sectional view along the vertical plane C-C' of FIG. 75A.

FIG. 76A is a top-down view, FIG. 76B is a vertical cross-sectional view along the vertical plane B-B' of FIG. 76A, and FIG. 76C is a vertical cross-sectional view along the vertical plane C-C' of FIG. 76A.

FIG. 77A is a top-down view, FIG. 77B is a vertical cross-sectional view along the vertical plane B-B' of FIG. 77A, and FIG. 77C is a vertical cross-sectional view along the vertical plane C-C' of FIG. 77A.

FIG. 78A is a top-down view, FIG. 78B is a vertical cross-sectional view along the vertical plane B-B' of FIG. 78A, and FIG. 78C is a vertical cross-sectional view along the vertical plane C-C' of FIG. 78A.

FIG. 79A is a top-down view, FIG. 79B is a vertical cross-sectional view along the vertical plane B-B' of FIG. 79A, and FIG. 79C is a vertical cross-sectional view along the vertical plane C-C' of FIG. 79A.

FIG. 80A is a top-down view, FIG. 80B is a vertical cross-sectional view along the vertical plane B-B' of FIG. 80A, and FIG. 80C is a vertical cross-sectional view along the vertical plane C-C' of FIG. 80A.

FIG. 81A is a top-down view, FIG. 81B is a vertical cross-sectional view along the vertical plane B-B' of FIG. 81A, and FIG. 81C is a vertical cross-sectional view along the vertical plane C-C' of FIG. 81A.

FIG. 83A is a top-down view, FIG. 83B is a vertical cross-sectional view along the vertical plane B-B' of FIG. 83A, and FIG. 83C is a vertical cross-sectional view along the vertical plane C-C' of FIG. 83A.

FIG. 84A is a top-down view, FIG. 84B is a vertical cross-sectional view along the vertical plane B-B' of FIG. 84A, and FIG. 84C is a vertical cross-sectional view along the vertical plane C-C' of FIG. 84A.

FIG. 85A is a top-down view, FIG. 85B is a vertical cross-sectional view along the vertical plane B-B' of FIG. 85A, and FIG. 85C is a vertical cross-sectional view along the vertical plane C-C' of FIG. 85A.

FIG. 86A is a top-down view, FIG. 86B is a vertical cross-sectional view along the vertical plane B-B' of FIG. 86A, and FIG. 86C is a vertical cross-sectional view along the vertical plane C-C' of FIG. 86A.

FIG. 87A is a top-down view, FIG. 87B is a vertical cross-sectional view along the vertical plane B-B' of FIG. 87A, and FIG. 87C is a vertical cross-sectional view along the vertical plane C-C' of FIG. 87A.

FIG. 88A is a top-down view, FIG. 88B is a vertical cross-sectional view along the vertical plane B-B' of FIG. 88A, and FIG. 88C is a vertical cross-sectional view along the vertical plane C-C' of FIG. 88A.

FIG. 89A is a top-down view, FIG. 89B is a vertical cross-sectional view along the vertical plane B-B' of FIG. 89A, and FIG. 89C is a vertical cross-sectional view along the vertical plane C-C' of FIG. 89A.

FIG. 90A is a top-down view, FIG. 90B is a vertical cross-sectional view along the vertical plane B-B' of FIG. 90A, and FIG. 90C is a vertical cross-sectional view along the vertical plane C-C' of FIG. 90A.

FIG. 91A is a top-down view, FIG. 91B is a vertical cross-sectional view along the vertical plane B-B' of FIG. 91A, and FIG. 91C is a vertical cross-sectional view along the vertical plane C-C' of FIG. 91A.

FIG. 92A is a top-down view, FIG. 92B is a vertical cross-sectional view along the vertical plane B-B' of FIG. 92A, and FIG. 92C is a vertical cross-sectional view along the vertical plane C-C' of FIG. 92A.

FIG. 93A is a top-down view, FIG. 93B is a vertical cross-sectional view along the vertical plane B-B' of FIG. 93A, and FIG. 93C is a vertical cross-sectional view along the vertical plane C-C' of FIG. 93A.

FIG. 94A is a top-down view, FIG. 94B is a vertical cross-sectional view along the vertical plane B-B' of FIG. 94A, and FIG. 94C is a vertical cross-sectional view along the vertical plane C-C' of FIG. 94A.

DETAILED DESCRIPTION

Figure 1:
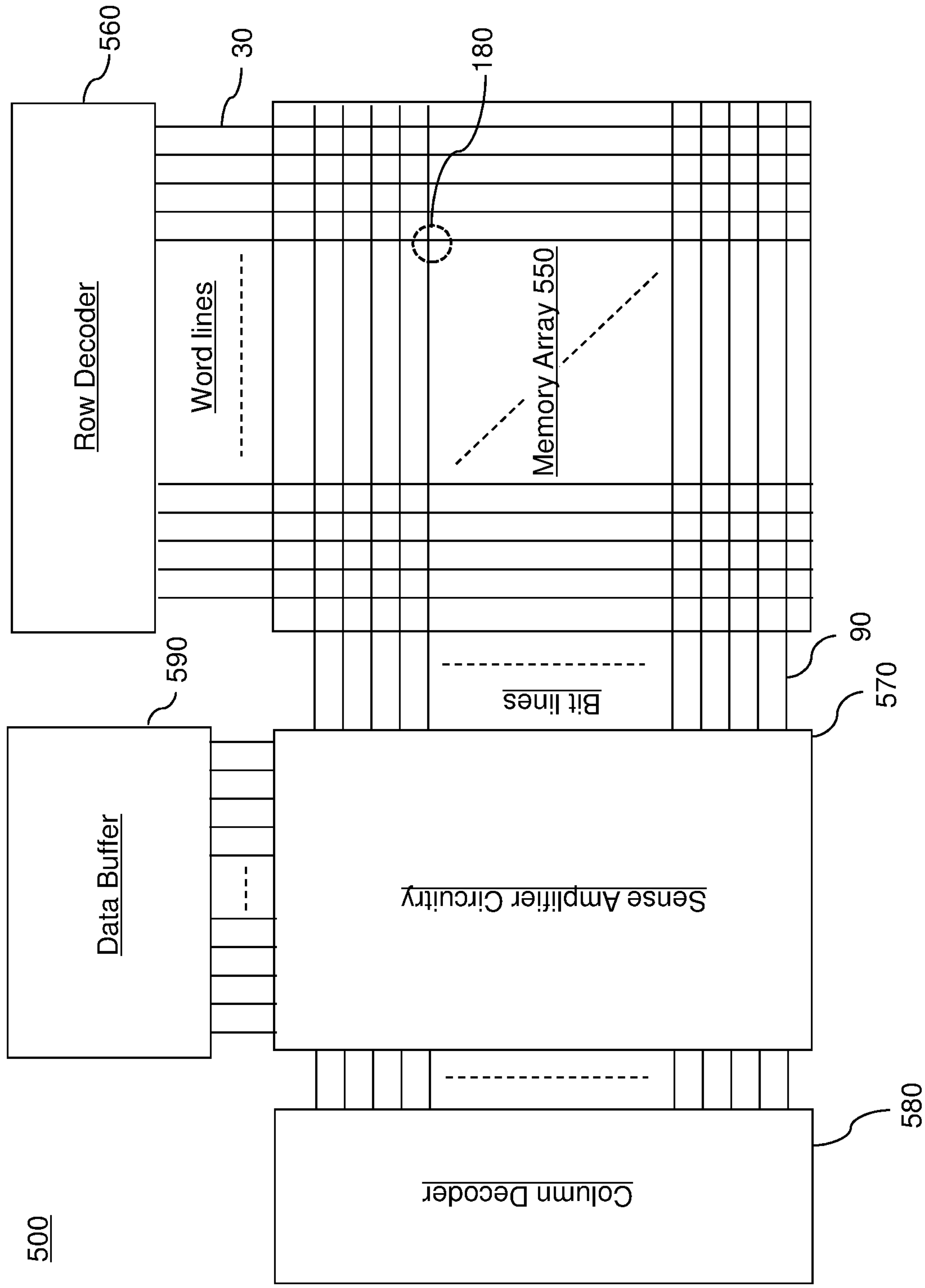
FIG. 1 is a schematic diagram of a memory device including resistive memory cells of the present disclosure in an array configuration.

As discussed above, the present disclosure is directed to a cross-point MRAM array and methods of manufacturing the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as “first,” “second,” and “third” are employed merely to identify similar elements, and different ordinals may be employed across the specification and the claims of the instant disclosure. As used herein, a first element located “on” a second element can be located on the exterior side of a surface of the second element or on the interior side of the second element. As used herein, a first element is located “directly on” a second element if there exist a physical contact between a surface of the first element and a surface of the second element. As used herein, an “in-process” structure or a “transient” structure refers to a structure that is subsequently modified.

As used herein, a “layer” refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a “layer stack” refers to a stack of layers. As used herein, a “line” or a “line structure” refers to a layer that has a predominant direction of extension, i.e., having a direction along which the layer extends the most.

As used herein, a “conductive material” refers to a material having electrical conductivity greater than $1.0\times10^{5}$ S/cm. As used herein, an “insulating material” or a “dielectric material” refers to a material having electrical conductivity less than $1.0\times10^{-6}$ S/cm. As used herein, a “metallic material” refers to a conductive material including at least one metallic element therein. All measurements for electrical conductivities are made at the standard condition.

Referring to FIG. 1, a schematic diagram is shown for a magnetic memory device including memory cells 180 of an embodiment of the present disclosure in an array configuration. The magnetic memory device can be configured as a MRAM device 500 containing MRAM cells 180. As used herein, a “RAM device” refers to a memory device containing memory cells that allow random access, e.g., access to any selected memory cell upon a command for reading the contents of the selected memory cell. As used herein, an “MRAM device” refers to a RAM device in which the memory cells are magnetoresistive memory cells.

The MRAM device 500 of an embodiment of the present disclosure includes a memory array region 550 containing an array of the respective MRAM cells 180 located at the intersection of the respective word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2:
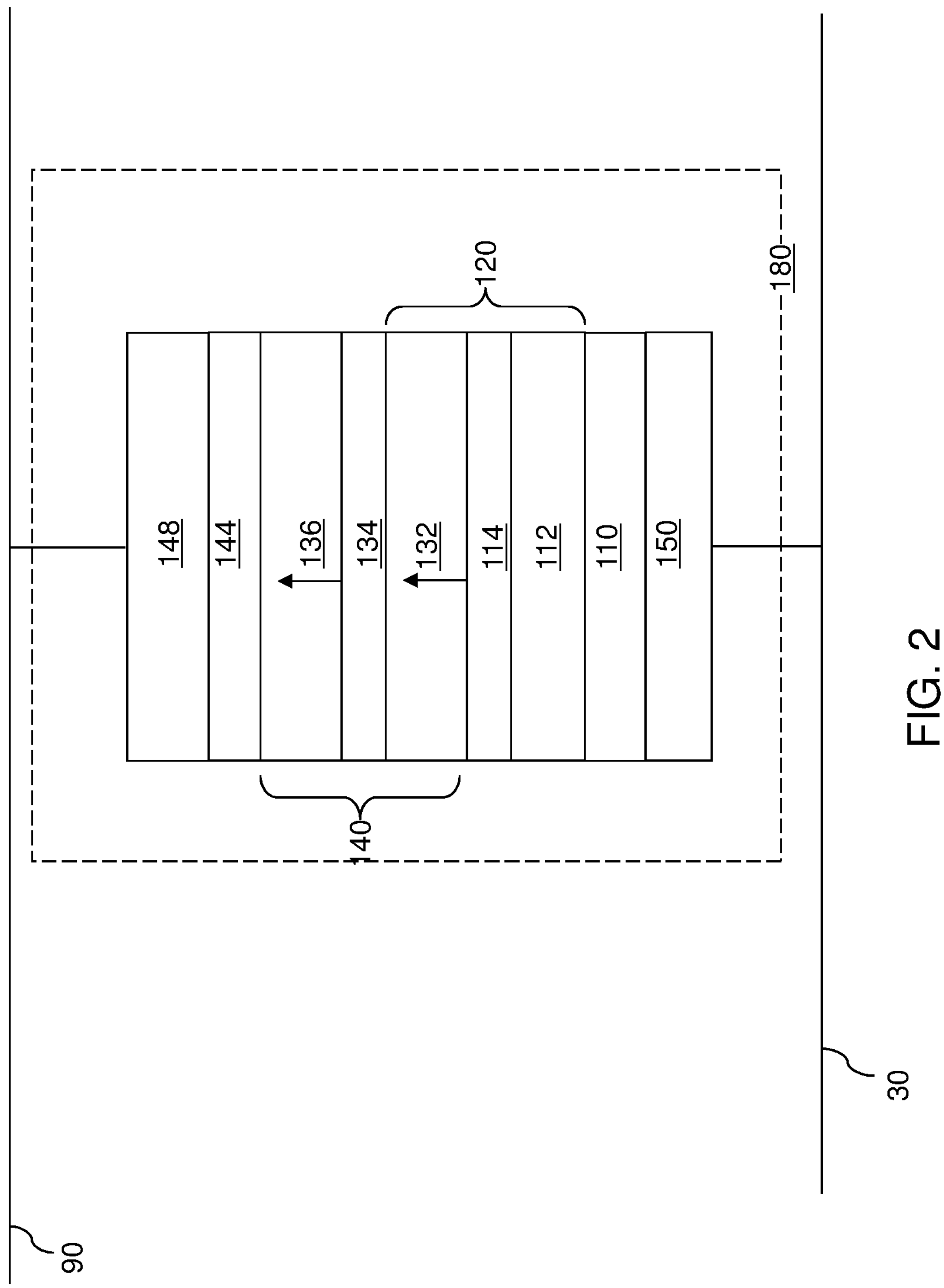
FIG. 2 illustrates an exemplary STT MRAM cell according to an embodiment of the present disclosure.

Referring to FIG. 2, an exemplary spin-transfer torque (STT) MRAM device is illustrated, which may comprise one MRAM cell 180 within the magnetic memory device illustrated in FIG. 1. The MRAM cell 180 of FIG. 2 can include a first terminal that may be electrically connected to, or comprises, a portion of a first electrically conductive line 30 and a second terminal that may be electrically connected to, or comprises, a portion of a second electrically conductive line 90. The first terminal can function as a first electrode, and the second terminal can function as a second electrode.

Generally, the MRAM cell 180 includes a magnetic tunnel junction (MTJ) 140. The magnetic tunnel junction 140 includes a reference layer 132 (which may also be referred to as a "pinned" layer) having a fixed vertical magnetization, a nonmagnetic tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 (which may be a dielectric layer such as a MgO layer), and have a magnetization direction perpendicular to the interface between the free layer 136 and the nonmagnetic tunnel barrier layer 134.

In one embodiment, the reference layer 132 is located below the nonmagnetic tunnel barrier layer 134, while the free layer 136 is located above the nonmagnetic tunnel barrier layer 134. An electrically conductive capping layer 148 may be formed on top of the free layer 136 in order to provide additional perpendicular anisotropy. A dielectric capping layer 144 may be provided between the free layer 136 and the electrically conductive capping layer 148. In one embodiment, the reference layer 132 and the free layer 136 have respective positive uniaxial magnetic anisotropy. Positive uniaxial magnetic anisotropy is also referred to as perpendicular magnetic anisotropy (PMA) in which a minimum energy preference for quiescent magnetization is along the axis perpendicular to the plane of the magnetic film.

The configuration in which the reference layer 132 and the free layer 136 have respective perpendicular magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

A data bit can be written in the STT MRAM cell by passing high enough electrical current through the reference layer 132 and the free layer 136 in a programming operation so that spin-transfer torque can set or reset the magnetization state of the free layer 136. The direction of the magnetization of the free layer 136 after the programming operation depends on the current polarity with respect to magnetization direction of the reference layer 132. The data bit can be read by passing smaller electrical current through the STT MRAM cell and measuring the resistance of the STT MRAM cell. The data bit "0" and the data bit "1" correspond to low and high resistance states of the STT MRAM cell (or vice versa), which are provided by parallel or antiparallel alignment of the magnetization directions of the free layer 136 and the reference layer 132, respectively. The relative resistance change between parallel and antiparallel alignment (i.e., orientation) of the magnetization direction is called tunnel magnetoresistance (TMR).

In one embodiment, the reference layer 132 and the free layer 136 may include one or more ferromagnetic layers, such as CoFe or CoFeB. In plural ferromagnetic layers are included in the reference layer 132, then a thin non-magnetic layer comprised of tantalum or tungsten having a thickness of 0.2 nm-0.5 nm may be located between the ferromagnetic layers. The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm.

The reference layer 132 may be provided as a component within a synthetic antiferromagnetic structure (SAF structure) 120 which is formed over an optional nonmagnetic metallic seed layer 110, such as a Ta and/or Pt seed layer. In one embodiment, the SAF structure 120 can include a vertical stack including at least one superlattice 112 and an antiferromagnetic coupling layer 114 located between the reference layer 132 and the at least one superlattice 112. In one embodiment, the at least one superlattice 112 may comprise a first superlattice and a second superlattice. The antiferromagnetic layer 114 may comprise an Ir or an IrMn alloy layer located between the first and the second superlattices. In one embodiment, the first superlattice comprises N1 repetitions of a first unit layer stack of the first cobalt layer and the first platinum layer, and a first capping cobalt layer, such that N1 of the first platinum layers are interlaced with (N1+1) of the first cobalt layers, where N1 is an integer in a range from 2 to 10. The second superlattice comprises N2 repetitions of a second unit layer stack of the second cobalt layer and the second platinum layer, and a second capping cobalt layer, such that N2 first platinum layers are interlaced with (N2+1) second cobalt layers, where N2 is an integer in a range from 2 to 10. Other SAF structures 120 may be used. For example, a hard-magnetization layer may be used instead of the at least one superlattice 112. The hard-magnetization layer 112 includes a ferromagnetic material having perpendicular magnetic anisotropy. The magnetization of the reference layer 132 can be antiferromagnetically coupled to the magnetization of the hard-magnetization layer 112.

The electrically conductive capping layer 148, if present, can include a nonmagnetic metal layer or multilayers, such as ruthenium, tungsten and/or tantalum. The electrically conductive capping layer 148 may be a portion of a second electrically conductive line 90, or may be an electrically conductive structure that underlies the second electrically conductive line 90.

In one embodiment, the insulating cap layer 144 may comprise a thin magnesium oxide layer that is thin enough to enable tunneling of electrical current, such as a thickness in a range from 4 Angstroms to 10 Angstroms. In one embodiment, the MRAM cell 180 can be a single tunnel junction device that includes only one magnetic tunnel junction 140.

A selector element 150 can be formed in a series connection with the magnetic tunnel junction 140. The selector element 150 includes a selector material that provides a bidirectional current flow when the current or voltage exceeds a threshold value. Thus, the selector element 150 is a bidirectional selector device which permits bidirectional current flow when the current or voltage exceeds a threshold value and blocks current flow when the current or voltage is below the threshold value. The selector element 150 may include an ovonic threshold switch (OTS) material that allows flow of electrical current only when a voltage differential thereacross exceeds a threshold voltage value. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material can be non-crystalline (for example, by being amorphous) at a non-conductive state, and can remain non-crystalline (for example, by remaining amorphous) at a conductive state, and can revert back to a high resistance state when a high voltage bias thereacross is removed, i.e., when not subjected to a large voltage bias across a layer of the ovonic threshold voltage material. Throughout the resistive state changes, the ovonic threshold switch material can remain amorphous. In one embodiment, the ovonic threshold switch material can comprise a chalcogenide material. The chalcogenide material may be a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, O, C, P, Ge, As, Te, Se, In, or Si.

The selector element 150 may also include one or more electrically conductive and/or barrier layers, such as tungsten, tungsten nitride, tantalum, tantalum nitride, a carbon-nitrogen layer, etc.). The electrically conductive and/or barrier layers may be located above and/or below the ovonic threshold switch material.

The layer stack including the selector element 150, the SAF structure 120, the magnetic tunnel junction 140, the insulating cap layer 144 and the electrically conductive capping layer 148 can be annealed to induce crystallographic alignment between the crystalline structure of the nonmagnetic tunnel barrier layer 134 (which may include crystalline MgO having a rock salt crystal structure) and the crystalline structure within the free layer 136.

In one embodiment, the reference layer 132 has a fixed vertical magnetization that is perpendicular to an interface between the reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization. The magnetization direction of the free layer 136 can be flipped (i.e., from upward to downward or vice versa) by flowing electrical current through the discrete patterned layer stack (120, 140, 144, 148, 150, 170).

Figure 3C:
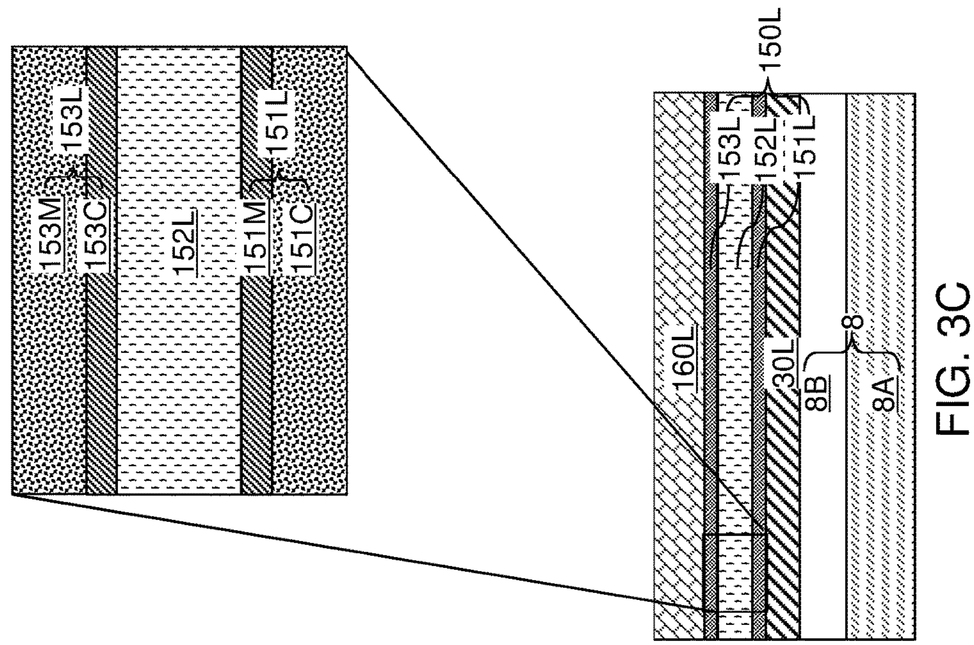
FIGS. 3A-3C are various views of a first exemplary structure after formation of a layer stack comprising a first electrically conductive layer, first selector-level material layers, and a first conductive material layer over a substrate according to a first embodiment of the present disclosure.
Figure 3A:
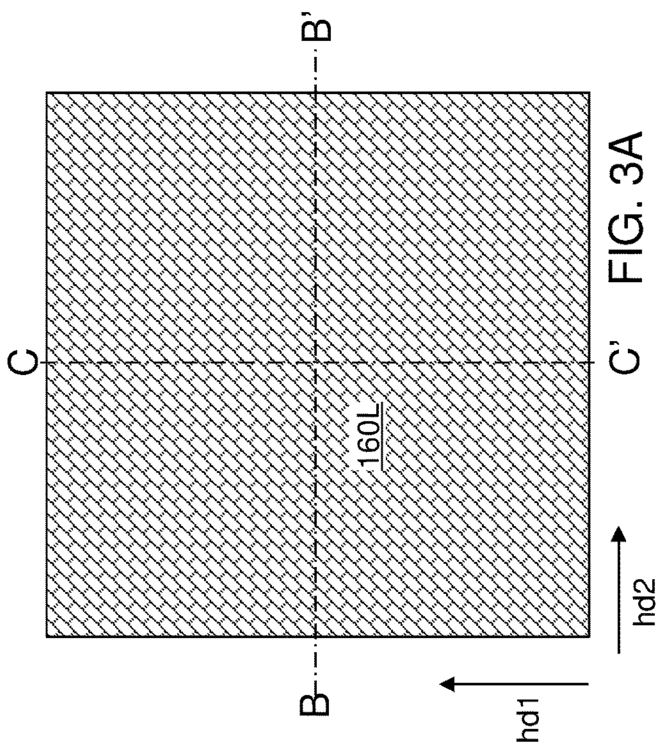
Figure 3B:
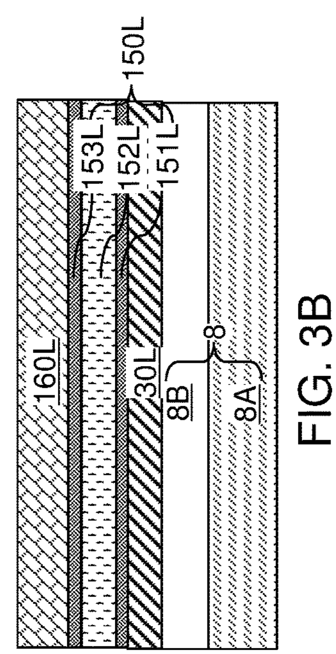

Referring to FIGS. 3A-3C, a first exemplary structure for forming a two-dimensional array of STT MRAM cells 180 is illustrated. The first exemplary structure can be provided by forming a layer stack of blanket (unpatterned) layers over a substrate 8. The substrate 8 may comprise, for example, a semiconductor substrate 8A and at least one dielectric material layer 8B formed over the semiconductor substrate 8A. Alternatively, an insulating substrate 8 (e.g., a ceramic or a glass substrate) or a conductive substrate 8 (e.g., a metal or metal alloy substrate) may be used instead. In one embodiment, various semiconductor devices (not shown) including switching devices and peripheral (i.e., driver) circuits may be formed over the semiconductor substrate 8A, and metal interconnect structures (not shown) may be formed in the at least one dielectric material layer 8B. The various semiconductor devices, if present, may comprise the various driver circuits of the MRAM device 500 illustrated in FIG. 1 other than the memory array region 550, which is subsequently formed in subsequent processing steps.

A layer stack (30L, 150L, 160L) can be deposited over the substrate 8. The layer stack (30L, 150L, 160L) can include, from bottom to top, a first electrically conductive layer 30L, first selector material layers 150L, and a first hardmask layer 160L.

The first electrically conductive layer 30L includes a first nonmagnetic electrically conductive material, such as Al, Cu, W, Ru, Mo, Nb, Ti, Ta, TiN, TaN, WN, MoN, or a combination thereof. The thickness of the first electrically conductive layer 30L can be in a range from 20 nm to 100 nm, although lesser and greater thicknesses can also be employed.

The first selector material layers 150L can comprise, from bottom to top, a first lower selector electrode material layer 151L, a first non-Ohmic material layer 152L, and a first upper selector electrode material layer 153L. The first lower selector electrode material layer 151L includes at least one conductive material that may be employed for lower selector electrodes to be subsequently formed. The first non-Ohmic material layer 152L includes a selector material that exhibits a non-Ohmic switching behavior. The first upper selector electrode material layer 153L includes at least one conductive material that may be employed for upper selector electrodes to be subsequently formed.

In one embodiment, the first lower selector electrode material layer 151L may comprise a layer stack including a first lower carbon-based electrode material layer 151C and a first lower metallic material layer 151M formed on the first lower carbon-based electrode material layer 151C. In one embodiment, the first upper selector electrode material layer 153L may comprise a layer stack including a first upper metallic material layer 153M and a first upper carbon-based electrode material layer 153C formed on the first upper metallic material layer 153M.

The first lower carbon-based electrode material layer 151C and the first upper carbon-based electrode material layer 153C within the selector-level material layers can include a respective carbon-based conductive material including carbon atoms at an atomic concentration greater than 50%. In one embodiment, the first lower carbon-based electrode material layer 151C and the first upper carbon-based electrode material layer 153C may include carbon atoms at an atomic concentration in a range from 50% to 100%, such as from 70% to 100% and/or from 80% to 100%. In one embodiment, each of first lower carbon-based electrode material layer 151C and the first upper carbon-based electrode material layer 153C comprises a respective material selected from diamond-like carbon (DLC), a carbon nitride material, and a carbon-rich conductive compound of carbon atoms and non-carbon atoms. Each of the first lower carbon-based electrode material layer 151C and the first upper carbon-based electrode material layer 153C may have a respective thickness in a range from 3 nm to 300 nm, although lesser and greater thicknesses may also be employed.

The first lower metallic material layer 151M and the first upper metallic material layer 153M within the first selector material layers 150L can include a respective metallic material having electrical conductivity that is greater than the electrical conductivity of the carbon-based conductive materials of the first lower carbon-based electrode material layer 151C and the first upper carbon-based electrode material layer 153C. In one embodiment, the first lower metallic material layer 151M comprises a first metallic material having electrical conductivity that is at least 10 times (which may be at least 30 times and/or at least 100 times and/or at least 1,000 times) the electrical conductivity of the carbon-based conductive material of first lower carbon-based electrode material layer 151C, and the first upper metallic material layer 153M comprises a second metallic material having electrical conductivity that is at least 10 times (which may be at least 30 times and/or at least 100 times and/or at least 1,000 times) the electrical conductivity of the carbon-based conductive material of the first upper carbon-based electrode material layer 153C.

Generally, each of the first lower metallic material layer 151M and the first upper metallic material layer 153M may comprise, and/or may consist essentially of, a high-conductivity metallic material that has a high electrical conductivity, and thus, is capable of functioning as a current-spreading material that prevents concentration of electrical current in the non-Ohmic material of the first non-Ohmic material layer 152L. In one embodiment, the first lower metallic material layer 151M and/or the first upper metallic material layer 153M may comprise, and/or may consist essentially of, an elemental metal, a conductive metallic carbide, or a conductive metallic nitride. In one embodiment, the first lower metallic material layer 151M and/or the first upper metallic material layer 153M may comprise, and/or may consist essentially of, a respective elemental metal having a melting point higher than 2,000 degrees Celsius (such as refractory metals). In one embodiment, the first lower metallic material layer 151M and/or the first upper metallic material layer 153M may comprise, and/or may consist essentially of, a respective elemental metal selected from ruthenium, niobium, molybdenum, tantalum, tungsten, or rhenium. In one embodiment, the first lower metallic material layer 151M and/or the first upper metallic material layer 153M may comprise, and/or may consist essentially of, a conductive metallic carbide such as tungsten carbide. In one embodiment, the first lower metallic material layer 151M and/or the first upper metallic material layer 153M may comprise, and/or may consist essentially of, a conductive metallic nitride such as tungsten nitride, titanium nitride, or tantalum nitride.

Generally, the first lower metallic material layer 151M and the first upper metallic material layer 153M may have a lower thickness than the first lower carbon-based electrode material layer 151C and the first upper carbon-based electrode material layer 153C. Each of the first lower metallic material layer 151M and the first upper metallic material layer 153M may have a respective thickness in a range from 0.2 nm to 10 nm, such as from 1 nm to 5 nm, although lesser and greater thicknesses may also be employed. In one embodiment, the ratio of the thickness of the first lower carbon-based electrode material layer 151C to the thickness of the first lower metallic material layer 151M may be in a range from 3.0 to 500, such as from 10 to 100, although lesser and greater ratios may also be employed. In one embodiment, the ratio of the thickness of the first upper carbon-based electrode material layer 153C to the thickness of the first upper metallic material layer 153M may be in a range from 3.0 to 500, such as from 10 to 100, although lesser and greater ratios may also be employed.

In one embodiment, the first non-Ohmic material layer 152L within the selector material layers 150L can include any suitable non-Ohmic selector material which exhibits non-linear electrical behavior. For example, the non-Ohmic selector material may comprise the above described OTS material or a volatile conductive bridge material. In another embodiment, the non-Ohmic selector material may comprise at least one non-threshold switch material, such as a tunneling selector material or diode materials (e.g., materials for p-n semiconductor diode, p-i-n semiconductor diode, Schottky diode or metal-insulator-metal diode). Thus, the material layer 152L may comprise a diode layer stack, such as a layer stack of p-doped semiconductor material layer and an n-doped semiconductor material layer, or a layer stack of a p-doped semiconductor material layer, an intrinsic semiconductor material layer, and an n-doped semiconductor material layer.

The OTS material can be non-crystalline (for example, amorphous) in a high resistivity state, and can remain non-crystalline (for example, remain amorphous) in a low resistivity state during application of a voltage above its threshold voltage across the OTS material. The ovonic threshold switch material can revert back to the high resistivity state when the high voltage above its threshold voltage is lowered below a critical holding voltage. Throughout the resistivity state changes, the ovonic threshold switch material can remain non-crystalline (e.g., amorphous). In one embodiment, the ovonic threshold switch material can comprise a chalcogenide material. The chalcogenide material may be a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, O, C, P, Ge, As, Te, Se, In, or Si. The thickness of the ovonic threshold selector-level material layers can be, for example, in a range from 1 nm to 50 nm, such as from 5 nm to 25 nm, although lesser and greater thicknesses can also be employed.

The first hardmask layer 160L includes any suitable hardmask material, such as an insulating, semiconductor or conductive hardmask material which may be used as a patterning mask for the underlying layers during a subsequent patterning step. Insulating hardmask materials include silicon nitride, silicon oxide, silicon oxynitride or insulating metal oxide materials, such as aluminum oxide. Electrically conductive hardmask materials include metals or metal alloys, such as Al, Cu, W, Ru, Mo, Nb, Ta, Ti, TiN, TaN, WN, MoN, or a combination thereof.

Figure 4C:
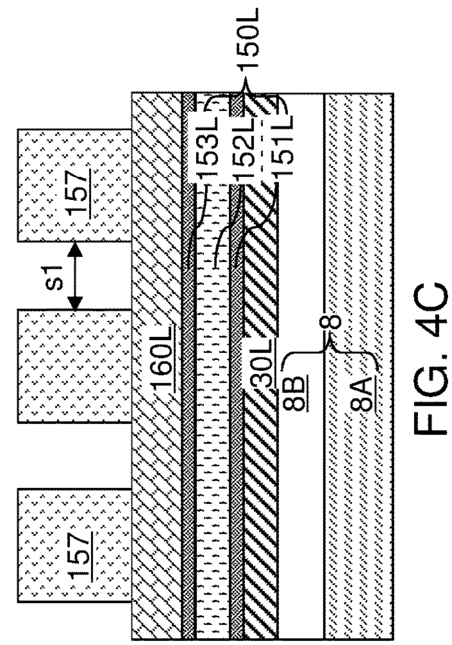
FIGS. 4A-4C are various views of the first exemplary structure after formation of a two-dimensional array of first discrete patterned photoresist material portions over the first conductive material layer according to the first embodiment of the present disclosure.
Figure 4A:
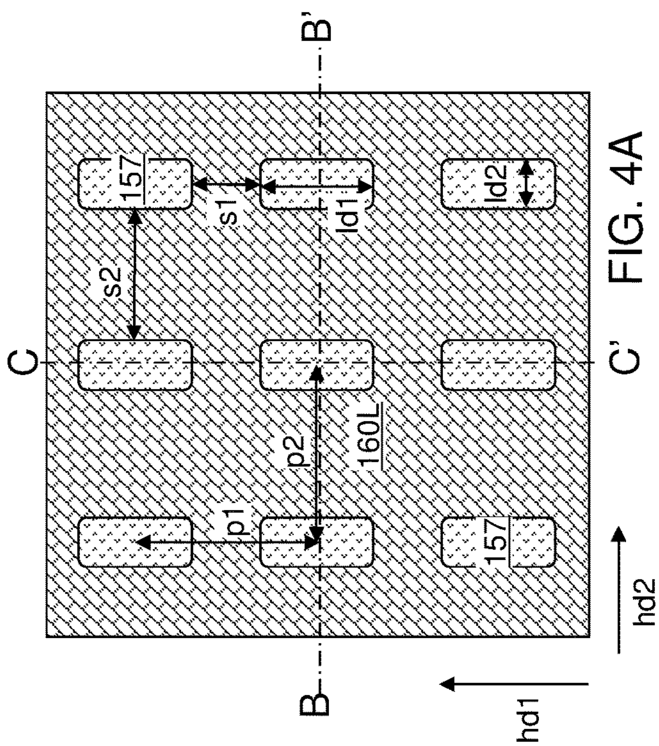
Figure 4B:
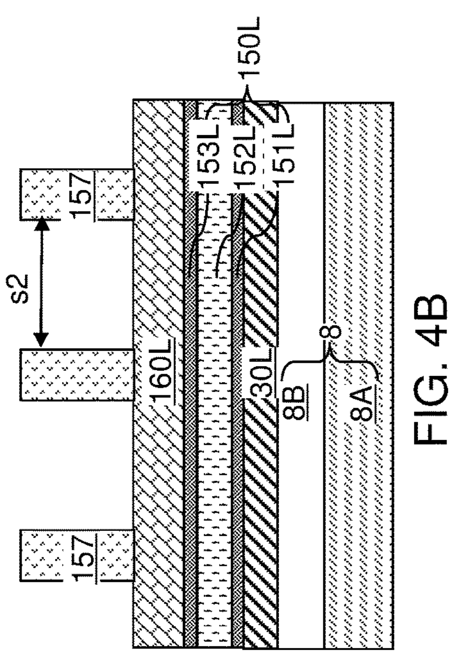

Referring to FIGS. 4A-4C, a photoresist layer can be applied over the first hardmask layer 160L, and can be lithographically patterned into a two-dimensional array of first discrete patterned photoresist material portions 157. The two-dimensional array of first discrete patterned photoresist material portions 157 may be a periodic two-dimensional array of first discrete patterned photoresist material portions 157 having a first periodicity along the first horizontal direction hd1 and having a second periodicity along the second horizontal direction hd2 that is perpendicular to the first horizontal direction hd1. In one embodiment, the first periodicity may be a first pitch p1, and the second periodicity may be a second pitch p2. The second pitch p2 may be the same as, or may be different from, the first pitch p1. The first pitch p1 may be in a range from 5 nm to 300 nm, such as from 10 nm to 100 nm, although lesser and greater dimensions may also be employed. The second pitch p2 may be in a range from 5 nm to 300 nm, such as from 10 nm to 100 nm, although lesser and greater dimensions may also be employed.

According to an aspect of the present disclosure, a first nearest-neighbor spacing s1 between neighboring pairs of the first discrete patterned photoresist material portions 157 that are laterally spaced apart along the first horizontal direction hd1 is less than a second nearest-neighboring spacing s2 between neighboring pairs of the first discrete patterned photoresist material portions 157 that are laterally spaced apart along the second horizontal direction hd2. In an illustrative case, each of the first discrete patterned photoresist material portions 157 may have a first lateral dimension ld1 along the first horizontal direction hd1, and may have a second lateral dimension ld2 along the second horizontal direction hd2. Each of the first discrete patterned photoresist material portions 157 may have a respective horizontal cross-sectional shape of a rectangle, a rounded rectangle, an oval, or a circle. The first nearest-neighbor spacing s1 between neighboring pairs of the first discrete patterned photoresist material portions 157 that are laterally spaced apart along the first horizontal direction hd1 can be the difference between the first pitch p1 and the first lateral dimension ld1. The second nearest-neighboring spacing s2 between neighboring pairs of the first discrete patterned photoresist material portions 157 that are laterally spaced apart along the second horizontal direction hd2 can be the second pitch p2 less the second lateral dimension ld2. In this case, p1−ld1 is less than p2−ld2, and thus s1 is less than s2. In one embodiment, the second pitch p2 may be the same as the first pitch p1, and the first lateral dimension ld1 may be greater than the second lateral dimension ld2.

Figures 5A, 5B, 5C:
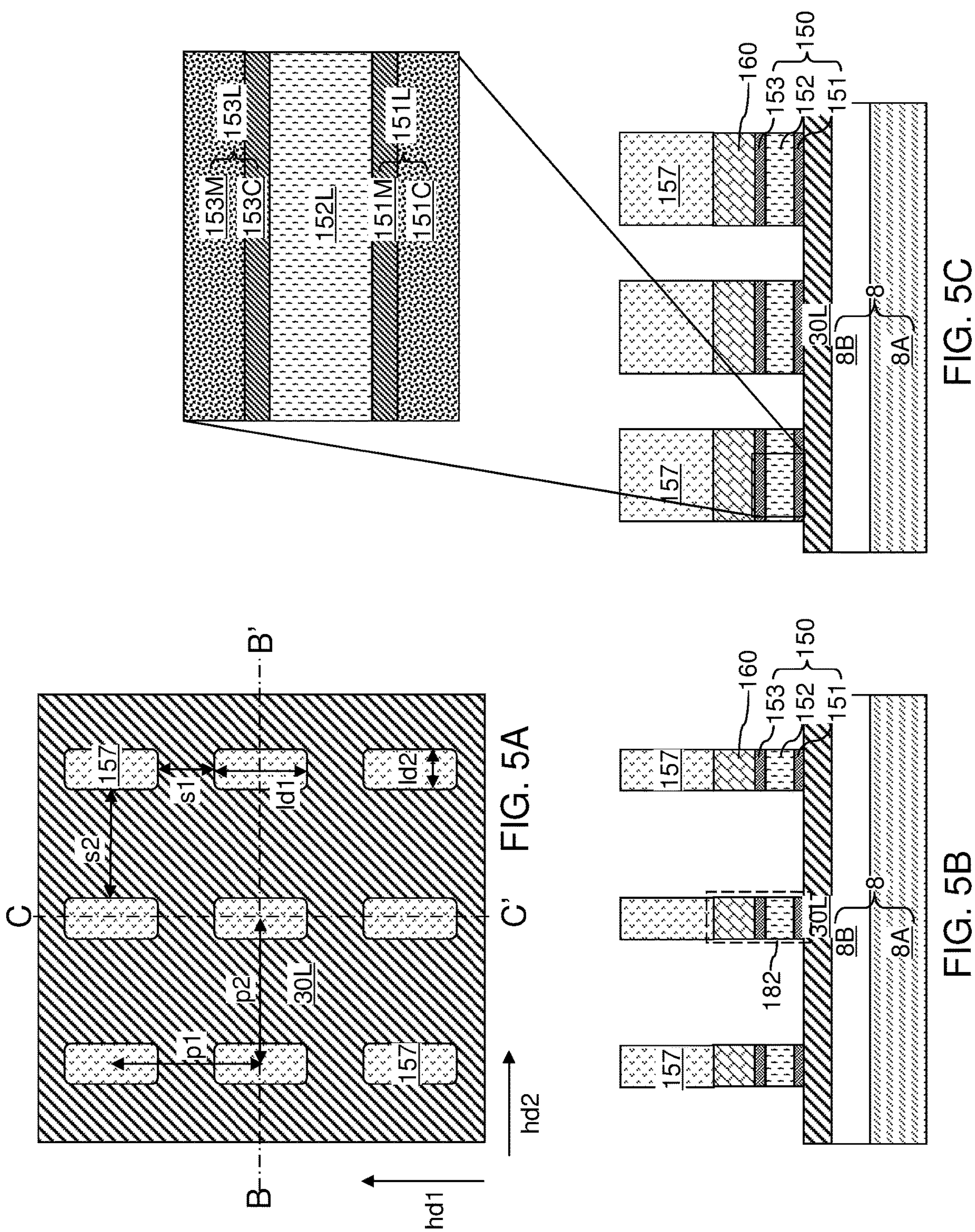
FIGS. 5A-5C are various views of the first exemplary structure after formation of a two-dimensional array of first selector-containing pillar structures according to the first embodiment of the present disclosure.

Referring to FIGS. 5A-5C, one or more pattern transfer processes may be performed to pattern the first hardmask layer 160L and the first selector material layers 150L. Specifically, an array-pattern-transfer process can be performed to transfer the pattern of the two-dimensional array of first discrete patterned photoresist material portions 157 through the first hardmask layer 160L and the first selector material layers 150L. For example, an anisotropic etch process can be performed to transfer the pattern in the two-dimensional array of first discrete patterned photoresist material portions 157 through the first conductive material layer 160L and the first selector material layers 150L. The patterned remaining portions of the first conductive material layer 160L and the first selector material layers 150L can include two-dimensional array of first selector-containing pillar structures 182.

Each of the first selector-containing pillar structures 182 may comprise a first selector element 150 and a first hardmask plate 160. Each first selector element 150 is a patterned portion of the first selector material layers 150L, and each first hardmask plate 160 is a patterned portion of the first hardmask layer 160L. Each first selector element 150 may include a vertical stack of a first lower selector electrode 151, a first non-Ohmic material plate 152, and a first upper selector electrode 153. Each first lower selector electrode 151 is a patterned portion of the first lower selector electrode material layer 151L. Each first non-Ohmic material plate 152 is a patterned portion of the first non-Ohmic material layer 152L. Each first upper selector electrode 153 is a patterned portion of the first upper selector electrode material layer 153L.

In one embodiment, the two-dimensional array of first selector-containing pillar structures 182 comprises a two-dimensional periodic array of first selector-containing pillar structures 182 having the first pitch p1 along the first horizontal direction hd1 and having the second pitch p2 along the second horizontal direction hd2. The nearest-neighbor spacing s1 between neighboring pairs of the first selector-containing pillar structures 182 that are laterally spaced apart along the first horizontal direction hd1 is less than the nearest-neighboring spacing s2 between neighboring pairs of the first selector-containing pillar structures 182 that are laterally spaced apart along the second horizontal direction hd2.

In one embodiment, each first selector-containing pillar structure 182 within the two-dimensional array of first selector-containing pillar structures 182 has a respective elongated horizontal cross-sectional shape having a first lateral dimension ld1 along the first horizontal direction hd1 and having a second lateral dimensional ld2 along the second horizontal direction hd2 that is less than the first lateral dimension ld1. In one embodiment, the ratio of the first lateral dimension ld1 to the second lateral dimension ld2 may be in a range from 1.2 to 4, such as from 1.5 to 3.0. The two-dimensional array of first selector-containing pillar structures 182 can be formed over the first electrically conductive layer 30L. The two-dimensional array of first discrete patterned photoresist material portions 157 can be subsequently removed, for example, by ashing.

Figure 6A:
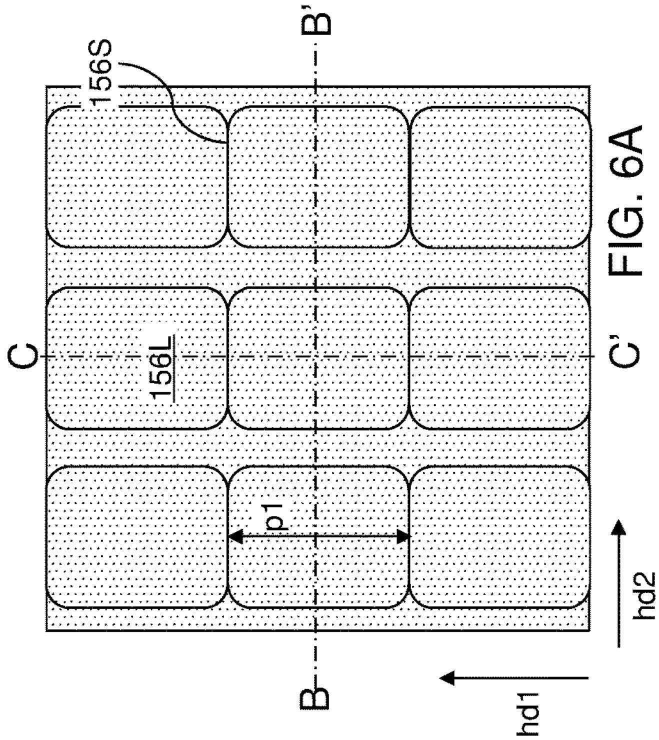
FIGS. 6A-6C are various views of the first exemplary structure after formation of a first dielectric spacer material layer according to the first embodiment of the present disclosure.
Figure 6B:
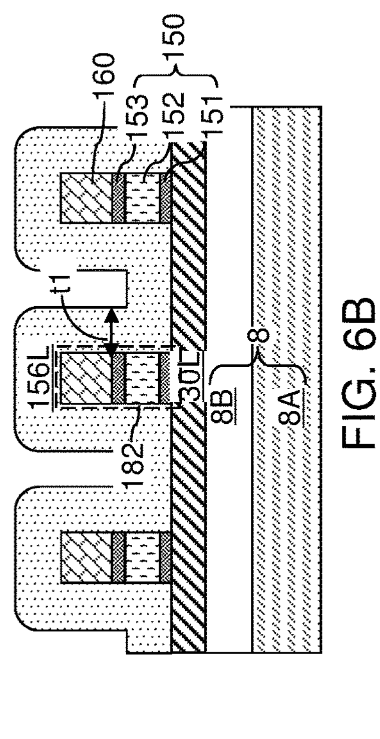
Figure 6C:
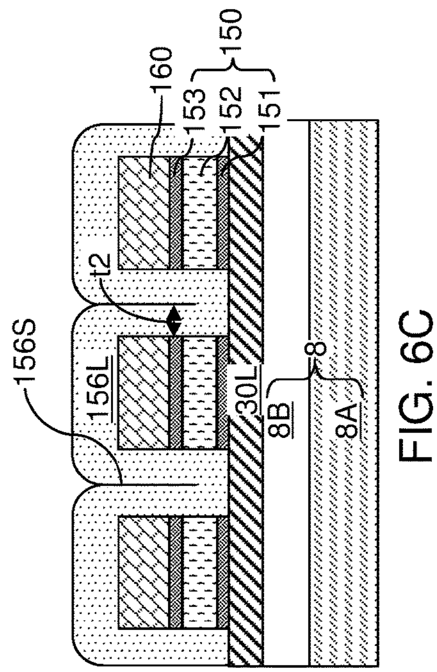

Referring to FIGS. 6A-6C, a first dielectric spacer material layer 156L can be formed over the two-dimensional array of first selector-containing pillar structures 182 and the first electrically conductive layer 30L. In one embodiment, the first dielectric spacer material layer 156L can be conformally deposited around the two-dimensional array of selector-containing pillar structures 182 such that the thickness of the first dielectric spacer material layer 156L is greater than one half of the nearest-neighbor spacing s1 between neighboring pairs of the first selector-containing pillar structures 182 that are laterally spaced apart along the first horizontal direction hd1, and is less than one half of the nearest-neighboring spacing s2 between neighboring pairs of the first selector-containing pillar structures 182 that are laterally spaced apart along the second horizontal direction hd2. Vertically-extending portions of the first dielectric spacer material layer 156L merge between neighboring pairs of the first selector-containing pillar structures 182 that are laterally spaced apart along the first horizontal direction hd1 to form vertically extending seams 156S. A two-dimensional periodic array of vertically-extending seams 156S can be formed, which can have the first pitch p1 along the first horizontal direction hd1 and can have the second pitch p2 along the second horizontal direction hd2. The vertically-extending seams 156S can be parallel to the second horizontal direction hd2, and can be located midway between a respective neighboring pair of first selector-containing pillar structures 182 of the two-dimensional array of first selector-containing pillar structures 182 that are laterally spaced apart along the first horizontal direction hd1.

Each vertically-extending portion of the first dielectric spacer material layer 156L located on a sidewall of a first selector-containing pillar structure 182 that extend along the first horizontal direction hd1 can have a first thickness t1, and can be physically exposed. Each vertically-extending portion of the first dielectric spacer material layer 156L located on a sidewall of a first selector-containing pillar structure 182 that extend along the second horizontal direction hd2 can have a second thickness t2, which is one half of the lateral spacing between neighboring pairs of first selector-containing pillar structures 182 that are laterally spaced apart along the first horizontal direction hd1. The second thickness t2 is less than the first thickness t1.

Figure 7A:
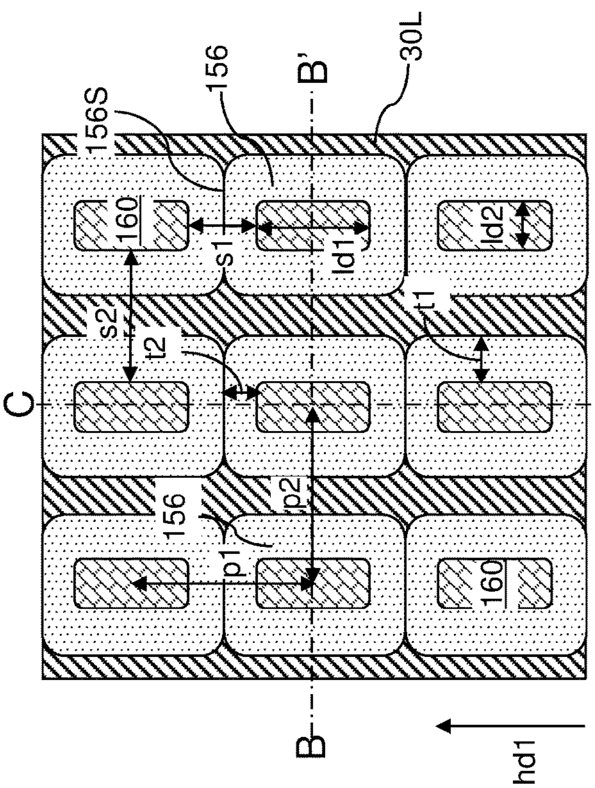
FIGS. 7A-7C are various views of the first exemplary structure after formation of first dielectric spacers according to the first embodiment of the present disclosure.
Figure 7B:
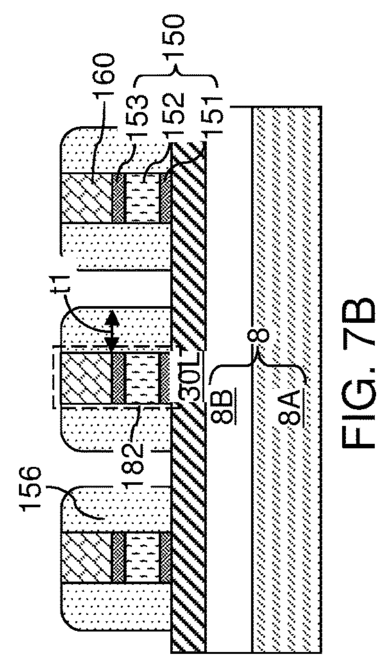
Figure 7C:
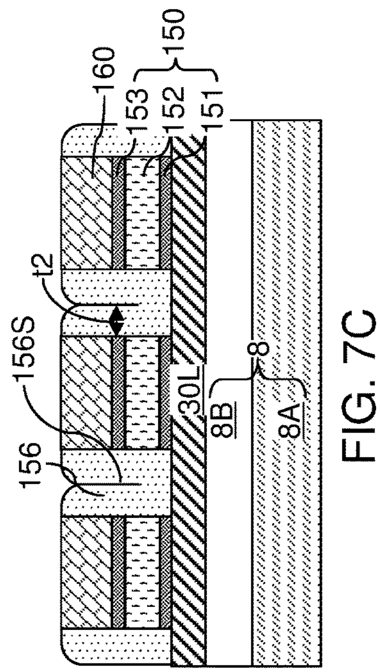

Referring to FIGS. 7A-7C, a first anisotropic etch process (e.g., a sidewall spacer etch process) can be performed to etch horizontally-extending portions of the first dielectric spacer material layer 156L. The first anisotropic etch process may be selective to the materials of the first hardmask plates 160. Each remaining continuous portion of the first dielectric spacer material layer 156L constitutes a first dielectric spacer 156. The first dielectric spacers 156 can be formed around the two-dimensional array of first selector-containing pillar structures 182 such that each of the first dielectric spacers 156 laterally surrounds a respective row of first selector-containing pillar structures 182 that are arranged along the first horizontal direction hd1. The first selector-containing pillar structures 156 within the respective row of first selector-containing pillar structures 156 are arranged along the first horizontal direction hd1. The first dielectric spacers 156 are laterally spaced apart from each other along the second horizontal direction hd2.

Generally, a first dielectric spacer formation process can be performed, in which the first dielectric spacers 156 are formed around the two-dimensional array of first selector-containing pillar structures 182. Each of the first dielectric spacers 156 comprises a respective plurality of vertically-extending seams 156S that are parallel to the second horizontal direction hd2 and located midway between a respective neighboring pair of first selector-containing pillar structures 182 of the two-dimensional array of first selector-containing pillar structures 182 that are laterally spaced apart along the first horizontal direction hd1.

In one embodiment, each of the first dielectric spacers 156 comprises a pair of contoured lengthwise sidewalls that generally extend along the first horizontal direction hd1 with a lateral undulation along the second horizontal direction hd2. Each lengthwise segment of each of the first dielectric spacers 156 that laterally extends along the first horizontal direction hd1 and located between a respective first selector-containing pillar structure 182 and a respective outer contoured lengthwise sidewall has a first thickness t1 along the second horizontal direction hd2. Each widthwise segment of each of the first dielectric spacers 156 located between a respective first selector-containing pillar structure 182 and a respective vertically-extending seam 156S has a second thickness t2 along the first horizontal direction hd1 that is less than the first thickness t1.

Referring to FIGS. 8A-8D, a second anisotropic etch process can be performed to transfer the pattern of the combination of the two-dimensional array of first selector-containing pillar structures 182 and the first dielectric spacers 156 through the first electrically conductive layer 30L. In other words, the combination of the two-dimensional array of first selector-containing pillar structures 182 and the first dielectric spacers 156 can be employed as an etch mask for anisotropically etching the first electrically conductive layer 30L. The first electrically conductive layer 30L can be patterned into a plurality of first electrically conductive lines 30, which may be a periodic one-dimensional array of first electrically conductive lines 30 having a periodicity of the second pitch p2 along the second horizontal direction hd2. The first electrically conductive lines 30 may comprise word lines in one embodiment. Optionally, the first dielectric spacers 156 may be recessed during the second anisotropic etch relative to the first hardmask plates 160 depending on their respective materials and the etch gas composition.

Figures 8A, 8B, 8C, 8D:
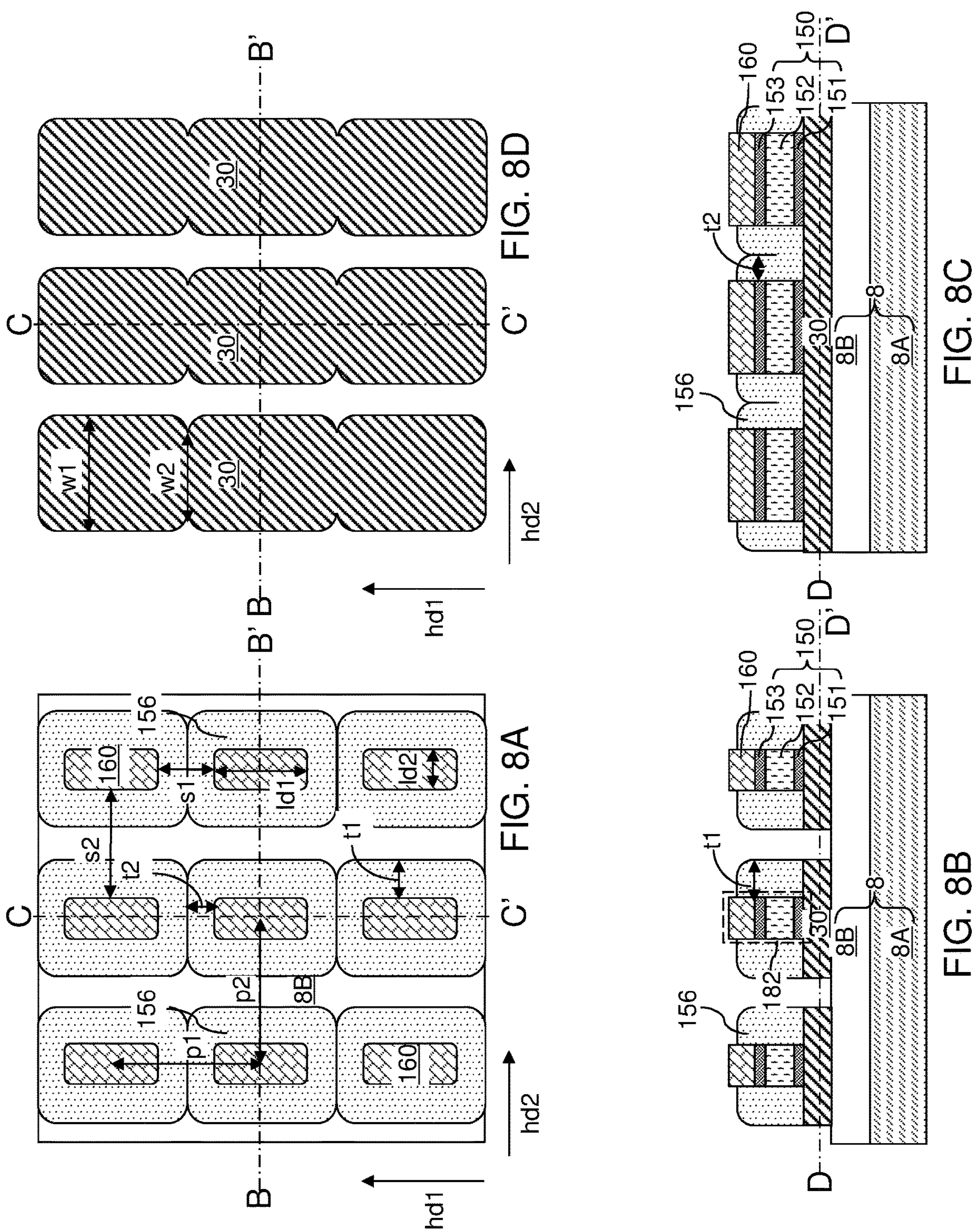
FIGS. 8A-8D are various views of the first exemplary structure after patterning the first electrically conductive layer into first electrically conductive lines according to the first embodiment of the present disclosure.

The pattern of the combination of the two-dimensional array of first selector-containing pillar structures 182 and the first dielectric spacers 156 includes the pattern of the lengthwise sidewalls of the first dielectric spacers 156. Thus, the first electrically conductive layer 30L can be patterned into the first electrically conductive lines 30 by transferring a pattern of lengthwise sidewalls of the first dielectric spacers 156 through the first electrically conductive layer 30L. The first electrically conductive lines 30 laterally extend along the first horizontal direction hd1, and have a respective variable width along the second horizontal direction hd2 that varies along the first horizontal direction hd1. In other words, the first electrically conductive lines 30 have a wiggled profile having alternating wider and narrower sections along the second horizontal direction hd2, as shown in FIG. 8D. The narrower sections have a first width w1 which is smaller than the second width w2 of the wider sections.

Each of the first electrically conductive lines 30 contacts a bottom surface of a respective one of the first dielectric spacers 156, and comprises a respective pair of contoured sidewalls that are vertically coincident with sidewalls of the respective one of the first dielectric spacers 156. As used herein, two surfaces are vertically coincident if one of the two surfaces overlies or underlies the other of the two surfaces and if there exists a vertical plane that contains the two surfaces. The vertical plane may have a straight horizontal cross-sectional profile or a contoured horizontal cross-sectional profile.

Figure 9A:
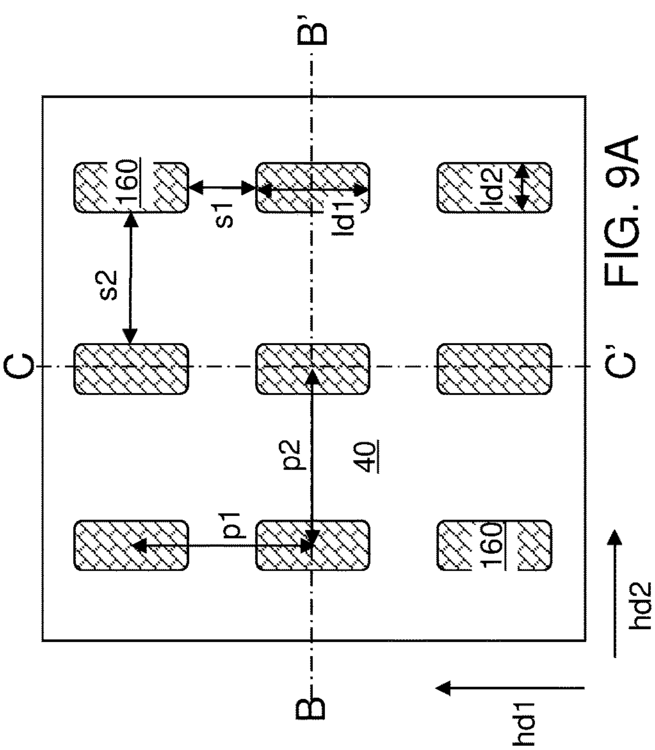
FIGS. 9A-9C are various views of the first exemplary structure after formation of a first selector-level dielectric matrix layer according to the first embodiment of the present disclosure.
Figure 9B:
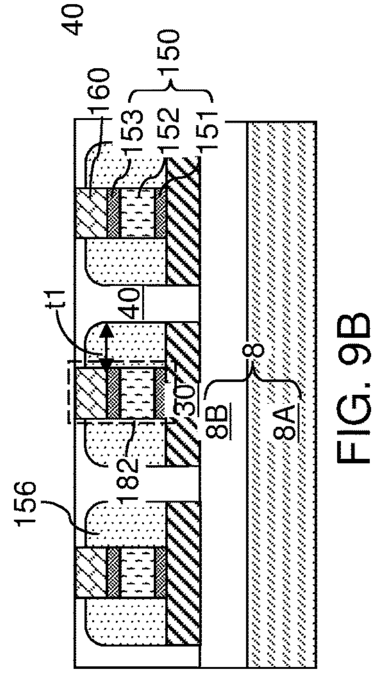
Figure 9C:
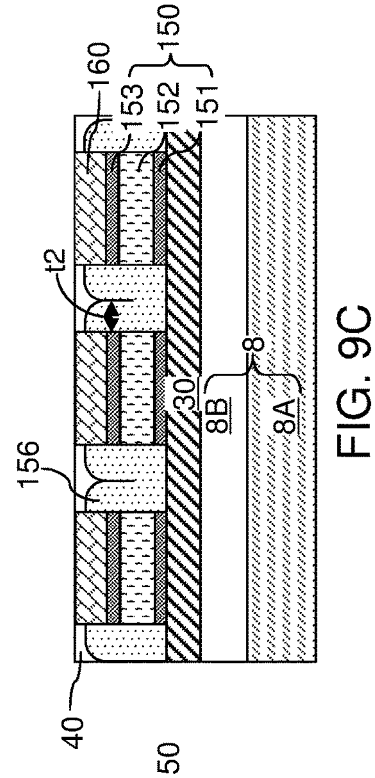

Referring to FIGS. 9A-9C, a dielectric fill material can be deposited in cavities between neighboring pairs of first dielectric spacers 156 to form a dielectric matrix layer, which is herein referred to as a first selector-level dielectric matrix layer 40. The first selector-level dielectric matrix layer 40 may comprise a silicon oxide layer and may comprise the same or different material from the material of the first dielectric spacers 156. Excess portions of the dielectric fill material of the first selector-level dielectric matrix layer 40 can be removed from above a horizontal plane including top surfaces of the first selector-containing pillar structures 182 by a planarization process, such as a chemical mechanical polishing (CMP) process. A top surface of a remaining portion of the first selector-level dielectric matrix layer 40 is located within a horizontal plane including top surfaces of the two-dimensional array of first selector-containing pillar structures 182. In this configuration, the first hardmask plates 160 are formed of an electrically conductive material and comprise first conductive material plates 160, which form the top surfaces of the first selector-containing pillar structures 182. The first conductive material plates 160 protect the underlying first upper selector electrodes 153 from CMP damage. Thus, in this configuration, the first upper selector electrodes 153 may comprise a carbon based material described above which may be damaged by CMP.

Figure 9D:
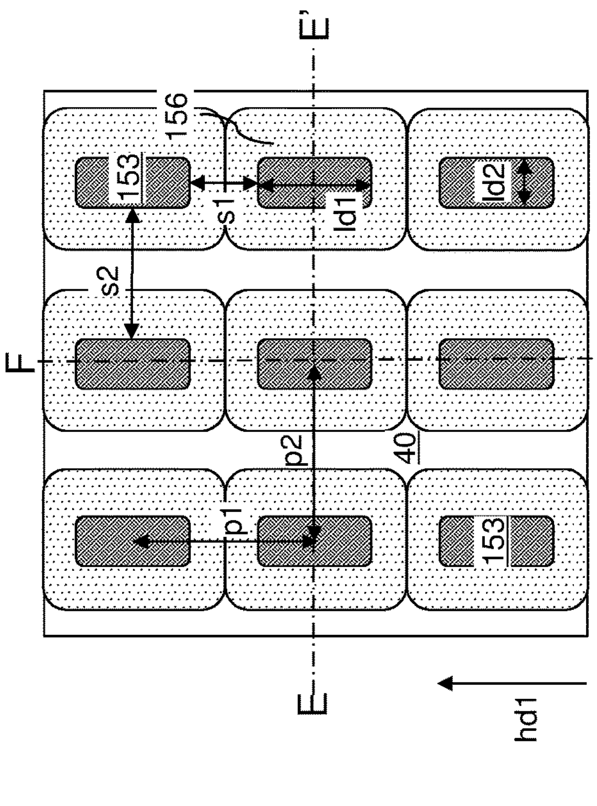
FIGS. 9D-9F are various views of an alternative configuration of the first exemplary structure after formation of a first selector-level dielectric matrix layer according to the first embodiment of the present disclosure.
Figure 9E:
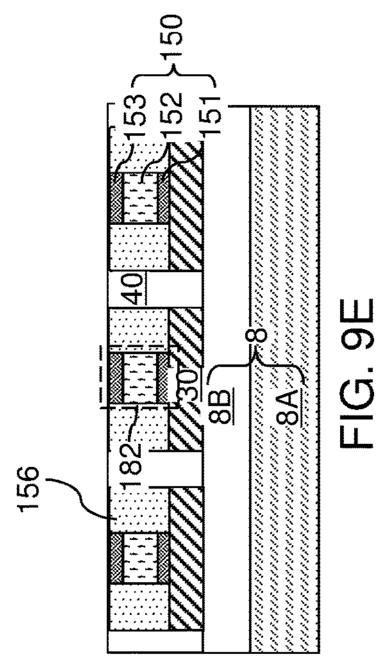
Figure 9F:
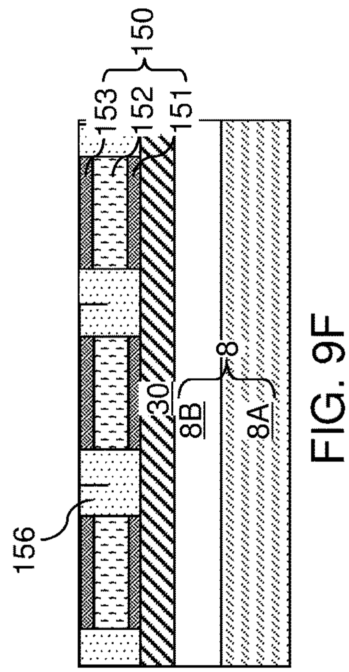

Referring to FIGS. 9D-9F in an alternative configuration of the first exemplary according to an alternative aspect of the first embodiment of the present disclosure, the first selector-level dielectric matrix layer 40 is also formed in cavities between neighboring pairs of first dielectric spacers 156, as described above. However, in this alternative configuration, the CMP process is continued to also remove the first hardmask plates 160 and to expose the upper surface of the first upper selector electrodes 153. In this alternative configuration, the first hardmask plates 160 may comprise an insulating material, such as silicon nitride or metal oxide, and at least an upper portion of the first upper selector electrodes 153 may comprise a metal or metal alloy rather than a carbon based material. Thus, the CMP does not damage the carbon material of the first upper selector electrodes 153.

Figure 10A:
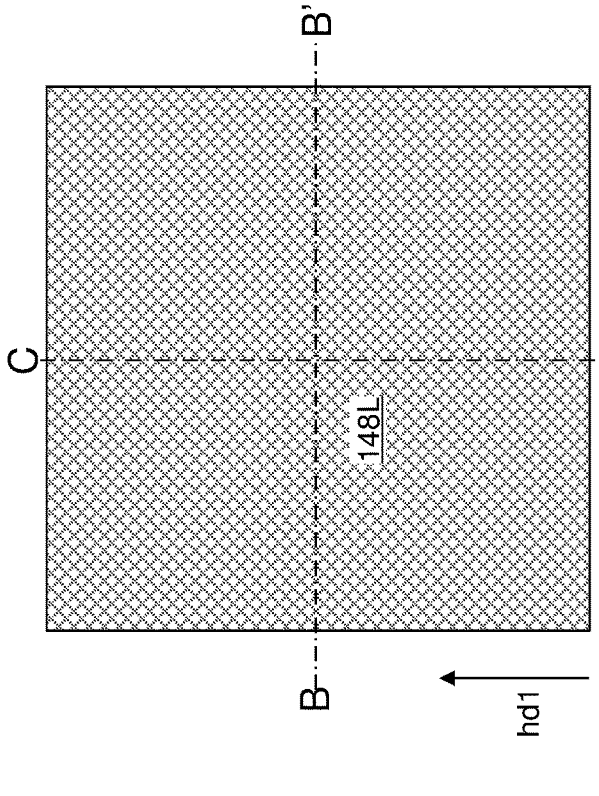
FIGS. 10A-10C are various views of the first exemplary structure after formation of a first continuous superlattice layer, a first continuous antiferromagnetic coupling layer, a first continuous reference layer, a first continuous nonmagnetic tunnel barrier layer, a first continuous free layer, a first continuous dielectric capping layer, and a first continuous metallic capping layer according to the first embodiment of the present disclosure.
Figure 10B:
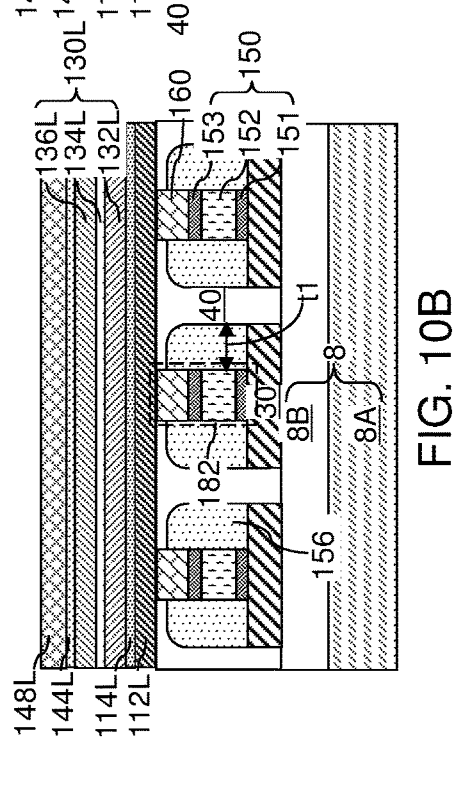
Figure 10C:
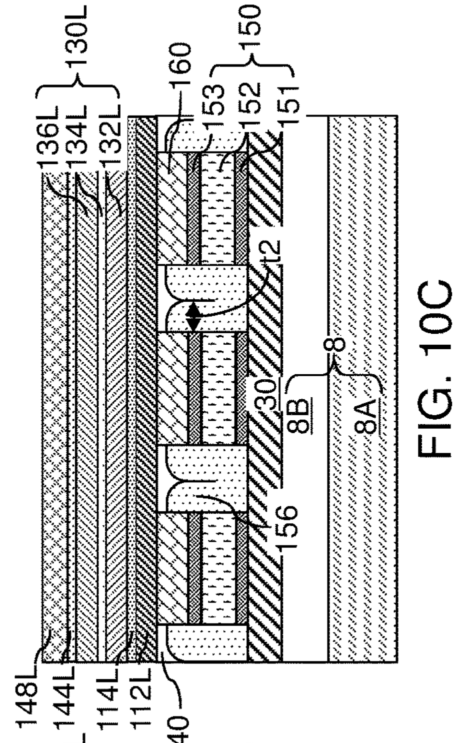

Referring to FIGS. 10A-10C, first magnetic tunnel junction-level (MTJ-level) material layers (112L, 114L, 130L, 144L, 148L) can be formed over the two-dimensional array of first selector-containing pillar structures 182 and the first selector-level dielectric matrix layer 40. The first MTJ-level material layers contact the top exposed surfaces of the first selector-containing pillar structures 182. The top exposed surfaces of the first selector-containing pillar structures 182 comprise an electrically conductive material, such as either the first conductive material plates 160 which are shown in FIGS. 9B and 9C, or the first upper selector electrodes 153 which are shown in FIGS. 9E and 9F. Thus, the first conductive material plates 160 may either be present or omitted at this stage of the process.

The first MTJ-level material layers may comprise, for example, a first continuous superlattice layer 112L, an optional first continuous antiferromagnetic coupling layer 114L, first continuous magnetic tunnel junction (MTJ) material layers 130L, a first continuous dielectric capping layer 144L, and a first continuous metallic capping layer 148L. The first MTJ material layers 130L may comprises a layer stack including a first continuous reference layer 132L, a first continuous nonmagnetic tunnel barrier layer 134L, and a first continuous free layer 136L. The first MTJ-level material layers may also optionally comprise the above described seed layer (i.e., the continuous non-magnetic metal layer (e.g., Pt, Ta, W, etc.) that is subsequently patterned to form the seed layer 110 shown in FIG. 2) located below the first continuous superlattice layer 112L.

The first continuous superlattice layer 112L can have the same material composition as the superlattice layer 112 described with reference to FIG. 2. The first continuous antiferromagnetic coupling layer 114L, if present, can have the same material composition as the antiferromagnetic coupling layer 114 described with reference to FIG. 2. In one embodiment, the first continuous antiferromagnetic coupling layer 114 may comprise ruthenium, iridium or IrMn alloy.

The first continuous reference layer 132L can have the same material composition as the reference layer 132 described with reference to FIG. 2. In one embodiment, the first continuous reference layer 132L can include a CoFe alloy or a CoFeB alloy. Optionally, the first continuous reference layer 132L may additionally include a thin non-magnetic layer comprised of tantalum or tungsten having a thickness of 0.2 nm-0.5 nm and a thin CoFeB layer (having a thickness in a range from 0.5 nm to 3 nm). The first continuous nonmagnetic tunnel barrier layer 134L includes any insulating tunnel barrier material such as magnesium oxide. The thickness of the first continuous nonmagnetic tunnel barrier layer 134L can be 0.7 nm to 1.3 nm, such as about 1 nm. The first continuous free layer 136L can have the same material composition as the free layer 136 described with reference to FIG. 2. In one embodiment, the first continuous free layer 136L can include a CoFe alloy or a CoFeB alloy. Optionally, the first continuous free layer 136L may additionally include a thin non-magnetic layer comprised of tantalum or tungsten having a thickness of 0.2 nm-0.5 nm and a thin CoFeB layer (having a thickness in a range from 0.5 nm to 3 nm).

The first continuous dielectric capping layer 144L can have the same material composition as the dielectric capping layer 144 described with reference to FIG. 2. The first continuous dielectric capping layer 144L may comprise a thin magnesium oxide layer that is thin enough to enable tunneling of electrical current, such as a thickness in a range from 0.4 nm to 1.0 nm. The first continuous metallic capping layer 148L can have the same material composition as the metallic capping layer 144 described with reference to FIG. 2. The first continuous metallic capping layer 148L may comprise a non-magnetic, electrically conductive material, such as W, Ti, Ta, WN, TiN, TaN, Ru, and Cu. The thickness of the first continuous metallic capping layer 148L can be in a range from 10 nm to 100 nm, although lesser and greater thicknesses can also be employed. An optional second hardmask layer may be located over the first continuous metallic capping layer 148L, and may comprise an insulating, semiconductor or conductive material. Alternatively, the first continuous metallic capping layer 148L may act as a hardmask during the subsequent patterning step.

Figures 11A, 11B, 11C:
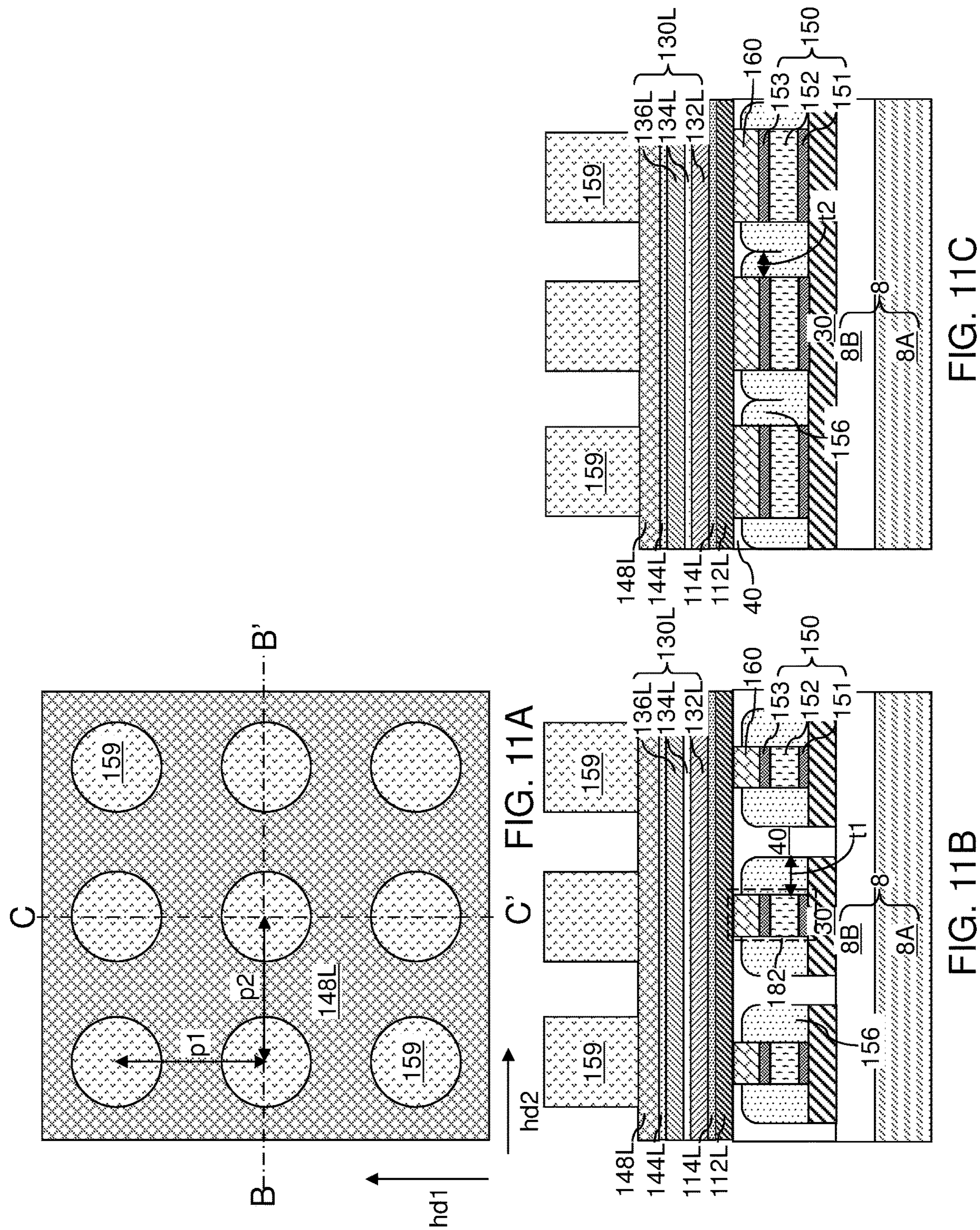
FIGS. 11A-11C are various views of the first exemplary structure after formation of a two-dimensional array of second discrete patterned photoresist material portions over the continuous metallic capping layer according to the first embodiment of the present disclosure.

Referring to FIGS. 11A-11C, a two-dimensional array of second discrete patterned photoresist material portions 159 can be formed over the first continuous metallic capping layer 148L. Each of the second discrete patterned photoresist material portions 159 has an areal overlap with a respective underlying one of the first selector-containing pillar structures 182. The two-dimensional array of second discrete patterned photoresist material portions 159 can be formed as a periodic array having the first pitch p1 along the first horizontal direction hd1 and having the second pitch p2 along the second horizontal direction hd2. The horizontal cross-sectional shapes of the second discrete patterned photoresist material portions 159 can be different from the horizontal cross-sectional shapes of the first selector-containing pillar structures 182. In one embodiment, the lateral dimension of each of the second discrete patterned photoresist material portions 159 along the first horizontal direction hd1 may be the same as the lateral dimension of each of the second discrete patterned photoresist material portions 159 along the second horizontal direction hd2. In one embodiment, each of the second discrete patterned photoresist material portions 159 may have a respective horizontal cross-sectional shape of a circle.

Figure 12A:
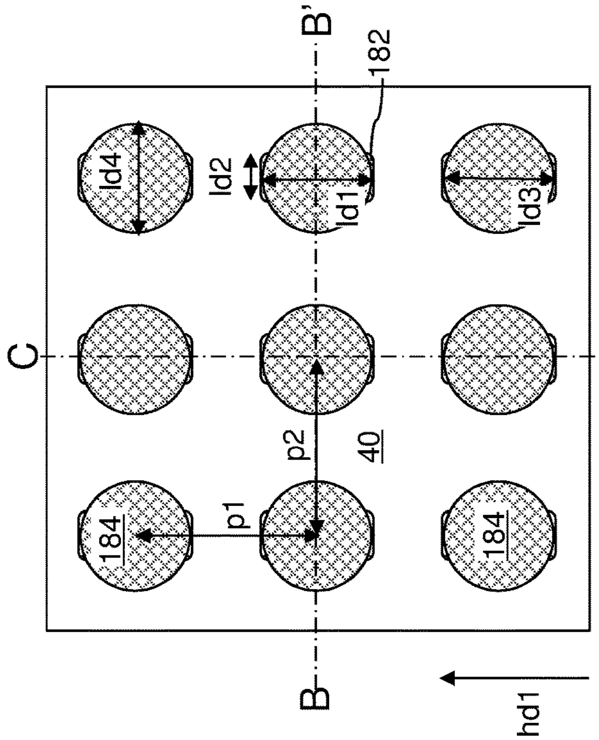
FIGS. 12A-12C are various views of the first exemplary structure after formation of a two-dimensional array of first magnetic tunnel junction pillar structures according to the first embodiment of the present disclosure.
Figure 12B:
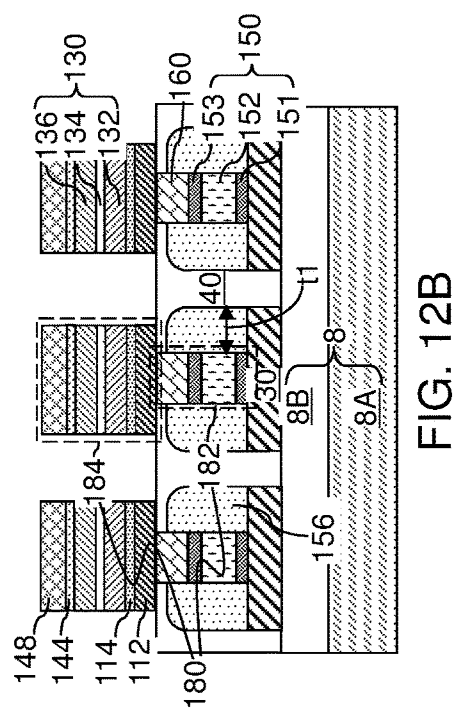
Figure 12C:
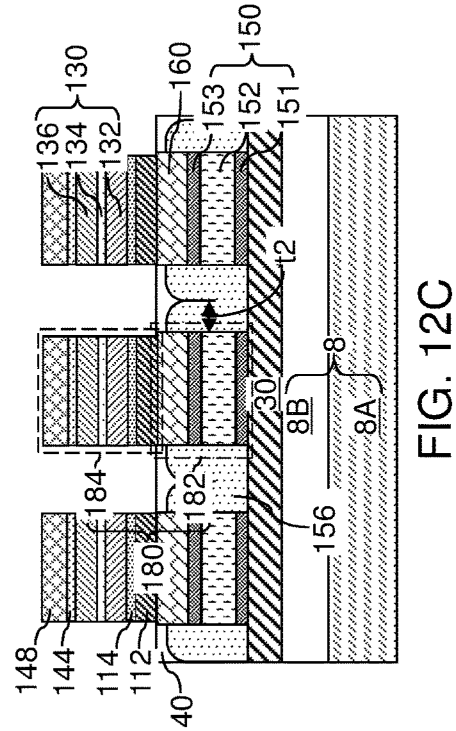

Referring to FIGS. 12A-12C, an anisotropic patterning process can be performed to pattern unmasked portions of the layer stack (112L, 114L, 130L, 144L, 148L) of the first continuous superlattice layer 112L, the optional first continuous antiferromagnetic coupling layer 114L, the first continuous magnetic tunnel junction (MTJ) material layers 130L, the first continuous dielectric capping layer 144L, and the first continuous metallic capping layer 148L employing the two-dimensional array of second discrete patterned photoresist material portions 159 as a mask.

In one embodiment, the anisotropic patterning process may comprise at least one of a reactive ion etch process or an ion beam etch (IBE) process (e.g., an ion milling process). In one embodiment, the second hardmask layer (if present) and/or the first continuous metallic capping layer 148L and/or the first continuous dielectric capping layer 144L may be patterned into a two-dimensional periodic array of second hardmask plates and/or first metallic capping layers 148 and/or first dielectric capping layers 144 by performing a reactive ion etch process. The two-dimensional array of second discrete patterned photoresist material portions 159 can be subsequently removed, for example, by ashing. The first continuous MTJ material layers 130L, the optional first continuous antiferromagnetic coupling layer 114L, and the first continuous superlattice layer 112L can be patterned by performing an ion beam etch process that employs the two-dimensional periodic array of the second hardmask plates and/or the first metallic capping layers 148 and/or the first dielectric capping layers 144 as a mask.

Each patterned portion of the layer stack (112L, 114L, 130L, 144L, 148L) comprises a first magnetic tunnel junction (MTJ) pillar structure 184. A two-dimensional array of first magnetic tunnel junction (MTJ) pillar structures 184 can be formed over the two-dimensional array of first selector-containing pillar structures 182. Each contiguous combination of a first selector-containing pillar structure 182 and a first MTJ pillar structure 184 constitutes a first memory cell 180, which can function as a memory cell 180 described with reference to FIG. 2.

Each first MTJ pillar structure 184 comprises a stack of an optional seed layer 110 (shown in FIG. 10), a first superlattice layer 112, a first antiferromagnetic coupling layer 114, a first magnetic tunnel junction 130, a first dielectric capping layer 144, and a first metallic capping layer 148. The first magnetic tunnel junction 130 includes a first reference layer 132, a first tunnel barrier layer 134, and a first free layer 136. Each first superlattice layer 112 is a patterned portion of the first continuous superlattice layer 112L. Each first antiferromagnetic coupling layer 114 is a patterned portion of the first continuous antiferromagnetic coupling layer 114L. Each first magnetic tunnel junction 130 is a patterned portion of the first magnetic tunnel junction material layers 130L. Each first dielectric capping layer 144 is a patterned portion of the first continuous dielectric capping layer 144L. Each first metallic capping layer 148 is a patterned portion of the first continuous metallic capping layer 148L. Each first reference layer 132 is a patterned portion of the first continuous reference layer 132L. Each first tunnel barrier layer 134 is a patterned portion of the first continuous tunnel barrier layer 134L. Each first free layer 136 is a patterned portion of the first continuous free layer 136L. Sidewalls of each component within an MTJ pillar structure 184 can be vertically coincident.

The two-dimensional array of first MTJ pillar structures 184 can be formed above the top surfaces of the remaining portions of the first selector-level dielectric matrix layer 40 and over the two-dimensional array of the first selector-containing pillar structures 182.

In one embodiment, each of the two-dimensional array of first selector-containing pillar structures 182 and the two-dimensional array of first MTJ pillar structures 184 has the first pitch p1 along the first horizontal direction hd1, and has the second pitch p2 along the second horizontal direction hd2. In one embodiment, each MTJ pillar structure 184 may have a horizontal cross-sectional shape of a circle, a square, or a rounded square, i.e., a shape that is derived from a square by rounding the four corners.

In one embodiment shown in FIG. 12A, the maximum lateral dimension ld1 of each of the first selector-containing pillar structures 182 along the first horizontal direction hd1 can be greater than the maximum lateral dimension ld3 of each of the first MTJ pillar structures 184 along the first horizontal direction hd1. The maximum lateral dimension ld2 of each of the first selector-containing pillar structures 182 along the second horizontal direction hd2 is less than the maximum lateral dimension ld4 of each of the first MTJ pillar structures 184 along the second horizontal direction hd2. In this embodiment, each MTJ pillar structure 184 may have a horizontal cross-sectional shape of a circle, while each of each of the first selector-containing pillar structures 182 may have a shape of rectangle or a rounded rectangle. Thus, each MTJ pillar structure 184 may have a horizontal cross-sectional shape that is different from that of the underlying first selector-containing pillar structure 182. Thus, at least one sidewall of the MTJ pillar structure 184 may not be vertically coincident with (i.e., may be laterally offset from) the underlying respective sidewall of the first selector-containing pillar structures 182.

In an alternative embodiment, each MTJ pillar structure 184 within the two-dimensional array of MTJ pillar structures 184 has a respective horizontal cross-sectional shape having a same lateral extent along the first horizontal direction hd1 and along the second horizontal direction hd2. Thus, each MTJ pillar structure 184 may have a horizontal cross-sectional shape that is the same as that of the underlying first selector-containing pillar structure 182.

Figures 13A, 13B, 13C:
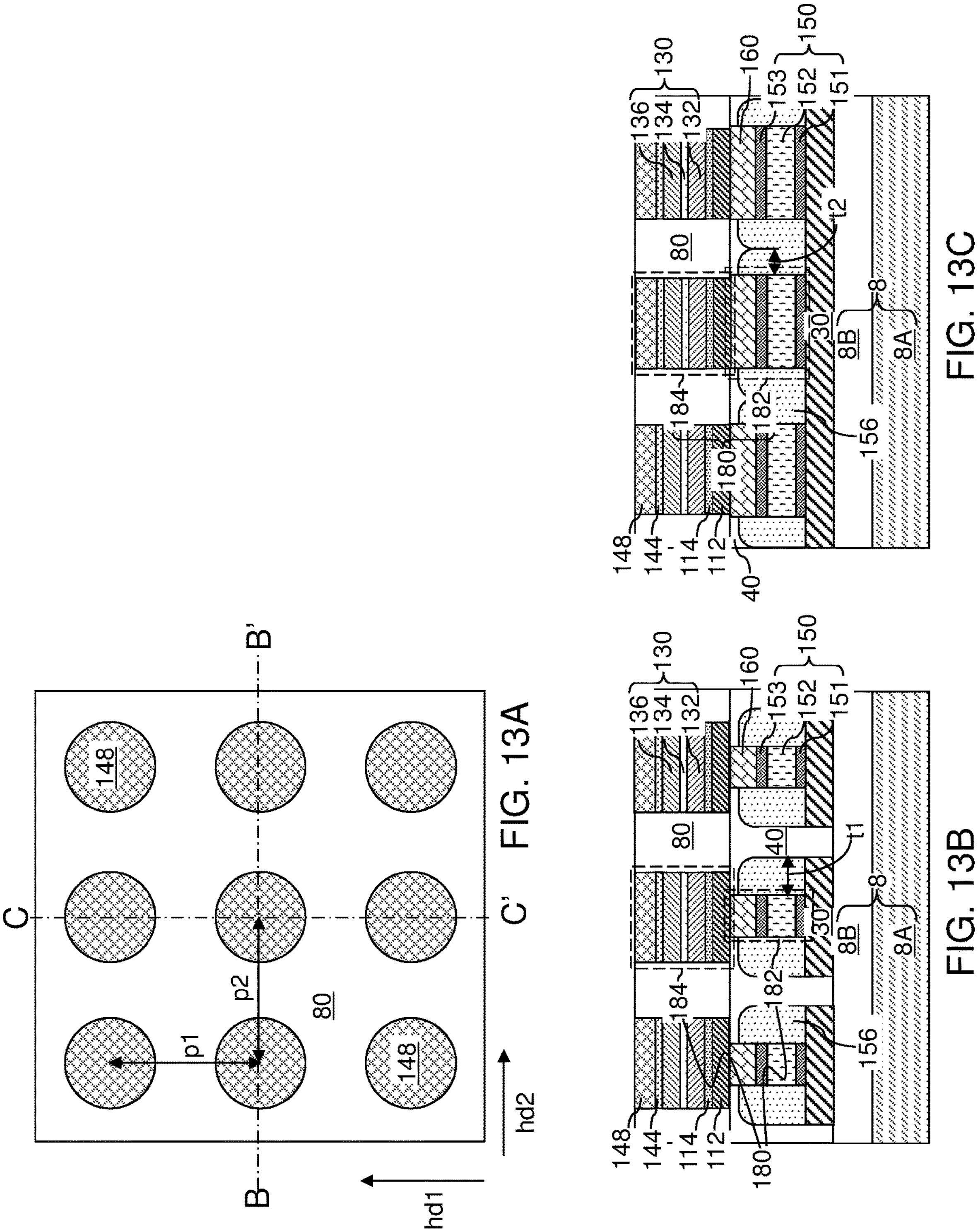
FIGS. 13A-13C are various views of the first exemplary structure after formation of a first magnetic-tunnel-junction-level (MTJ-level) dielectric matrix layer according to the first embodiment of the present disclosure.

Referring to FIGS. 13A-13C, a dielectric fill material can be deposited in the gaps between neighboring pairs of the first MTJ pillar structures 184, and can be subsequently planarized to remove portions of the dielectric fill material from above the horizontal plane including the top surfaces of the first MTJ pillar structures 184. The remaining portions of the dielectric fill material comprises a dielectric matrix layer, which is herein referred to as a first magnetic-tunnel-junction-level (MTJ-level) dielectric matrix layer 80.

A second electrically conductive layer 90L may be deposited over the two-dimensional array of first MTJ pillar structures 184 and be patterned into second electrically conductive lines 90 (e.g., bit lines) which extend perpendicular to the first electrically conductive lines 30 to form a one level MRAM device.

Figure 14A:
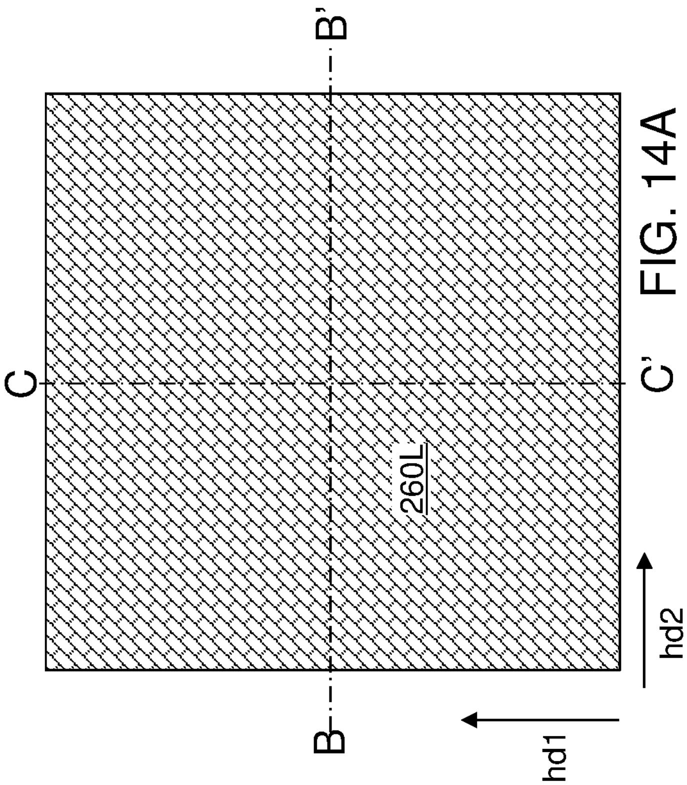
FIGS. 14A-14C are various views of the second exemplary structure after formation of a layer stack comprising a second electrically conductive layer, second selector-level material layers, and a second conductive material layer according to the second embodiment of the present disclosure.
Figure 14C:
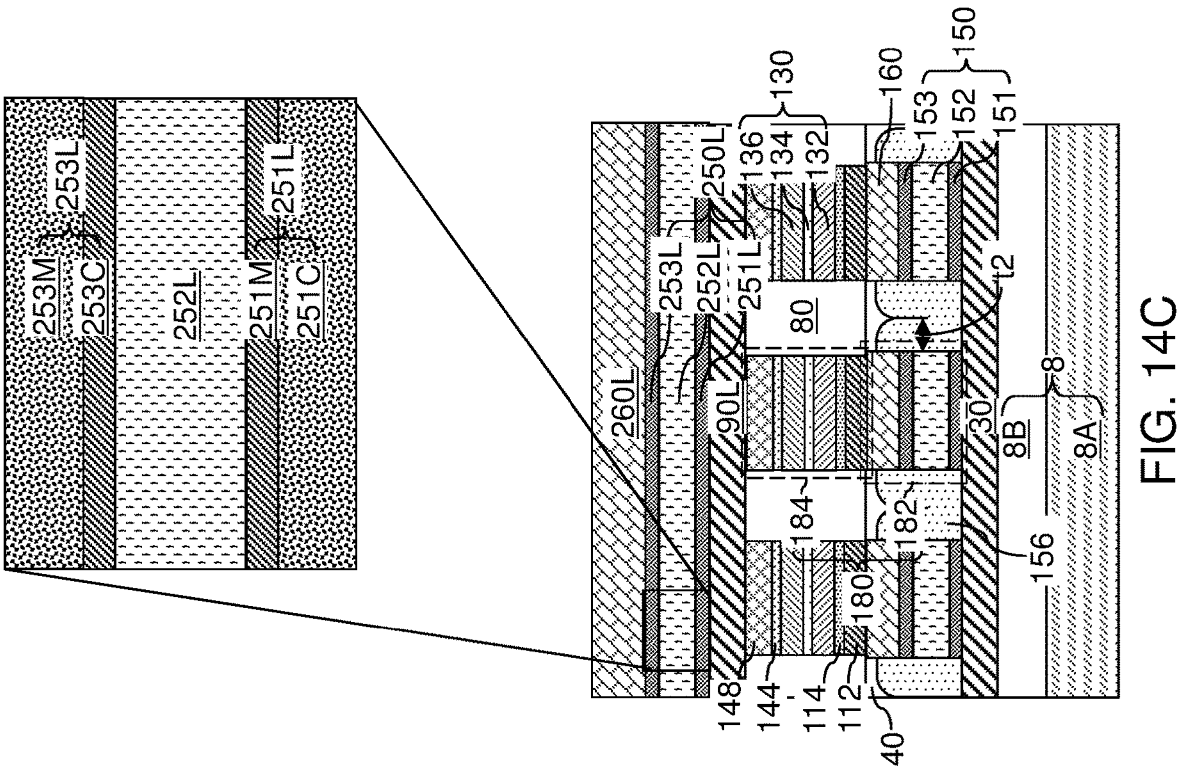
Figure 14B:
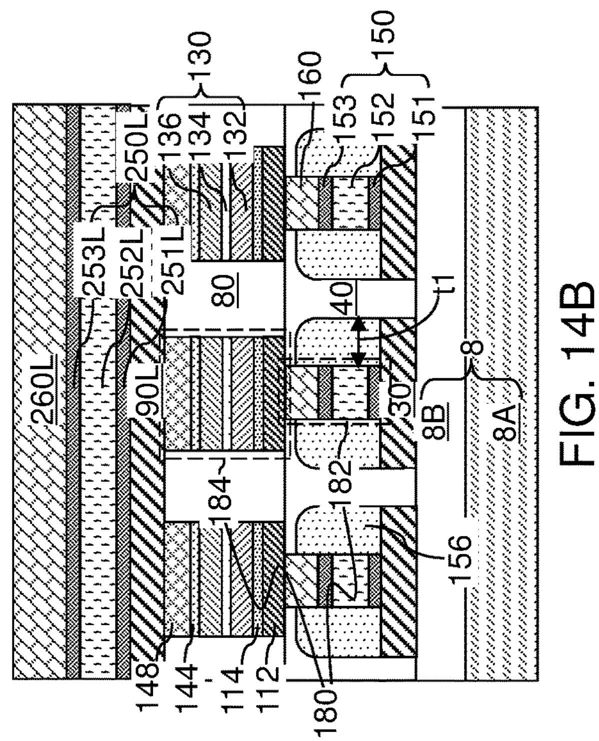

Alternatively, to form a multi-level (e.g., three-dimensional) MRAM device, a layer stack (90L, 250L, 260L) can be deposited over the two-dimensional array of first MTJ pillar structures 184, as shown in FIGS. 14A-14C. The layer stack (90L, 250L, 260L) can include, from bottom to top, a second electrically conductive layer 90L, second selector material layers 250L, and a second hardmask layer 260L.

The second electrically conductive layer 90L includes a second nonmagnetic electrically conductive material such as Al, Cu, W, Ru, Mo, Nb, Ti, Ta, TiN, TaN, WN, MoN, or a combination thereof. The thickness of the second electrically conductive layer 90L can be in a range from 20 nm to 200 nm, although lesser and greater thicknesses can also be employed.

The second selector material layers 250L can comprise, from bottom to top, a second lower selector electrode material layer 251L, a second non-Ohmic material layer 252L, and a second upper selector electrode material layer 253L. The second lower selector electrode material layer 251L includes at least one material that may be employed for lower selector electrodes to be subsequently formed. The second non-Ohmic material layer 252L includes a selector material that exhibits a non-Ohmic switching behavior. The second upper selector electrode material layer 253L includes at least one material that may be employed upper selector electrodes to be subsequently formed.

In one embodiment, the second lower selector electrode material layer 251L may comprise the same one or more materials used for the first lower selector electrode material layer 151L. The second lower selector electrode material layer 251L may comprise a layer stack including a second lower carbon-based electrode material layer 251C and a second metallic material layer 251M formed on the second lower carbon-based electrode material layer 251C. In one embodiment, the second upper selector electrode material layer 253L may comprise a layer stack including a second metallic material layer 253M and a second carbon-based electrode material layer 253C formed on the second metallic material layer 253M.

In one embodiment, the second non-Ohmic material layer 252L within the selector material layers 250L can include any suitable non-Ohmic selector material which exhibits non-linear electrical behavior. In one embodiment, the second non-Ohmic material layer 252L may have any material composition that may be employed for the first non-Ohmic material layer 152L, and have the same thickness range as the first non-Ohmic material layer 152L. The second hardmask layer 260L may include any material that may be employed for the first hardmask layer 160L.

Figure 15A:
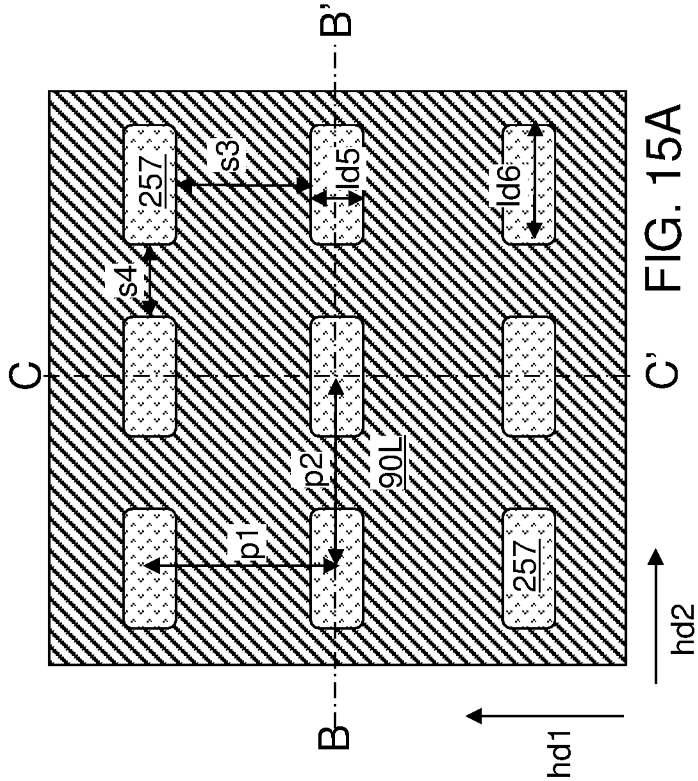
FIGS. 15A-15C are various views of the first exemplary structure after formation of a two-dimensional array of second selector-containing pillar structures according to the first embodiment of the present disclosure.
Figure 15C:
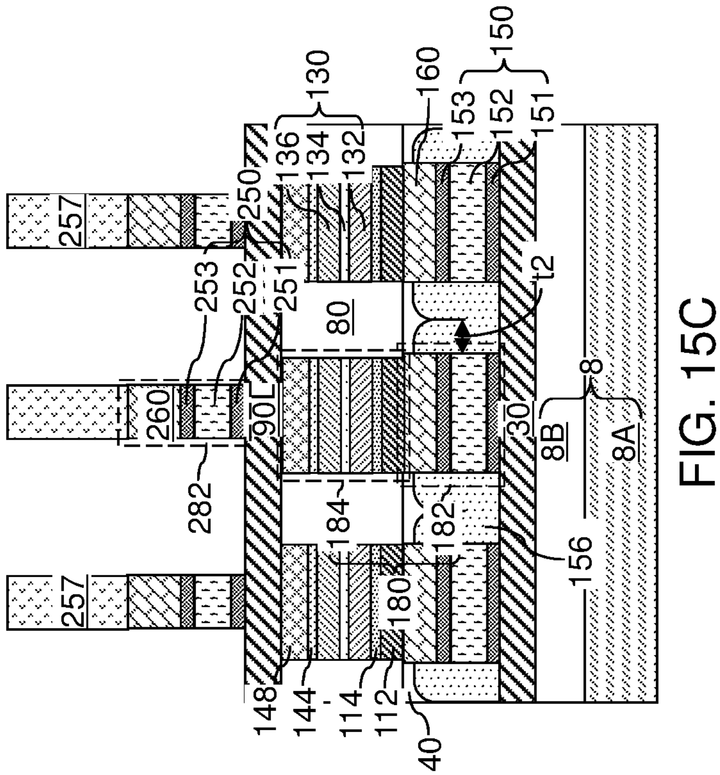
Figure 15B:
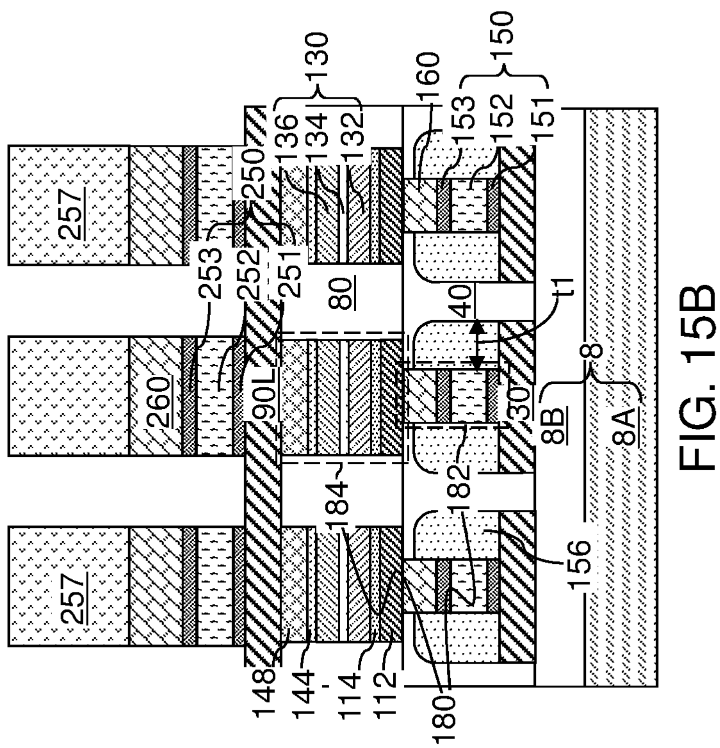

Referring to FIGS. 15A-15C, a photoresist layer can be applied over the second hardmask layer 260L, and can be lithographically patterned into a two-dimensional array of third discrete patterned photoresist material portions 257. The two-dimensional array of third discrete patterned photoresist material portions 257 may be a periodic two-dimensional array of third discrete patterned photoresist material portions 257 having a first periodicity along the first horizontal direction hd1 and having a second periodicity along the second horizontal direction hd2 that is perpendicular to the first horizontal direction hd1. In one embodiment, the first periodicity may be the first pitch p1, and the second periodicity may be the second pitch p2. As discussed above, the second pitch p2 may be the same as, or may be different from, the first pitch p1. The first pitch p1 may be in a range from 5 nm to 300 nm, such as from 20 nm to 200 nm, although lesser and greater dimensions may also be employed. The second pitch p2 may be in a range from 5 nm to 300 nm, such as from 20 nm to 200 nm, although lesser and greater dimensions may also be employed.

According to an aspect of the present disclosure, a nearest-neighbor spacing s3 between neighboring pairs of the third discrete patterned photoresist material portions 257 that are laterally spaced apart along the first horizontal direction hd1 is greater than a nearest-neighboring spacing s4 between neighboring pairs of the third discrete patterned photoresist material portions 257 that are laterally spaced apart along the second horizontal direction hd2. In an illustrative case, each of the third discrete patterned photoresist material portions 257 may have a third lateral dimension ld5 along the first horizontal direction hd1, and may have a fourth lateral dimension ld6 along the second horizontal direction hd2. Each of the third discrete patterned photoresist material portions 257 may have a respective horizontal cross-sectional shape of a rectangle, a rounded rectangle, an oval, or a circle. The nearest-neighbor spacing s3 between neighboring pairs of the third discrete patterned photoresist material portions 257 that are laterally spaced apart along the first horizontal direction hd1 can be the difference between the first pitch p1 and the third lateral dimension ld5. The nearest-neighboring spacing s4 between neighboring pairs of the third discrete patterned photoresist material portions 257 that are laterally spaced apart along the second horizontal direction hd2 can be the second pitch p2 less the fourth lateral dimension ld6. In this case, p1−ld5 is greater than p2−ld6. In one embodiment, the second pitch p2 may be the same as the first pitch p1, and the third lateral dimension ld5 may be less than the fourth lateral dimension ld6. The third discrete patterned photoresist material portions 257 may be elongated along the second horizontal direction hd2, while the first photoresist material portions are elongated along the first horizontal direction hd1.

One or more pattern transfer process may be performed to pattern the second hardmask layer 260L and the second selector material layers 250L. Specifically, an array-pattern-transfer process can be performed to transfer the pattern of the two-dimensional array of third discrete patterned photoresist material portions 257 through the second hardmask layer 260L and the second selector material layers 250L. For example, an anisotropic etch process can be performed to transfer the pattern in the two-dimensional array of third discrete patterned photoresist material portions 257 through the second hardmask layer 260L and the second selector material layers 250L. The patterned remaining portions of the second hardmask layer 260L and the second selector material layers 250L can include two-dimensional array of second selector-containing pillar structures 282.

Each of the second selector-containing pillar structures 282 may comprise a second selector element 250 and a second hardmask plate 260. Each second selector element 250 is a patterned portion of the second selector material layers 250L, and each second hardmask plate 260 is a patterned portion of the second hardmask layer 260L. Each second selector element 250 may include a vertical stack of a second lower selector electrode 251, a second non-Ohmic material plate 252, and a second upper selector electrode 253. Each second lower selector electrode 251 is a patterned portion of the second lower selector electrode material layer 251L. Each second non-Ohmic material plate 252 is a patterned portion of the second non-Ohmic material layer 252L. Each second upper selector electrode 253 is a patterned portion of the second upper selector electrode material layer 253L.

In one embodiment, the two-dimensional array of second selector-containing pillar structures 282 comprises a two-dimensional periodic array of second selector-containing pillar structures 282 having the first pitch p1 along the first horizontal direction hd1 and having the second pitch p2 along the second horizontal direction hd2. The nearest-neighbor spacing s3 between neighboring pairs of the second selector-containing pillar structures 282 that are laterally spaced apart along the first horizontal direction hd1 is greater than the nearest-neighboring spacing s4 between neighboring pairs of the second selector-containing pillar structures 282 that are laterally spaced apart along the second horizontal direction hd2.

In one embodiment, each second selector-containing pillar structure 282 within the two-dimensional array of second selector-containing pillar structures 282 has a respective elongated horizontal cross-sectional shape having a third lateral dimension ld5 along the first horizontal direction hd1 and having a fourth lateral dimensional ld6 along the second horizontal direction hd2 that is greater than the third lateral dimension ld5. In one embodiment, the ratio of the fourth lateral dimension ld6 to the third lateral dimension ld5 may be in a range from 2.2 to 4, such as from 2.5 to 3. The two-dimensional array of second selector-containing pillar structures 282 can be formed over the second electrically conductive layer 90L. The two-dimensional array of third discrete patterned photoresist material portions 257 can be subsequently removed, for example, by ashing.

Figure 16A:
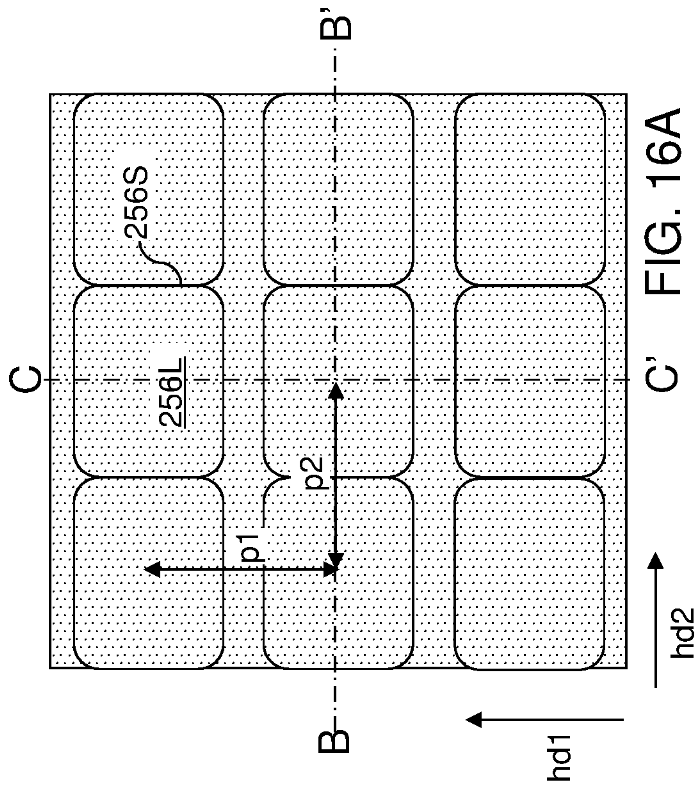
FIGS. 16A-16C are various views of the first exemplary structure after formation of a second dielectric spacer material layer according to the first embodiment of the present disclosure.
Figure 16C:
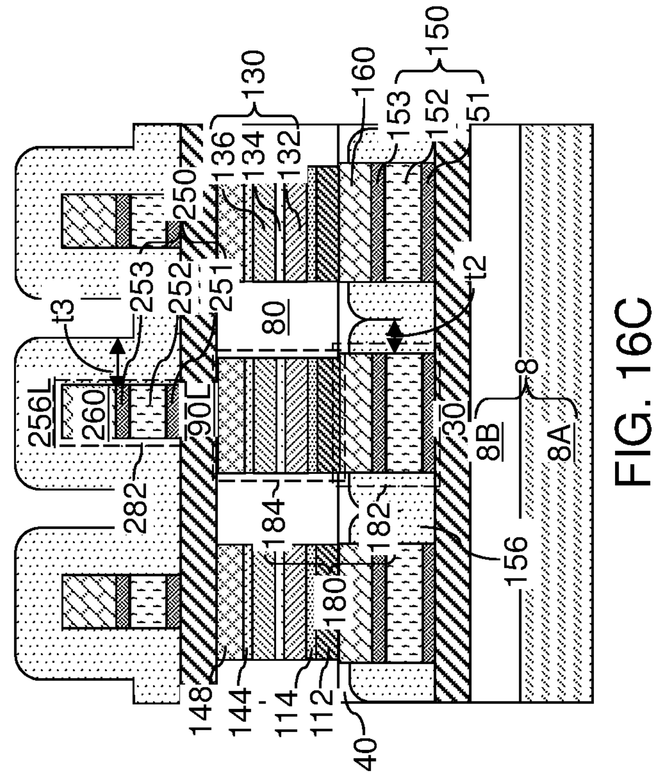
Figure 16B:
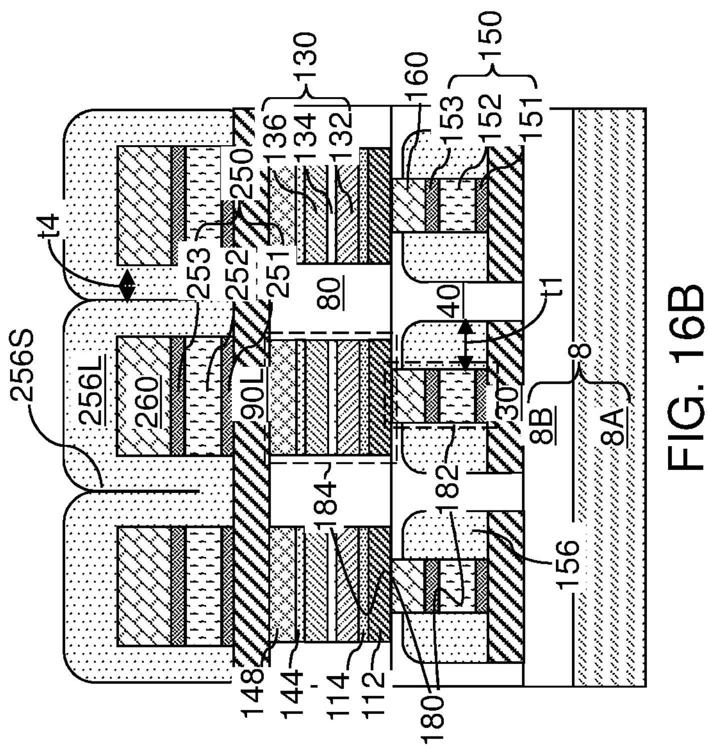

Referring to FIGS. 16A-16C, a second dielectric spacer material layer 256L can be formed over the two-dimensional array of second selector-containing pillar structures 282 and the second electrically conductive layer 90L. In one embodiment, the second dielectric spacer material layer 256L can be conformally deposited around the two-dimensional array of selector-containing pillar structures 282 such that the thickness of the second dielectric spacer material layer 256L is greater than one half of the nearest-neighbor spacing between s4 neighboring pairs of the second selector-containing pillar structures 282 that are laterally spaced apart along the second horizontal direction hd2, and is less than one half of the nearest-neighboring spacing s3 between neighboring pairs of the second selector-containing pillar structures 282 that are laterally spaced apart along the first horizontal direction hd1. Vertically-extending portions of the second dielectric spacer material layer 256L merge between neighboring pairs of the second selector-containing pillar structures 282 that are laterally spaced apart along the second horizontal direction hd2 to form vertically extending seams 256S. A two-dimensional periodic array of vertically-extending seams 256S can be formed, which can have the first pitch p1 along the first horizontal direction hd1 and can have the second pitch p2 along the second horizontal direction hd2. The vertically-extending seams 256S can be parallel to the first horizontal direction hd1, and can be located midway between a respective neighboring pair of second selector-containing pillar structures 282 of the two-dimensional array of second selector-containing pillar structures 282 that are laterally spaced apart along the second horizontal direction hd2.

Each vertically-extending portion of the second dielectric spacer material layer 256L located on a sidewall of a second selector-containing pillar structure 282 that extends along the second horizontal direction hd2 can have a third thickness t3, and can be physically exposed. Each vertically-extending portion of the second dielectric spacer material layer 256L located on a sidewall of a second selector-containing pillar structure 282 that extends along the first horizontal direction hd1 can have a fourth thickness t4, which is one half of the lateral spacing between neighboring pairs of second selector-containing pillar structures 282 that are laterally spaced apart along the second horizontal direction hd2. The fourth thickness t4 is less than the third thickness t3.

Figure 17A:
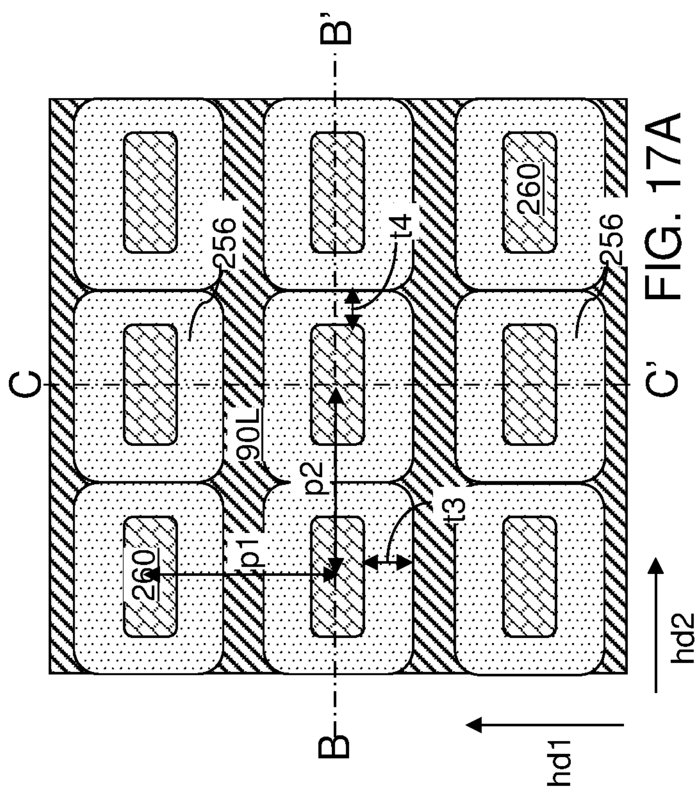
FIGS. 17A-17C are various views of the first exemplary structure after formation of second dielectric spacers according to the first embodiment of the present disclosure.
Figure 17C:
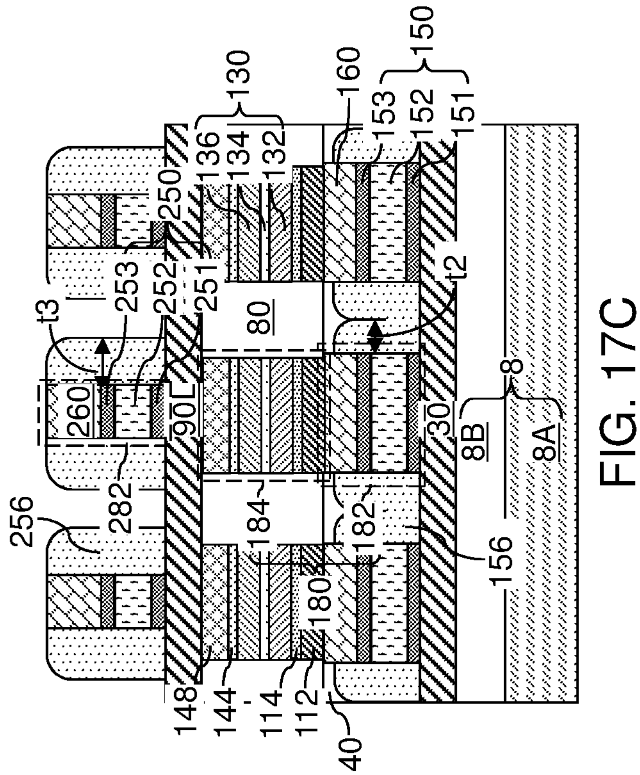
Figure 17B:
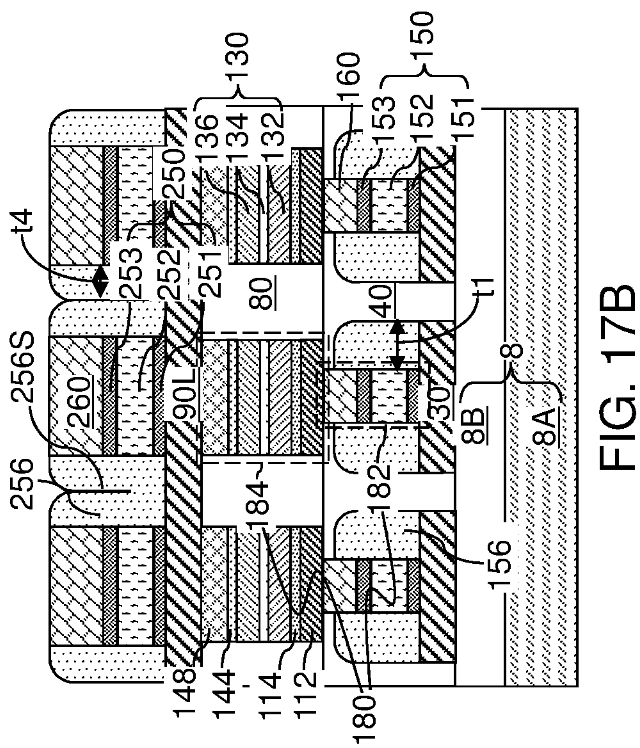

Referring to FIGS. 17A-17C, a third anisotropic etch process (e.g., a sidewall spacer etch process) can be performed to etch horizontally-extending portions of the second dielectric spacer material layer 256L. The third anisotropic etch process may be selective to the materials of the second hardmask plates 260. Each remaining continuous portion of the second dielectric spacer material layer 256L constitutes a second dielectric spacer 256. The second dielectric spacers 256 can be formed around the two-dimensional array of second selector-containing pillar structures 282 such that each of the second dielectric spacers 256 laterally surrounds a respective column of second selector-containing pillar structures 282 that are arranged along the second horizontal direction hd2. The second dielectric spacers 256 are laterally spaced from each other along the first horizontal direction hd1.

Generally, a second dielectric spacer formation process can be performed, in which the second dielectric spacers 256 are formed around the two-dimensional array of second selector-containing pillar structures 282. Each of the second dielectric spacers 256 comprises a respective plurality of vertically-extending seams 256S that are parallel to the first horizontal direction hd1 and located midway between a respective neighboring pair of second selector-containing pillar structures 282 of the two-dimensional array of second selector-containing pillar structures 282 that are laterally spaced apart along the second horizontal direction hd2.

In one embodiment, each of the second dielectric spacers 256 comprises a pair of contoured lengthwise sidewalls that generally extend along the second horizontal direction hd2 with a lateral undulation along the first horizontal direction hd1. Each lengthwise segment of each of the second dielectric spacers 256 that laterally extend along the second horizontal direction hd2 and located between a respective second selector-containing pillar structure 282 and a respective outer contoured lengthwise sidewall has a third thickness t3 along the first horizontal direction hd1. Each widthwise segment of each of the second dielectric spacers 256 located between a respective second selector-containing pillar structure 282 and a respective vertically-extending seam 256S has a fourth thickness t4 along the second horizontal direction hd2 that is less than the third thickness t3.

Referring to FIGS. 18A-18D, a fourth anisotropic etch process can be performed to transfer the pattern of the combination of the two-dimensional array of second selector-containing pillar structures 282 and the second dielectric spacers 256 through the second electrically conductive layer 90L. In other words, the combination of the two-dimensional array of second selector-containing pillar structures 282 and the second dielectric spacers 256 can be employed as an etch mask for anisotropically etching the second electrically conductive layer 90L. The second electrically conductive layer 90L can be patterned into a plurality of second electrically conductive lines (e.g., bit lines) 90, which may be a periodic one-dimensional array of second electrically conductive lines 90 having a periodicity of the first pitch p1 along the first horizontal direction hd1.

Figure 18D:
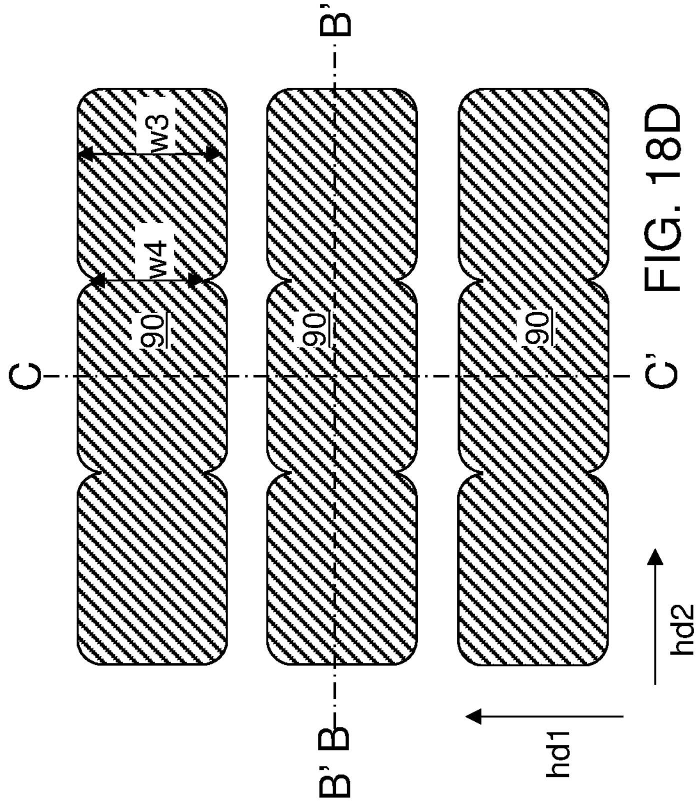
FIG. 18D is a horizontal cross-sectional view of the first exemplary structure along the horizontal plane D-D' of FIGS. 18B and 18C.
Figure 18A:
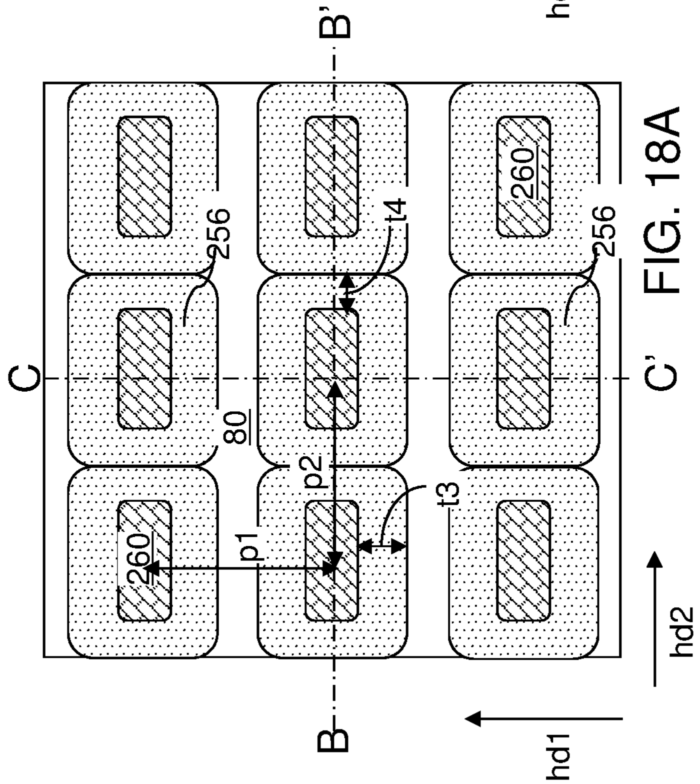
FIGS. 18A-18C are various views of the first exemplary structure after patterning the second electrically conductive layer into first electrically conductive lines according to the first embodiment of the present disclosure.
Figure 18C:
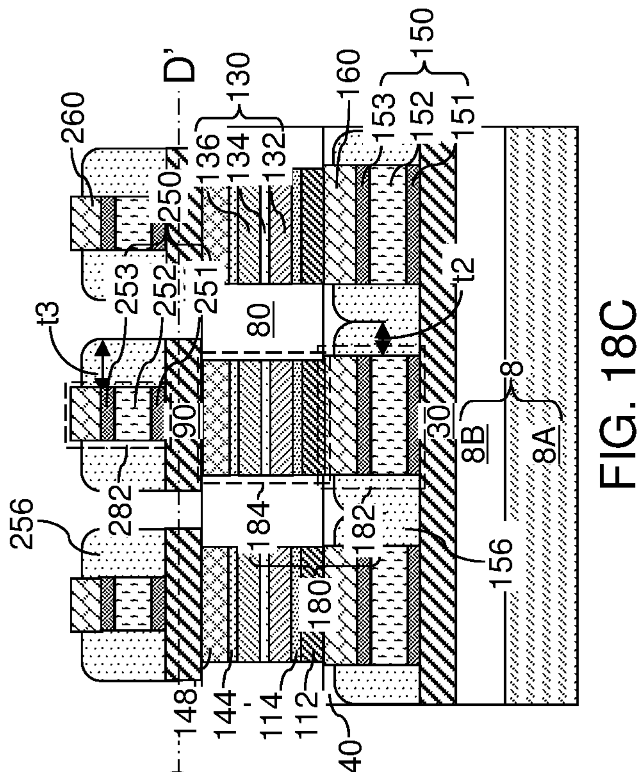
Figure 18B:
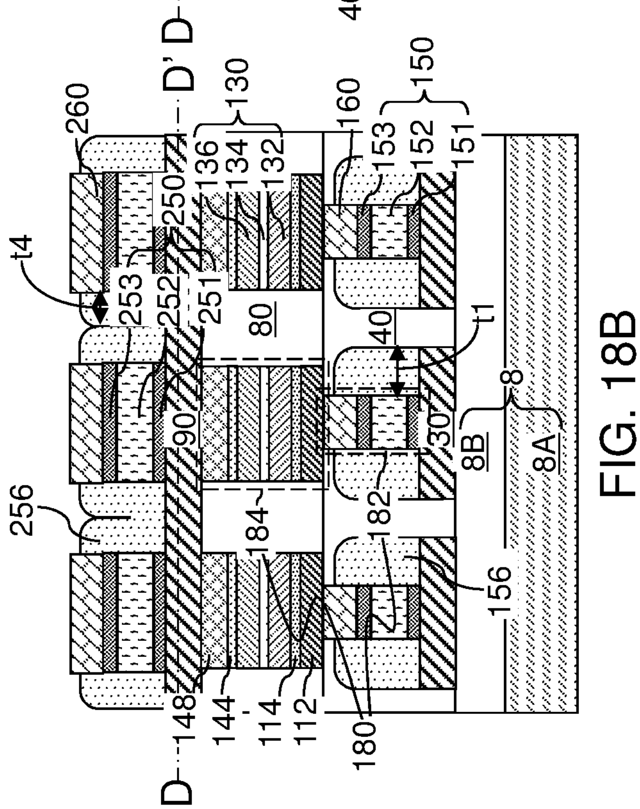

The pattern of the combination of the two-dimensional array of second selector-containing pillar structures 282 and the second dielectric spacers 256 includes the pattern of the lengthwise sidewalls of the second dielectric spacers 256. Thus, the second electrically conductive layer 90L can be patterned into the second electrically conductive lines 90 by transferring a pattern of lengthwise sidewalls of the second dielectric spacers 256 through the second electrically conductive layer 90L. The second electrically conductive lines 90 laterally extend along the second horizontal direction hd2, and have a respective variable width along the first horizontal direction hd1 that varies along the second horizontal direction hd2. In other words, the second electrically conductive lines 90 have a wiggled profile having alternating wider and narrower sections along the first horizontal direction hd2, as shown in FIG. 18D. The narrower sections have a third width w3 which is smaller than the fourth width w4 of the wider sections. Each of the second electrically conductive lines 90 contacts a bottom surface of a respective one of the second dielectric spacers 256, and comprises a respective pair of contoured sidewalls that are vertically coincident with sidewalls of the respective one of the second dielectric spacers 256.

Figure 19A:
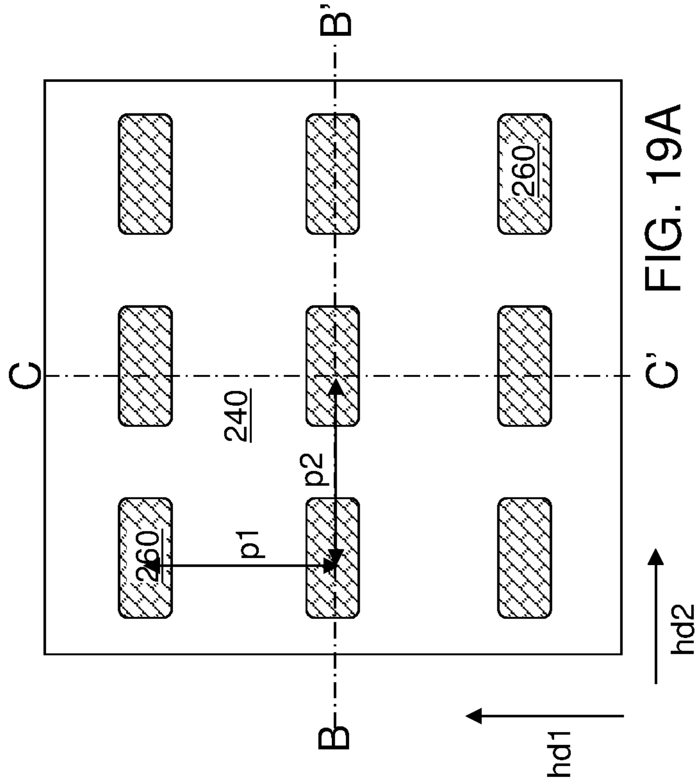
FIGS. 19A-19C are various views of the first exemplary structure after formation of a second selector-level dielectric matrix layer according to the first embodiment of the present disclosure.
Figure 19C:
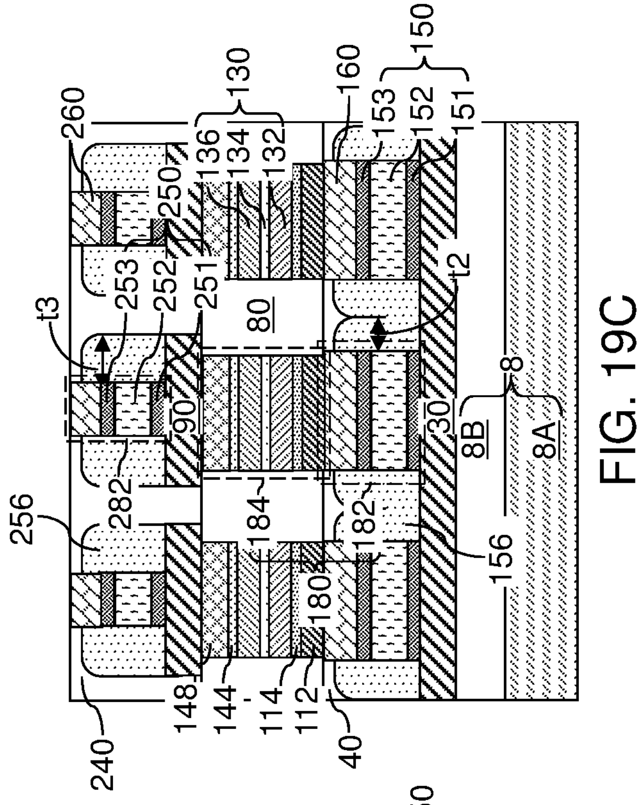
Figure 19B:
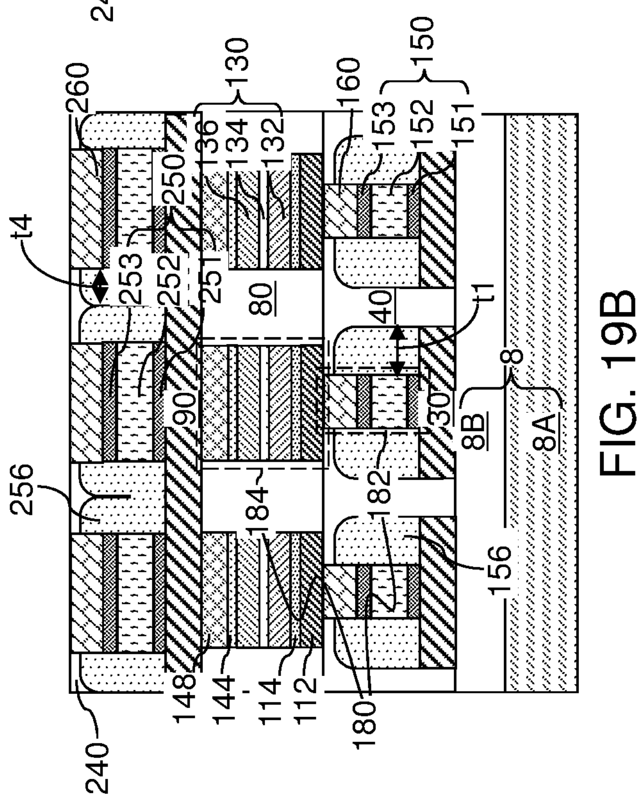

Referring to FIGS. 19A-19C, a dielectric fill material can be deposited in cavities between neighboring pairs of first dielectric spacers 256 to form a dielectric matrix layer, which is herein referred to as a second selector-level dielectric matrix layer 240. Excess portions of the dielectric fill material of the second selector-level dielectric matrix layer 240 can be removed from above a horizontal plane including top surfaces of the first selector-containing pillar structures 282 by a planarization process such as a chemical mechanical polishing process. A top surfaces of a remaining portion of the second selector-level dielectric matrix layer 240 is formed within a horizontal plane including top surfaces of the two-dimensional array of second selector-containing pillar structures 282. In this embodiment, the second hardmask plates 260 may comprise second electrically conductive plates 260.

In the alternative configuration of the first exemplary according to the alternative aspect of the first embodiment of the present disclosure, the second selector-level dielectric matrix layer 240 is also formed in cavities between neighboring pairs of second dielectric spacers 256, as described above. However, similar to the step shown in FIGS. 9D-9F, in this alternative configuration, the CMP process is continued to also remove the second hardmask plates 260 and to expose the upper surface of the second upper selector electrodes 253. In this alternative configuration, the second hardmask plates 260 may comprise an insulating material, such as silicon nitride or metal oxide, and at least an upper portion of the second upper selector electrodes 253 may comprise a metal or metal alloy rather than a carbon based material. Thus, the CMP does not damage the carbon material of the second upper selector electrodes 153.

Figure 20A:
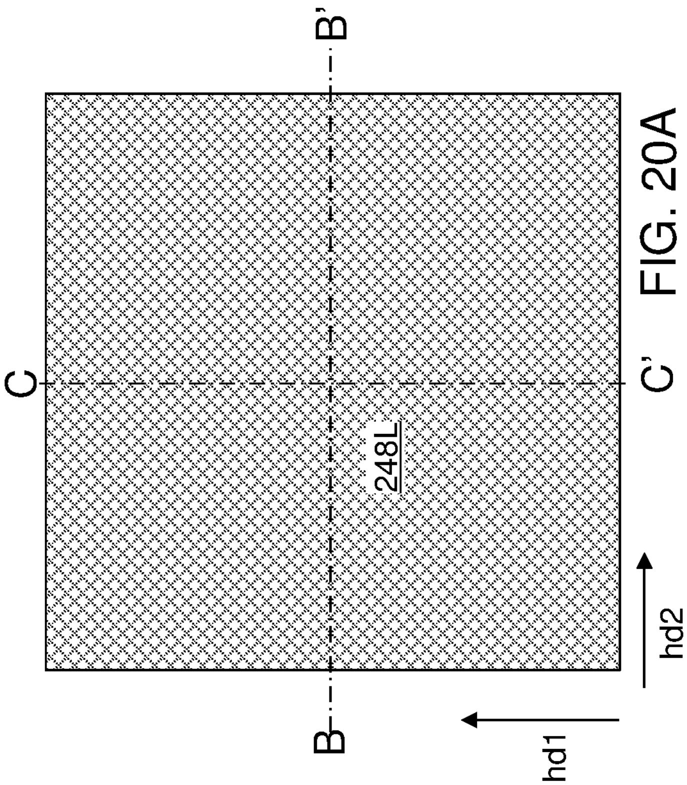
FIGS. 20A-20C are various views of the first exemplary structure after formation of a second continuous superlattice layer, a second continuous antiferromagnetic coupling layer, a second continuous reference layer, a second continuous nonmagnetic tunnel barrier layer, a second continuous free layer, a second continuous dielectric capping layer, and a second continuous metallic capping layer according to the first embodiment of the present disclosure.
Figure 20B:
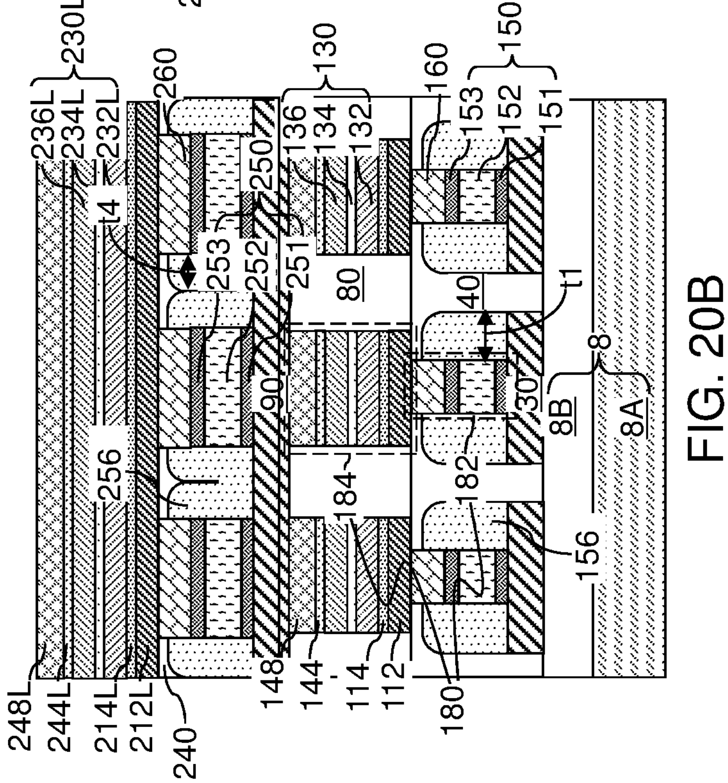
Figure 20C:
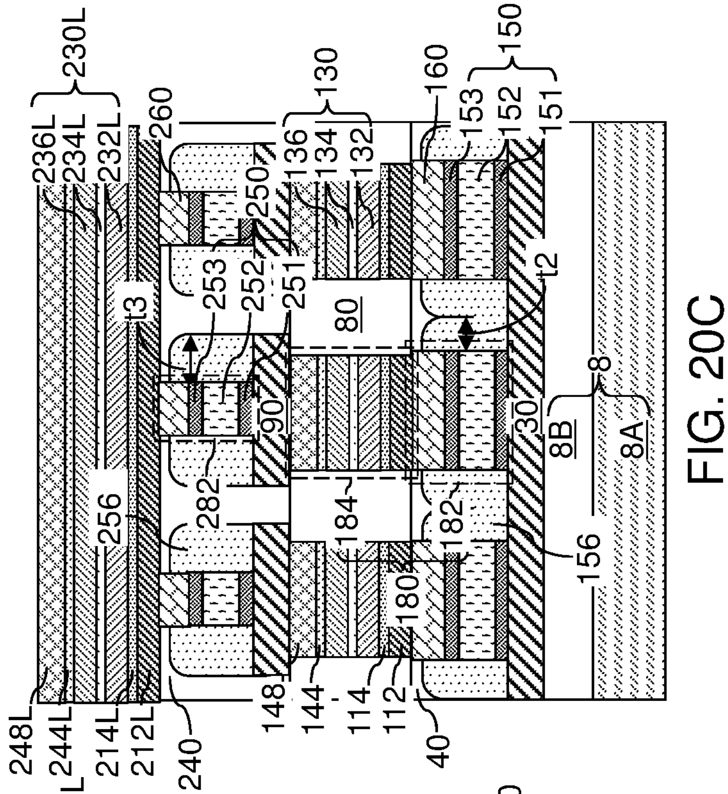

Referring to FIGS. 20A-20C, second magnetic tunnel junction-level (MTJ-level) material layers (212L, 214L, 230L, 244L, 248L) can be formed over the two-dimensional array of second selector-containing pillar structures 282 and the second selector-level dielectric matrix layer 240. The second MTJ-level material layers may comprise, for example, a second continuous superlattice layer 212L, an optional second continuous antiferromagnetic coupling layer 214L, second continuous magnetic tunnel junction (MTJ) material layers 230L, a second continuous dielectric capping layer 244L, and a second continuous metallic capping layer 248L. The second MTJ material layers 230L may comprises a layer stack including a second continuous reference layer 232L, a second continuous nonmagnetic tunnel barrier layer 234L, a second continuous free layer 236L. The second MTJ-level material layers may also optionally comprise the above described seed layer (i.e., the continuous non-magnetic metal layer (e.g., Pt, Ta, W, etc.)) that is subsequently patterned to form the seed layer located below the second continuous superlattice layer 212L.

The second continuous superlattice layer 212L can have the same material composition and the same thickness as the first superlattice layer 112 described above. The second continuous antiferromagnetic coupling layer 214L, if present, can have the same material composition and the same thickness as the first antiferromagnetic coupling layer 114 described above. The second continuous reference layer 232L can have the same material composition and the same thickness as the first reference layer 132 described above. The second continuous nonmagnetic tunnel barrier layer 234L can have the same material composition and the same thickness as the first continuous nonmagnetic tunnel barrier layer 134L described above. The second continuous free layer 236L can have the same material composition and the same thickness as the first free layer 136 described above. The second continuous dielectric capping layer 244L can have the same material composition and the same thickness as the first dielectric capping layer 144 described above. The second continuous metallic capping layer 248L can have the same material composition and the same thickness as the first metallic capping layer 148 described above.

Figure 21A:
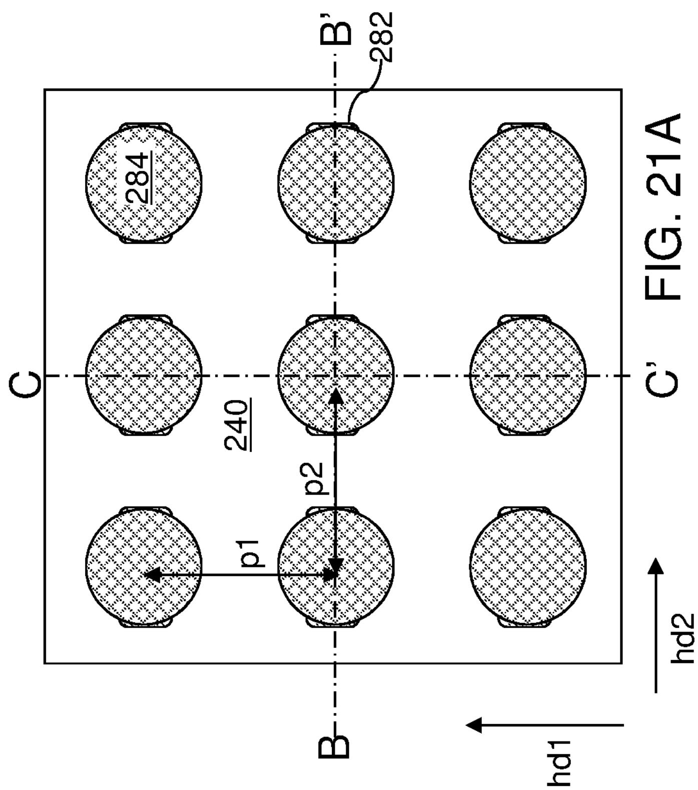
FIGS. 21A-21C are various views of the first exemplary structure after formation of a two-dimensional array of second magnetic tunnel junction pillar structures according to the first embodiment of the present disclosure.
Figure 21C:
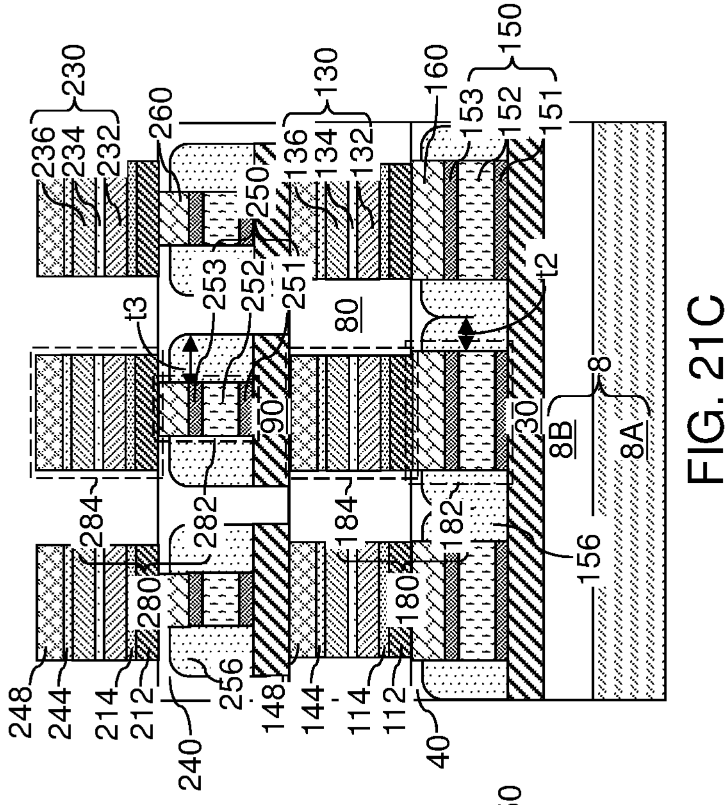
Figure 21B:
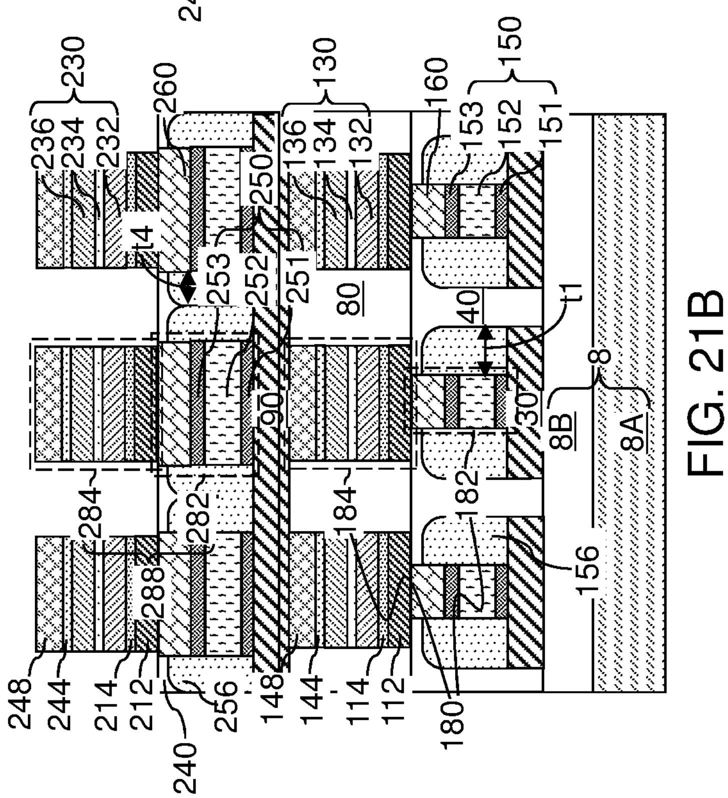

Referring to FIGS. 21A-21C, a two-dimensional array of fourth discrete patterned photoresist material portions (not shown) can be formed over the second continuous metallic capping layer 248L. Each of the fourth discrete patterned photoresist material portions has an areal overlap with a respective underlying one of the second selector-containing pillar structures 282. The two-dimensional array of second discrete patterned photoresist material portions can be formed as a periodic array having the first pitch p1 along the first horizontal direction hd1 and having the second pitch p2 along the second horizontal direction hd2. The horizontal cross-sectional shapes of the fourth discrete patterned photoresist material portions can be different from the horizontal cross-sectional shapes of the second selector-containing pillar structures 282. In one embodiment, the lateral dimension of each of the fourth discrete patterned photoresist material portions along the first horizontal direction hd1 may be the same as the lateral dimension of each of the fourth discrete patterned photoresist material portions along the second horizontal direction hd2. In one embodiment, each of the fourth discrete patterned photoresist material portions may have a respective horizontal cross-sectional shape of a circle.

An anisotropic etch process can be performed to etch unmasked portions of the layer stack (212L, 214L, 230L, 244L, 248L) including the second continuous superlattice layer 212L, the optional second continuous antiferromagnetic coupling layer 214L, the second continuous magnetic tunnel junction (MTJ) material layers 230L, the second continuous dielectric capping layer 244L, and the second continuous metallic capping layer 248L employing the two-dimensional array of fourth discrete patterned photoresist material portions as an etch mask.

In one embodiment, the anisotropic etch process may comprise a combination of a reactive ion etch process and an ion beam etch (IBE) process. In one embodiment, an optional hardmask layer (if present) and/or the second continuous metallic capping layer 248L and/or the second continuous dielectric capping layer 244L may be patterned into a two-dimensional periodic array of optional hardmask plates and/or second metallic capping layers 248 and/or second dielectric capping layers 244 by performing a reactive ion etch process. The two-dimensional array of fourth discrete patterned photoresist material portions can be subsequently removed, for example, by ashing. The second continuous MTJ material layers 230L, the optional second continuous antiferromagnetic coupling layer 214L, and the second continuous superlattice layer 212L can be patterned by performing an ion beam etch process that employs the two-dimensional periodic array of the optional hardmask plates and/or the second metallic capping layers 248 and/or the second dielectric capping layers 244 as a mask.

Each patterned portion of the layer stack (212L, 214L, 230L, 244L, 248L) comprises a second magnetic tunnel junction (MTJ) pillar structure 284. A two-dimensional array of second magnetic tunnel junction (MTJ) pillar structures 284 can be formed over the two-dimensional array of second selector-containing pillar structures 282. Each contiguous combination of a second selector-containing pillar structure 282 and a second MTJ pillar structure 284 constitutes a second memory cell 280, which can function as a memory cell 180 described with reference to FIG. 2.

Each second MTJ pillar structure 284 comprises a stack of a second superlattice layer 212, a second antiferromagnetic coupling layer 214, a second magnetic tunnel junction 230, a second dielectric capping layer 244, and a second metallic capping layer 248. The second magnetic tunnel junction 230 includes a second reference layer 232, a second tunnel barrier layer 234, and a second free layer 236. Each second superlattice layer 212 is a patterned portion of the second continuous superlattice layer 212L. Each third antiferromagnetic coupling layer 214 is a patterned portion of the second continuous antiferromagnetic coupling layer 214L. Each second magnetic tunnel junction 230 is a patterned portion of the second magnetic tunnel junction material layers 230L. Each second dielectric capping layer 244 is a patterned portion of the second continuous dielectric capping layer 244L. Each second metallic capping layer 248 is a patterned portion of the second continuous metallic capping layer 248L. Each second reference layer 232 is a patterned portion of the second continuous reference layer 232L. Each second tunnel barrier layer 234 is a patterned portion of the second continuous tunnel barrier layer 234L. Each second free layer 236 is a patterned portion of the second continuous free layer 236L. Sidewalls of each layer within an MTJ pillar structure 284 can be vertically coincident.

The two-dimensional array of second MTJ pillar structures 284 can be formed above the top surfaces of the remaining portions of the second selector-level dielectric matrix layer 240 and over the two-dimensional array of the second selector-containing pillar structures 282. Each of the second MTJ pillar structures 284 comprises a respective magnetic tunnel junction 230.

In one embodiment, each MTJ pillar structure 284 within the two-dimensional array of MTJ pillar structures 284 has a respective horizontal cross-sectional shape having a same lateral extent along the first horizontal direction hd1 and along the second horizontal direction hd2. In one embodiment, each MTJ pillar structure 284 may have a horizontal cross-sectional shape of a circle, a square, or a rounded square, i.e., a shape that is derived from a square by rounding the four corners.

In one embodiment, each of the two-dimensional array of second selector-containing pillar structures 282 and the two-dimensional array of second MTJ pillar structures 284 has the first pitch p1 along the first horizontal direction hd1, and has the second pitch p2 along the second horizontal direction hd2. In one embodiment, the maximum lateral dimension of each of the second selector-containing pillar structures 282 along the first horizontal direction hd1 can be less than the maximum lateral dimension of each of the second MTJ pillar structures 284 along the first horizontal direction hd1, and the maximum lateral dimension of each of the second selector-containing pillar structures 282 along the second horizontal direction hd2 is greater than the maximum lateral dimension of each of the second MTJ pillar structures 284 along the second horizontal direction hd2.

Figure 22A:
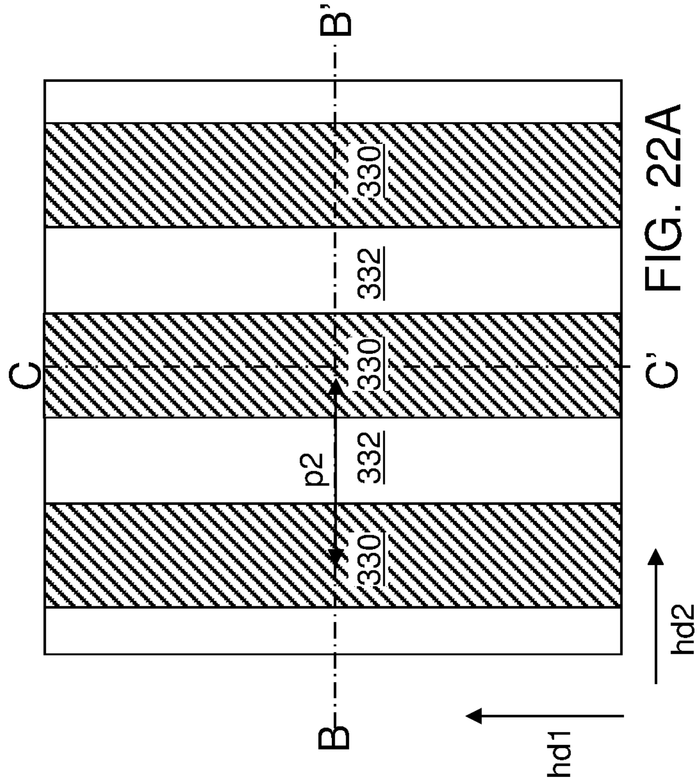
FIGS. 22A-22C are various views of the first exemplary structure after formation of a second magnetic-tunnel-junction-level (MTJ-level) dielectric matrix layer and third electrically conductive lines according to the first embodiment of the present disclosure.
Figure 22C:
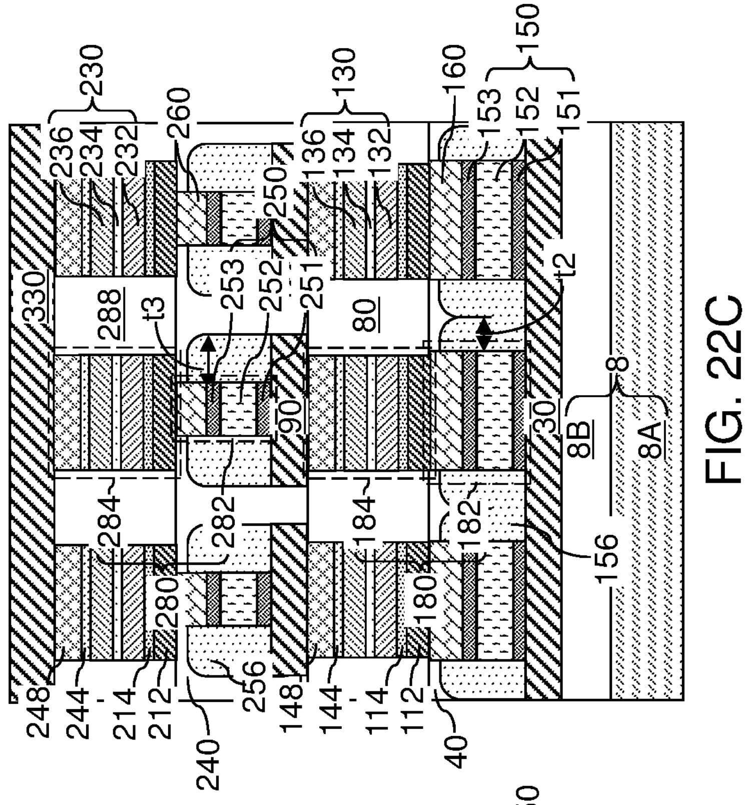
Figure 22B:
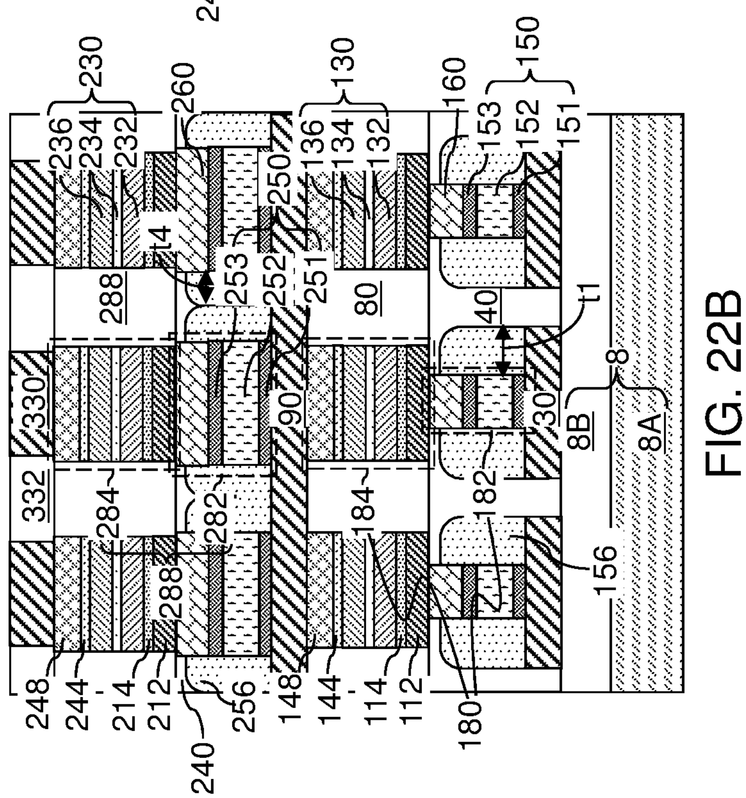

Referring to FIGS. 22A-22C, a dielectric fill material can be deposited in the gaps between neighboring pairs of the second MTJ pillar structures 284, and can be subsequently planarized. The portion of the dielectric fill material located underneath the horizontal plane including the top surfaces of the second MTJ pillar structures 284 comprises a dielectric matrix layer, which is herein referred to as a second magnetic-tunnel-junction-level (MTJ-level) dielectric matrix layer 288. The portion of the dielectric fill material located above the horizontal plane including the top surfaces of the second MTJ pillar structures 284 comprises a line-level dielectric layer 332.

Line trenches laterally extending along the first horizontal direction hd1 can be formed above each row of second MTJ pillar structures 284. A conductive material can be deposited in the line trenches, and excess portions of the conductive material can be removed from above the horizontal plane including the top surface of the line-level dielectric layer 332. Remaining portions of the conductive material filling the line trenches constitute third electrically conductive lines 330 (e.g., additional word lines). The third electrically conductive lines 330 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the third electrically conductive lines 330 can be in a range from 20 nm to 100 nm, although lesser and greater thicknesses can also be employed.

Alternatively, instead of using the above described damascene process to form the third electrically conductive lines 330, these lines may be formed by a pattern and etch process. In the pattern and etch process, a continuous electrically conductive layer is patterned into the third electrically conductive lines 330 by photolithography and etching. The line-level dielectric layer 332 is then deposited between the third electrically conductive lines 330 and optionally planarized with the top surfaces of the third electrically conductive lines 330.

Figure 23A:
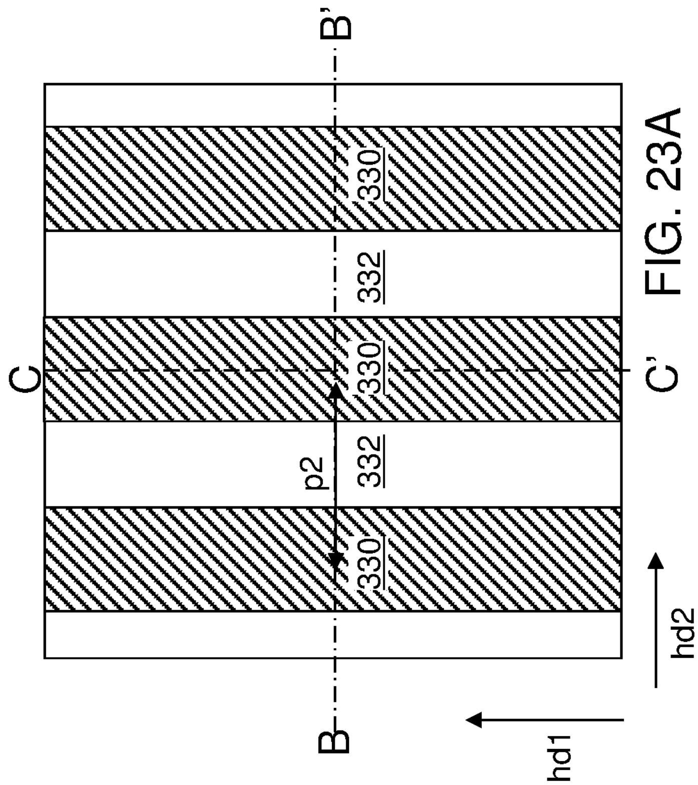
FIGS. 23A-23C are various views of an alternative configuration of the first exemplary structure according to the first embodiment of the present disclosure.
Figure 23C:
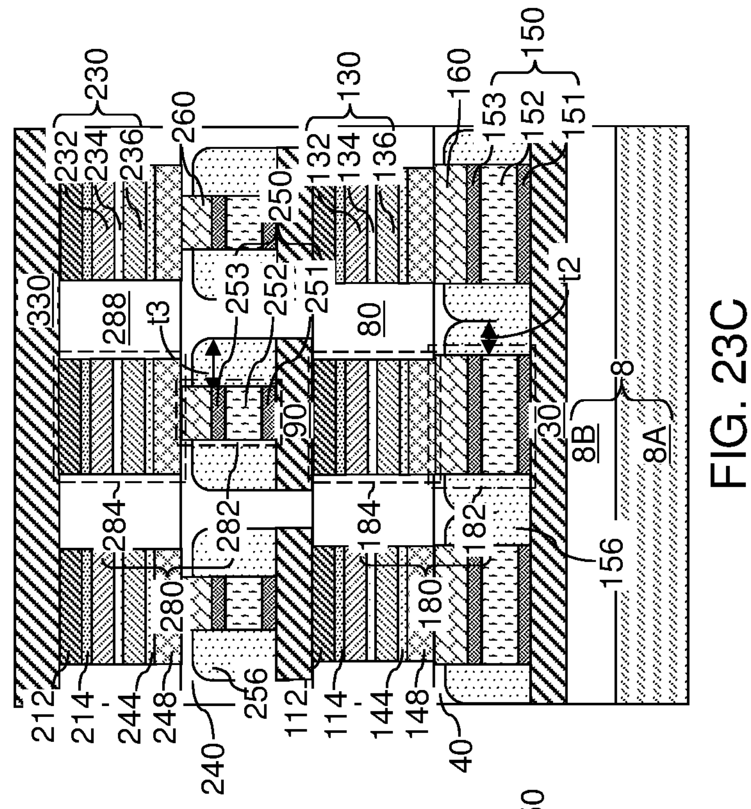
Figure 23B:
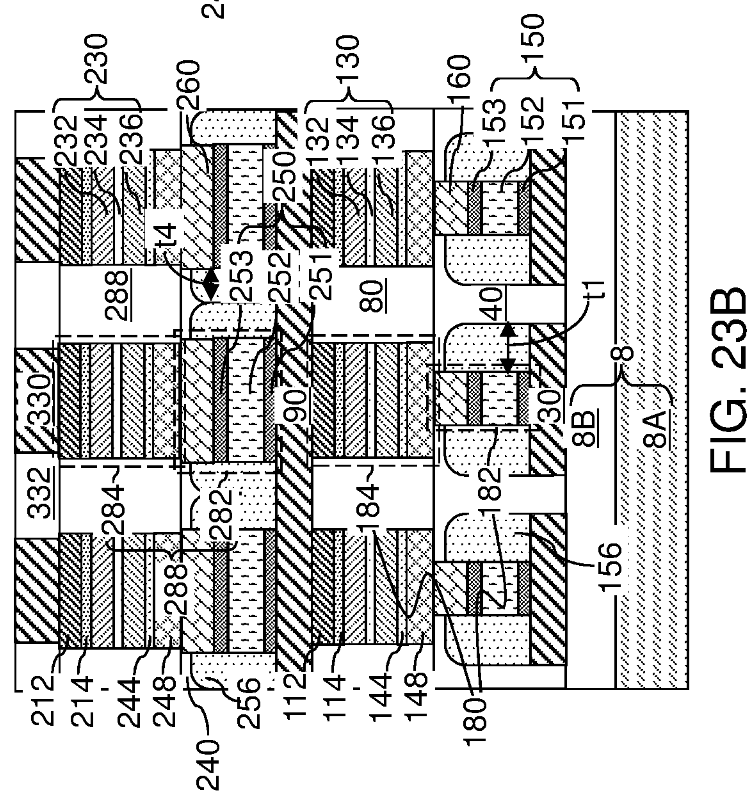

Referring to FIGS. 23A-23C, an alternative configuration of the first exemplary structure may be derived from the first exemplary structure illustrated in FIGS. 22A-22C by reversing the order of the vertical stack of material layers within each of the first MTJ pillar structures 184 and/or within each of the second MTJ pillar structures 284.

The method of the first embodiment forms the first electrically conductive lines 30 without using a separate photolithographic mask. Instead, the first selector-containing pillar structures 182 and the surrounding dielectric spacers 156 are used as a mask to pattern the first electrically conductive lines 30. This reduces the number of photolithography steps, and thus reduces the cost and complexity of the process. Furthermore, the word lines 30 are self-aligned with the selector bits (i.e., the first selector-containing pillar structures 182), thus avoiding misalignment. Still further, due to the presence of the dielectric spacers 156, damage to the sidewalls of the first selector-containing pillar structures 182 is reduced or avoided during the etching of the word lines 30.

Furthermore, since the first selector-containing pillar structures 182 are patterned prior to depositing the layers of the MTJ pillar structures 184, redeposition of the first selector-containing pillar structure 182 materials on the sidewalls of the MTJ pillar structures 184 during the reactive ion etching of the first selector-containing pillar structures 182 does not occur. This permits the first selector-containing pillar structure 182 to be placed closer together, thus increasing the device density and reducing the device cost. Therefore, very small pitch MRAM cross point arrays may be formed with fewer lithography steps.

The MRAM layer stack is deposited onto a polished dielectric surface (e.g., the surface of layer 40) with embedded selector-containing pillar structures 182. Since the MRAM layer stack is deposited on a smooth and flat surface, it may result in improved MRAM device performance. Furthermore, since the MRAM pillars (i.e., MTJ pillar structures 184) are patterned with mostly dielectric material (i.e., layer 40) exposed below, it is believed that there will be little undesirable sidewall material redeposition on the MTJ 130 of the MTJ pillar structures 184 during the patterning.

IBE may lead to shadowing effects when etching line shaped features. Therefore, in the first embodiment, IBE is preferably only used to pattern the discrete pillar-shaped MTJ pillar structures 184. Thus, the line shaped word lines 30 do not have to be patterned by IBE to avoid the shadowing effects of IBE. The MRAM pillars (i.e., MTJ pillar structures 184) are patterned into dot (i.e., cylindrical pillar) arrays, which are favorable for dense MRAM array fabrication.

Referring collectively to FIGS. 1-23C, a memory array is provided, which comprises: first electrically conductive lines 30 laterally extending along a first horizontal direction hd1 and having a respective variable width along a second horizontal direction that varies along the first horizontal direction hd1; a two-dimensional array of selector-containing pillar structures 182 located over the first electrically conductive lines 182 and including a respective selector element 150; a two-dimensional array of magnetic tunnel junction (MTJ) pillar structures 184 located over the two-dimensional array of selector-containing pillar structures 182 and including a respective magnetic tunnel junction (MTJ) 130; and second electrically conductive lines 90 laterally extending along the second horizontal direction hd2 and overlying the two-dimensional array of (MTJ) pillar structures 184.

In one embodiment, the memory device comprises dielectric spacers 156 laterally surrounding a respective row of selector-containing pillar structures 182 of the two-dimensional array of selector-containing pillar structures 182, wherein the selector-containing pillar structures 182 within the respective row of selector-containing pillar structures 182 are arranged along the first horizontal direction hd1.

In one embodiment, each of the first electrically conductive lines 30 contacts a bottom surface of a respective one of the dielectric spacers 156, and comprises a respective pair of contoured sidewalls that are vertically coincident with sidewalls of the respective one of the dielectric spacers 156.

In one embodiment, each of the dielectric spacers 156 comprises a respective plurality of vertically-extending seams that are parallel to the second horizontal direction hd2 and located midway between a respective neighboring pair of selector-containing pillar structures 182 of the two-dimensional array of selector-containing pillar structures 182 that are laterally spaced apart along the first horizontal direction hd1. In one embodiment, each of the dielectric spacers 156 comprises a pair of contoured lengthwise sidewalls that generally extend along the first horizontal direction hd1 with a lateral undulation along the second horizontal direction hd2; each lengthwise segment of each of the dielectric spacers 156 that laterally extend along the first horizontal direction hd1 and located between a respective selector-containing pillar structure and a respective contoured lengthwise sidewall has a first thickness t1 along the second horizontal direction hd2; and each widthwise segment of each of the dielectric spacers 156 located between a respective selector-containing pillar structure 182 and a respective vertically-extending seam 156S has a second thickness t2 along the first horizontal direction hd1 that is less than the first thickness t1.

In one embodiment, each selector-containing pillar structure 182 within the two-dimensional array of selector-containing pillar structures 182 has a first lateral dimension ld1 along the first horizontal direction hd1 and has a second lateral dimensional ld2 along the second horizontal direction hd2 that is less than the first lateral dimension ld1. In one embodiment, a ratio of the first lateral dimension ld1 to the second lateral dimension ld2 is in a range from 1.2 to 4.

In one embodiment, the second electrically conductive lines 90 have a respective variable width along the first horizontal direction hd1 that varies along the second horizontal direction hd2.

In one embodiment, each of the two-dimensional array of selector-containing pillar structures 182 and the two-dimensional array of (MTJ) pillar structures 184 has a first pitch p1 along the first horizontal direction hd1 and has a second pitch p2 along the second horizontal direction hd2; the first electrically conductive lines 30 are periodic along the second horizontal direction hd2 and have the second pitch p2 along the second horizontal direction hd2; and the second electrically conductive lines 90 are periodic along the first horizontal direction hd1 and have the first pitch p1 along the first horizontal direction hd1.

In one embodiment, a maximum lateral dimension of each of the selector-containing pillar structures 182 along the first horizontal direction hd1 is greater than a maximum lateral dimension of each of the (MTJ) pillar structures 184 along the first horizontal direction hd1; and a maximum lateral dimension of each of the selector-containing pillar structures 182 along the second horizontal direction hd2 is less than a maximum lateral dimension of each of the MTJ pillar structures along the second horizontal direction hd2.

Figure 24A:
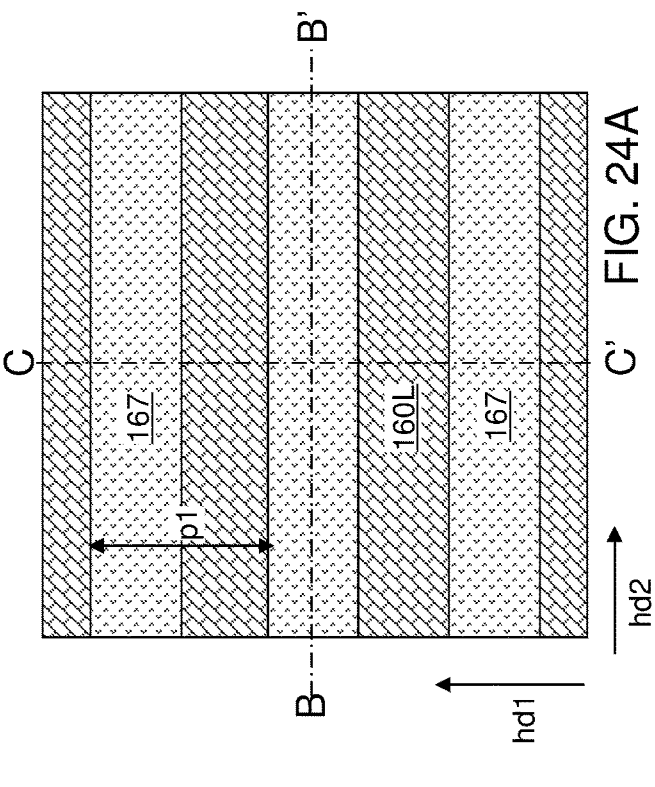
FIGS. 24A-24C are various views of a second exemplary structure after formation of a layer stack comprising a first electrically conductive layer, first selector-level material layers, and a first conductive material layer and formation of a first patterned photoresist layer according to a second embodiment of the present disclosure.
Figure 24B:
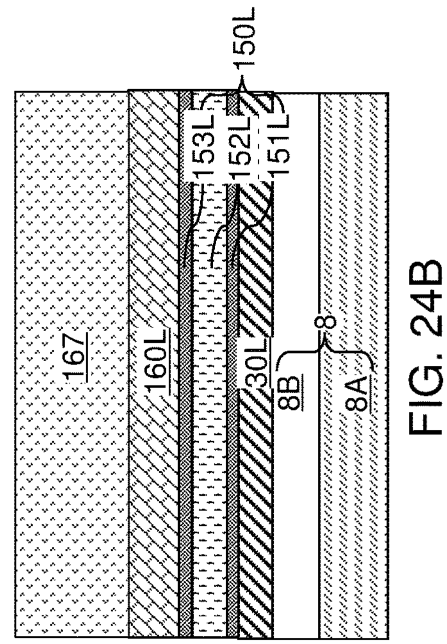
Figure 24C:
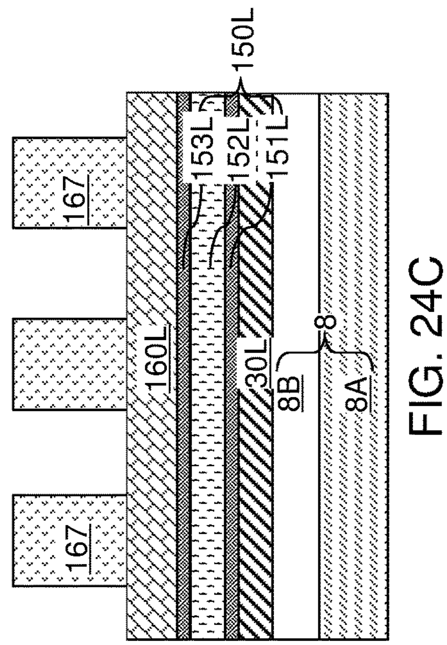

Referring to FIGS. 24A-24C, a second exemplary structure according to a second embodiment of the present disclosure is illustrated, which can be derived from the first exemplary structure illustrated in FIGS. 3A and 3B by applying a photoresist layer over the first hardmask layer 160L and by patterning the photoresist layer into a first patterned photoresist layer 167. The first patterned photoresist layer 167 may have a line-and-space pattern in which each of the first patterned photoresist layer 167 has a uniform width along a first horizontal direction hd1 and laterally extends along a second horizontal direction hd2. Each neighboring pair of first patterned photoresist layer 167 may be laterally spaced apart by a uniform spacing. The sum of the uniform width and the uniform spacing equals the periodicity of the first patterned photoresist layer 167 along the first horizontal direction hd1, which is herein referred to as a first pitch p1.

Figure 25A:
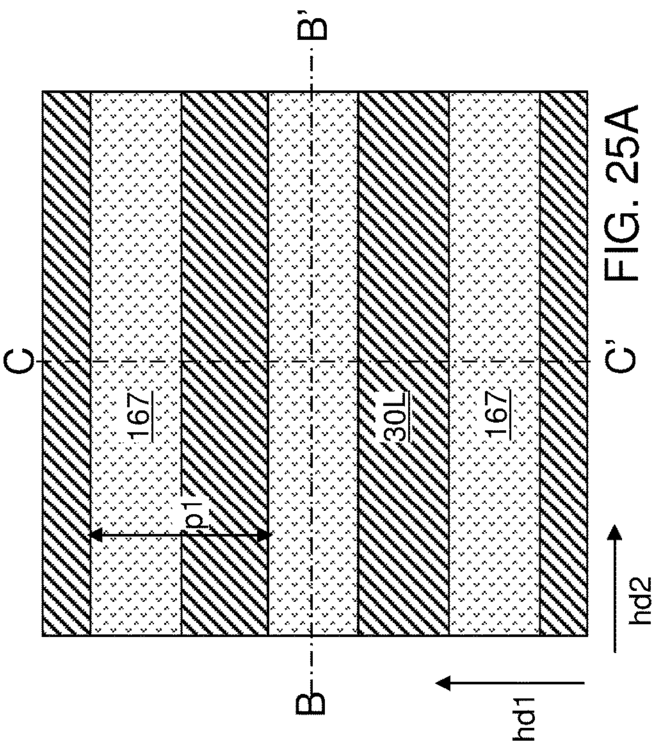
FIGS. 25A-25C are various views of the second exemplary structure after formation of selector rail structures according to the second embodiment of the present disclosure.
Figure 25B:
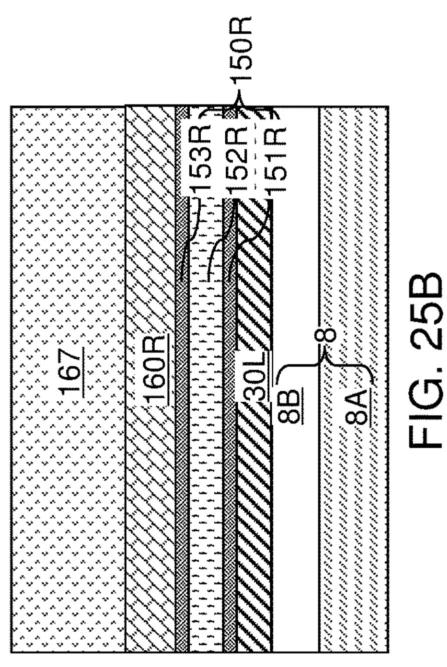
Figure 25C:
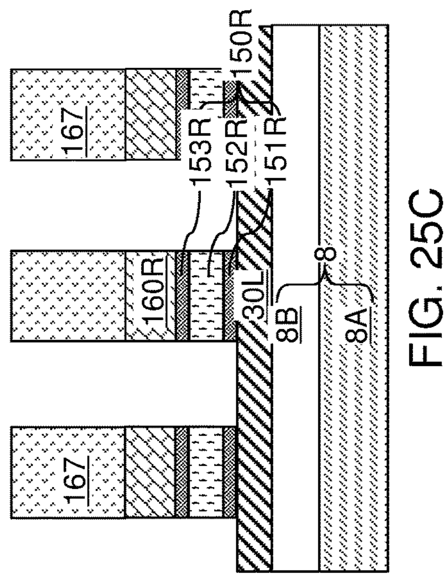

Referring to FIGS. 25A-25C, a first line-pattern-transfer process can be performed, which transfers the line-and-space pattern in the first patterned photoresist layer 167 through the first hardmask layer 160L and the first selector material layers 150L. The first line-pattern-transfer process can comprise a first anisotropic etch process that etches the materials of the first hardmask layer 160L and the first selector material layers 150L employing the first patterned photoresist layer 167 as an etch mask. The first electrically conductive layer 30L may be employed as an etch stop layer for the first anisotropic etch process. Patterned portions of the first hardmask layer 160L and the first selector material layers 150L comprise first selector rail structures (150R, 160R) that laterally extend along the second horizontal direction hd2 and are laterally spaced apart along the first horizontal direction hd1. Each first selector rail structure (150R, 160R) comprises a first selector-level rail 150R that is a patterned portion of the first selector material layers 150L, and a first hardmask rail 160R that is a patterned portion of the first hardmask layer 160L. The first patterned photoresist layer 167 can be subsequently removed, for example, by ashing.

Figure 26A:
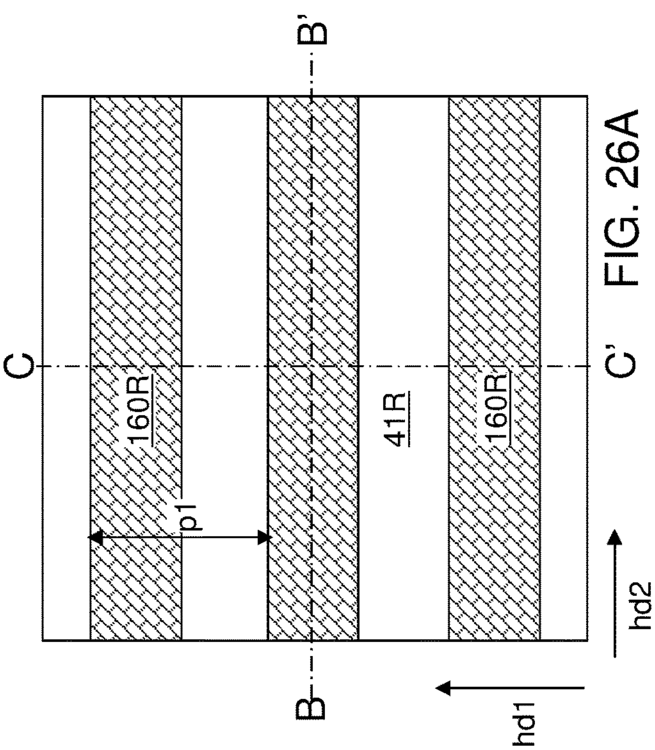
FIGS. 26A-26C are various views of the second exemplary structure after formation of first selector-level isolation rails according to the second embodiment of the present disclosure.
Figure 26B:
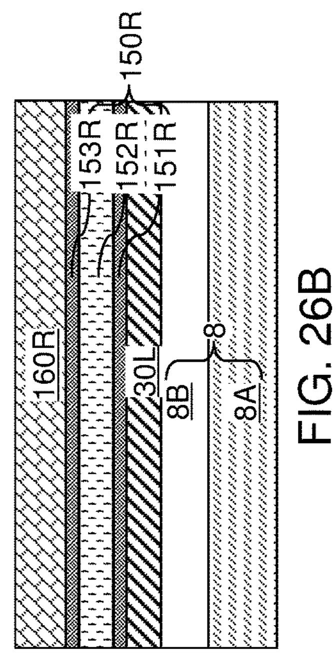
Figure 26C:
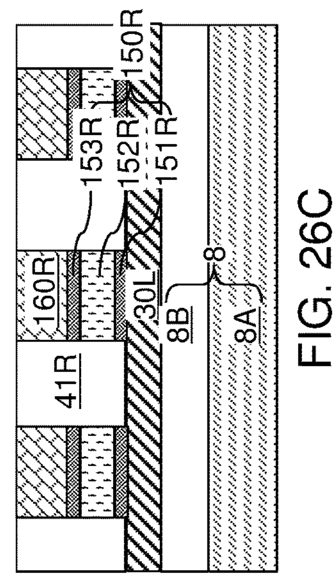

Referring to FIGS. 26A-26C, a dielectric fill material can be deposited in the gaps between neighboring pairs of first selector rail structures (150R, 160R). Excess portions of the dielectric fill material can be removed from above the horizontal plane including the top surfaces of the first selector rail structures (150R, 160R) by performing a planarization process such as a chemical mechanical polishing process. Remaining portions of the dielectric fill material are herein referred to as first selector-level isolation rails 41R.

Figure 27A:
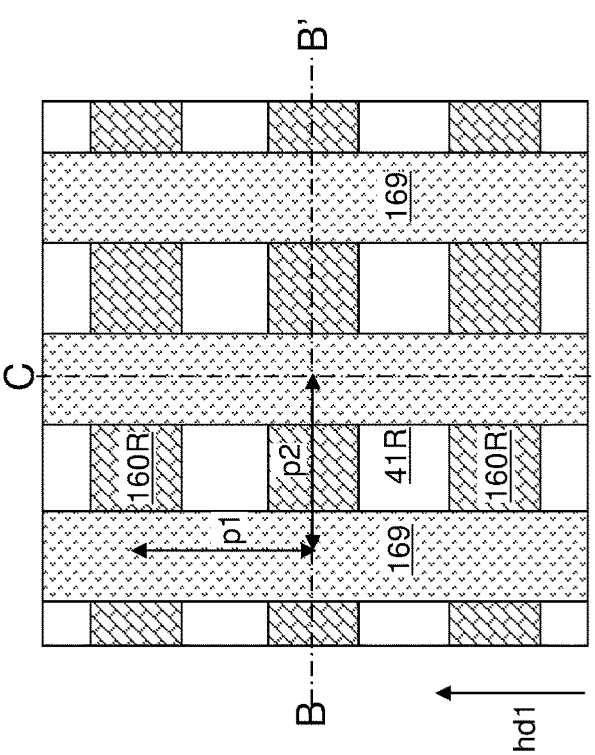
FIGS. 27A-27C are various views of the second exemplary structure after formation of a second patterned photoresist layer according to the second embodiment of the present disclosure.
Figure 27B:
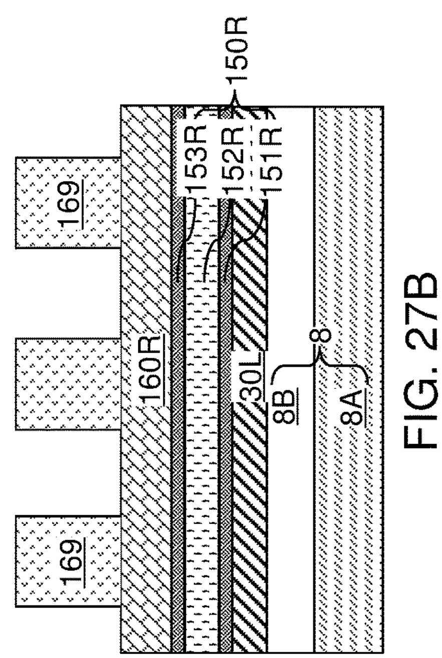
Figure 27C:
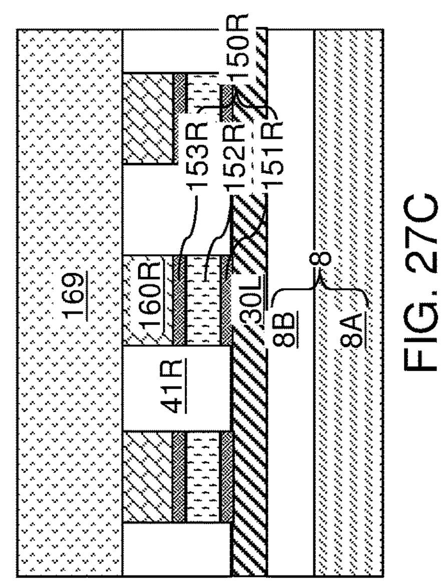

Referring to FIGS. 27A-27C, a photoresist layer can be applied over the first selector rail structures (150R, 160R) and the first selector-level isolation rails 41R, and can be lithographically patterned into a second patterned photoresist layer 169. The second patterned photoresist layer 169 may have a line-and-space pattern in which each of the second patterned photoresist layer 169 has a uniform width along the second horizontal direction hd2 and laterally extends along the first horizontal direction hd1. Each neighboring pair of second patterned photoresist layer 169 may be laterally spaced apart by a uniform spacing. The sum of the uniform width and the uniform spacing equals the periodicity of the second patterned photoresist layer 169 along the second horizontal direction hd2, which is herein referred to as a second pitch p2. The second pitch p2 may be the same as, or may be different from, the first pitch p1. In one embodiment, the second pitch p2 is the same as the first pitch p1.

Figure 28A:
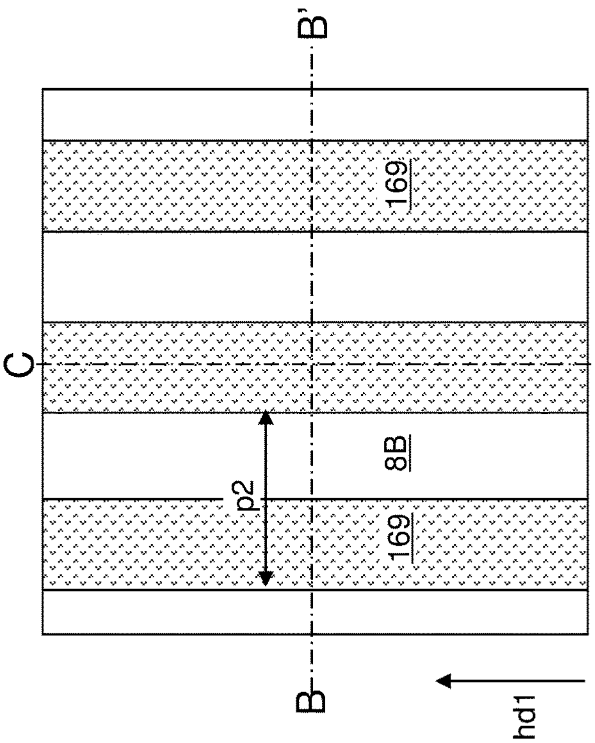
FIGS. 28A-28C are various views of the second exemplary structure after formation of a two-dimensional array of selector-containing pillar structures and first electrically conductive lines according to the second embodiment of the present disclosure.
Figure 28B:
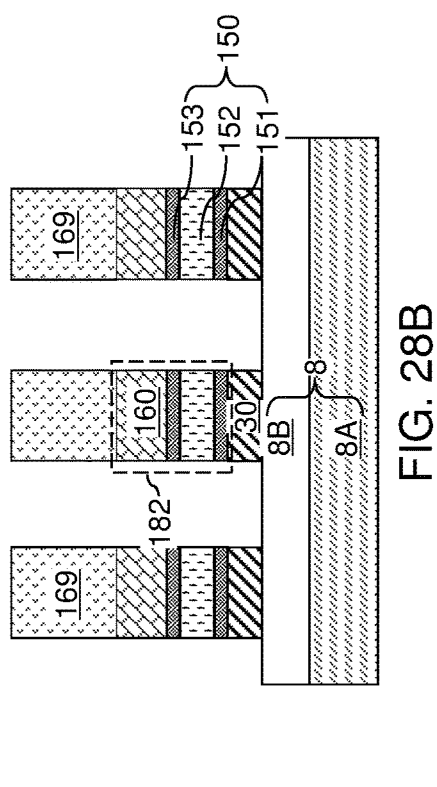
Figure 28C:
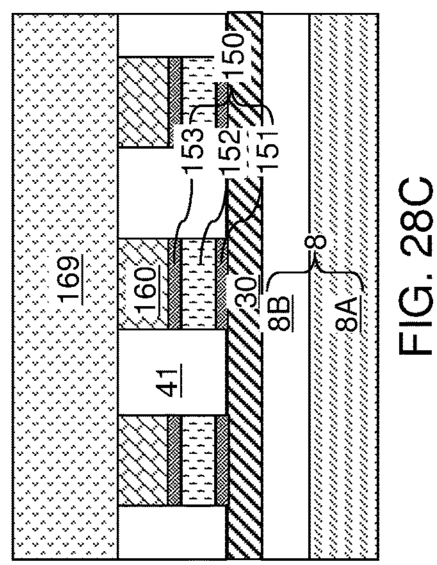

Referring to FIGS. 28A-28C, a second line-pattern-transfer process can be performed, which transfers the line-and-space pattern in the second patterned photoresist layer 169 through the first selector rail structures (150R, 160R), the first selector-level isolation rails 41R, and the first electrically conductive layer 30L. The second line-pattern-transfer process can comprise a second anisotropic etch process that etches the materials of the first selector rail structures (150R, 160R), the first selector-level isolation rails 41R, and the first electrically conductive layer 30L employing the second patterned photoresist layer 169 as an etch mask. Patterned portions of the first selector rail structures (150R, 160R) comprise a two-dimensional array of first selector-containing pillar structures 182.

Each first selector-containing pillar structure 182 can include a first selector element 150 and a first hardmask plate 160. Each first selector element 150 is a patterned portion of the first selector material layers 150L, and each first hardmask plate 160 is a patterned portion of the first hardmask layer 160L. Each first selector element 150 may include a vertical stack of a first lower selector electrode 151, a first non-Ohmic material plate 152, and a first upper selector electrode 153. Each first lower selector electrode 151 is a patterned portion of the first lower selector electrode material layer 151L. Each first non-Ohmic material plate 152 is a patterned portion of the first non-Ohmic material layer 152L. Each first upper selector electrode 153 is a patterned portion of the first upper selector electrode material layer 153L.

The patterned portions of the first selector-level isolation rails 41R comprise a two-dimensional periodic array of first selector-level isolation pillars 41, which may have a first periodicity of the first pitch p1 along the first horizontal direction hd1 and may have a second periodicity of the second pitch p2 along the second horizontal direction hd2. Each of the first selector-level isolation pillars 41 may have a respective rectangular horizontal cross-sectional shape. Laterally alternating sequences of first selector-containing pillar structures 182 and first selector-level isolation pillars 41 can be formed. Each laterally alternating sequence of first selector-containing pillar structures 182 and first selector-level isolation pillars 41 includes a respective plurality of first selector-containing pillar structures 182 and a respective plurality of first selector-level isolation pillars 41 that are interlaced along the first horizontal direction hd1. Line trenches are present between each neighboring pair of laterally alternating sequences of first selector-containing pillar structures 182 and first selector-level isolation pillars 41. The first selector-containing pillar structures 182 may have a rectangular or square horizontal cross-sectional shape.

The first electrically conductive layer 30L is patterned into a plurality of first electrically conductive lines (e.g., word lines) 30 that laterally extend along the first horizontal direction hd1 and are laterally spaced apart along the second horizontal direction hd2. The first electrically conductive lines 30 may have straight sidewalls that laterally extend along the first horizontal direction hd1, and may be laterally spaced apart along the second horizontal direction hd2. The first electrically conductive lines 30 can be formed as a periodic one-dimensional array of first electrically conductive lines 30 having the periodicity of the second pitch p2 along the second horizontal direction. The second patterned photoresist layer 169 can be subsequently removed, for example, by ashing.

Generally, one or more pattern transfer processes can be employed to form a two-dimensional array of first selector-containing pillar structures 182. In one embodiment, the one or more pattern transfer processes may comprise a first line-pattern-transfer process and a second line-pattern-transfer process. In one embodiment, a first line-and-space pattern is transferred during the first line-pattern-transfer process through the first selector material layers 150L to pattern the first selector-level material layers 150L into first selector rail structures 150R that laterally extend along the second horizontal direction hd2 and are laterally spaced apart along the first horizontal direction hd1. During the second line-pattern-transfer process, a second line-and-space pattern is transferred through the first selector rail structures 150R and the first electrically conductive layer 30L to pattern the first selector rail structures 150R into a two-dimensional array of first selector elements 150 and to pattern the first electrically conductive layer 30L into the first electrically conductive lines 30.

Figure 29A:
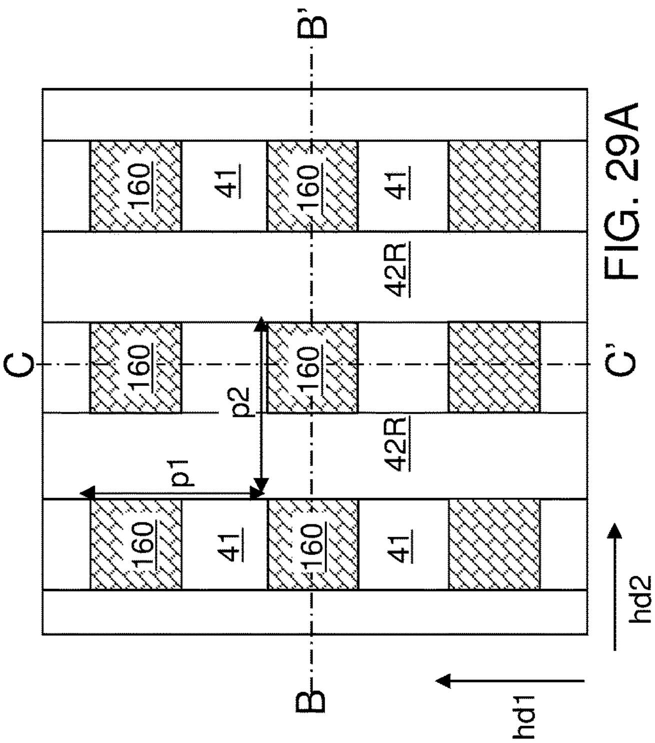
FIGS. 29A-29C are various views of the second exemplary structure after formation of second selector-level isolation rails according to the second embodiment of the present disclosure.
Figure 29B:
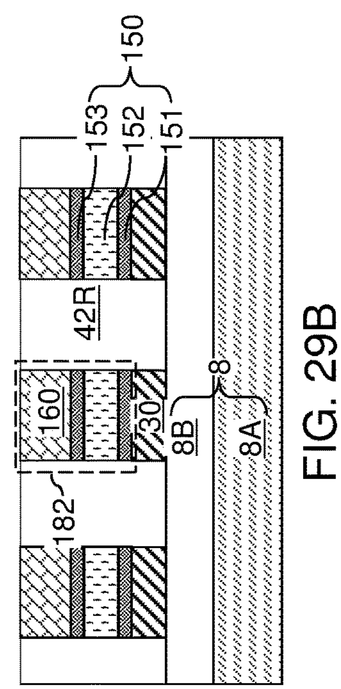
Figure 29C:
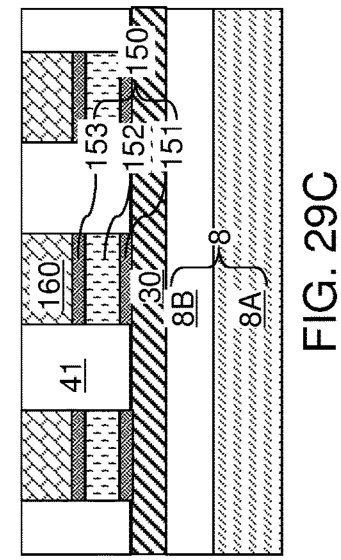

Referring to FIGS. 29A-29C, a dielectric fill material can be deposited in the line trenches between each neighboring pairs of laterally alternating sequences of first selector-containing pillar structures 182 and first selector-level isolation pillars 41. Excess portions of the dielectric fill material can be removed from above the horizontal plane including the top surfaces of the first selector-containing pillar structures 182 by performing a planarization process, such as a chemical mechanical polishing process. Remaining portions of the dielectric fill material are herein referred to as second selector-level isolation rails 42R. Each second selector-level isolation rail 42R may laterally extend along the first horizontal direction hd1, and may be laterally spaced apart along the second horizontal direction hd2. The second selector-level isolation rails 42R may be arranged as a one-dimensional periodic array having the periodicity of the second pitch p2 along the second horizontal direction hd2.

Generally, dielectric fill material portions (41R, 42R) can be formed during processing steps for manufacturing the second exemplary structure between rows of selector-containing pillar structures 182 arranged along the first horizontal direction hd1, and/or between columns of selector-containing pillar structures 182 arranged along the second horizontal direction hd2. Top surfaces of the dielectric fill material portions (41R, 42R) are formed within a horizontal plane including top surfaces of the two-dimensional array of selector-containing pillar structures 182.

In an alternative configuration, the CMP process is continued to also remove the first hardmask plates 160 and to expose the upper surface of the first upper selector electrodes 153, similar to the step shown in FIGS. 9D-9F. In this alternative configuration, the first hardmask plates 160 may comprise an insulating material, such as silicon nitride or metal oxide, and at least an upper portion of the first upper selector electrodes 153 may comprise a metal or metal alloy rather than a carbon based material. Thus, the CMP does not damage the carbon material of the first upper selector electrodes 153.

Figures 30A, 30B, 30C:
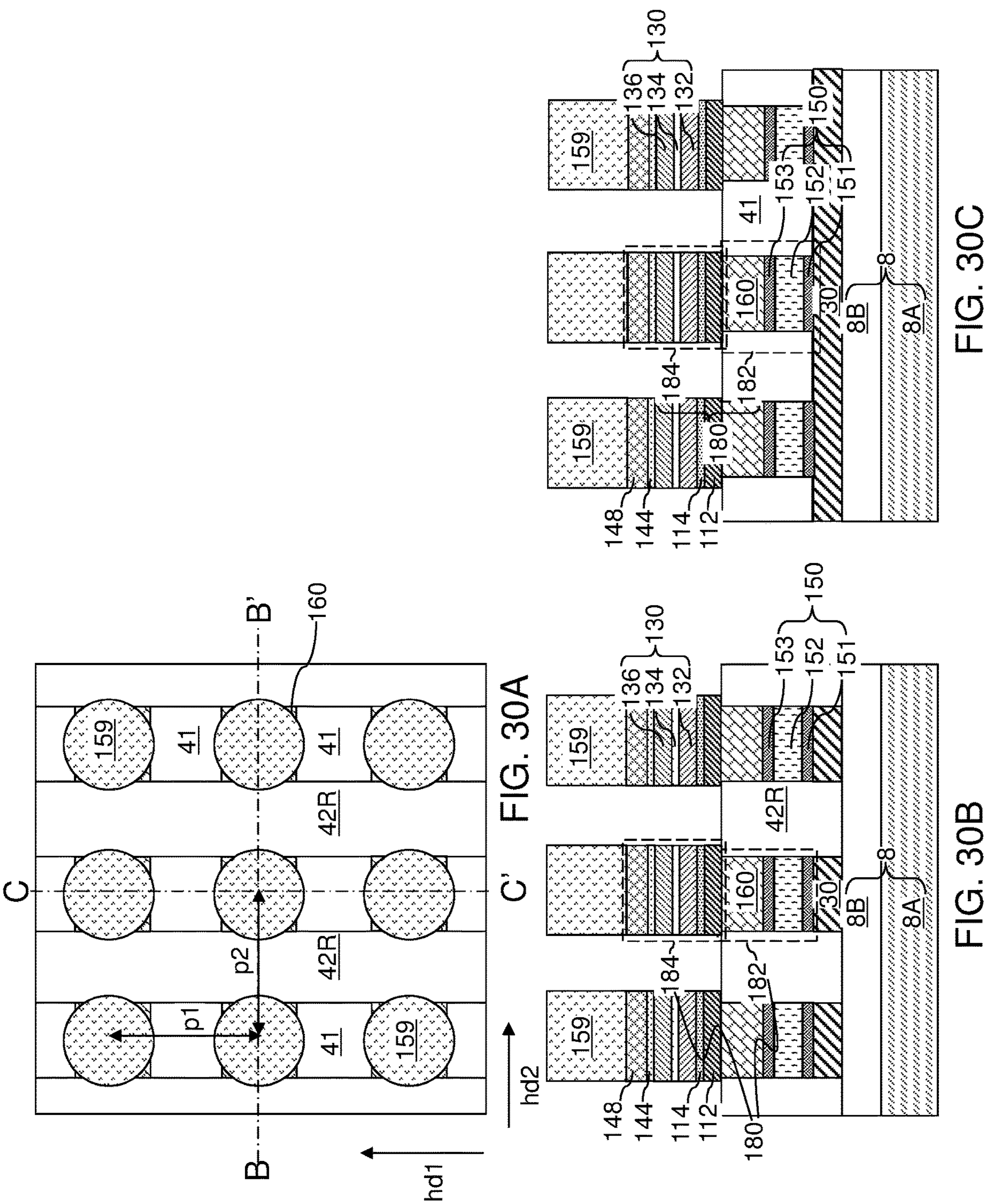
FIGS. 30A-30C are various views of the second exemplary structure after formation of a two-dimensional array of magnetic tunnel junction (MTJ) pillar structures according to the second embodiment of the present disclosure.

Referring to FIGS. 30A-30C, the processing steps of FIGS. 10A-10C, 11A-11C, and 12A-12C can be performed to form a two-dimensional array of first magnetic tunnel junction (MTJ) pillar structures 184 over the two-dimensional array of first selector-containing pillar structures 182. Each contiguous combination of a first selector-containing pillar structure 182 and a first MTJ pillar structure 184 constitutes a first memory cell 180, which can function as a memory cell 180 described with reference to FIG. 2. Generally, first magnetic tunnel junction-level (MTJ-level) material layers (112L, 114L, 130L, 144L, 148L) can be formed over the two-dimensional array of first selector-containing pillar structures 182 and the second selector-level isolation rails 42R. The first MTJ-level material layers may comprise, for example, a first continuous superlattice layer 112L, an optional first continuous antiferromagnetic coupling layer 114L, first continuous magnetic tunnel junction (MTJ) material layers 130L, a first continuous dielectric capping layer 144L, and a first continuous metallic capping layer 148L. The first MTJ material layers 130L may comprises a layer stack including a first continuous reference layer 132L, a first continuous nonmagnetic tunnel barrier layer 134L, a first continuous free layer 136L. A two-dimensional array of discrete patterned photoresist material portions 159 can be employed as an etch mask, and can be subsequently removed after an anisotropic etch process that forms the two-dimensional array of first magnetic tunnel junction (MTJ) pillar structures 184.

Figures 31A, 31B, 31C:
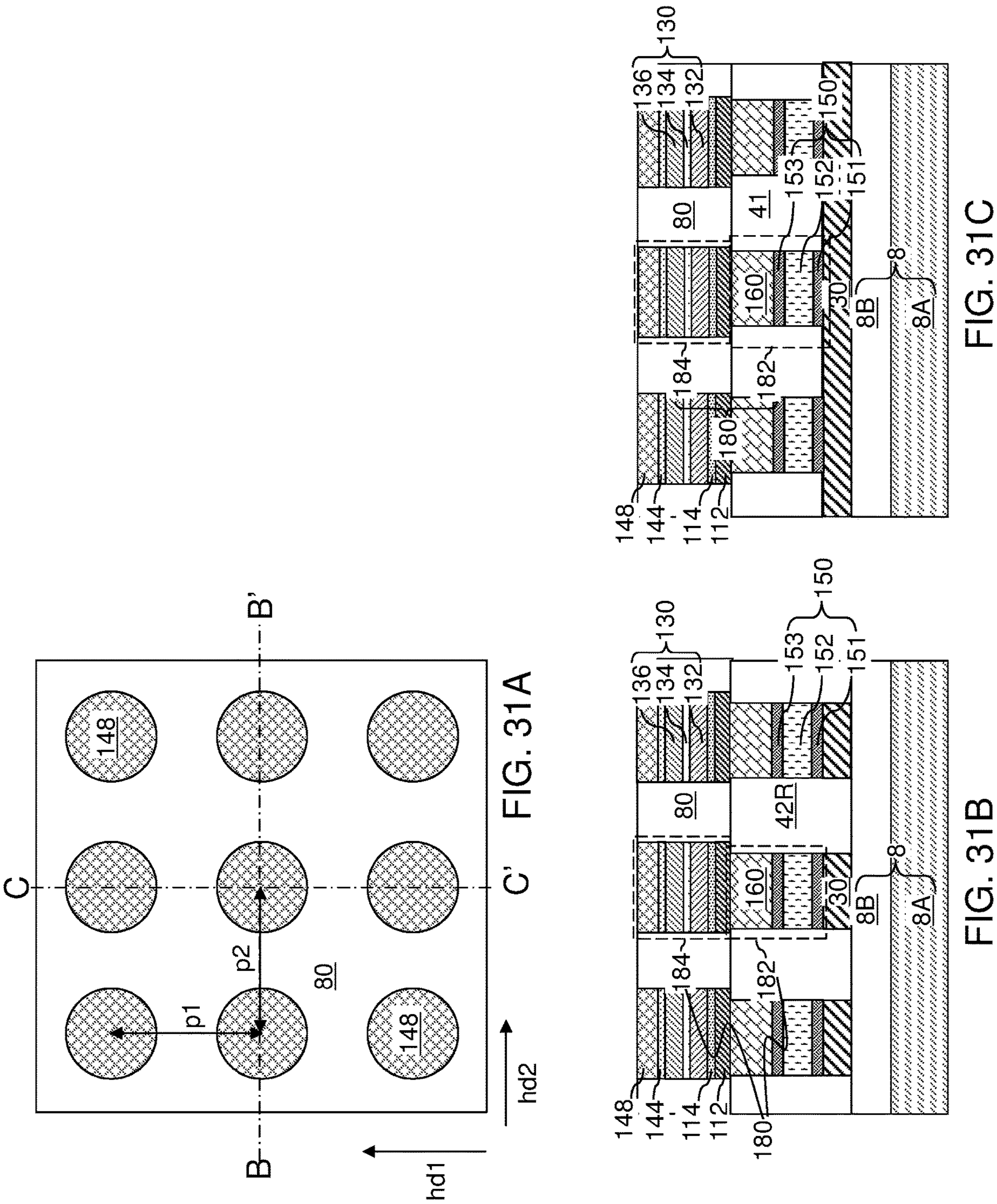
FIGS. 31A-31C are various views of the second exemplary structure after formation of a magnetic-tunnel-junction-level (MTJ-level) dielectric matrix layer according to the second embodiment of the present disclosure.

Referring to FIGS. 31A-31C, a dielectric fill material can be deposited in the gaps between neighboring pairs of the first MTJ pillar structures 184. Portions of the dielectric fill material underlying the horizontal plane including the top surfaces of the first MTJ pillar structures 184 can be removed by a planarization process such as a chemical mechanical polishing process. The remaining contiguous portion of the dielectric fill material located underneath the horizontal plane including the top surfaces of the first MTJ pillar structures 184 comprises a dielectric matrix layer, which is herein referred to as a first magnetic-tunnel-junction-level (MTJ-level) dielectric matrix layer 80.

Figures 32A, 32B, 32C:
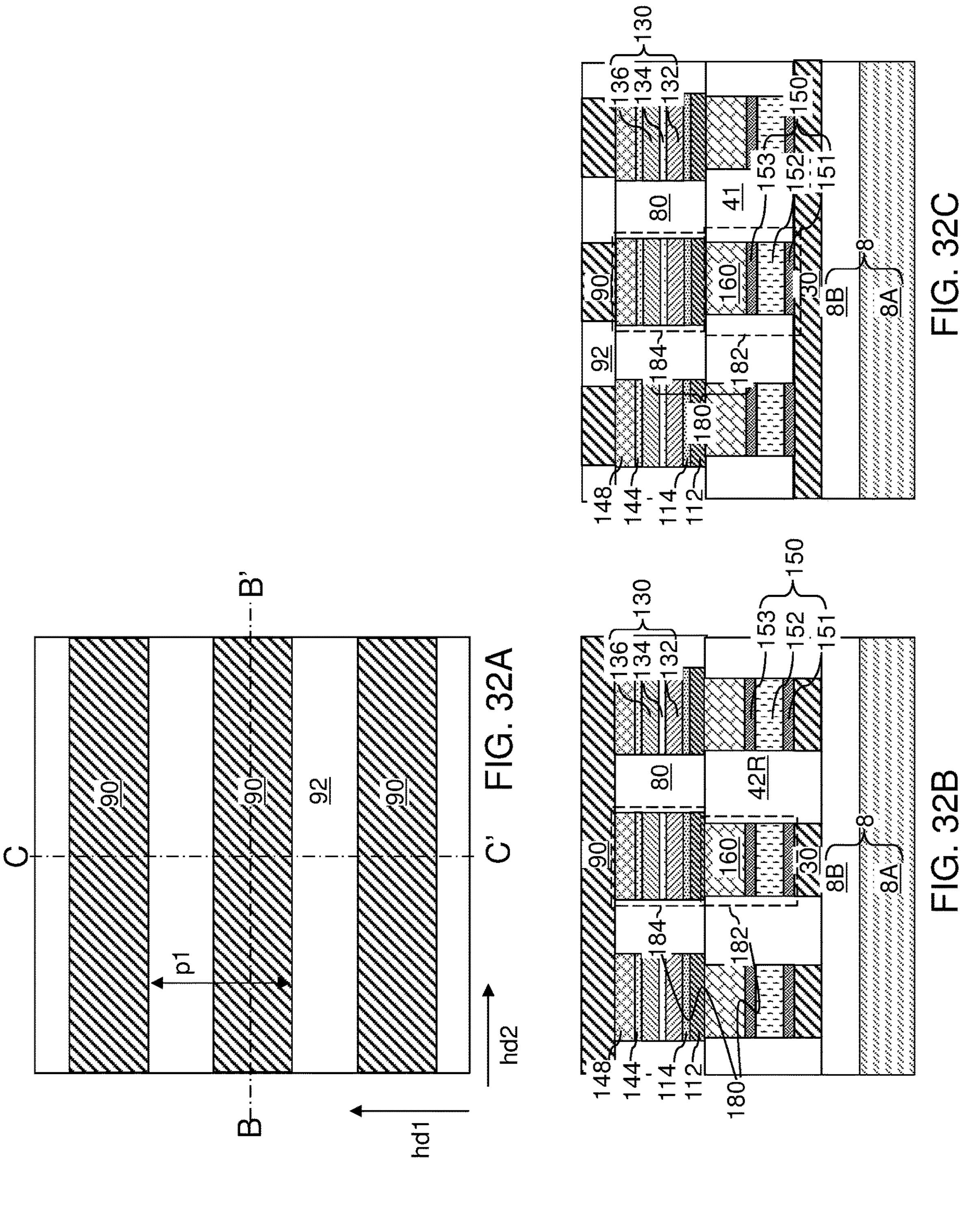
FIGS. 32A-32C are various views of the second exemplary structure after formation of second electrically conductive lines according to the second embodiment of the present disclosure.

Referring to FIGS. 32A-32C, a dielectric material can be deposited over the two-dimensional array of first MTJ pillar structures 184 to form a line-level dielectric layer 92. Line trenches laterally extending along the second horizontal direction hd2 can be formed through the line-level dielectric layer 92 above each column of MTJ pillar structures 184 arranged along the second horizontal direction hd2. A conductive material can be deposited in the line trenches, and excess portions of the conductive material can be removed from above the horizontal plane including the top surface of the line-level dielectric layer 92. Remaining portions of the conductive material filling the line trenches constitute second electrically conductive lines 90. The second electrically conductive lines 90 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrically conductive lines 90 can be in a range from 20 nm to 100 nm, although lesser and greater thicknesses can also be employed.

Alternatively, instead of using the above described damascene process to form the second electrically conductive lines 90, these lines may be formed by a pattern and etch process. In the pattern and etch process, a continuous electrically conductive layer is patterned into the second electrically conductive lines 90 by photolithography and etching.

Alternatively, the processing steps of FIGS. 24A-24C, 25A-25C, 26A-26C, 27A-27C, 28A-28C, 29A-29C, 30A-30C, and 31A-31C can be performed with a 90 degree rotation in all patterns to form a two-dimensional array of second memory cells (not illustrated) over the two-dimensional array of first memory cells 180. In this case, the processing steps of FIGS. 22A-22C can be subsequently performed to form a second magnetic-tunnel-junction-level (MTJ-level) dielectric matrix layer (not shown), a line-level dielectric layer (not shown), and third electrically conductive lines (not shown).

Figure 33A:
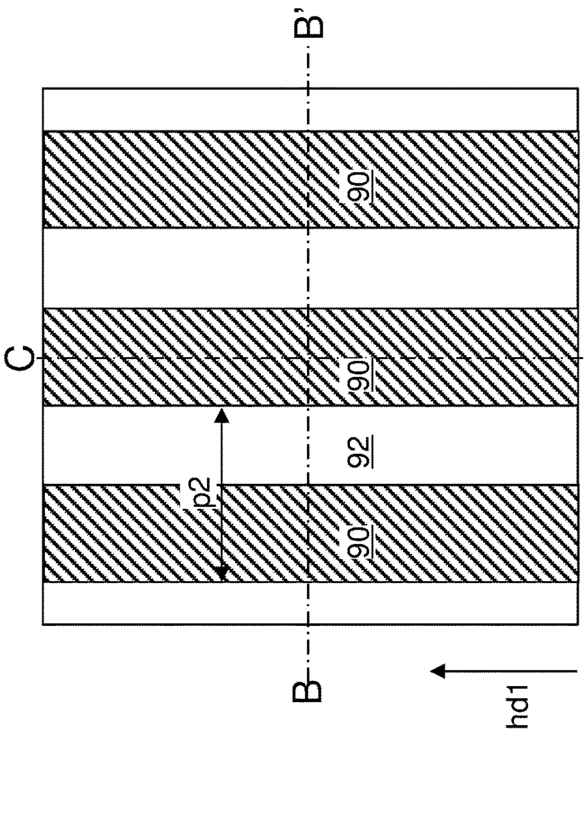
FIGS. 33A-33C are various views of a first alternative configuration of the second exemplary structure according to the second embodiment of the present disclosure.
Figure 33B:
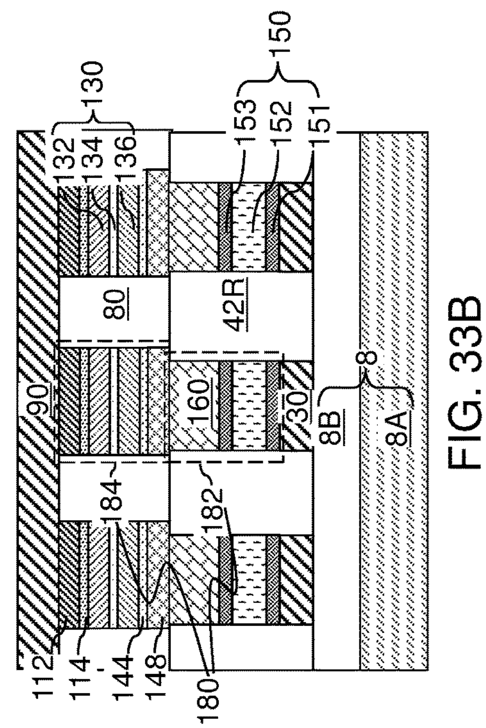
Figure 33C:
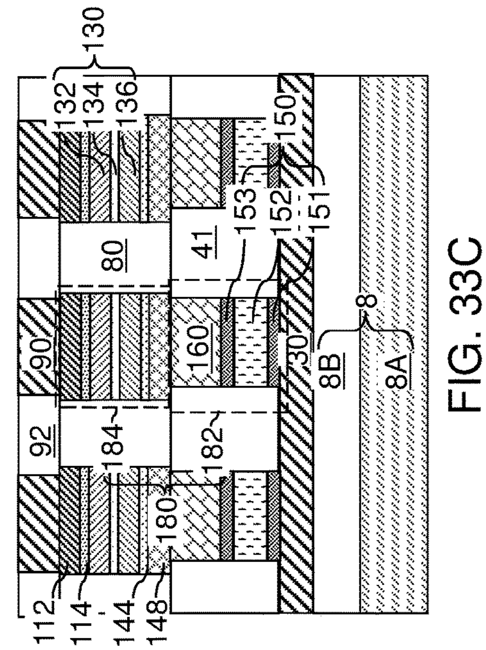

Referring to FIGS. 33A-33C, a first alternative configuration of the second exemplary structure may be derived from the second exemplary structure illustrated in FIGS. 32A-32C by reversing the order of the vertical stack of material layers within each of the first MTJ pillar structures 184.

Figure 34A:
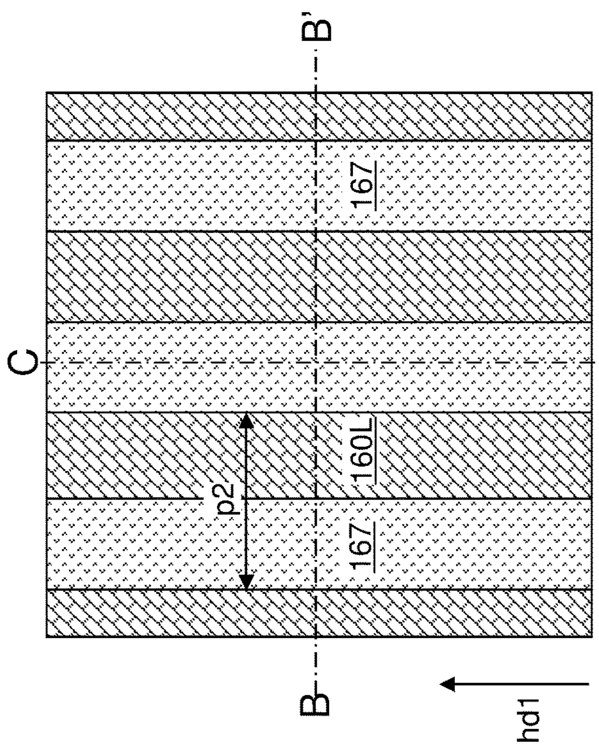
FIGS. 34A-34C are various views of a second alternative configuration of the second exemplary structure after formation of a layer stack comprising a first electrically conductive layer, first selector-level material layers, and a first conductive material layer and formation of a first patterned photoresist layer according to a second embodiment of the present disclosure.
Figure 34B:
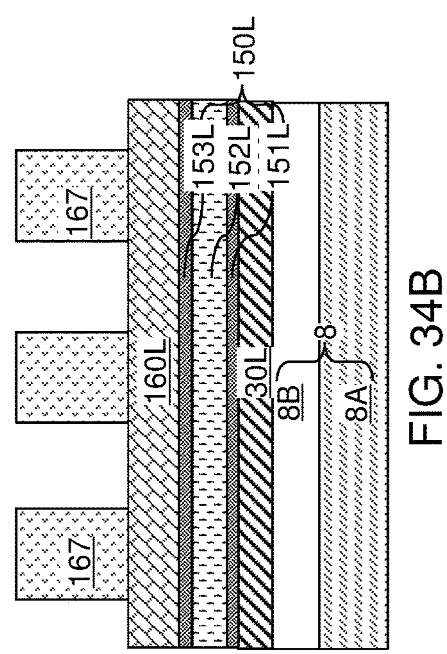
Figure 34C:
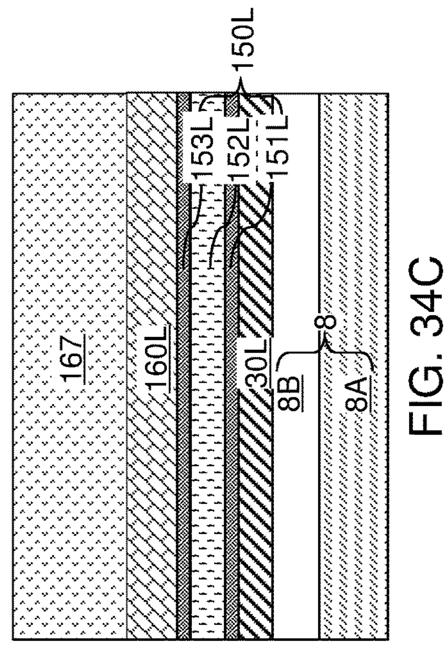

Referring to FIGS. 34A-34C, a second alternative configuration of the second exemplary structure is shown, which may be derived from the second exemplary structure illustrated in FIGS. 24A-24C by modifying the pattern of the first patterned photoresist layer 167. Specifically, the pattern of the first patterned photoresist layer 167 employed in the second alternative configuration of the second exemplary structure at the processing steps of FIGS. 34A-34C can be the same as the pattern of the second patterned photoresist layer 169 that is employed at the processing steps of FIGS. 27A-27C.

Figure 35A:
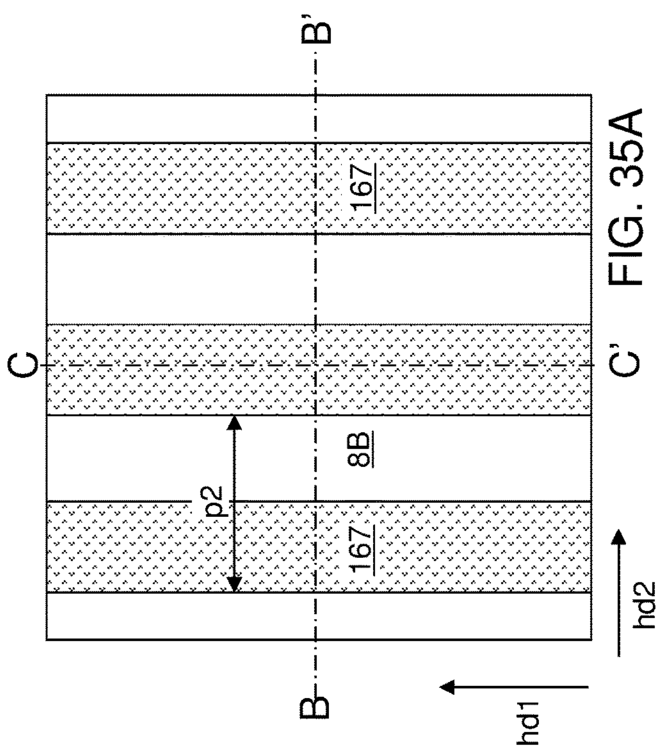
FIGS. 35A-35C are various views of the second alternative configuration of the second exemplary structure after formation of selector rail structures and first electrically conductive lines according to the second embodiment of the present disclosure.
Figure 35B:
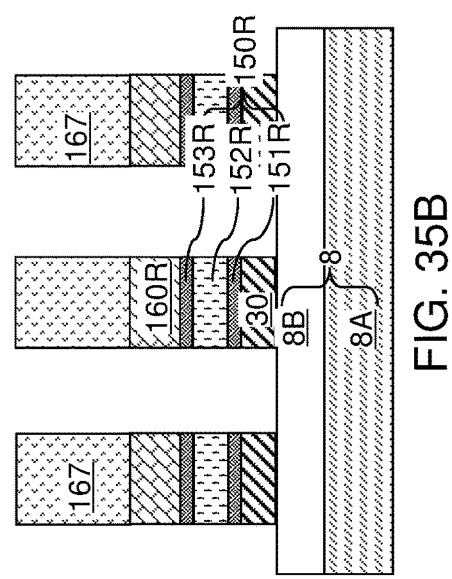
Figure 35C:
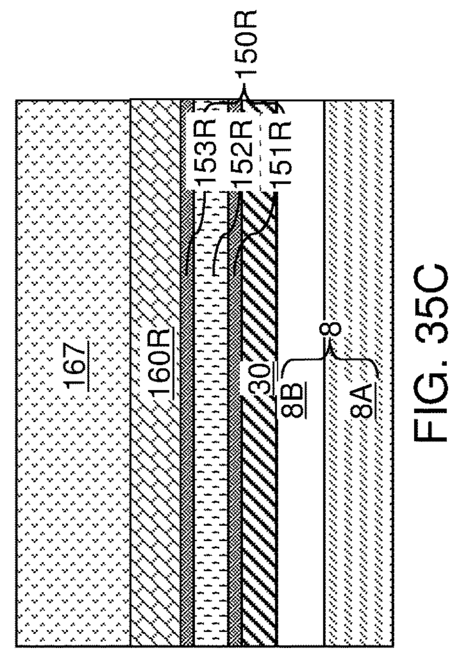

Referring to FIGS. 35A-35C, the processing steps of FIGS. 25A-25C can be performed with a modification to the first anisotropic etch process. Specifically, the first anisotropic etch process includes an additional etch step that patterns the first electrically conductive layer 30L into first electrically conductive lines 30. Patterned portions of the first hardmask layer 160L and the first selector material layers 150L comprise first selector rail structures (150R, 160R) that laterally extend along the first horizontal direction hd1 and are laterally spaced apart along the second horizontal direction hd2. Each first selector rail structure (150R, 160R) comprises a first selector-level rail 150R that is a patterned portion of the first selector material layers 150L, and a first hardmask rail 160R that is a patterned portion of the first hardmask layer 160L.

The first electrically conductive lines 30 laterally extend along the first horizontal direction hd1 and are laterally spaced apart along the second horizontal direction hd2. The first electrically conductive lines 30 may have straight sidewalls that laterally extend along the first horizontal direction hd1, and may be laterally spaced apart along the second horizontal direction hd2. The first electrically conductive lines 30 can be formed as a periodic one-dimensional array of first electrically conductive lines 30 having the periodicity of the second pitch p2 along the second horizontal direction. The first patterned photoresist layer 167 can be subsequently removed, for example, by ashing.

Figure 36A:
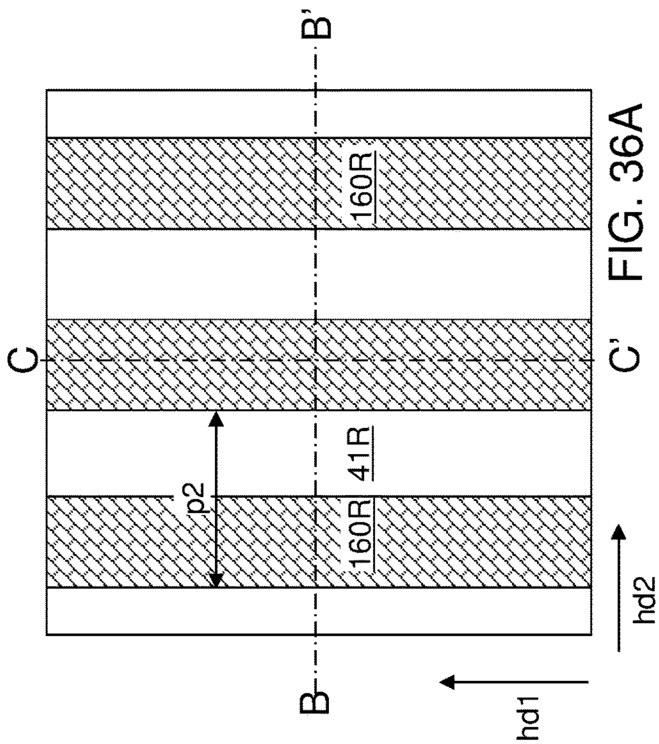
FIGS. 36A-36C are various views of the second alternative configuration of the second exemplary structure after formation of first selector-level isolation rails according to the second embodiment of the present disclosure.
Figure 36B:
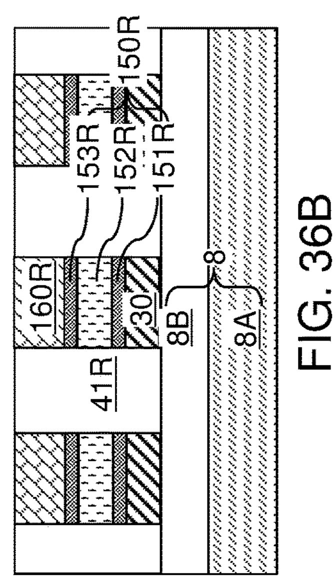
Figure 36C:
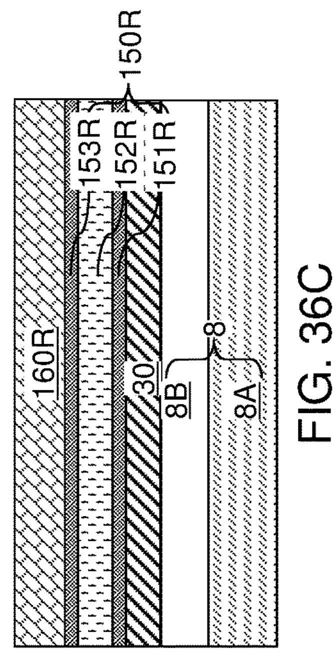

Referring to FIGS. 36A-36C, a dielectric fill material can be deposited in the gaps between neighboring pairs of first selector rail structures (150R, 160R). Excess portions of the dielectric fill material can be removed from above the horizontal plane including the top surfaces of the first selector rail structures (150R, 160R) by performing a planarization process such as a chemical mechanical polishing process. Remaining portions of the dielectric fill material are herein referred to as first selector-level isolation rails 41R.

Figure 37A:
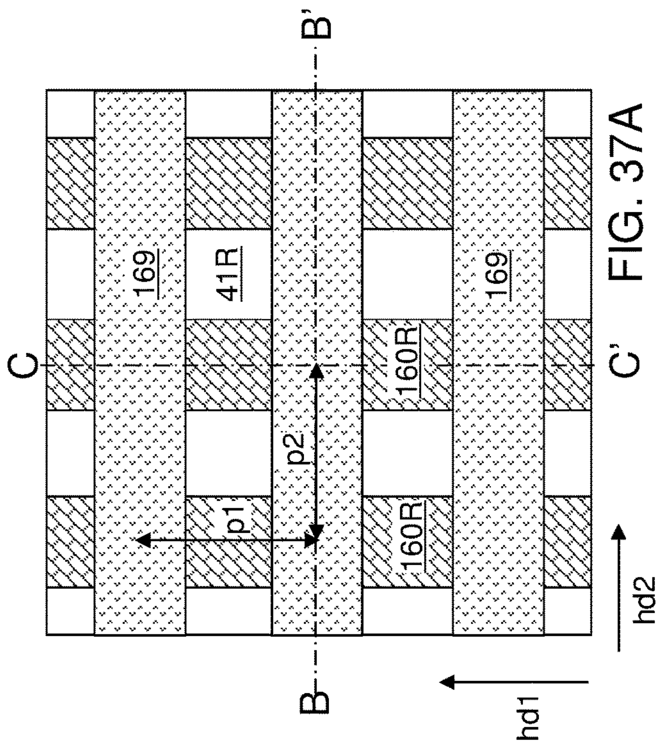
FIGS. 37A-37C are various views of the second alternative configuration of the second exemplary structure after formation of a second patterned photoresist layer according to the second embodiment of the present disclosure.
Figure 37B:
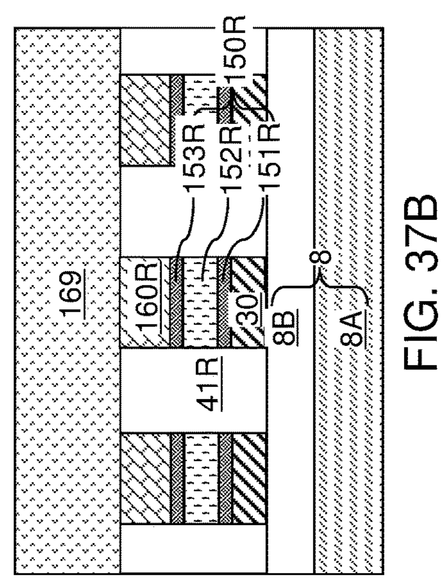
Figure 37C:
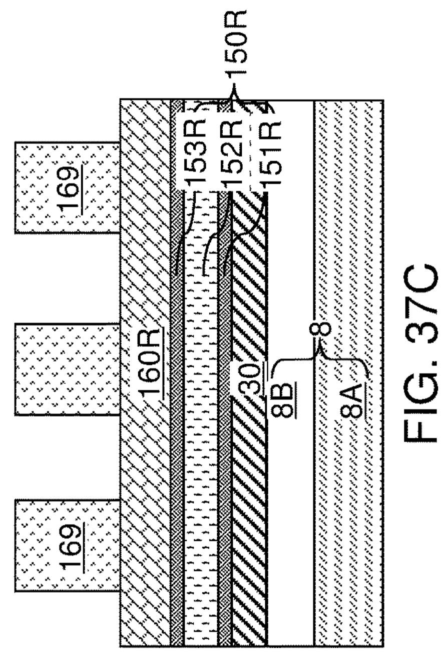

Referring to FIGS. 37A-37C, the processing steps of FIGS. 27A-27C can be performed to form second patterned photoresist layer 169, which can have the same pattern as the first patterned photoresist layer 167 illustrated in FIGS. 24A-24C.

Figure 38A:
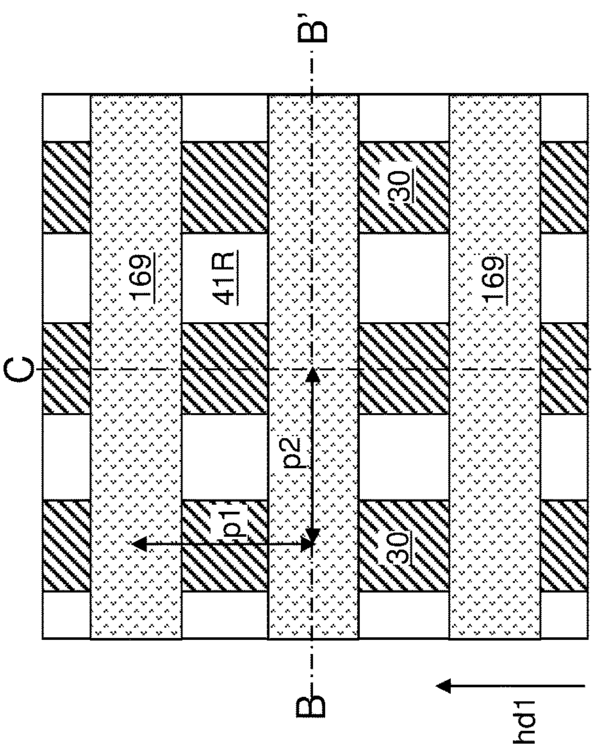
FIGS. 38A-38C are various views of the second alternative configuration of the second exemplary structure after formation of a two-dimensional array of selector-containing pillar structures according to the second embodiment of the present disclosure.
Figure 38B:
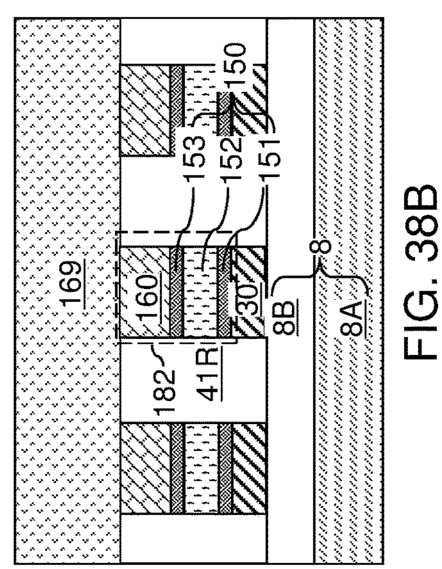
Figure 38C:
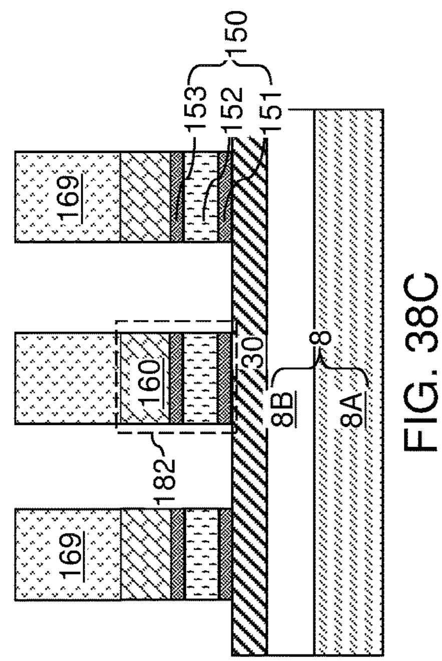

Referring to FIGS. 38A-38C, the processing steps of FIGS. 28A-28C can be performed with a modification such that the second anisotropic etch process etches the materials of the first selector rail structures (150R, 160R) and the first selector-level isolation rails 41R selective to the material of the first electrically conductive lines 30 employing the second patterned photoresist layer 169 as an etch mask.

Patterned portions of the first selector rail structures (150R, 160R) comprise a two-dimensional array of first selector-containing pillar structures 182. Each first selector-containing pillar structure 182 can include a first selector element 150 and a first hardmask plate 160. Each first selector element 150 is a patterned portion of the first selector material layers 150L, and each first hardmask plate 160 is a patterned portion of the first hardmask layer 160L. Each first selector element 150 may include a vertical stack of a first lower selector electrode 151, a first non-Ohmic material plate 152, and a first upper selector electrode 153. Each first lower selector electrode 151 is a patterned portion of the first lower selector electrode material layer 151L. Each first non-Ohmic material plate 152 is a patterned portion of the first non-Ohmic material layer 152L. Each first upper selector electrode 153 is a patterned portion of the first upper selector electrode material layer 153L.

The first selector-level isolation rails 41R can be patterned such that each of the first selector-level isolation rails 41R includes a repetition of indentations having the periodicity of the first pitch p1 along the first horizontal direction hd1. The indentations can be formed in each area of the first selector-level isolation rails 41R that are not masked by the second patterned photoresist layer 169. Line trenches are present between each neighboring columns of first selector-containing pillar structures 182 that are arranged along the second horizontal direction hd2. The second patterned photoresist layer 169 can be subsequently removed, for example, by ashing.

Generally, one or more pattern transfer processes can be employed to form a two-dimensional array of first selector-containing pillar structures 182. In one embodiment, the one or more pattern transfer processes may comprise a first line-pattern-transfer process and a second line-pattern-transfer process. In one embodiment, a first line-and-space pattern is transferred during the first line-pattern-transfer process through the first selector material layers 150L and the first electrically conductive layer 30L to pattern the first selector-level material layers 150L into first selector rail structures 150R that laterally extend along the first horizontal direction hd1 and are laterally spaced apart along the second horizontal direction hd2 and to pattern the first electrically conductive layer 30L into the first electrically conductive lines 30. During the second line-pattern-transfer process, a second line-and-space pattern is transferred through the first selector rail structures 150R to pattern the first selector rail structures 150R into a two-dimensional array of selector elements 150.

Figure 39C:
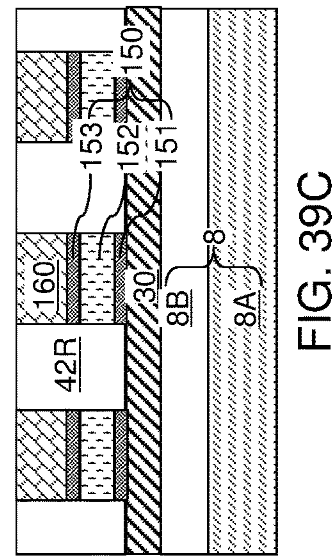
FIGS. 39A-39C are various views of the second alternative configuration of the second exemplary structure after formation of second selector-level isolation rails according to the second embodiment of the present disclosure.
Figure 39A:
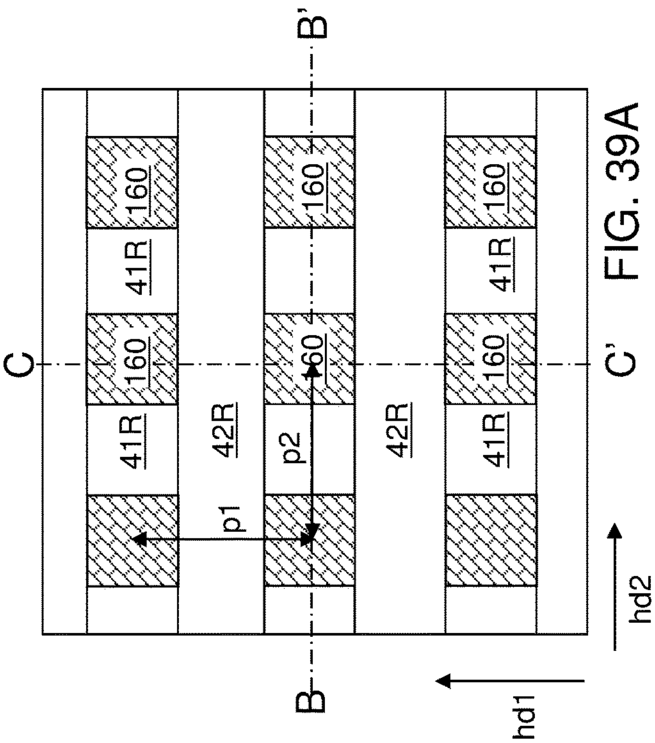
Figure 39B:
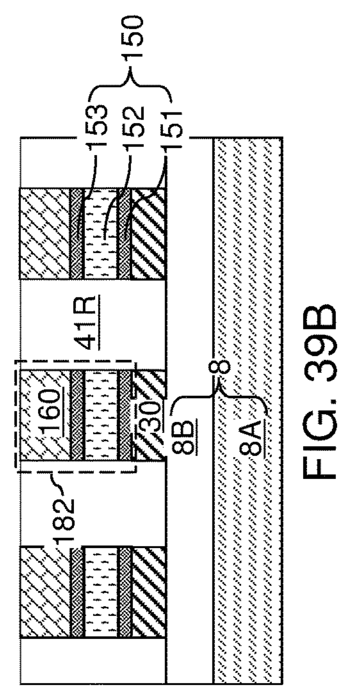

Referring to FIGS. 39A-39C, a dielectric fill material can be deposited in the line trenches between each neighboring columns of first selector-containing pillar structures 182 that are laterally spaced apart along the first horizontal direction hd1. Excess portions of the dielectric fill material can be removed from above the horizontal plane including the top surfaces of the first selector-containing pillar structures 182 by performing a planarization process such as a chemical mechanical polishing process. Remaining portions of the dielectric fill material are herein referred to as second selector-level isolation rails 42R. Each second selector-level isolation rail 42R may laterally extend along the second horizontal direction hd2, and may be laterally spaced apart along the first horizontal direction hd1. The second selector-level isolation rails 42R may be arranged as a one-dimensional periodic array having the periodicity of the first pitch p1 along the first horizontal direction hd1.

In an alternative configuration, the CMP process is continued to also remove the first hardmask plates 160 and to expose the upper surface of the first upper selector electrodes 153, similar to the step shown in FIGS. 9D-9F. In this alternative configuration, the first hardmask plates 160 may comprise an insulating material, such as silicon nitride or metal oxide, and at least an upper portion of the first upper selector electrodes 153 may comprise a metal or metal alloy rather than a carbon based material. Thus, the CMP does not damage the carbon material of the first upper selector electrodes 153.

Generally, dielectric fill material portions (41R, 42R) can be formed during processing steps for manufacturing the second exemplary structure between rows of selector-containing pillar structures 182 arranged along the first horizontal direction hd1, and/or between columns of selector-containing pillar structures 182 arranged along the second horizontal direction hd2. Top surfaces of the dielectric fill material portions (41R, 42R) are formed within a horizontal plane including top surfaces of the two-dimensional array of selector-containing pillar structures 182.

Figure 40A:
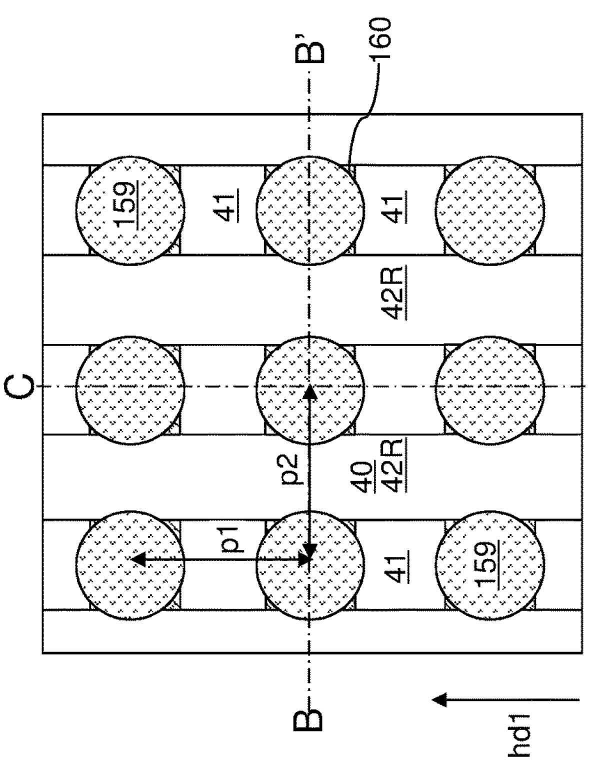
FIGS. 40A-40C are various views of the second alternative configuration of the second exemplary structure after formation of a two-dimensional array of magnetic tunnel junction (MTJ) pillar structures according to the second embodiment of the present disclosure.
Figure 40B:
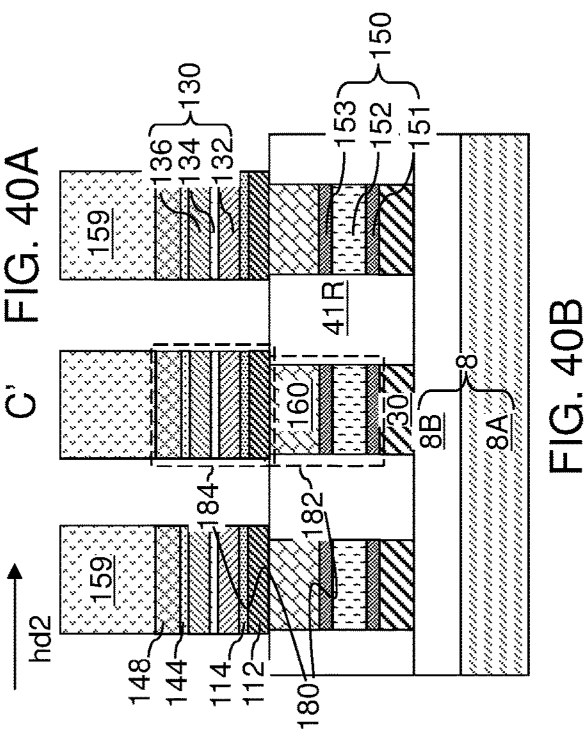
Figure 40C:
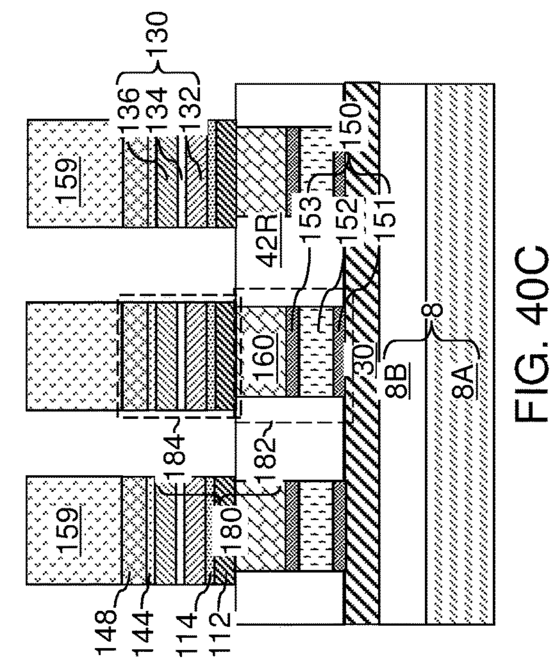

Referring to FIGS. 40A-40C, the processing steps of FIGS. 10A-10C, 11A-11C, and 12A-12C can be performed to form a two-dimensional array of first magnetic tunnel junction (MTJ) pillar structures 184 over the two-dimensional array of first selector-containing pillar structures 182. Each contiguous combination of a first selector-containing pillar structure 182 and a first MTJ pillar structure 184 constitutes a first memory cell 180, which can function as a memory cell 180 described with reference to FIG. 2.

Figure 41A:
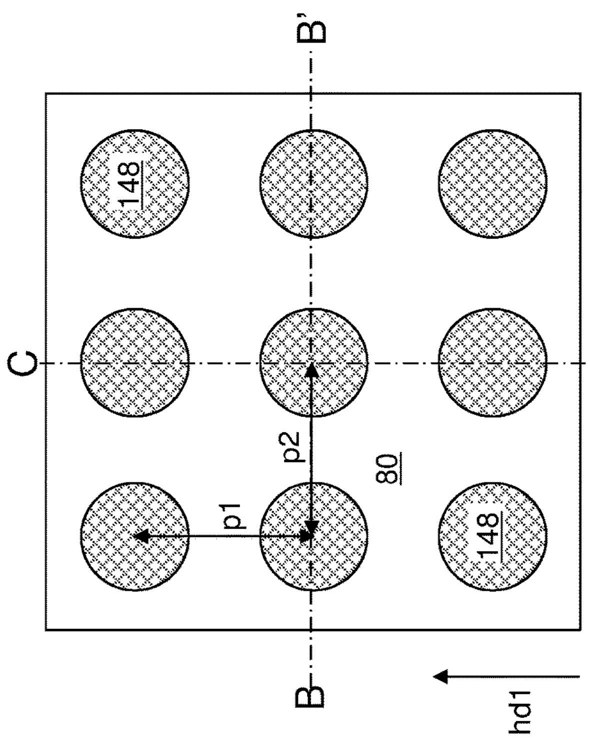
FIGS. 41A-41C are various views of the second alternative configuration of the second exemplary structure after formation of a magnetic-tunnel-junction-level (MTJ-level) dielectric matrix layer according to the second embodiment of the present disclosure.
Figure 41B:
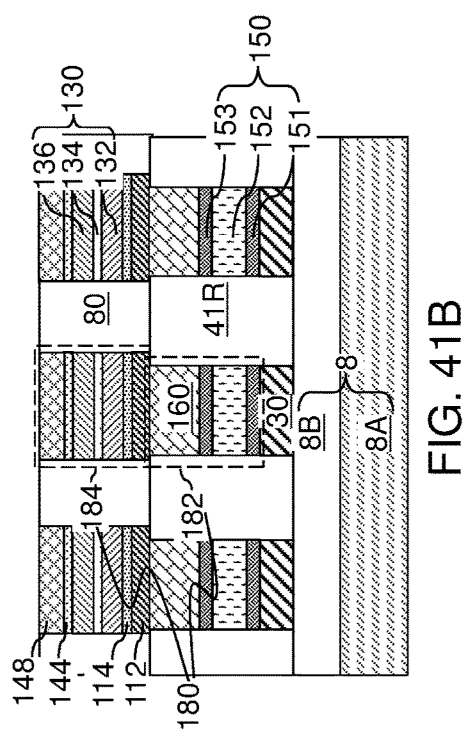
Figure 41C:
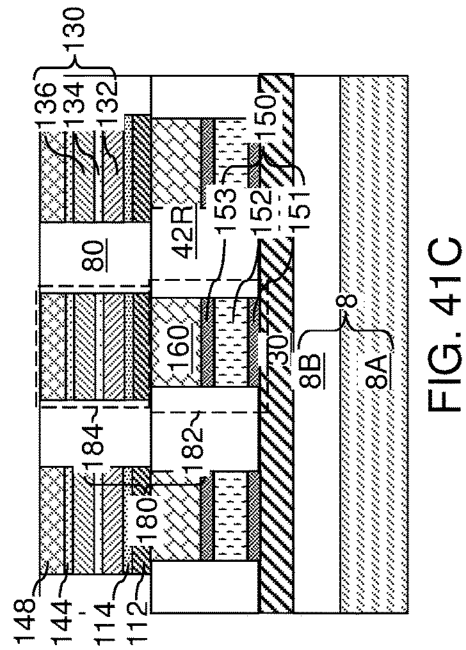

Referring to FIGS. 41A-41C, a dielectric fill material can be deposited in the gaps between neighboring pairs of the first MTJ pillar structures 184. Portions of the dielectric fill material underlying the horizontal plane including the top surfaces of the first MTJ pillar structures 184 can be removed by a planarization process such as a chemical mechanical polishing process. The remaining contiguous portion of the dielectric fill material located underneath the horizontal plane including the top surfaces of the first MTJ pillar structures 184 comprises a dielectric matrix layer, which is herein referred to as a first magnetic-tunnel-junction-level (MTJ-level) dielectric matrix layer 80.

Figure 42A:
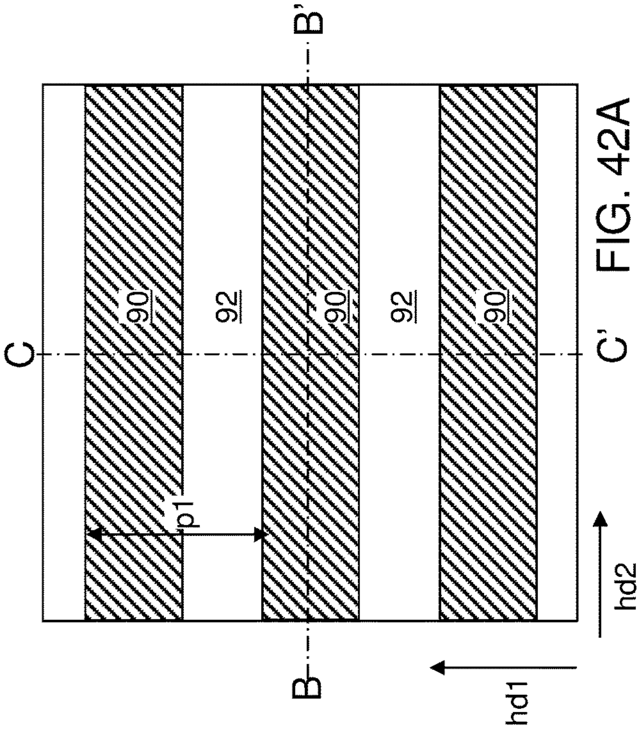
FIGS. 42A-42C are various views of the second alternative configuration of the second exemplary structure after formation of second electrically conductive lines according to the second embodiment of the present disclosure.
Figure 42B:
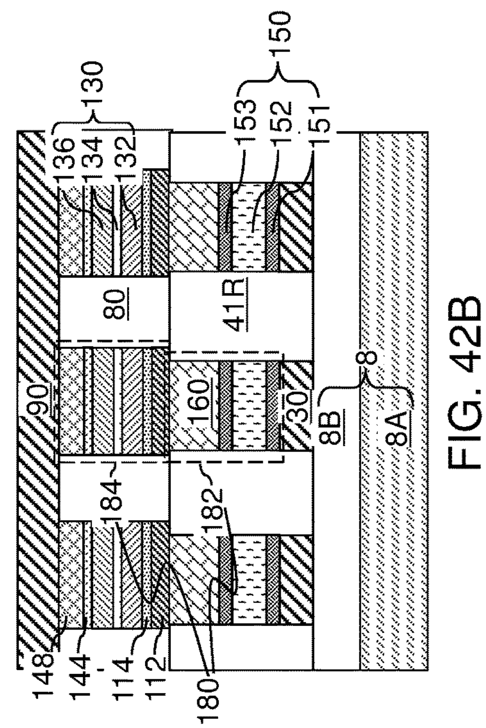
Figure 42C:
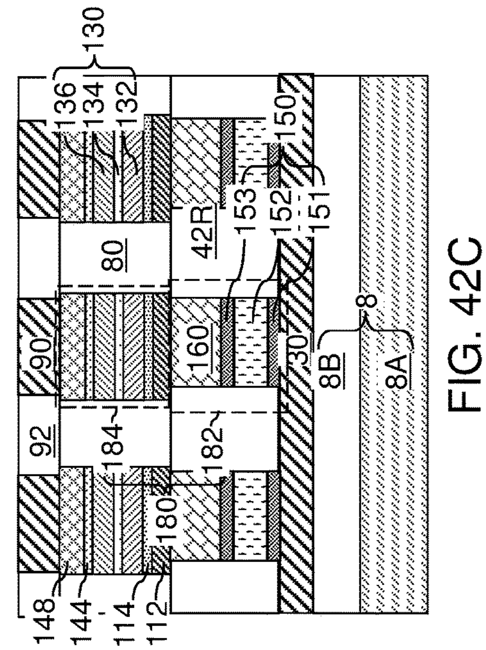

Referring to FIGS. 42A-42C, a dielectric material can be deposited over the two-dimensional array of first MTJ pillar structures 184 to form a line-level dielectric layer 92. Line trenches laterally extending along the second horizontal direction hd2 can be formed through the line-level dielectric layer 92 above each column of MTJ pillar structures 184 arranged along the second horizontal direction hd2. A conductive material can be deposited in the line trenches, and excess portions of the conductive material can be removed from above the horizontal plane including the top surface of the line-level dielectric layer 92. Remaining portions of the conductive material filling the line trenches constitute second electrically conductive lines 90. The second electrically conductive lines 90 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrically conductive lines 90 can be in a range from 20 nm to 100 nm, although lesser and greater thicknesses can also be employed.

Alternatively, instead of using the above described damascene process to form the second electrically conductive lines 90, these lines may be formed by a pattern and etch process. In the pattern and etch process, a continuous electrically conductive layer is patterned into the second electrically conductive lines 90 by photolithography and etching.

Alternatively, the processing steps of FIGS. 24A-24C, 25A-25C, 26A-26C, 27A-27C, 28A-28C, 29A-29C, 30A-30C, and 31A-31C can be performed with a 90 degree rotation in all patterns to form a two-dimensional array of second memory cells (not illustrated) over the two-dimensional array of first memory cells 180. In this case, the processing steps of FIGS. 22A-22C can be subsequently performed to form a second magnetic-tunnel-junction-level (MTJ-level) dielectric matrix layer (not shown), a line-level dielectric layer (not shown), and third electrically conductive lines (not shown).

Figure 43A:
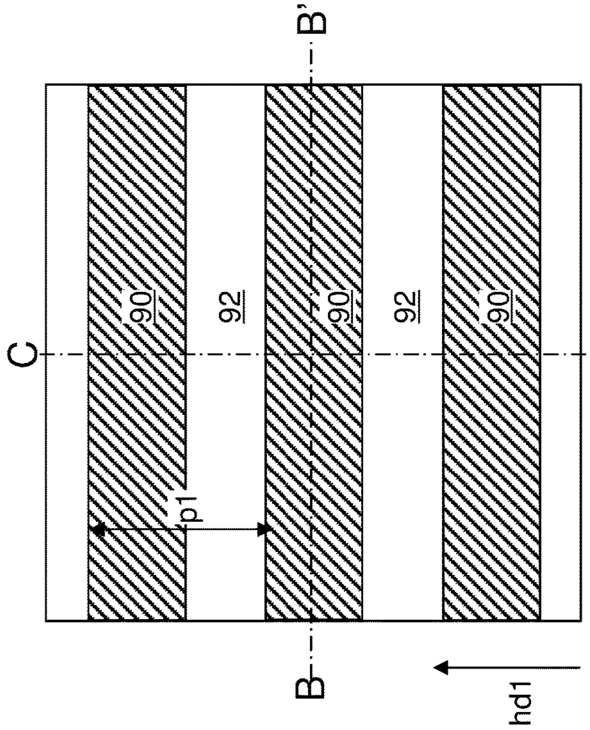
FIGS. 43A-43C are various views of a third alternative configuration of the second exemplary structure according to the second embodiment of the present disclosure.
Figure 43B:
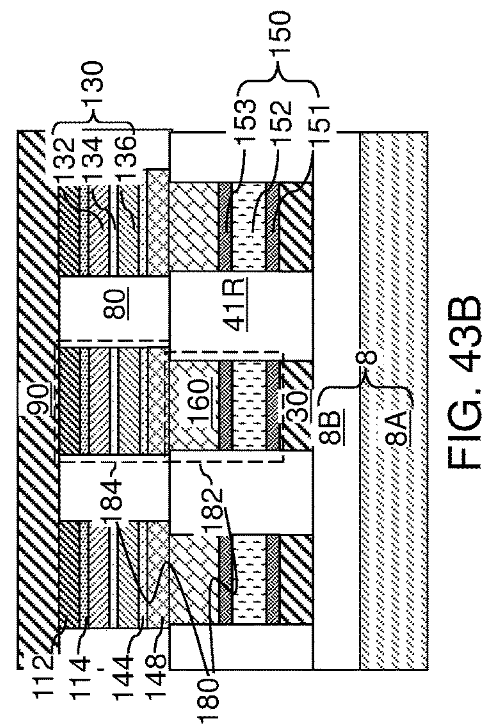
Figure 43C:
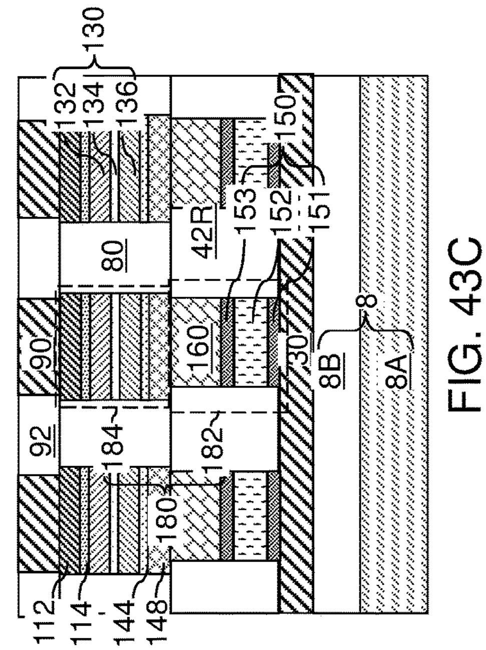

Referring to FIGS. 43A-43C, a third alternative configuration of the second exemplary structure may be derived from the second exemplary structure illustrated in FIGS. 42A-42C by reversing the order of the vertical stack of material layers within each of the first MTJ pillar structures 184.

Figure 44A:
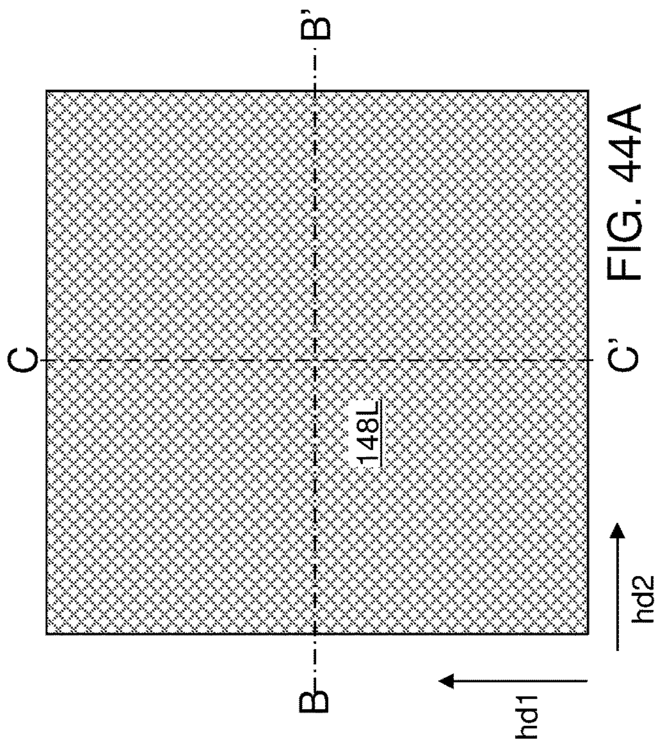
FIGS. 44A-44C are various views of a third exemplary structure after formation of a first electrically conductive layer and first magnetic tunnel junction material layers according to a third embodiment of the present disclosure.
Figure 44B:
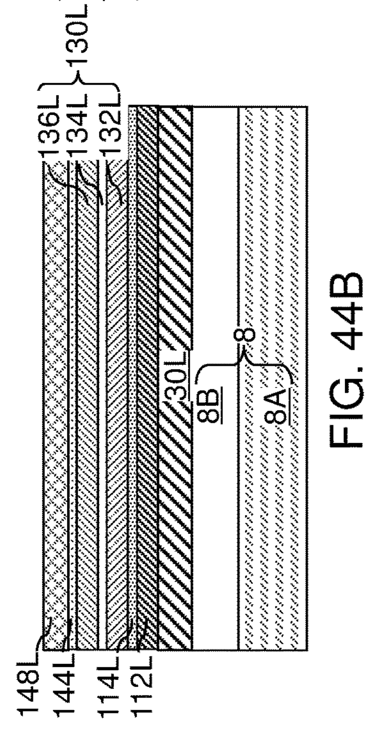
Figure 44C:
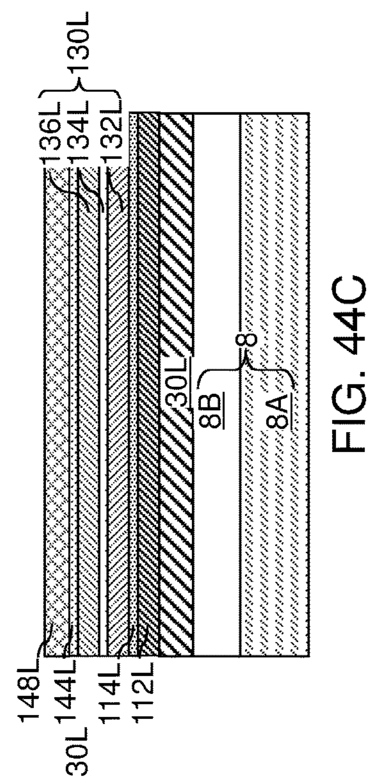

Referring to FIGS. 44A-44C, a third exemplary structure according to a third embodiment of the present disclosure can be derived from the first exemplary structure illustrated in FIGS. 3A-3C by forming first magnetic tunnel junction-level (MTJ-level) material layers (112L, 114L, 130L, 144L, 148L) described with reference to FIGS. 10A-10C in lieu of selector-level material layers (150L, 160L) described with reference to FIGS. 3A-3C. As described above, the first MTJ-level material layers (112L, 114L, 130L, 144L, 148L) comprise first magnetic tunnel junction (MTJ) material layers 130L. The first MTJ material layers 130L may comprises a layer stack including a first continuous reference layer 132L, a first continuous nonmagnetic tunnel barrier layer 134L, a first continuous free layer 136L. An optional seed layer 110 described above with respect to FIG. 2 may be formed below the superlattice layer 112L.

Figures 45A, 45B, 45C:
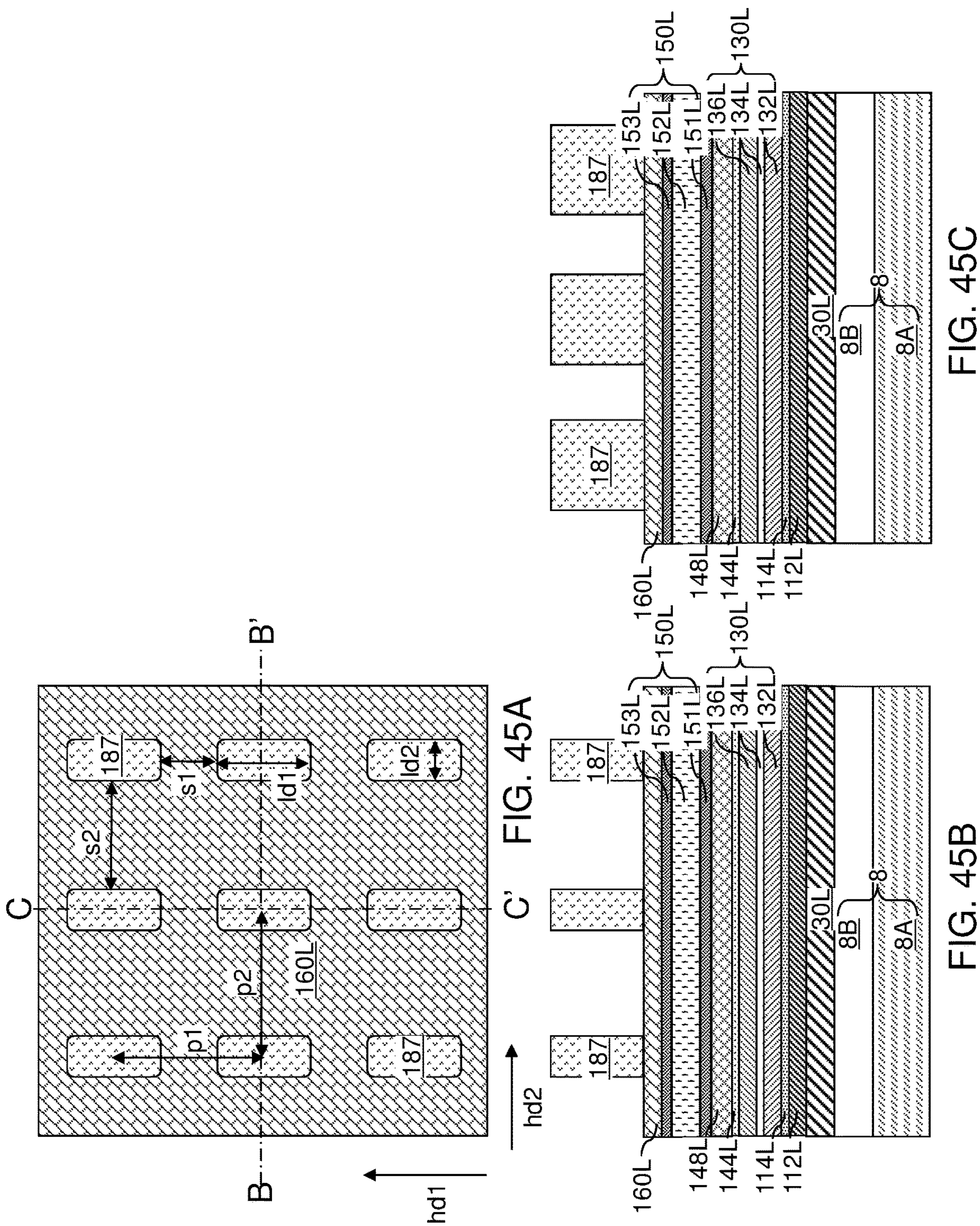
FIGS. 45A-45C are various views of the third exemplary structure after formation of first selector level material layers and a two-dimensional array of discrete photoresist material portions according to the third embodiment of the present disclosure.

Referring to FIGS. 45A-45C, first selector-level material layers (150L, 160L) including first selector material layers 150L and a first hardmask layer 160L described with reference to FIGS. 3A-3C can be formed over the first magnetic tunnel junction-level (MTJ-level) material layers (112L, 114L, 130L, 144L, 148L). In this embodiment, the first hardmask layer 160L may comprise a first conductive material layer which is retained in the final device. A photoresist layer can be deposited over the first conductive material layer 160L, and can be lithographically patterned to form a two-dimensional array of first discrete patterned photoresist material portions 187.

According to an aspect of the present disclosure, the two-dimensional array of first discrete patterned photoresist material portions 187 can be a periodic two-dimensional array having a first pitch p1 along a first horizontal direction hd1 and having a second pitch p2 along a second horizontal direction hd2. The first nearest-neighbor spacing s1 along the first horizontal direction hd1 of the two-dimensional array of first discrete patterned photoresist material portions 187 is less than the second nearest-neighbor spacing s2 along the second horizontal direction hd2 of the two-dimensional array of first discrete patterned photoresist material portions 187.

In an illustrative case, each of the first discrete patterned photoresist material portions 187 may have a first lateral dimension ld1 along the first horizontal direction hd1, and may have a second lateral dimension ld2 along the second horizontal direction hd2. Each of the first discrete patterned photoresist material portions 187 may have a respective horizontal cross-sectional shape of a rectangle, a rounded rectangle, an oval, or a circle. The nearest-neighbor spacing s1 between neighboring pairs of the first discrete patterned photoresist material portions 187 that are laterally spaced apart along the first horizontal direction hd1 can be the difference between the first pitch p1 and the first lateral dimension ld1. The nearest-neighboring spacing s2 between neighboring pairs of the first discrete patterned photoresist material portions 187 that are laterally spaced apart along the second horizontal direction hd2 can be the second pitch p2 less the second lateral dimension ld2. In this case, p1−ld1 is less than p2−ld2. In one embodiment, the second pitch p2 may be the same as the first pitch p1, and the first lateral dimension ld1 may be greater than the second lateral dimension ld2. In one embodiment, the pattern of the first discrete patterned photoresist material portions 187 may be the same as the pattern of the first discrete patterned photoresist material portions 157 described with reference to FIGS. 4A-4C.

Figures 46A, 46B, 46C:
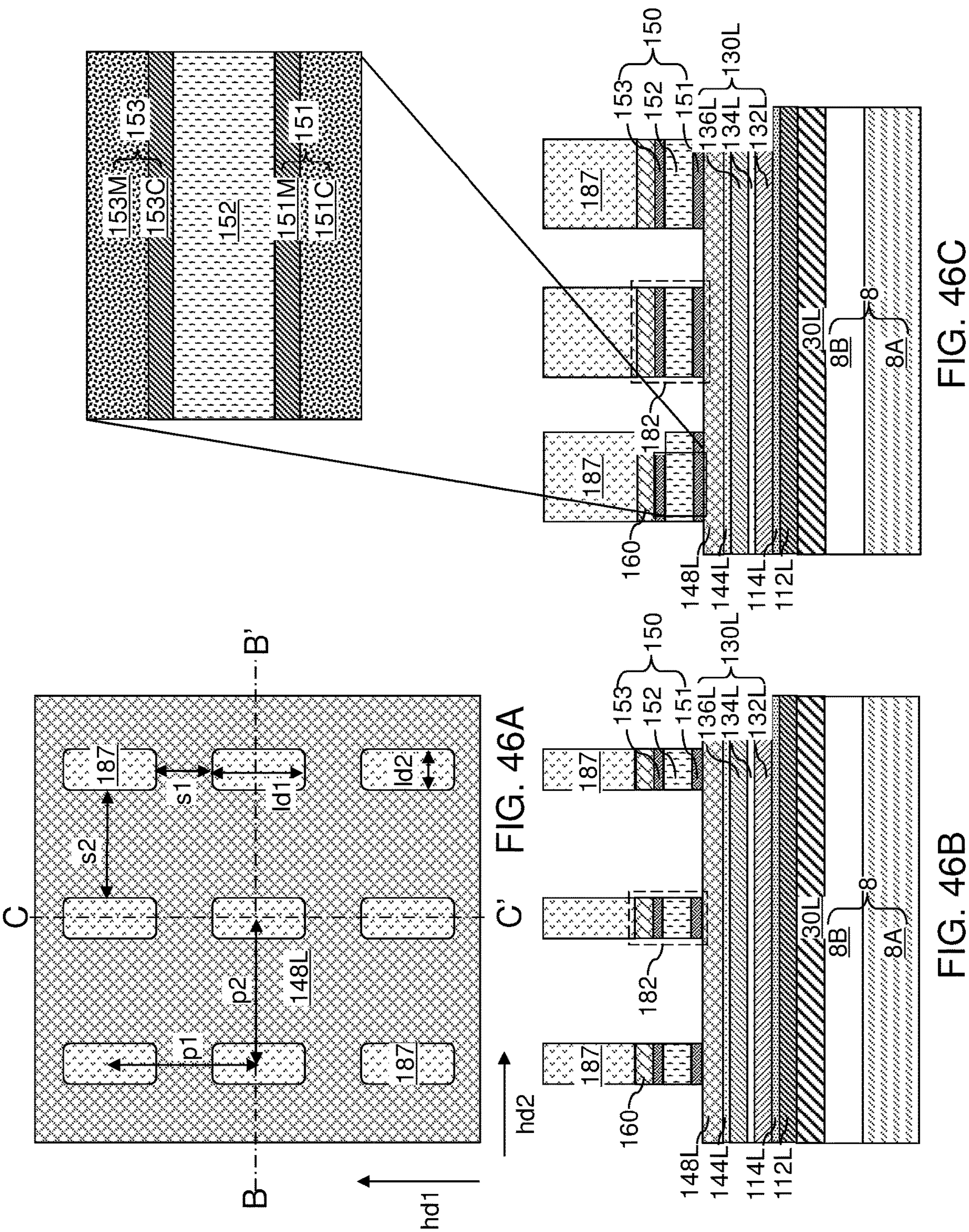
FIGS. 46A-46C are various views of the third exemplary structure after formation of a two-dimensional array of first selector-containing pillar structures according to the third embodiment of the present disclosure.

Referring to FIGS. 46A-46C, an array-pattern-transfer process can be performed to transfer the pattern of the two-dimensional array of first discrete patterned photoresist material portions 187 through the first conductive material layer 160L and the first selector material layers 150L. For example, an anisotropic etch process can be performed to transfer the pattern in the two-dimensional array of first discrete patterned photoresist material portions 187 through the first conductive material layer 160L and the first selector material layers 150L. The patterned remaining portions of the first conductive material layer 160L and the first selector material layers 150L can include two-dimensional array of first selector-containing pillar structures 182.

Each of the first selector-containing pillar structures 182 may comprise a first selector element 150 and a first conductive material plate 160. Each first selector element 150 is a patterned portion of the first selector material layers 150L, and each first conductive material plate 160 is a patterned portion of the first conductive material layer 160L. Each first selector element 150 may include a vertical stack of a first lower selector electrode 151, a first non-Ohmic material plate 152, and a first upper selector electrode 153. Each first lower selector electrode 151 is a patterned portion of the first lower selector electrode material layer 151L. Each first non-Ohmic material plate 152 is a patterned portion of the first non-Ohmic material layer 152L. Each first upper selector electrode 153 is a patterned portion of the first upper selector electrode material layer 153L.

In one embodiment, the two-dimensional array of first selector-containing pillar structures 182 comprises a two-dimensional periodic array of first selector-containing pillar structures 182 having the first pitch p1 along the first horizontal direction hd1 and having the second pitch p2 along the second horizontal direction hd2. The nearest-neighbor spacing s1 between neighboring pairs of the first selector-containing pillar structures 182 that are laterally spaced apart along the first horizontal direction hd1 is less than the nearest-neighboring spacing s2 between neighboring pairs of the first selector-containing pillar structures 182 that are laterally spaced apart along the second horizontal direction hd2.

In one embodiment, each first selector-containing pillar structure 182 within the two-dimensional array of first selector-containing pillar structures 182 has a respective elongated horizontal cross-sectional shape having a first lateral dimension ld1 along the first horizontal direction hd1 and having a second lateral dimensional ld2 along the second horizontal direction hd2 that is less than the first lateral dimension ld1. In one embodiment, the ratio of the first lateral dimension ld1 to the second lateral dimension ld2 may be in a range from 1.2 to 4, such as from 1.5 to 3. The two-dimensional array of first selector-containing pillar structures 182 can be formed over the first electrically conductive layer 30L.

Referring to FIGS. 47A-47D, an ion beam etch process can be performed to etch unmasked portions of the layer stack (112L, 114L, 130L, 144L, 148L) employing the two-dimensional array of second discrete patterned photoresist material portions 187 and/or the array of first conductive material plates (i.e., hardmask plates) 160 as an etch mask. In other words, the second discrete patterned photoresist material portions 187 may be removed during or after formation of the first conductive material plates 160. The ion beam etch of the layer stack then proceeds using the first conductive material plates 160 as a mask. Alternatively, the second discrete patterned photoresist material portions 187 are retained as a mask during the ion beam etch of the layer stack.

Figures 47A, 47B, 47C, 47D:
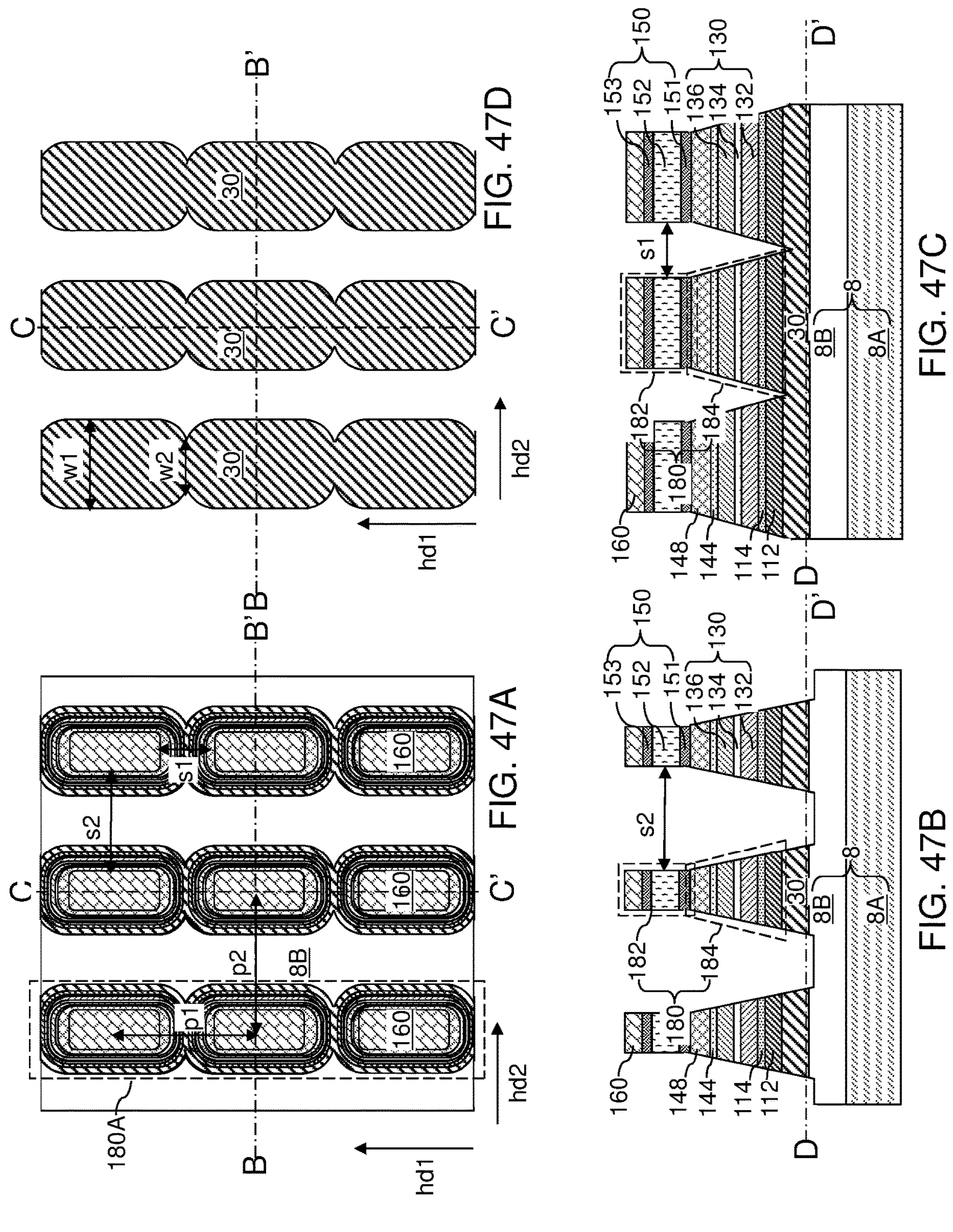
FIGS. 47A-47D are various views of the third exemplary structure after formation of a two-dimensional array of first magnetic tunnel junction pillar structures and first electrically conductive lines according to the third embodiment of the present disclosure.

In one embodiment shown in FIG. 47C, the ion beam etch process etches the first continuous metallic capping layer 148L, the first continuous dielectric capping layer 144L, the first continuous MTJ material layers 130L, the optional first continuous antiferromagnetic coupling layer 114L, and the first continuous superlattice layer 112L. Each patterned portion of the layer stack (112L, 114L, 130L, 144L, 148L) comprises a first magnetic tunnel junction (MTJ) pillar structure 184. A two-dimensional array of first magnetic tunnel junction (MTJ) pillar structures 184 can be formed underneath the two-dimensional array of first selector-containing pillar structures 182. Each contiguous combination of a first selector-containing pillar structure 182 and a first MTJ pillar structure 184 constitutes a first memory cell 180, which can function as a memory cell 180 described with reference to FIG. 2.

Each first MTJ pillar structure 184 comprises a stack of a first superlattice layer 112, a first antiferromagnetic coupling layer 114, a first magnetic tunnel junction 130, a first dielectric capping layer 144, and a first metallic capping layer 148. The first magnetic tunnel junction 130 includes a first reference layer 132, a first tunnel barrier layer 134, and a first free layer 136. Each first superlattice layer 112 is a patterned portion of the first continuous superlattice layer 112L. Each first antiferromagnetic coupling layer 114 is a patterned portion of the first continuous antiferromagnetic coupling layer 114L. Each first magnetic tunnel junction 130 is a patterned portion of the first magnetic tunnel junction material layers 130L. Each first dielectric capping layer 144 is a patterned portion of the first continuous dielectric capping layer 144L. Each first metallic capping layer 148 is a patterned portion of the first continuous metallic capping layer 148L. Each first reference layer 132 is a patterned portion of the first continuous reference layer 132L. Each first tunnel barrier layer 134 is a patterned portion of the first continuous tunnel barrier layer 134L. Each first free layer 136 is a patterned portion of the first continuous free layer 136L.

According to an aspect of the present disclosure, the transfer of the pattern in the two-dimensional array of first discrete patterned photoresist material portions 187 via the pattern in the two-dimensional array of first conductive material plates 160 through the first magnetic tunnel junction-level (MTJ-level) material layers (112L, 114L, 130L, 144L, 148L) can be performed employing an aspect-ratio-dependent ion beam etch process that etches materials of the first MTJ-level material layers (112L, 114L, 130L, 144L, 148L) with dependency on the aspect ratio of the local geometry. An aspect ratio is the ratio of the depth of an etched region to the width of the etched region. The ions used in ion beam etching are generally not perfectly collimated, but have an angular distribution around the primary direction of the ion beam (which may be a downward vertical direction). Due to the finite angular distribution of the ions, the percentage of the ions that impinge on sidewalls of an etched region increases with the increase in the aspect ratio. In other words, a lower fraction of the ions impinge on the bottom surface of the etched region if the aspect ratio is high, and a higher fraction of the ions impinge on the bottom surface of the etched region if the aspect ratio is low. This effect is referred to as a "shadowing effect". In this case, areas having a greater lateral distance between neighboring pairs of first electrically conductive plates 160 are etched at a higher etch rate than areas having a smaller lateral distance between neighboring pairs of first electrically conductive plates 160. Generally, the aspect-ratio-dependent etch process can etch the materials of the first MTJ-level material layers (112L, 114L, 130L, 144L, 148L) at a variable etch rate that decreases with a local aspect ratio.

In one embodiment, the two-dimensional array of first electrically conductive plates 160 may comprise rows of first electrically conductive plates 160 that are arranged along the first horizontal direction hd1. Each row of first electrically conductive plates 160 may comprise a respective subset of first electrically conductive plates 160 that are arranged along the first horizontal direction hd1. The gap (i.e., spacing s1) between neighboring pairs of first electrically conductive plates 160 within each row of first electrically conductive plates 160 along direction hd1 may be less than the gap (i.e., spacing s2) between neighboring rows of first electrically conductive plates 160 along direction hd2. In this case, the etch rate of the materials of the first magnetic tunnel junction-level (MTJ-level) material layers (112L, 114L, 130L, 144L, 148L) between neighboring rows of first electrically conductive plates 160 can be higher than the etch rate of the materials of the first magnetic tunnel junction-level (MTJ-level) material layers (112L, 114L, 130L, 144L, 148L) between neighboring pairs of first electrically conductive plates 160 within each row of first electrically conductive plates 160.

According to an aspect of the present disclosure, the ion bean etch process can anisotropically etch the first magnetic tunnel junction-level (MTJ-level) material layers (112L, 114L, 130L, 144L, 148L) and the first electrically conductive layer 30L such that physically exposed surfaces of remaining portions of the first magnetic tunnel junction-level (MTJ-level) material layers (112L, 114L, 130L, 144L, 148L) are formed with taper angles. The taper angles can be measured with respect to the vertical direction that is perpendicular to the top surface of the substrate 8. In one embodiment, the taper angle may be in a range from 3 degrees to 30 degrees, such as from 6 degrees to 20 degrees, although lesser and greater taper angles may also be employed.

Generally, patterned portions of the first selector-level material layers (150L, 160L) comprise a two-dimensional array of selector-containing pillar structures 182 including a respective selector element 150 and a respective first conductive material plate 160, and patterned portions of the first magnetic tunnel junction-level (MTJ-level) material layers (112L, 114L, 130L, 144L, 148L) comprise a two-dimensional array of first magnetic tunnel junction (MTJ) pillar structures 184. Patterned portions of the first magnetic tunnel junction material layers 130L comprise a two-dimensional array of first magnetic tunnel junctions (MTJs) 130.

According to an aspect of the present disclosure, the duration of the ion beam etch process can be selected such that portions of the first electrically conductive layer 30L located in areas between neighboring rows of first conductive material plates 160 are etched through, while portions of the first electrically conductive material layer 30L located in areas between neighboring pairs of first conductive material plates 160 within each row of first conductive material plates 160 are not etched through. The difference in the etch depth between the two types of areas is caused by the tapered profile of the sidewalls of the etched portions of the first magnetic tunnel junction-level (MTJ-level) material layers (112L, 114L, 130L, 144L, 148L) and the shadowing effect. Thus, the first electrically conductive layer 30L is divided into multiple disjoined patterned electrically conductive strips that laterally extend along the first horizontal direction hd1, which constitute first electrically conductive lines 30. In other words, the patterned portions of the first electrically conductive layer 30L comprise first electrically conductive lines (e.g., word lines) 30 that laterally extend along the first horizontal direction hd1 and laterally spaced apart from each other along the second horizontal direction hd2 and have a respective variable width along the second horizontal direction hd2 that varies along the first horizontal direction hd1. In other words, the first electrically conductive lines 30 have a wiggled profile having alternating wider and narrower sections along the second horizontal direction hd2, as shown in FIG. 47D. The narrower sections have a first width w1 which is smaller than the second width w2 of the wider sections.

According to an aspect of the present disclosure, each of the first electrically conductive lines 30 may be patterned with a respective pair of contoured and tapered lengthwise sidewalls that laterally extend along the first horizontal direction hd1. Each of the first electrically conductive lines 30 may be formed with a respective bottom surface having a respective variable width along the second horizontal direction hd2 that varies along the first horizontal direction hd1. In one embodiment, each of the first electrically conductive lines 30 may comprise a periodic repetition of uniform-width regions and neck regions with a periodicity of the first pitch p1.

The two-dimensional array of first MTJ pillar structures 184 comprises rows of first MTJ pillar structures 184 that are arranged along the first horizontal direction hd1. In some embodiments, the tapered sidewalls of each neighboring pair of first MTJ pillar structures 184 within each row of first MTJ pillar structures 184 may be adjoined to each other at a respective edge. According to an aspect of the present disclosure, the edges are formed above a horizontal plane including top surfaces of the first electrically conductive lines 30 during patterning of the first MTJ-level material layers (112L, 114L, 130L, 144L, 148L). The merged edges laterally extend along the second horizontal direction hd2. The edges at which a respective pair of tapered sidewalls of the first MTJ pillar structures 184 are merged (i.e., joined to each other) are formed below the horizontal plane including the bottom surfaces of the first free layers 136.

Figure 47E:
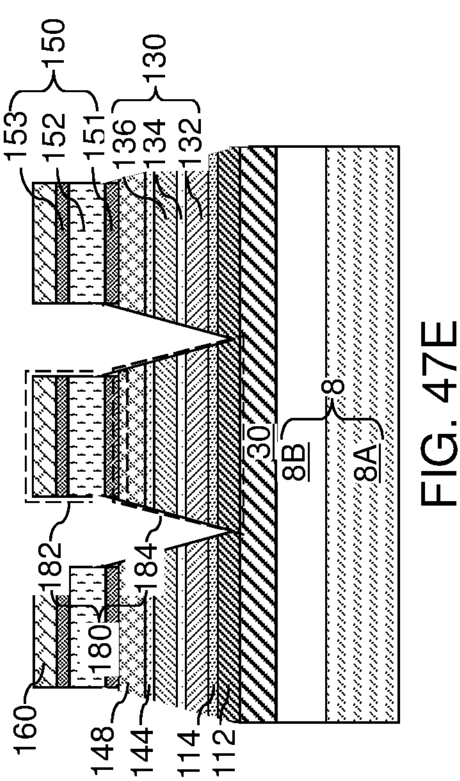
FIGS. 47E, 47F, 47G and 47H are vertical cross-sectional view along the vertical plane C-C' of FIG. 47A according to alternative configurations of the third exemplary structure.
Figure 47F:
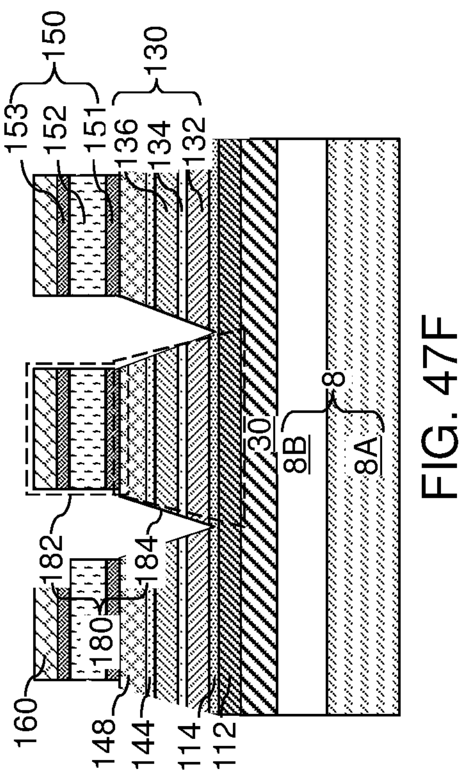
Figure 47G:
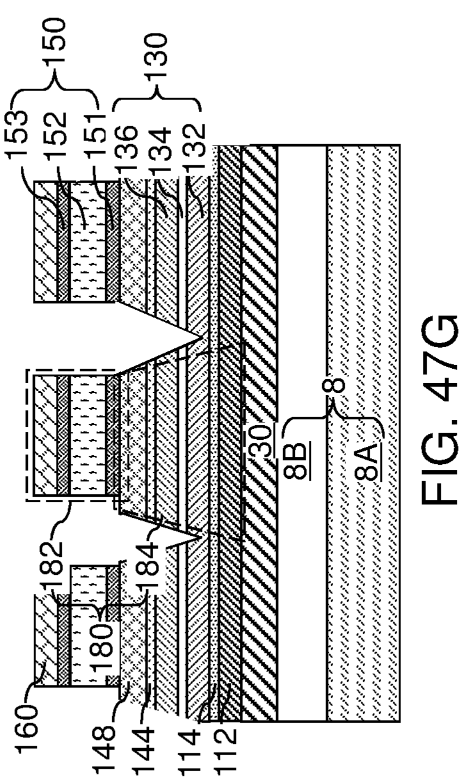
Figure 47H:
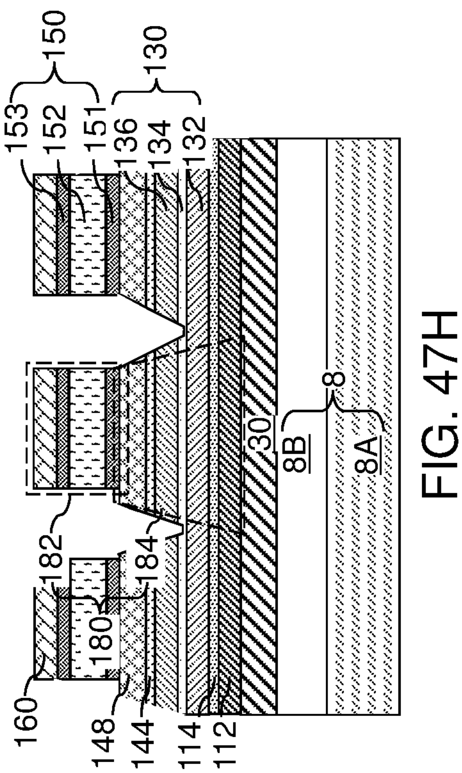

In one embodiment illustrated in FIG. 47E, the edges at which a respective pair of tapered sidewalls of the MTJ pillar structures 184 merge are formed within the superlattice layers 112. In alternative embodiments, the edges at which a respective pair of tapered sidewalls of the first MTJ pillar structures 184 merge may be formed below the first reference layer 132 (e.g., in the antiferromagnetic layer) 114, within the first continuous reference layer 132L, or within the first continuous nonmagnetic tunnel barrier layer 134L, as shown in FIGS. 47F, 47G and 47H respectively. In the embodiments of FIGS. 47G and 47H, the first continuous reference layer 132L is not split into separate reference layers 132 along the first horizontal direction hd1. In the embodiment of FIG. 47H, the first continuous tunnel barrier layer 134L is not split into separate tunnel barrier layers 134 along the first horizontal direction hd1.

Each vertical stack of a first selector-containing pillar structure 182 and a first MTJ pillar structure 184 constitutes a first memory cell 180. According to an aspect of the present disclosure, each row of first memory cells 180 that are arranged along the first horizontal direction hd1 are merged with each other below the horizontal plane including the bottom surfaces of the first free layers 136 within the respective row of first memory cells 180. Each merged row of first memory cells 180 is herein referred to as first selector-magnetic tunnel junction (selector-MTJ) assembly 180A, as shown in FIG. 47A. The third exemplary structure can include rows of first selector-magnetic tunnel junction (selector-MTJ) assemblies 180A located on a respective one of the first electrically conductive lines 30. Each of the selector-MTJ assemblies 180A comprises a respective row of first magnetic tunnel junction (MTJ) pillar structures 184 and a respective row of first selector-containing pillar structures 182 that are arranged along the first horizontal direction hd1. Tapered sidewalls of each neighboring pair of first MTJ pillar structures 184 within the respective row of first MTJ pillar structures 184 are adjoined to each other at a respective edge laterally extending along the second horizontal direction hd2 and located above a horizontal plane including top surfaces of the first electrically conductive lines 30.

In one embodiment, the rows of first selector-containing pillar structures 182 are arranged as a two-dimensional periodic array of first selector-containing pillar structures 182 having a first pitch p1 along the first horizontal direction hd1 and having a second pitch p2 long the second horizontal direction hd2. A lateral spacing s1 between neighboring pairs of first selector-containing pillar structures 182 that are laterally spaced apart along the first horizontal direction hd1 is less than a lateral spacing s2 between neighboring pairs of first selector-containing pillar structures 182 that are laterally spaced apart along the second horizontal direction hd2.

In one embodiment, each of the selector-containing pillar structures 182 has an elongated horizontal cross-sectional shape having a greater lateral dimension along the first horizontal direction hd1 than along the second horizontal direction hd2, and the rows of selector-containing pillar structures 182 are arranged as a two-dimensional periodic array of selector-containing pillar structures 182 having the first pitch p1 along the first horizontal direction hd1 and having the second pitch p2 along the second horizontal direction hd2. In one embodiment, the second pitch p2 is the same as the first pitch p1.

In one embodiment, each of the first electrically conductive lines 30 comprises a laterally alternating sequence of uniform thickness segments (e.g., regions w1) that underlie a respective one of the first MTJ pillar structures 184 and indented segments (e.g., regions w2) that includes a V-shaped indentation. In one embodiment, each of the first electrically conductive lines 30 comprises a pair of contoured lengthwise sidewalls that generally extend along the first horizontal direction hd1 with a lateral undulation along the second horizontal direction hd2, and each of the contoured lengthwise sidewalls comprises straight segments located in a respective uniform width region w1 and laterally extending along the first horizontal direction hd1, and pairs of adjoined convex sidewalls adjoined at a respective vertically-extending edge located at a respective neck region w2. Regions w2 have a narrower width along the second horizontal direction hd2 than regions w1.

Each of the first MTJ pillar structures 184 comprises a vertical stack including a first reference layer 132, a first tunnel barrier layer 134, and a first free layer 136. First free layers 136 within the respective row of first MTJ pillar structures are laterally spaced apart from each other along the first horizontal direction hd1 and do not contact one another.

In one embodiment, each free layer 136 within the two-dimensional array of MTJ pillar structures 184 has a respective horizontal cross-sectional shape having a same lateral extent along the first horizontal direction hd1 and along the second horizontal direction hd2. In one embodiment, each free layer 136 may have a horizontal cross-sectional shape of a circle, a square, or a rounded square, i.e., a shape that is derived from a square by rounding the four corners.

Figure 48A:
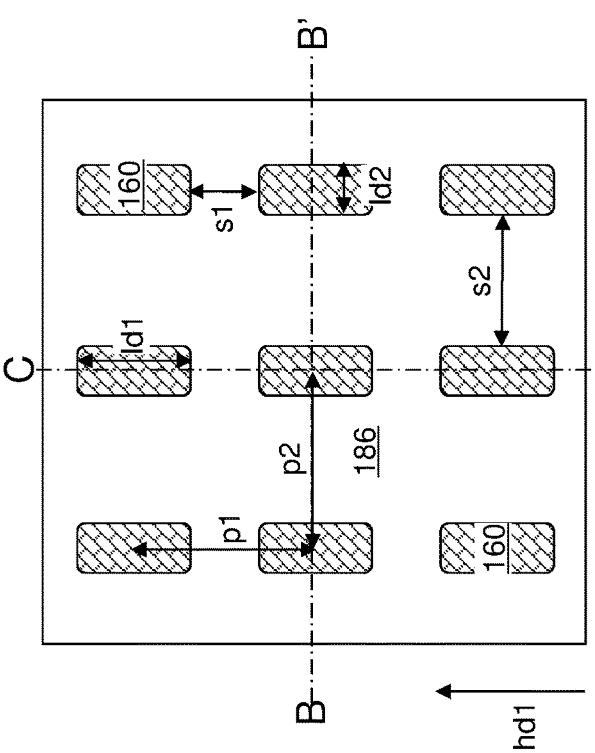
FIGS. 48A-48C are various views of the third exemplary structure after formation of a first dielectric matrix layer according to the third embodiment of the present disclosure.
Figure 48B:
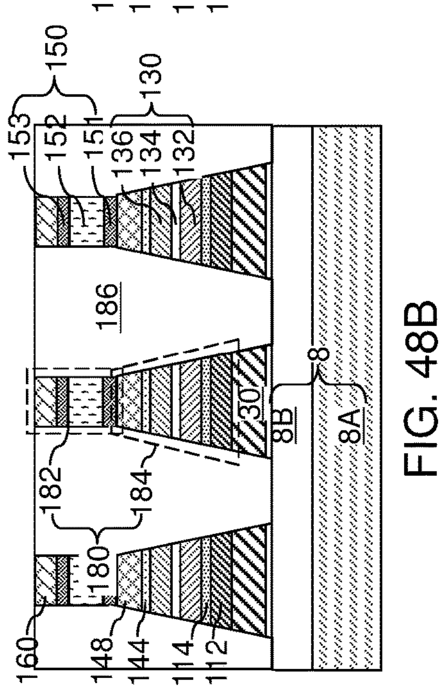
Figure 48C:
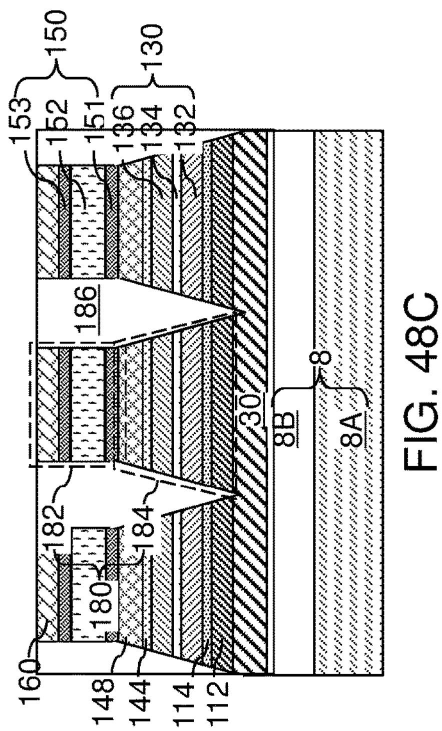

Referring to FIGS. 48A-48C, a dielectric fill material can be deposited in gaps between neighboring pairs of first memory cells 180 to form a dielectric matrix layer, which is herein referred to as a first dielectric matrix layer 186. Excess portions of the dielectric fill material of the first dielectric matrix layer 186 can be removed from above a horizontal plane including top surfaces of the first selector-containing pillar structures 182 by a planarization process such as a chemical mechanical polishing process. A top surfaces of a remaining portion of the first dielectric matrix layer 186 is formed within a horizontal plane including top surfaces of the two-dimensional array of first selector-containing pillar structures 182. In an alternative configuration, the CMP process is continued to also remove the first hardmask plates 160 and to expose the upper surface of the first upper selector electrodes 153, similar to the step shown in FIGS. 9D-9F. The above described second electrically conductive lines (e.g., bit lines) 90 are subsequently formed over the first selector-containing pillar structures 182.

Figure 49A:
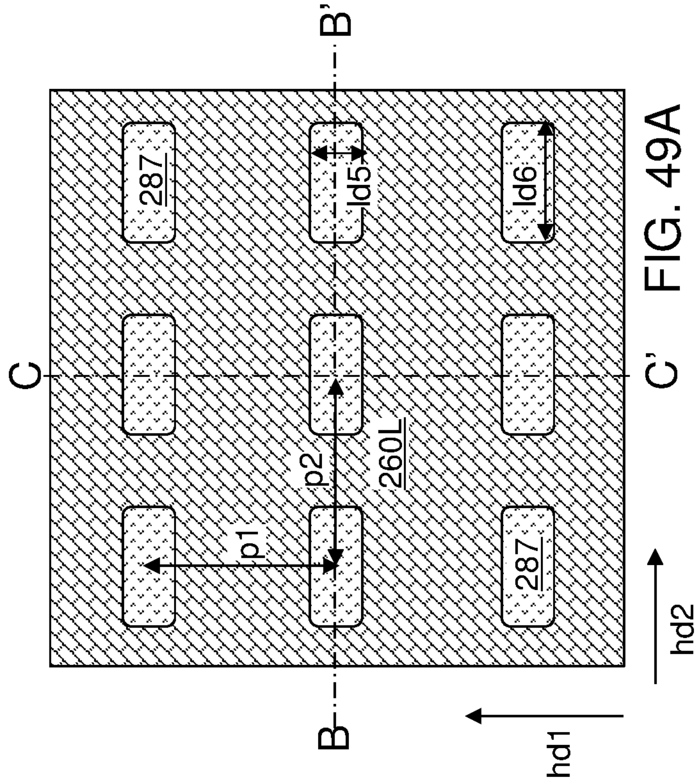
FIGS. 49A-49C are various views of the third exemplary structure after formation of a second electrically conductive layer, second magnetic tunnel junction material layers, second selector level material layers, and a two-dimensional array of discrete photoresist material portions according to the third embodiment of the present disclosure.
Figure 49C:
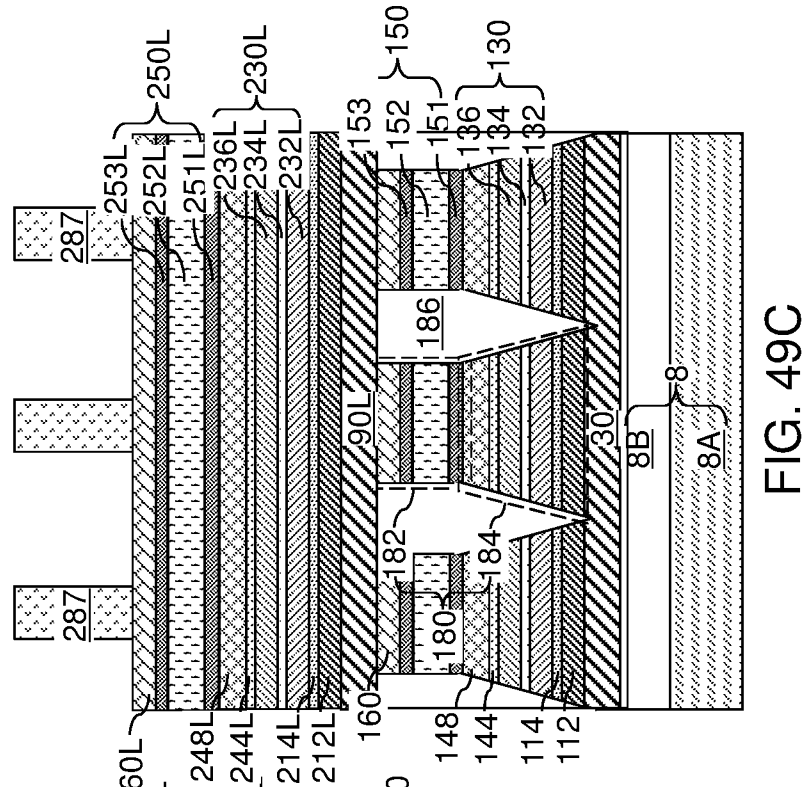
Figure 49B:
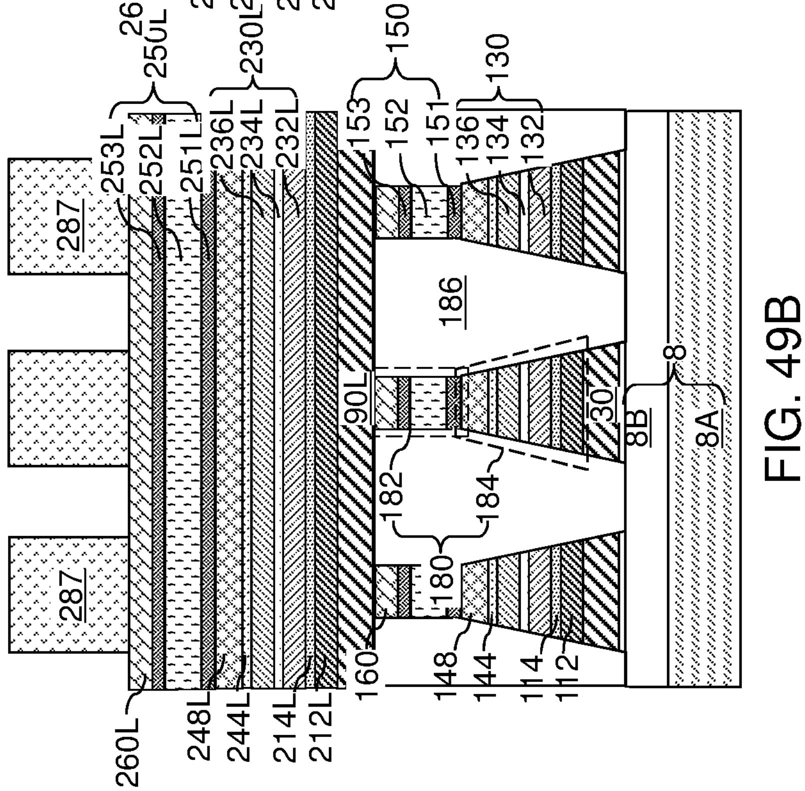

Optionally, additional device levels may be formed above the second electrically conductive lines 90. Referring to FIGS. 49A-49C, a second electrically conductive layer 90L and second magnetic tunnel junction-level (MTJ-level) material layers (212L, 214L, 230L, 244L, 248L) can be deposited over the two-dimensional array of first memory cells 180 and the first dielectric matrix layer 186. The second MTJ-level material layers (212L, 214L, 230L, 244L, 248L) may be the same as the first MTJ-level material layers (112, 114L, 130L, 144L, 148L). As described above, the second MTJ-level material layers (212L, 214L, 230L, 244L, 248L) comprise second magnetic tunnel junction (MTJ) material layers 230L. The second MTJ material layers 230L may comprises a layer stack including a second continuous reference layer 232L, a second continuous nonmagnetic tunnel barrier layer 234L, a second continuous free layer 236L.

A layer stack (250L, 260L) including second selector material layers 250L and a second conductive material layer (e.g., second hardmask layer) 260L described with reference to FIGS. 14A-14C can be formed over the second magnetic tunnel junction-level (MTJ-level) material layers (212L, 214L, 230L, 244L, 248L). A photoresist layer can be deposited over the second conductive material layer 260L, and can be lithographically patterned to form a two-dimensional array of second discrete patterned photoresist material portions 287.

According to an aspect of the present disclosure, the two-dimensional array of second discrete patterned photoresist material portions 287 can be a periodic two-dimensional array having the first pitch p1 along the first horizontal direction hd1 and having the second pitch p2 along the second horizontal direction hd2. A first nearest-neighbor spacing along the first horizontal direction hd1 of the two-dimensional array of second discrete patterned photoresist material portions 287 is greater than a second nearest-neighbor spacing along the second horizontal direction hd2 of the two-dimensional array of second discrete patterned photoresist material portions 287. In one embodiment, the pattern of the second discrete patterned photoresist material portions 287 may be the same as the pattern of the second discrete patterned photoresist material portions 257 described with reference to FIGS. 15A-15C.

Figure 50A:
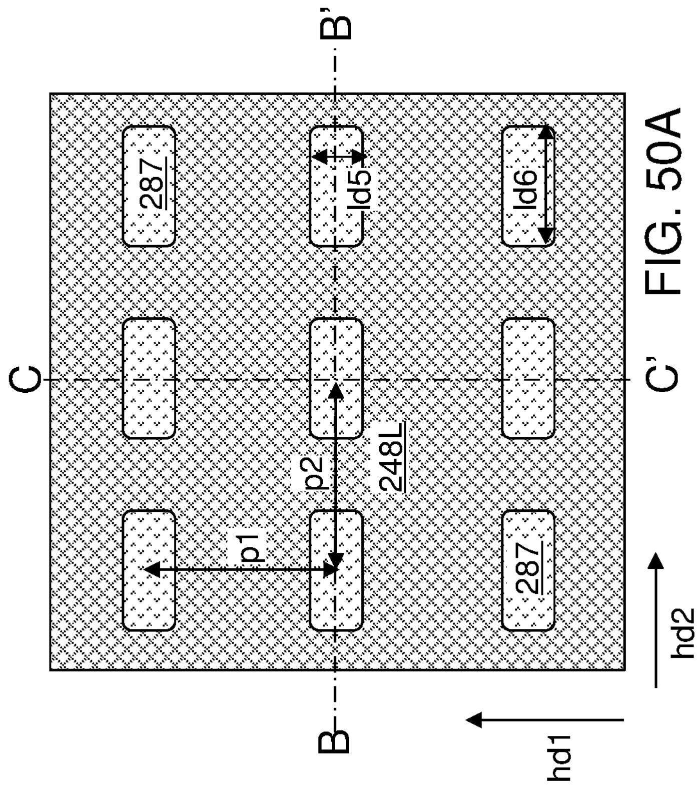
FIGS. 50A-50C are various views of the third exemplary structure after formation of a two-dimensional array of second selector-containing pillar structures according to the third embodiment of the present disclosure.
Figure 50C:
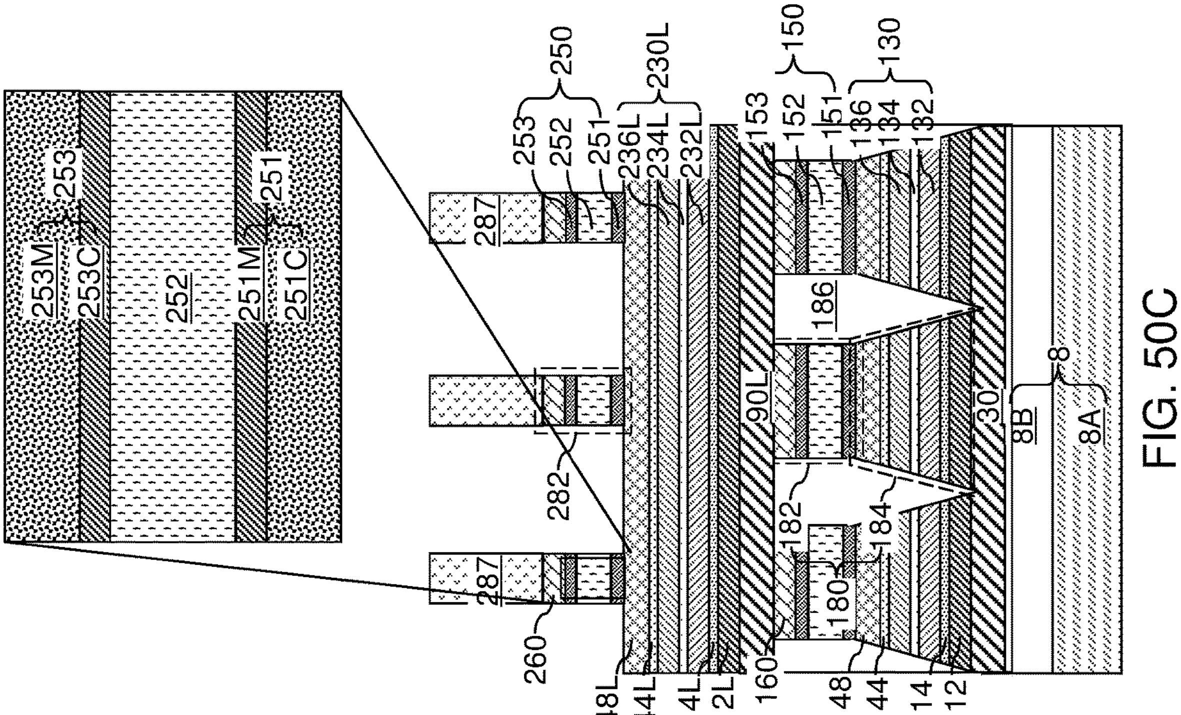
Figure 50B:
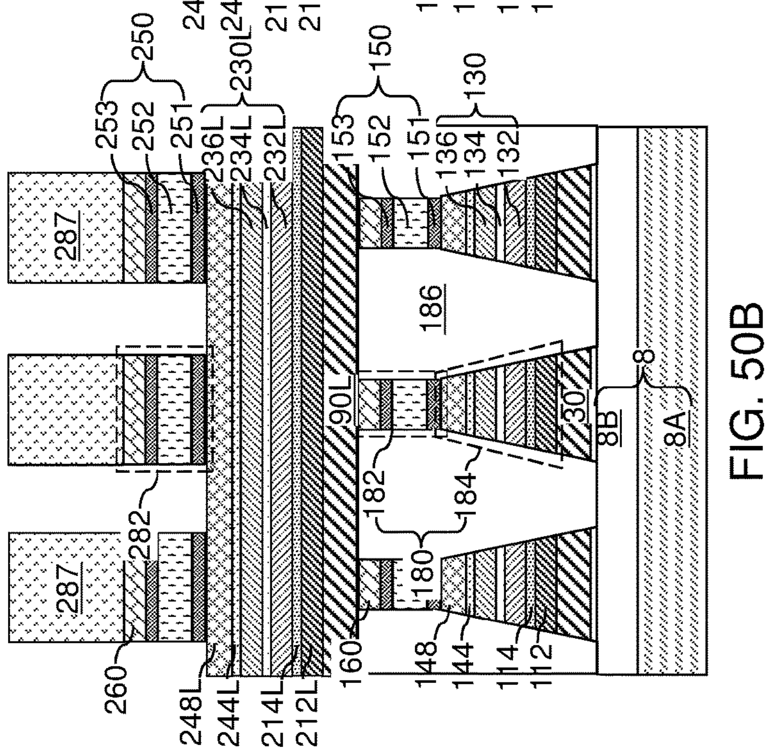
Figure 51D:
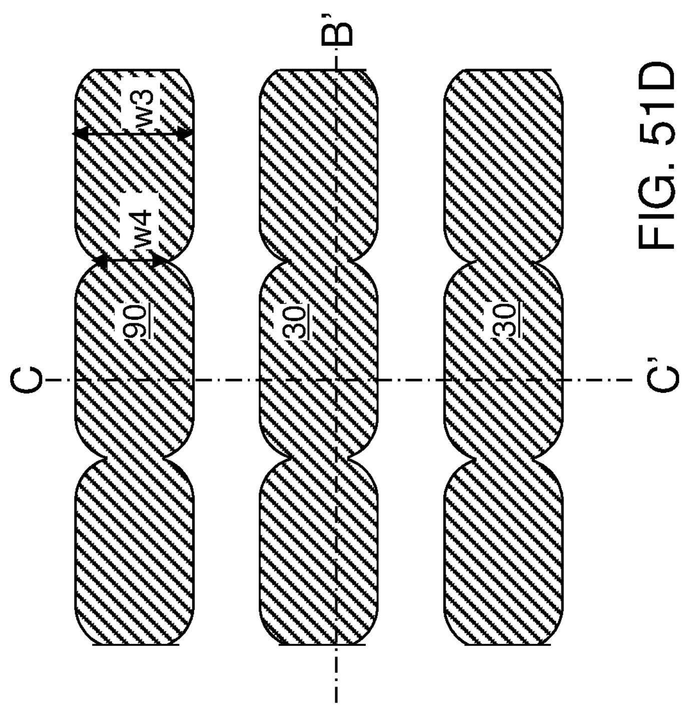
FIGS. 51A-51D are various views of the third exemplary structure after formation of a two-dimensional array of second magnetic tunnel junction pillar structures and second electrically conductive lines according to the third embodiment of the present disclosure.
Figure 51A:
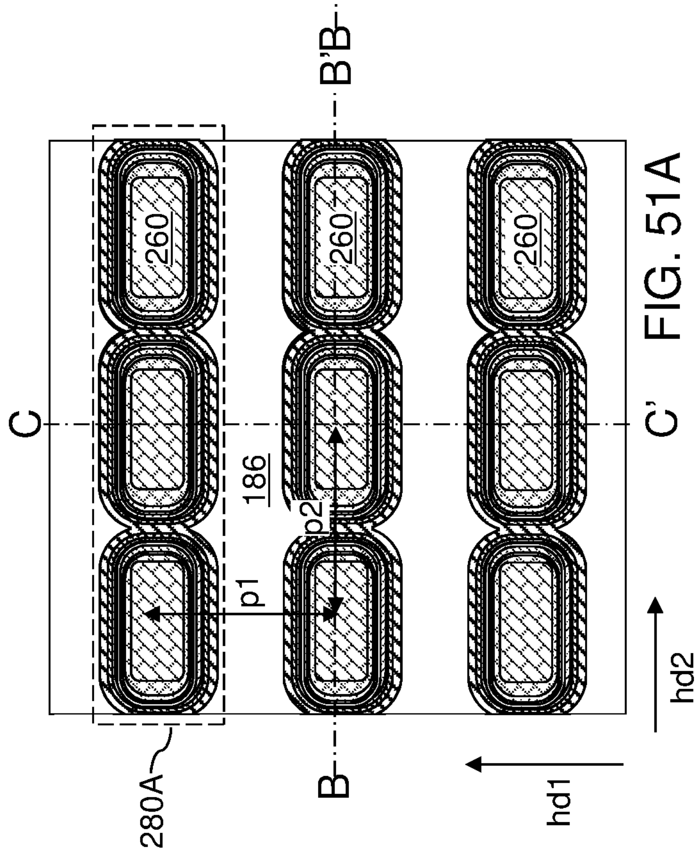
Figure 51C:
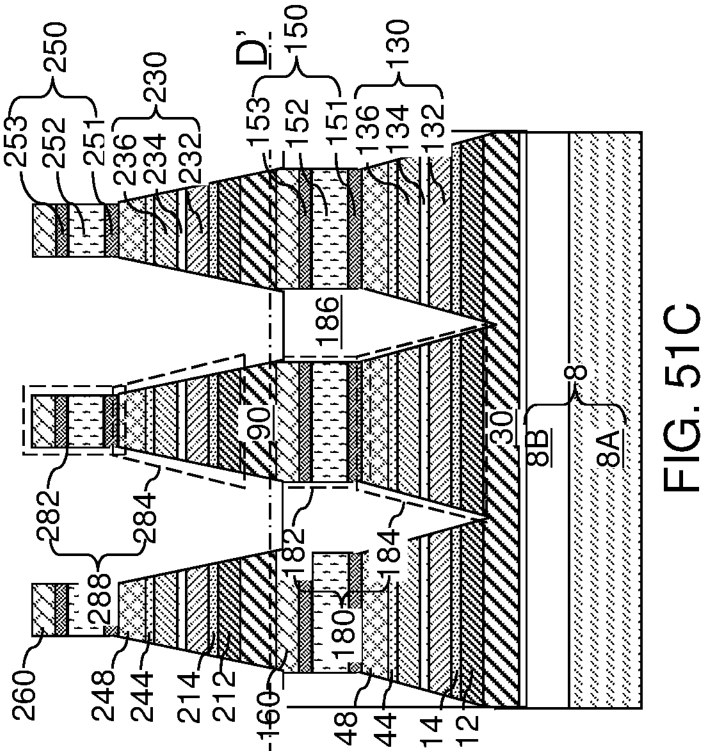
Figure 51B:
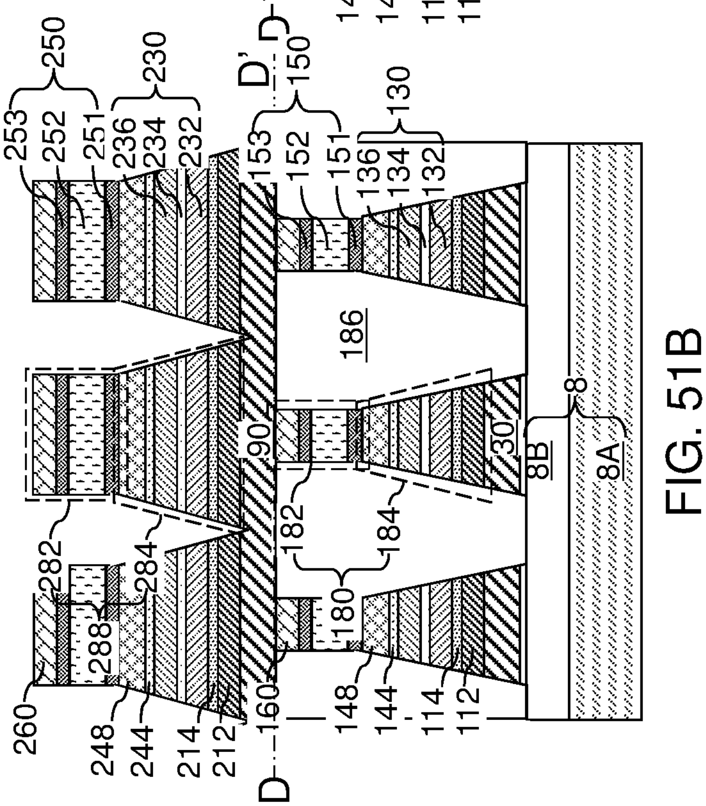

Referring to FIGS. 50A-50C, an array-pattern-transfer process can be performed to transfer the pattern of the two-dimensional array of second discrete patterned photoresist material portions 287 through the second conductive material layer 260L and the second selector material layers 250L. For example, an anisotropic etch process can be performed to transfer the pattern in the two-dimensional array of second discrete patterned photoresist material portions 287 through the second conductive material layer 260L and the second selector material layers 250L. The patterned remaining portions of the second conductive material layer 260L and the second selector material layers 250L can include two-dimensional array of second selector-containing pillar structures 282.

Each of the second selector-containing pillar structures 282 may comprise a second selector element 250 and a second conductive material plate 260. Each second selector element 250 is a patterned portion of the second selector material layers 250L, and each second conductive material plate 260 is a patterned portion of the second conductive material layer 260L. Each second selector element 250 may include a vertical stack of a second lower selector electrode 252, a second non-Ohmic material plate 252, and a second upper selector electrode 253. Each second lower selector electrode 252 is a patterned portion of the second lower selector electrode material layer 252L. Each second non-Ohmic material plate 252 is a patterned portion of the second non-Ohmic material layer 252L. Each second upper selector electrode 253 is a patterned portion of the second upper selector electrode material layer 253L.

In one embodiment, the two-dimensional array of second selector-containing pillar structures 282 comprises a two-dimensional periodic array of second selector-containing pillar structures 282 having the first pitch p1 along the first horizontal direction hd1 and having the second pitch p2 along the second horizontal direction hd2. The nearest-neighbor spacing between neighboring pairs of the second selector-containing pillar structures 282 that are laterally spaced apart along the first horizontal direction hd1 is greater than the nearest-neighboring spacing between neighboring pairs of the second selector-containing pillar structures 282 that are laterally spaced apart along the second horizontal direction hd2.

In one embodiment, each second selector-containing pillar structure 282 within the two-dimensional array of second selector-containing pillar structures 282 has a respective elongated horizontal cross-sectional shape having a third lateral dimension ld5 along the first horizontal direction hd1 and having a fourth lateral dimensional ld6 along the second horizontal direction hd2 that is greater than the third lateral dimension ld5. In one embodiment, the ratio of the fourth lateral dimension ld6 to the third lateral dimension ld5 may be in a range from 1.2 to 4, such as from 1.5 to 3. The two-dimensional array of second selector-containing pillar structures 282 can be formed over the second electrically conductive layer 90L.

Referring to FIGS. 51A-51D, an anisotropic etch process can be performed to etch unmasked portions of the layer stack (212L, 214L, 230L, 244L, 248L) of the second continuous superlattice layer 212L, the optional second continuous antiferromagnetic coupling layer 214L, the second continuous magnetic tunnel junction (MTJ) material layers 230L, the second continuous dielectric capping layer 244L, and the second continuous metallic capping layer 248L employing the two-dimensional array of second discrete patterned photoresist material portions 287 as an etch mask. In one embodiment, the anisotropic etch process may comprise an beam etch (IBE) process.

Each patterned portion of the layer stack (212L, 214L, 230L, 244L, 248L) comprises a second magnetic tunnel junction (MTJ) pillar structure 284. A two-dimensional array of second magnetic tunnel junction (MTJ) pillar structures 284 can be formed underneath the two-dimensional array of second selector-containing pillar structures 282. Each contiguous combination of a second selector-containing pillar structure 282 and a second MTJ pillar structure 284 constitutes a second memory cell 280, which can function as a memory cell 180 described with reference to FIG. 2.

Each second MTJ pillar structure 284 comprises a stack of a second superlattice layer 212, a second antiferromagnetic coupling layer 214, a second magnetic tunnel junction 230, a second dielectric capping layer 244, and a second metallic capping layer 248. The second magnetic tunnel junction 230 includes a second reference layer 232, a second tunnel barrier layer 234, and a second free layer 236. Each second superlattice layer 212 is a patterned portion of the second continuous superlattice layer 212L. Each second antiferromagnetic coupling layer 214 is a patterned portion of the second continuous antiferromagnetic coupling layer 214L. Each second magnetic tunnel junction 230 is a patterned portion of the second magnetic tunnel junction material layers 230L. Each second dielectric capping layer 244 is a patterned portion of the second continuous dielectric capping layer 244L. Each second metallic capping layer 248 is a patterned portion of the second continuous metallic capping layer 248L. Each second reference layer 232 is a patterned portion of the second continuous reference layer 232L. Each second tunnel barrier layer 234 is a patterned portion of the second continuous tunnel barrier layer 234L. Each second free layer 236 is a patterned portion of the second continuous free layer 236L.

According to an aspect of the present disclosure, the transfer of the pattern in the two-dimensional array of second discrete patterned photoresist material portions 287 via the pattern in the two-dimensional array of second conductive material plates 260 through the second magnetic tunnel junction-level (MTJ-level) material layers (212L, 214L, 230L, 244L, 248L) can be performed employing an aspect-ratio-dependent ion beam etch process that etches materials of the second MTJ-level material layers (212L, 214L, 230L, 244L, 248L) with dependency on the aspect ratio of the local geometry.

In one embodiment, the ion beam etch process etches an area with a smaller aspect ratio at a higher etch rate than an area with a large aspect ratio. In this case, areas having a greater lateral distance between neighboring pairs of second electrically conductive plates 260 are etched at a higher etch rate than areas having a lesser lateral distance between neighboring pairs of second electrically conductive plates 260.

In one embodiment, the two-dimensional array of second electrically conductive plates 260 may comprise columns of second electrically conductive plates 260 that are arranged along the second horizontal direction hd2. Each column of second electrically conductive plates 260 may comprise a respective subset of second electrically conductive plates 260 that are arranged along the second horizontal direction hd2. The gap between neighboring pairs of second electrically conductive plates 260 within each column of second electrically conductive plates 260 may be less than the gap between neighboring columns of second electrically conductive plates 260. In this case, the etch rate of the materials of the second magnetic tunnel junction-level (MTJ-level) material layers (212L, 214L, 230L, 244L, 248L) between neighboring columns of second electrically conductive plates 260 can be higher than the etch rate of the materials of the second magnetic tunnel junction-level (MTJ-level) material layers (212L, 214L, 230L, 244L, 248L) between neighboring pairs of second electrically conductive plates 260 within each column of second electrically conductive plates 260.

According to an aspect of the present disclosure, the ion bean etch process can anisotropically etch the second magnetic tunnel junction-level (MTJ-level) material layers (212L, 214L, 230L, 244L, 248L) and the second electrically conductive layer 90L such that physically exposed surfaces of remaining portions of the second magnetic tunnel junction-level (MTJ-level) material layers (212L, 214L, 230L, 244L, 248L) are formed with taper angles. The taper angles can be measured with respect to the vertical direction that is perpendicular to the top surface of the substrate 8. In one embodiment, the taper angle may be in a range from 3 degrees to 30 degrees, such as from 6 degrees to 20 degrees, although lesser and greater taper angles may also be employed.

Generally, patterned portions of the second selector-level material layers (250L, 260L) comprise a two-dimensional array of selector-containing pillar structures 282 including a respective selector element 250 and a respective second conductive material plate 260, and patterned portions of the second magnetic tunnel junction-level (MTJ-level) material layers (212L, 214L, 230L, 244L, 248L) comprise a two-dimensional array of second magnetic tunnel junction (MTJ) pillar structures 284. Patterned portions of the second magnetic tunnel junction material layers 230L comprise a two-dimensional array of second magnetic tunnel junctions (MTJs) 230.

According to an aspect of the present disclosure, the duration of the etch process can be selected such that portions of the second electrically conductive layer 90L located in areas between neighboring columns of second conductive material plates 260 are etched through, while portions of the second electrically conductive material layer 90L located in areas between neighboring pairs of second conductive material plates 260 within each column of second conductive material plates 260 are not etched through. Thus, the second electrically conductive layer 90L is divided into multiple disjoined patterned electrically conductive strips that laterally extend along the second horizontal direction hd2, which constitute second electrically conductive lines 90. In other words, the patterned portions of the second electrically conductive layer 90L comprise second electrically conductive lines 90 that laterally extend along the second horizontal direction hd2 and laterally spaced apart from each other along the first horizontal direction hd1. The second electrically conductive lines 90 include wider portions w3 and narrower neck portions w4 which have a narrower width than portions w3 in the first horizontal direction. In one embodiment, each of the second electrically conductive lines 90 comprises a laterally alternating sequence of uniform thickness segments that underlie a respective one of the second MTJ pillar structures 284 and indented segments that includes a V-shaped indentation in a respective top surface segment.

According to an aspect of the present disclosure, each of the second electrically conductive lines 90 may be patterned with a respective pair of contoured and tapered lengthwise sidewalls that laterally extend along the second horizontal direction hd2. Each of the second electrically conductive lines 90 may be formed with a respective bottom surface having a respective variable width along the first horizontal direction hd1 that varies along the second horizontal direction hd2. In one embodiment, each of the second electrically conductive lines 90 may comprise a periodic repetition of uniform-width regions w3 and neck regions w4 with a periodicity of the second pitch p2.

According to an aspect of the present disclosure, each of the second electrically conductive lines 90 may be patterned with a respective pair of contoured and tapered lengthwise sidewalls that laterally extend along the second horizontal direction hd2. Each of the second electrically conductive lines 90 may be formed with a respective bottom surface having a respective variable width along the first horizontal direction hd1 that varies along the second horizontal direction hd2. In one embodiment, each of the second electrically conductive lines 90 may comprise a periodic repetition of uniform-width regions w3 and neck regions w4 with a periodicity of the second pitch p2.

In one embodiment, each of the second electrically conductive lines 90 comprises a pair of contoured lengthwise sidewalls that generally extend along the second horizontal direction hd2 with a lateral undulation along the first horizontal direction hd1, and each of the contoured lengthwise sidewalls comprises straight segments located in a respective uniform width region and laterally extending along the second horizontal direction hd2, and pairs of adjoined convex sidewalls adjoined at a respective vertically-extending edge located at a respective neck region.

The two-dimensional array of second MTJ pillar structures 284 comprises columns of MTJ pillar structures 284 that are arranged along the second horizontal direction hd2. In one embodiment, tapered sidewalls of each neighboring pair of MTJ pillar structures 284 within each column of second MTJ pillar structures 284 are adjoined to each other at a respective edge. According to an aspect of the present disclosure, the edges are formed above a horizontal plane including top surfaces of the second electrically conductive lines 90 during patterning of the second MTJ-level material layers (212L, 214L, 230L, 244L, 248L). The edges laterally extending along the first horizontal direction hd1.

In one embodiment, the edges at which a respective pair of tapered sidewalls of the second MTJ pillar structures 284 merge (i.e., are joined to each other) are formed below the horizontal plane including the bottom surfaces of the second free layers 236. In one embodiment, the edges at which a respective pair of tapered sidewalls of the second MTJ pillar structures 284 merge may be formed within the second continuous nonmagnetic tunnel barrier layer 234L, within the second continuous reference layer 232L, or below the second continuous reference layer 232L, similar to the embodiments illustrated in FIGS. 47E-47H.

Each vertical stack of a second selector-containing pillar structure 282 and a second MTJ pillar structure 284 constitutes a second memory cell 280. According to an aspect of the present disclosure, each column of second memory cells 280 that are arranged along the second horizontal direction hd2 are merged with each other below the horizontal plane including the bottom surfaces of the second free layers 236 within the respective column of second memory cells 280. Each merged column of second memory cells 280 is herein referred to as second selector-magnetic tunnel junction (selector-MTJ) assembly 280A. The third exemplary structure can include columns of second selector-magnetic tunnel junction (selector-MTJ) assemblies 280A located on a respective one of the second electrically conductive lines 90. Each of the selector-MTJ assemblies 280A comprises a respective column of second magnetic tunnel junction (MTJ) pillar structures 284 and a respective column of second selector-containing pillar structures 282 that are arranged along the second horizontal direction hd2. Tapered sidewalls of each neighboring pair of second MTJ pillar structures 284 within the respective column of second MTJ pillar structures 284 are adjoined to each other at a respective edge laterally extending along the second horizontal direction hd1 and located above a horizontal plane including top surfaces of the second electrically conductive lines 90.

Each of the second MTJ pillar structures 284 comprises a vertical stack including a second reference layer 232, a second tunnel barrier layer 234, and a second free layer 236. First free layers 236 within the respective row of second MTJ pillar structures are laterally spaced apart among one another along the second horizontal direction hd2 and do not contact one another.

In one embodiment, the columns of second selector-containing pillar structures 282 are arranged as a two-dimensional periodic array of second selector-containing pillar structures 282 having a first pitch p1 along the first horizontal direction hd1 and having a second pitch p2 long the second horizontal direction hd2. A lateral spacing between neighboring pairs of second selector-containing pillar structures 282 that are laterally spaced apart along the first horizontal direction hd1 is greater than a lateral spacing between neighboring pairs of second selector-containing pillar structures 282 that are laterally spaced apart along the second horizontal direction hd2.

In one embodiment, each of the selector-containing pillar structures 282 has an elongated horizontal cross-sectional shape having a greater lateral dimension along the second horizontal direction hd2 than along the first horizontal direction hd1, and the columns of selector-containing pillar structures 282 are arranged as a two-dimensional periodic array of selector-containing pillar structures 282 having the first pitch p1 along the first horizontal direction hd1 and having the second pitch p2 along the second horizontal direction hd2. In one embodiment, the second pitch p2 is the same as the first pitch p1.

In one embodiment, each free layer 236 within the two-dimensional array of MTJ pillar structures 284 has a respective horizontal cross-sectional shape having a same lateral extent along the first horizontal direction hd1 and along the second horizontal direction hd2. In one embodiment, each free layer 236 may have a horizontal cross-sectional shape of a circle, a square, or a rounded square, i.e., a shape that is derived from a square by rounding the four corners.

Figure 52A:
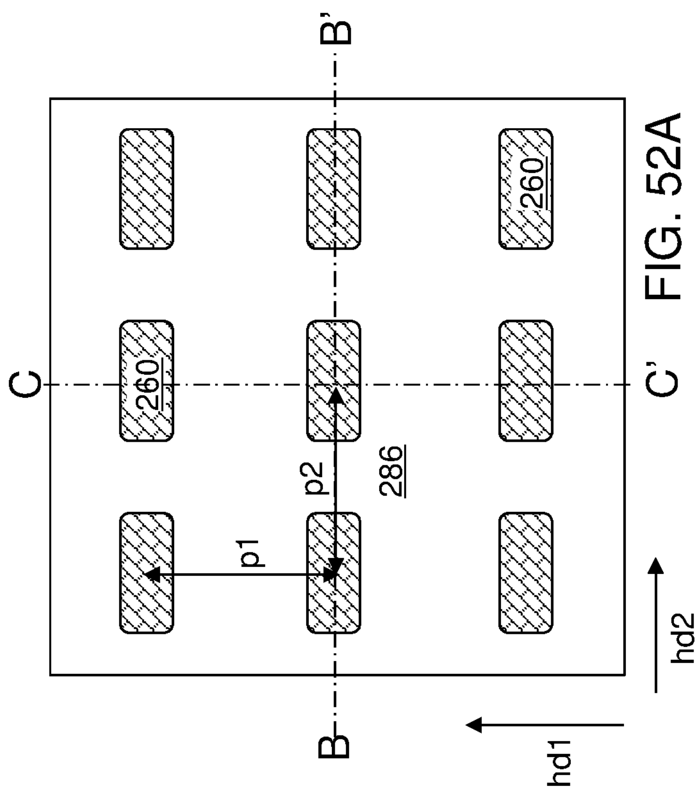
FIGS. 52A-52C are various views of the third exemplary structure after formation of a second dielectric matrix layer according to the third embodiment of the present disclosure.
Figure 52C:
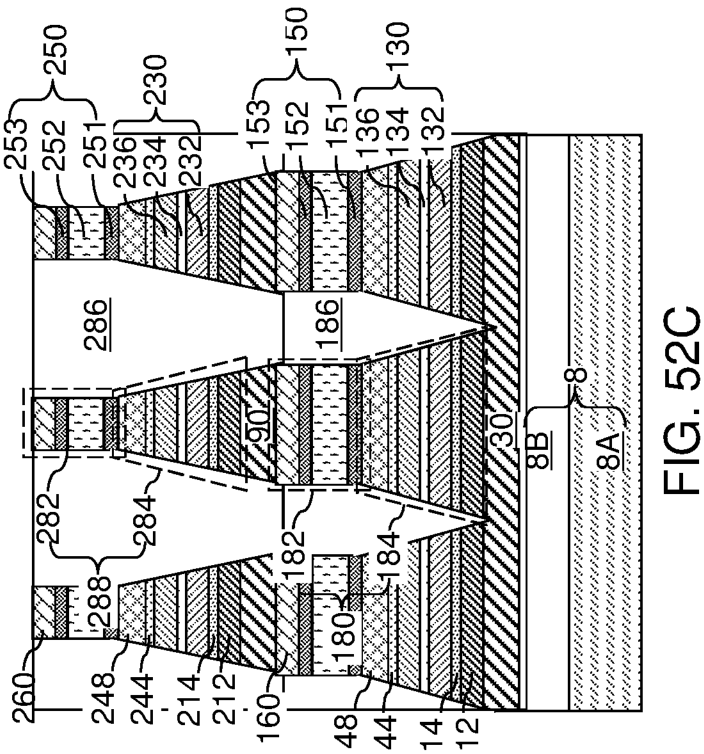
Figure 52B:
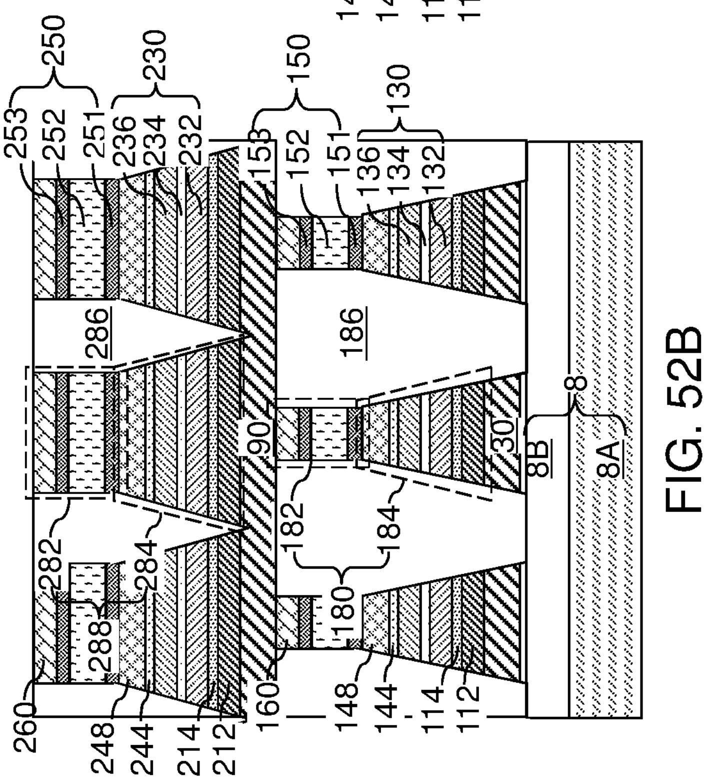

Referring to FIGS. 52A-52C, a dielectric fill material can be deposited in gaps between neighboring pairs of second memory cells 280 to form a dielectric matrix layer, which is herein referred to as a second dielectric matrix layer 286. Excess portions of the dielectric fill material of the second dielectric matrix layer 286 can be removed from above a horizontal plane including top surfaces of the second selector-containing pillar structures 282 by a planarization process such as a chemical mechanical polishing process. A top surfaces of a remaining portion of the second dielectric matrix layer 286 is formed within a horizontal plane including top surfaces of the two-dimensional array of second selector-containing pillar structures 282. In an alternative configuration, the CMP process is continued to also remove the second hardmask plates 260 and to expose the upper surface of the second upper selector electrodes 253, similar to the step shown in FIGS. 9D-9F.

Figure 53A:
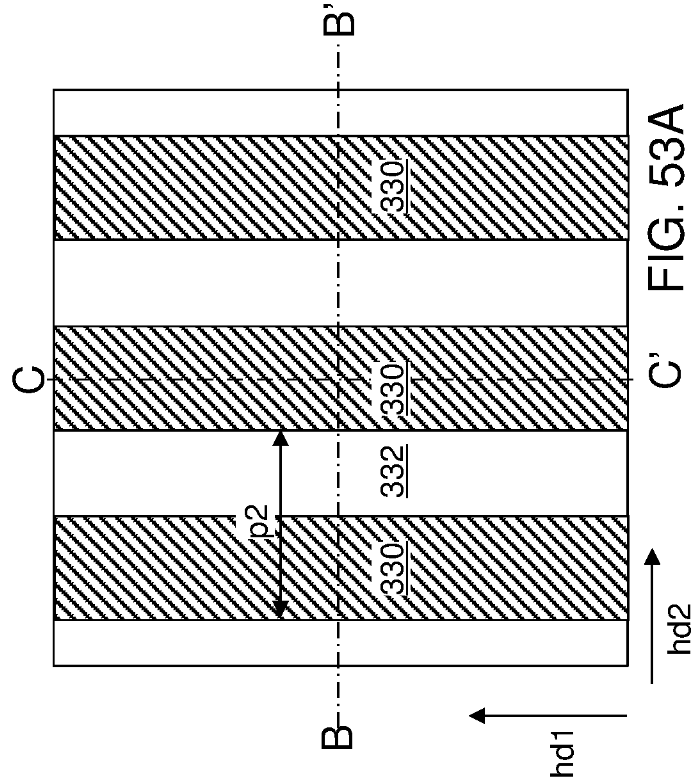
FIGS. 53A-53C are various views of the third exemplary structure after formation of third electrically conductive lines according to the third embodiment of the present disclosure.
Figure 53C:
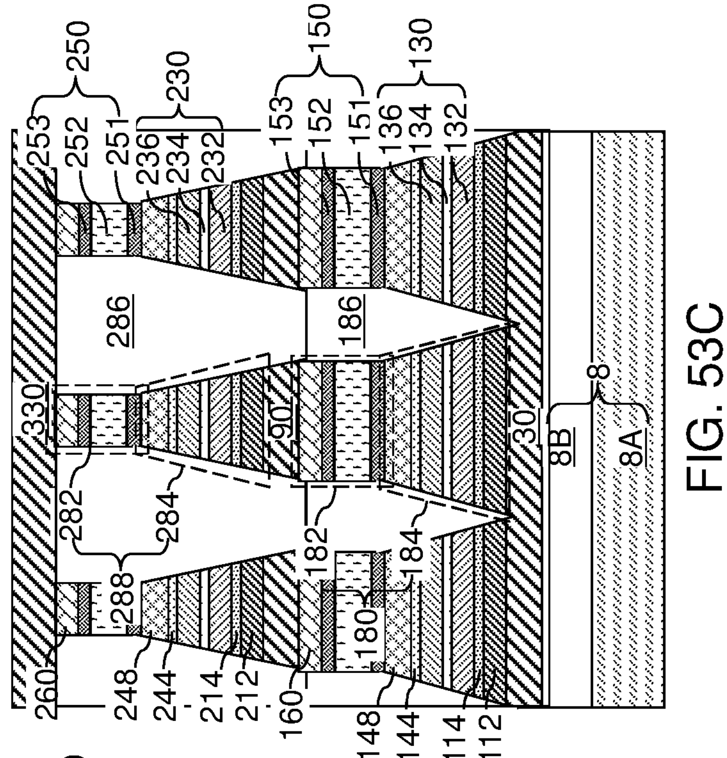
Figure 53B:
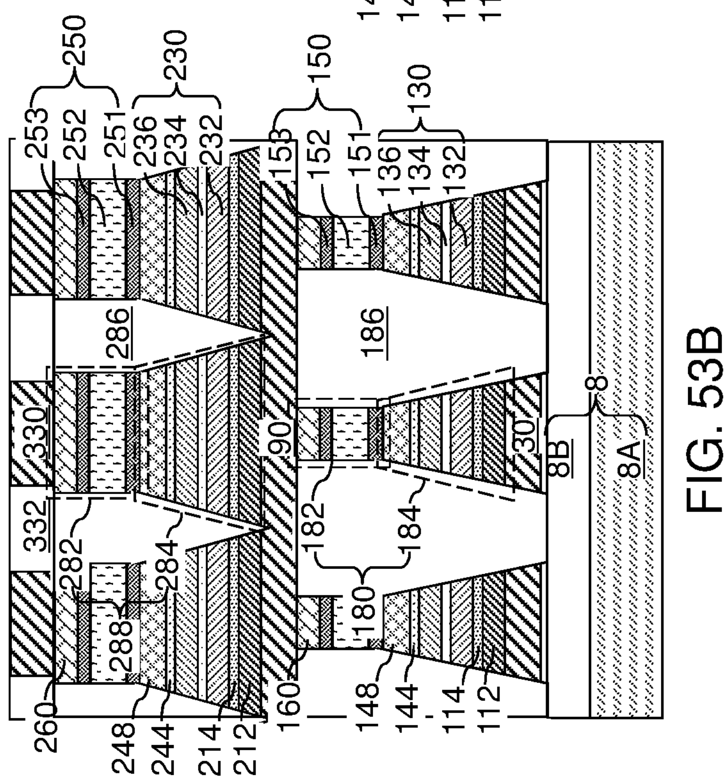

Referring to FIGS. 53A-53C, a line-level dielectric layer 332 can be formed by depositing a dielectric material over the two-dimensional array of second memory cells 280. Line trenches laterally extending along the first horizontal direction hd1 can be formed above each row of second MTJ pillar structures 284. A conductive material can be deposited in the line trenches, and excess portions of the conductive material can be removed from above the horizontal plane including the top surface of the line-level dielectric layer 332. Remaining portions of the conductive material filling the line trenches constitute third electrically conductive lines 330. The third electrically conductive lines 330 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the third electrically conductive lines 330 can be in a range from 20 nm to 100 nm, although lesser and greater thicknesses can also be employed. Alternatively, instead of using the above described damascene process to form the second electrically conductive lines 90, these lines may be formed by a pattern and etch process.

Figure 54A:
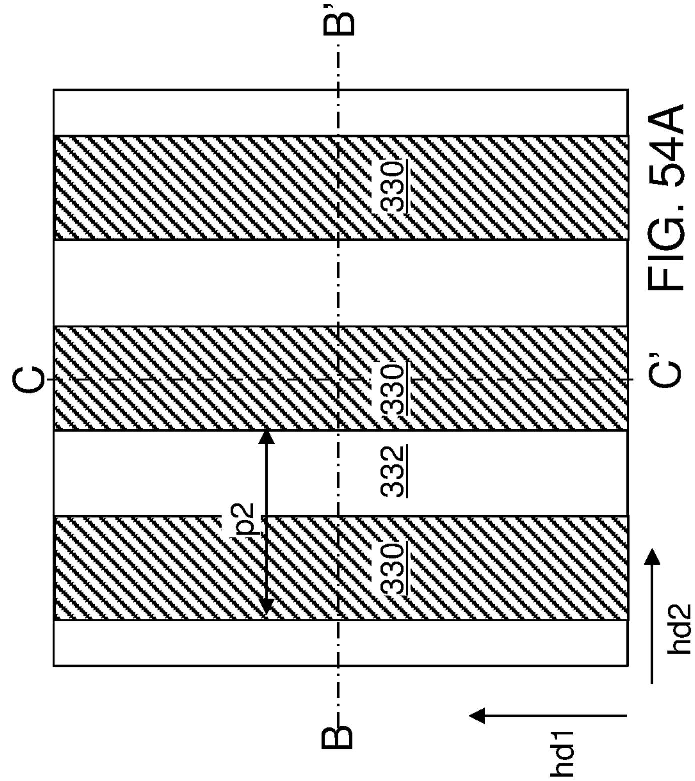
FIGS. 54A-54C are various views of a first alternative configuration of the third exemplary structure after formation of third electrically conductive lines according to the third embodiment of the present disclosure.
Figure 54C:
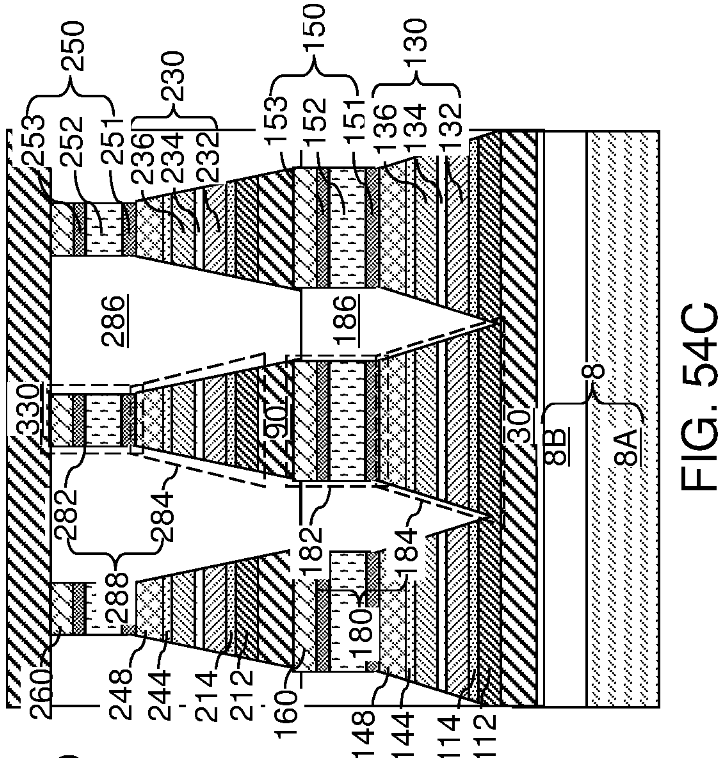
Figure 54B:
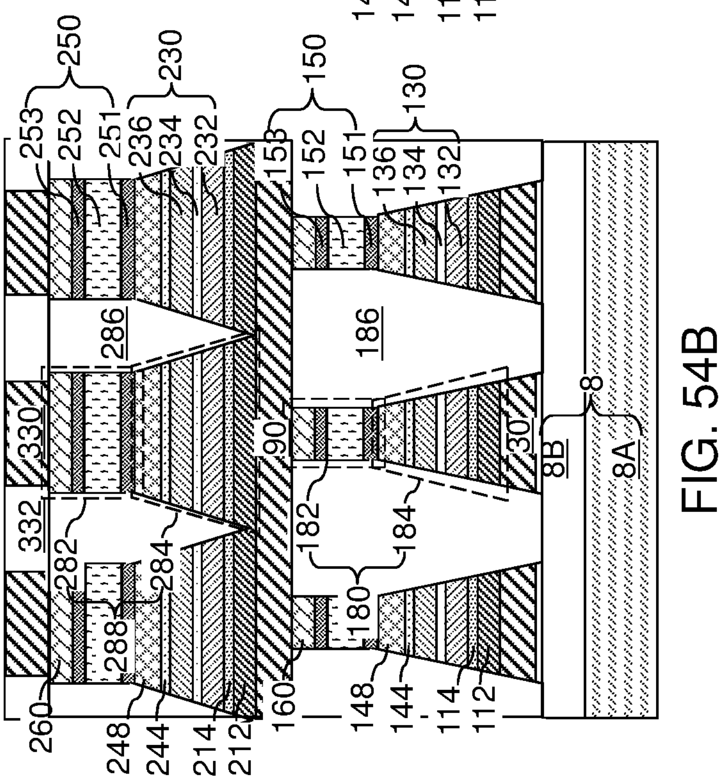

Referring to FIGS. 54A-54C, a first alternative configuration of the third exemplary structure can be derived from the third exemplary structure illustrated in FIGS. 53A-53C by modifying the ion beam etching process that patterns the second MTJ pillar structures 284. In this case, the height of the edges of the V-shaped indentations in the first selector-MTJ assemblies 180A may be changed. The edges of the V-shaped indentations in the second selector-MTJ assemblies 280A may be formed anywhere between the horizontal plane including the top surfaces of the second electrically conductive lines 90 and the horizontal plane including the bottom surfaces of the second free layers 236.

In one embodiment, a second superlattice layer 212 is located underneath and is magnetically coupled to a second reference layer 232 within each second MTJ pillar structure 284 in a second selector-MTJ assembly 280A. The second superlattice layers 212 within the respective column of MTJ pillar structures 284 in each second selector-MTJ assembly 280A may be interconnected as a single continuous structure, and may extend underneath the respective column of selector-containing pillar structures 282. In one embodiment, the edges at which tapered sidewalls of a respective neighboring pair of MTJ pillar structures 284 are adjoined may be located at V-shaped indentations in a top surface of the single continuous structure.

Figure 55A:
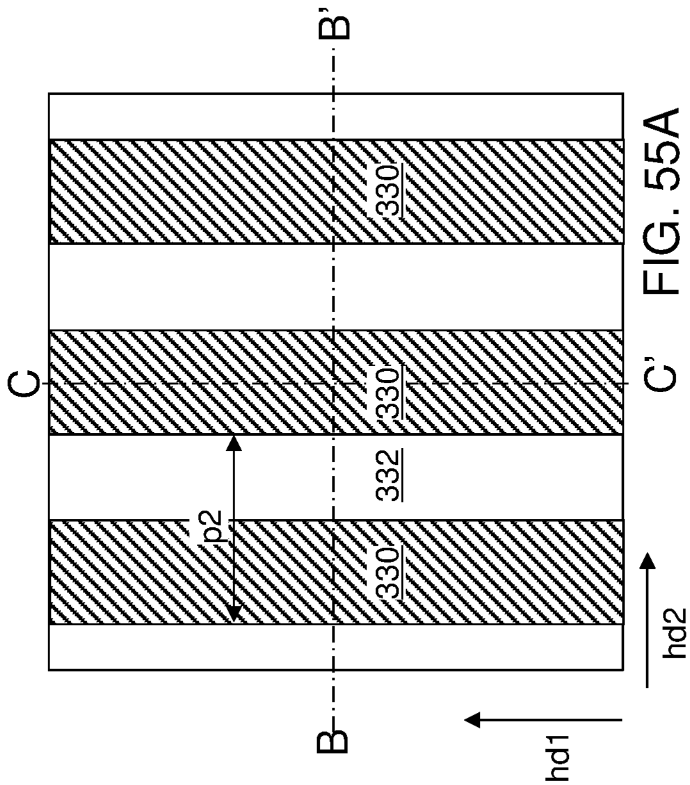
FIGS. 55A-55C are various views of a second alternative configuration of the third exemplary structure after formation of third electrically conductive lines according to the third embodiment of the present disclosure.
Figure 55C:
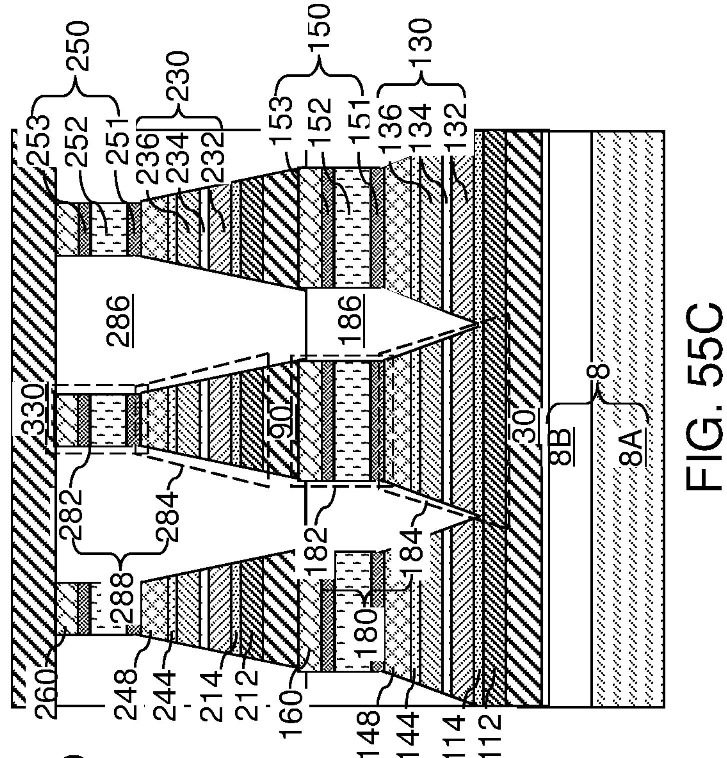
Figure 55B:
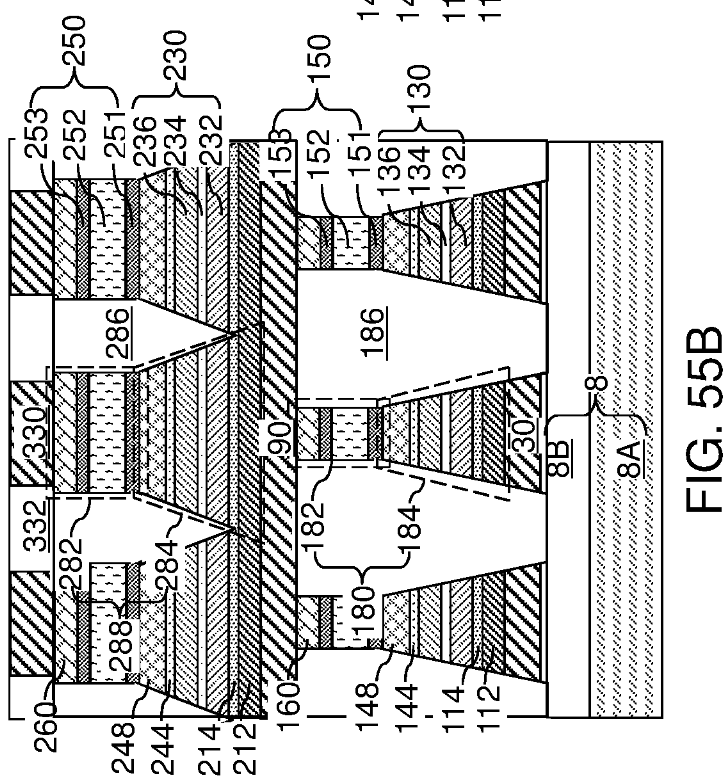

Referring to FIGS. 55A-55C, a second alternative configuration of the third exemplary structure can be derived from the third exemplary structure illustrated in FIGS. 53A-53C by modifying the ion beam etch process that patterns the second MTJ pillar structures 284. In one embodiment, the second antiferromagnetic coupling layer 214 is located underneath the second reference layer 232 within each second MTJ pillar structure 284 in the second selector-MTJ assembly 280A. The second antiferromagnetic coupling layers 214 within the respective column of MTJ pillar structures 284 in each second selector-MTJ assembly 280A may be interconnected as a single continuous antiferromagnetic coupling structure, and may extend underneath the respective column of selector-containing pillar structures 282. In one embodiment, the edges at which tapered sidewalls of a respective neighboring pair of MTJ pillar structures 284 are adjoined may be located at V-shaped indentations in a top surface of the single continuous antiferromagnetic coupling structure.

Figure 56A:
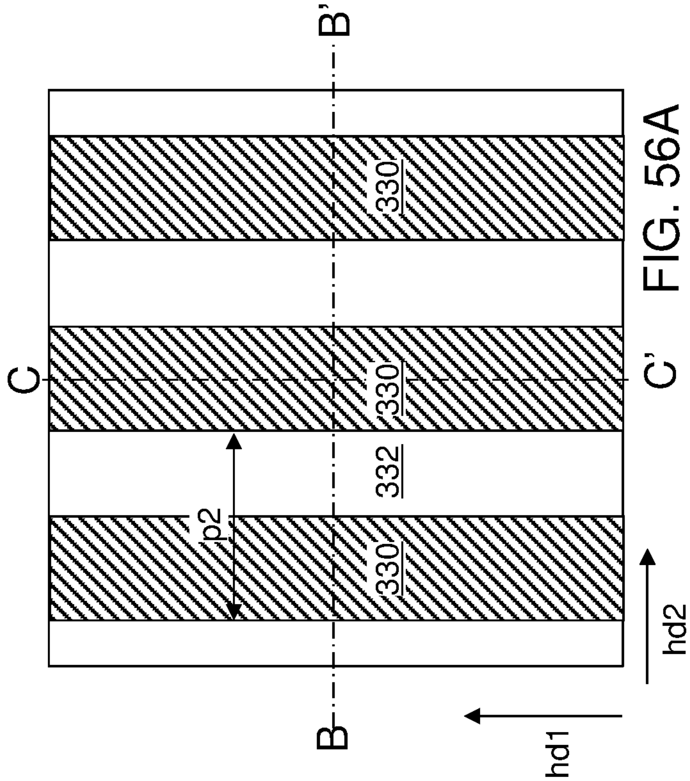
FIGS. 56A-56C are various views of a third alternative configuration of the third exemplary structure after formation of third electrically conductive lines according to the third embodiment of the present disclosure.
Figure 56C:
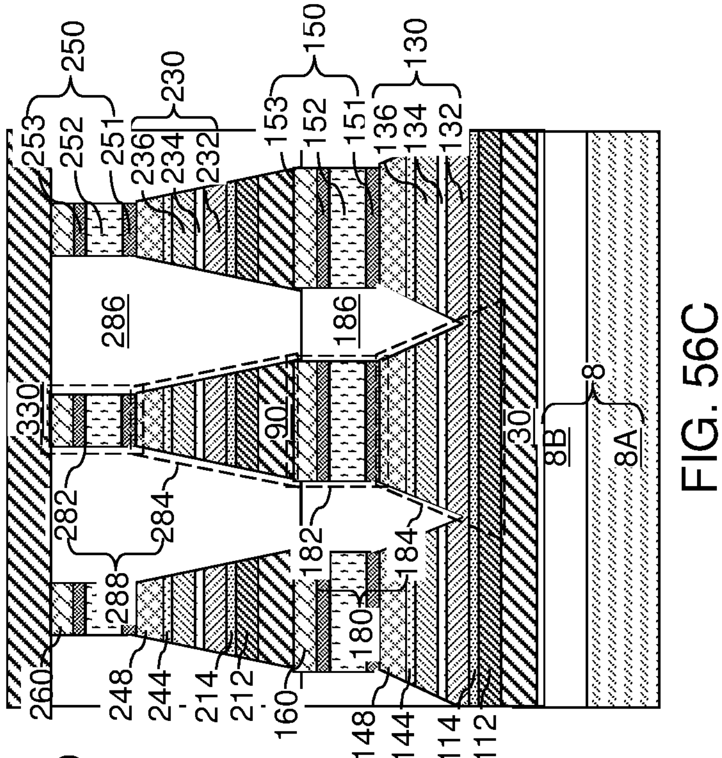
Figure 56B:
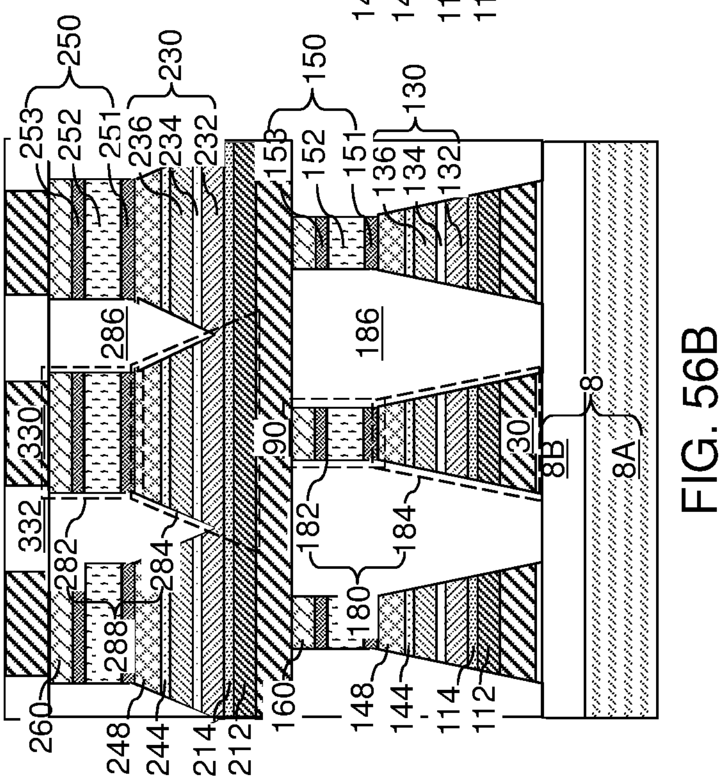

Referring to FIGS. 56A-56C, a third alternative configuration of the third exemplary structure can be derived from the third exemplary structure illustrated in FIGS. 53A-53C by modifying the ion beam etch process that patterns the second MTJ pillar structures 284. In one embodiment, the second reference layers 232 within the respective column of second MTJ pillar structures 284 in the second selector-MTJ assembly 280A are interconnected as a single continuous reference structure underlying the respective row of selector-containing pillar structures 282. In one embodiment, the edges at which tapered sidewalls of a respective neighboring pair of second MTJ pillar structures 284 are adjoined are located at V-shaped indentations in a top surface of the single continuous reference structure.

Figure 57A:
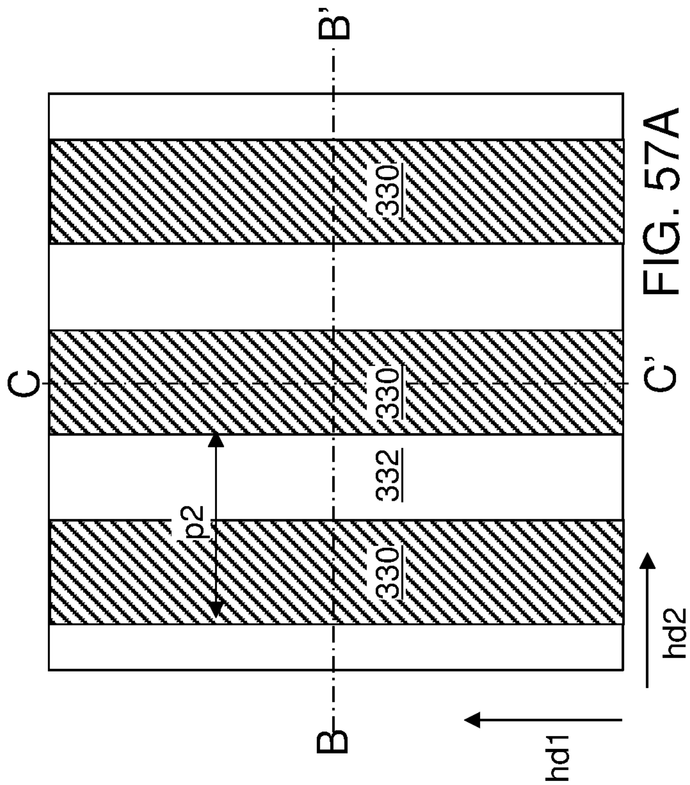
FIGS. 57A-57C are various views of a fourth alternative configuration of the third exemplary structure after formation of third electrically conductive lines according to the third embodiment of the present disclosure.
Figure 57C:
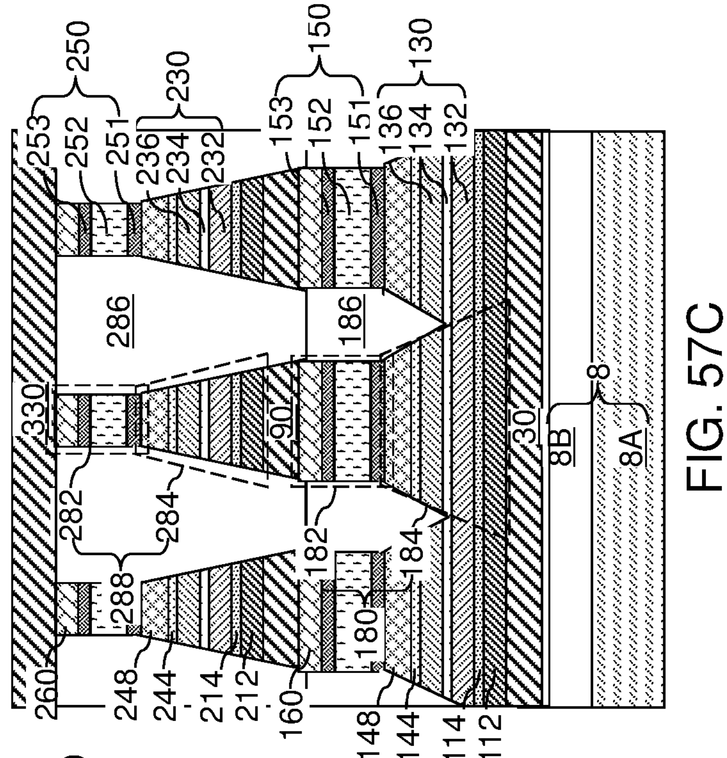
Figure 57B:
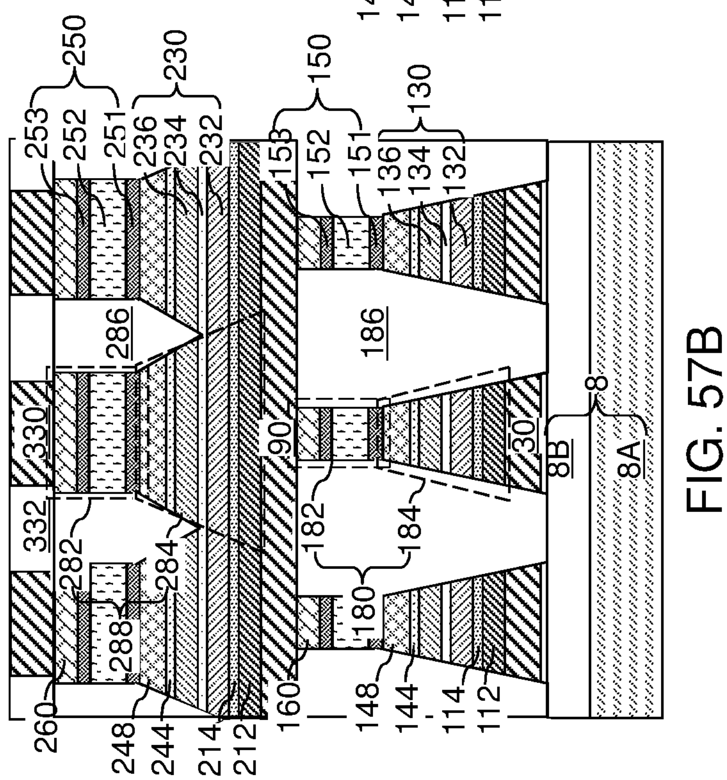

Referring to FIGS. 57A-57C, a fourth alternative configuration of the third exemplary structure can be derived from the third exemplary structure illustrated in FIGS. 53A-53C by modifying the ion beam etch process that patterns the second MTJ pillar structures 284. In one embodiment, the second nonmagnetic tunnel barrier layers 234 within the respective column of second MTJ pillar structures 284 in the second selector-MTJ assembly 280A are merged as a single continuous nonmagnetic tunnel barrier structure underlying the respective column of second selector-containing pillar structures 282. The edges at which tapered sidewalls of a respective neighboring pair of second MTJ pillar structures 284 are adjoined are located at V-shaped indentations in a top surface of the single continuous nonmagnetic tunnel barrier structure.

Figures 58A, 58B, 58C:
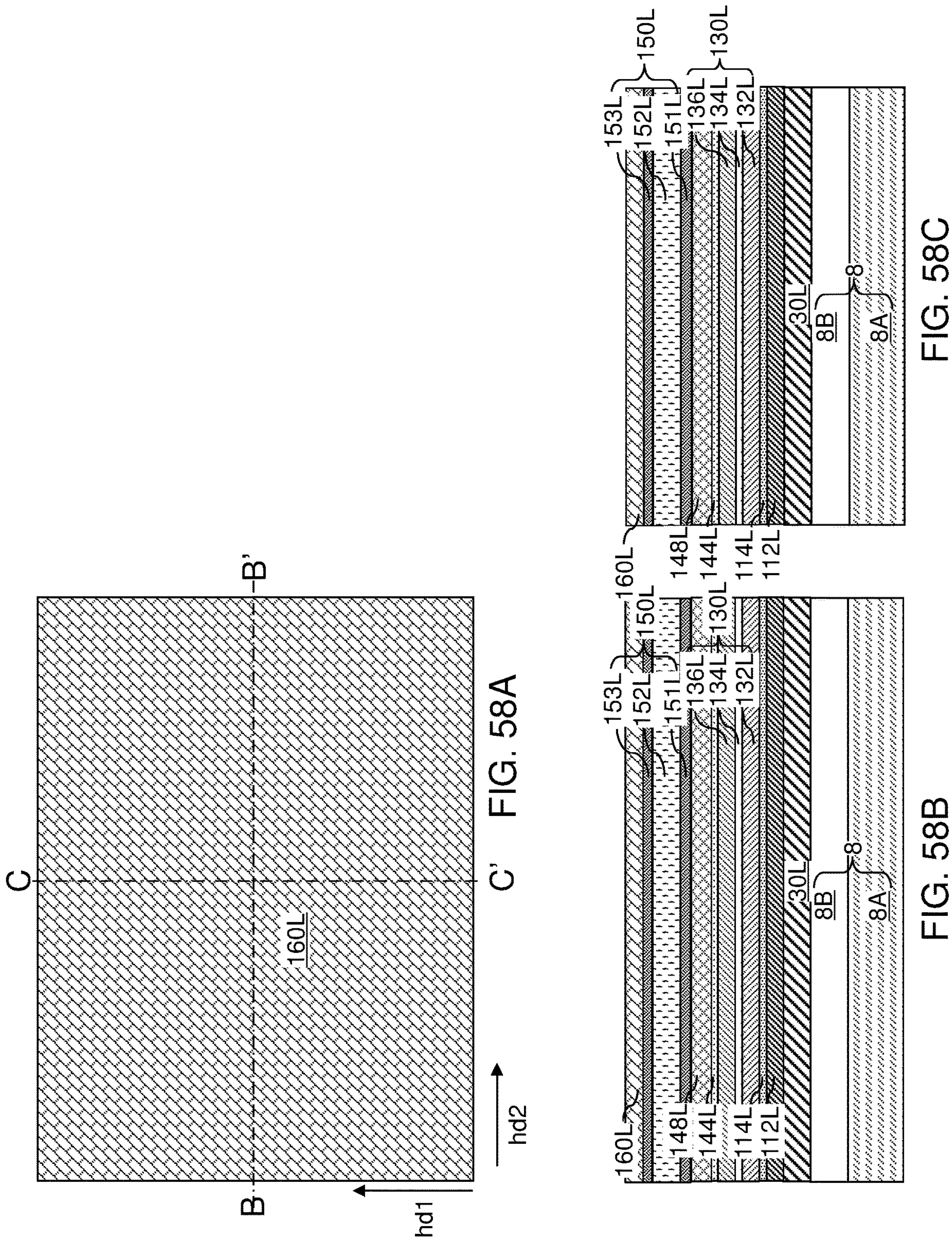
FIGS. 58A-58C are various views of a fourth exemplary structure after formation of a first electrically conductive layer, magnetic tunnel junction material layers, and selector-level material layers according to a fourth embodiment of the present disclosure.

Referring to FIGS. 58A-58C, a fourth exemplary structure according to a fourth embodiment of the present disclosure may be the same as the third exemplary structure illustrated in FIGS. 45A-45C prior to formation of the two-dimensional array of first discrete patterned photoresist material portions 187.

Figure 59A:
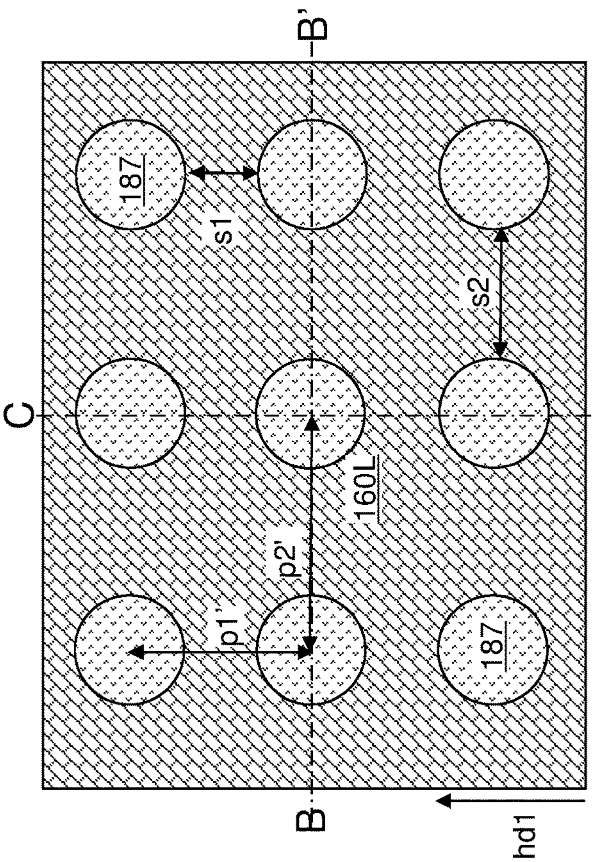
FIGS. 59A-59C are various views of a fourth exemplary structure after formation of a two-dimensional array of discrete resist material portions according to a fourth embodiment of the present disclosure.
Figure 59B:
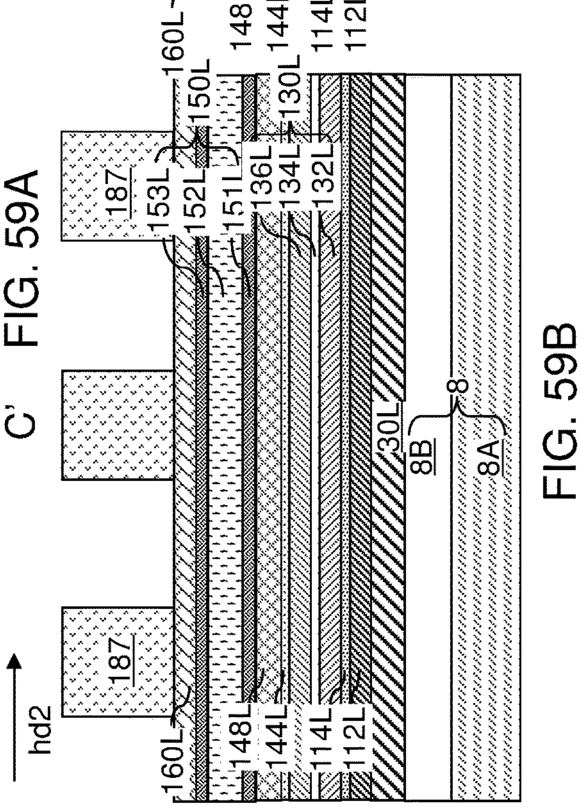
Figure 59C:
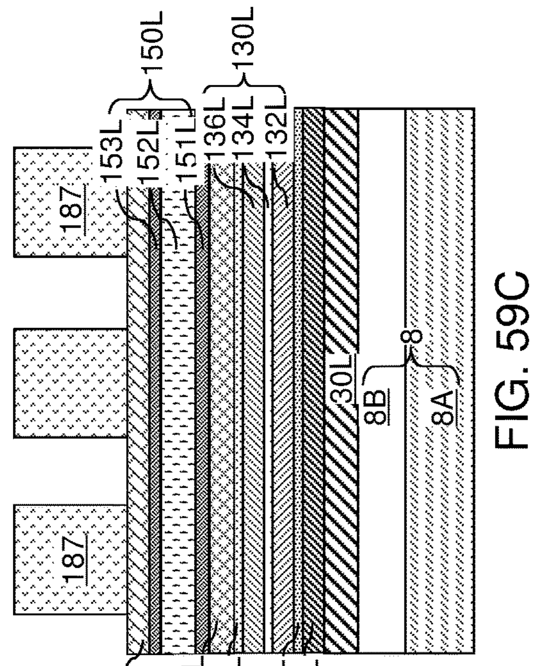

Referring to FIGS. 59A-59C, a two-dimensional array of first discrete patterned resist material portions 187 can be formed over the top surface of the first conductive material layer 160L. The resist material portions may comprise electron beam resist or photoresist material portions. According to an aspect of the present disclosure, the two-dimensional array of first discrete patterned resist material portions 187 can be a periodic two-dimensional array having a first pitch p1' along a first horizontal direction hd1 and having a second pitch p2' along a second horizontal direction hd2. A first nearest-neighbor spacing s1 along the first horizontal direction hd1 of the two-dimensional array of first discrete patterned resist material portions 187 is less than a second nearest-neighbor spacing s2 along the second horizontal direction hd2 of the two-dimensional array of first discrete patterned resist material portions 187.

Each of the first discrete patterned resist material portions 187 may have a respective horizontal cross-sectional shape of a circle. In one embodiment, the maximum lateral dimension of each of the first discrete patterned resist material portions 187 along the first horizontal direction hd1 may be the same as, or may be substantially the same as, the maximum lateral dimension of each of the first discrete patterned resist material portions 187 along the second horizontal direction hd2. In this case, the first pitch p1' is different from the second pitch p2'. In one embodiment, the second pitch p2' is greater than the first pitch p1'. The ratio of the second pitch p2' to the first pitch p1' may be in a range from 1.2 to 4, such as from 1.5 to 3, although lesser and greater ratios may also be employed.

Figure 60A:
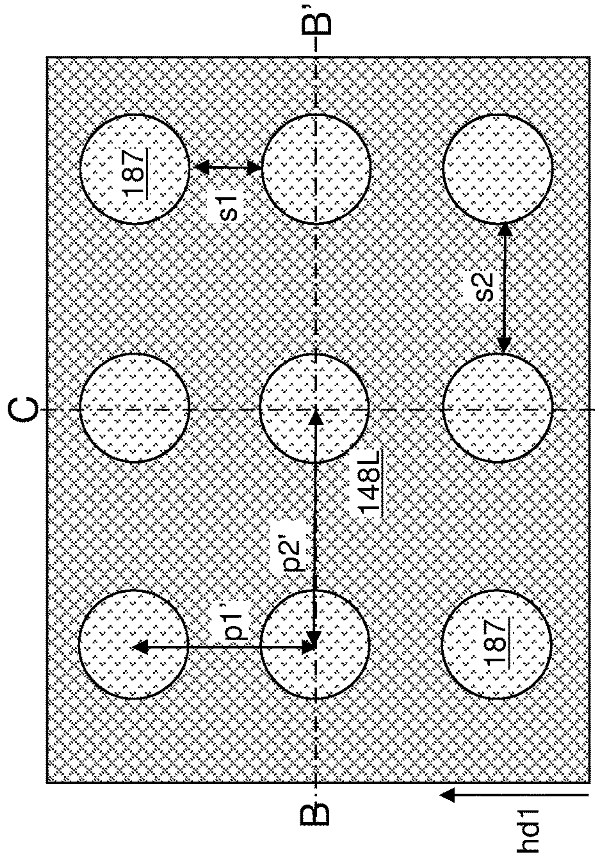
FIGS. 60A-60C are various views of the fourth exemplary structure after formation of a two-dimensional array of first selector-containing pillar structures according to the fourth embodiment of the present disclosure.
Figure 60B:
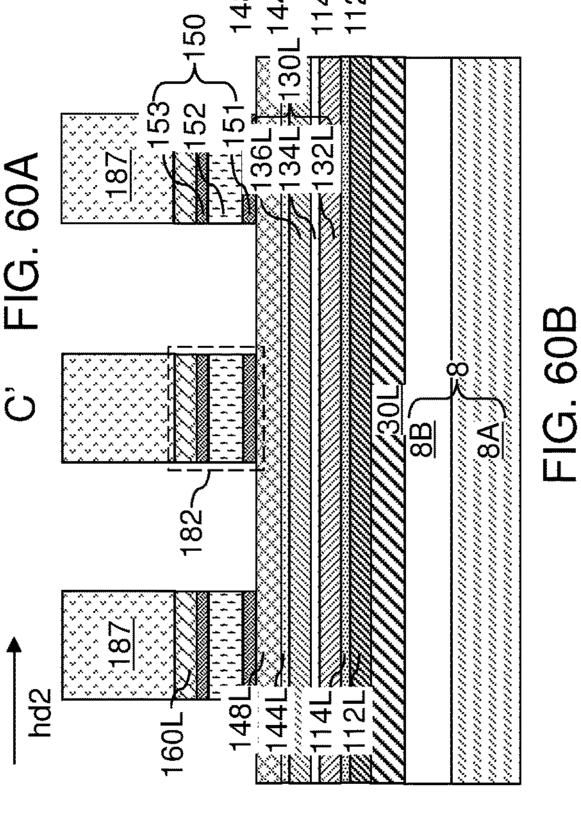
Figure 60C:
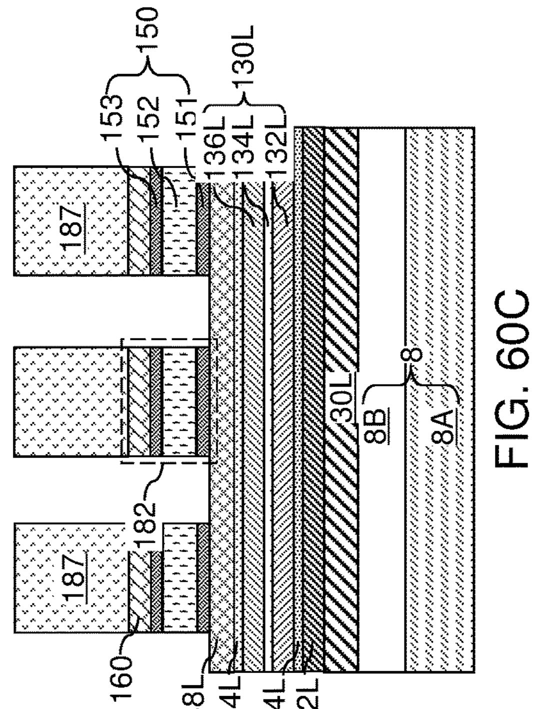
Figure 61D:
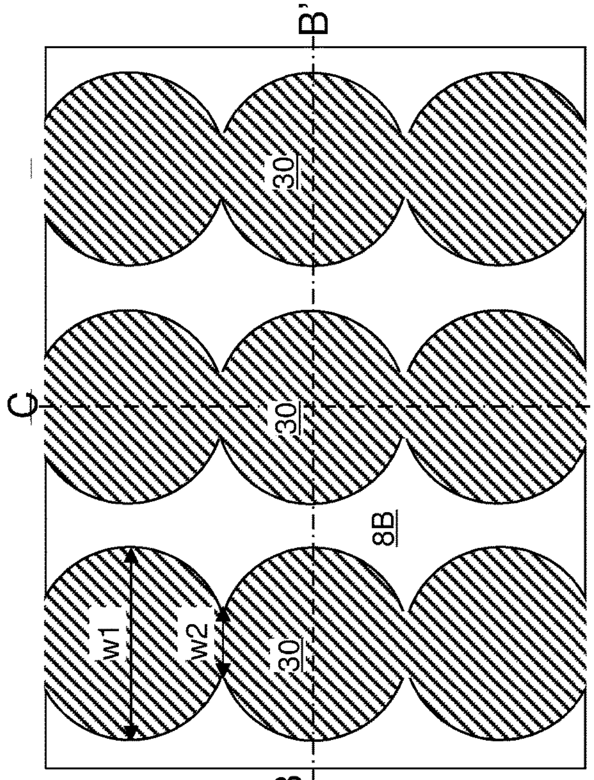
FIGS. 61A-61D are various views of the fourth exemplary structure after formation of a two-dimensional array of first magnetic tunnel junction pillar structures and first electrically conductive lines according to the fourth embodiment of the present disclosure.
Figure 61A:
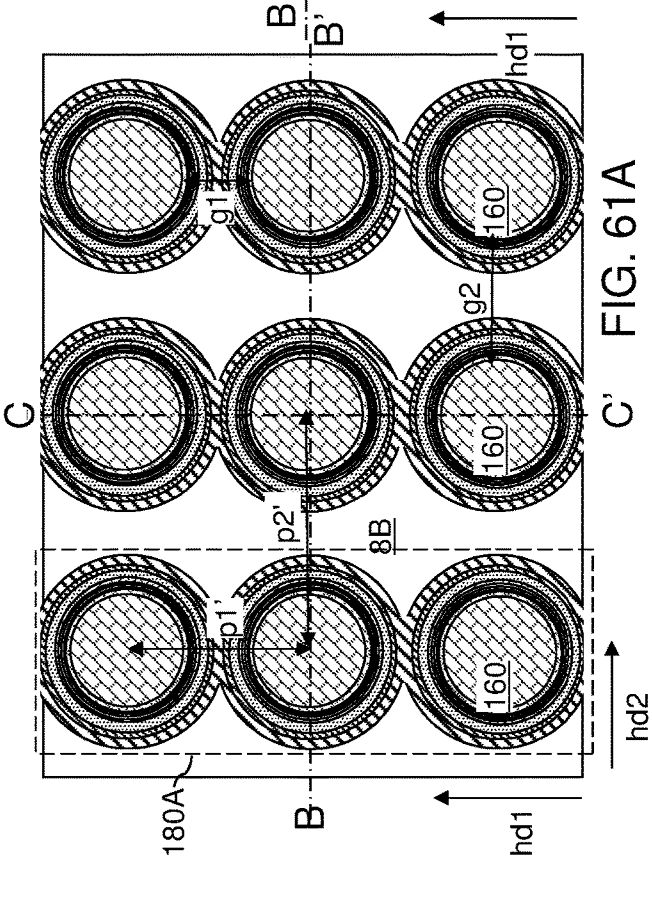
Figure 61C:
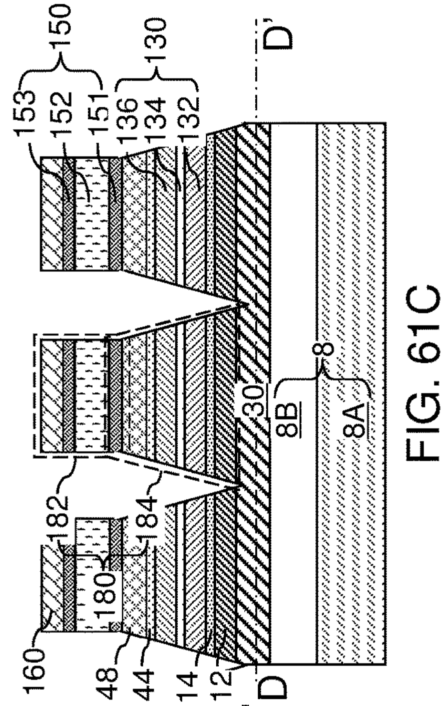
Figure 61B:
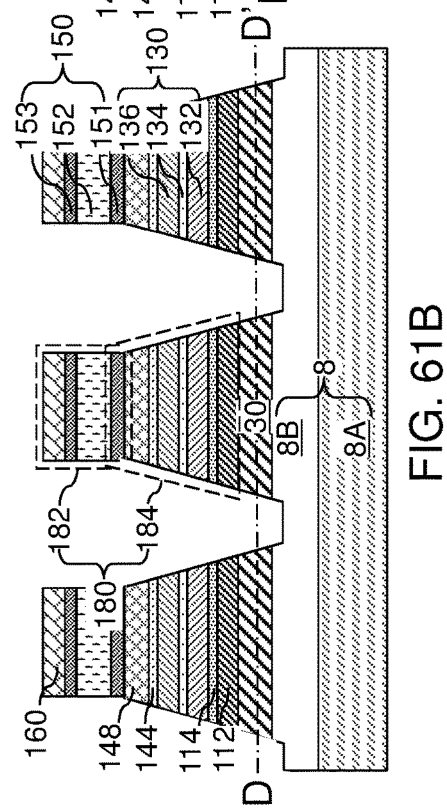

Referring to FIGS. 60A-60C, the processing steps of FIGS. 46A-46C can be performed to form the two-dimensional array of first selector-containing pillar structures 182. Each first selector-containing pillar structure 182 may comprise a first selector element 150 and a first conductive material plate 160. Each first selector element 150 is a patterned portion of the first selector material layers 150L, and each first conductive material plate 160 is a patterned portion of the first conductive material layer 160L. Each first selector element 150 may include a vertical stack of a first lower selector electrode 151, a first non-Ohmic material plate 152, and a first upper selector electrode 153. Each first lower selector electrode 151 is a patterned portion of the first lower selector electrode material layer 151L. Each first non-Ohmic material plate 152 is a patterned portion of the first non-Ohmic material layer 152L. Each first upper selector electrode 153 is a patterned portion of the first upper selector electrode material layer 153L. In one embodiment, the two-dimensional array of first selector-containing pillar structures 182 comprises a two-dimensional periodic array of first selector-containing pillar structures 182 having the first pitch p1' along the first horizontal direction hd1 and having the second pitch p2' along the second horizontal direction hd2. In one embodiment, each of the first selector-containing pillar structures 182 may have a same lateral extent along the second horizontal direction hd2 as along the first horizontal direction hd1.

Referring to FIGS. 61A-61D, the ion beam etch process can be performed to etch unmasked portions of the layer stack (112L, 114L, 130L, 144L, 148L) employing the two-dimensional array of second discrete patterned resist material portions 187 and/or the first conductive material plates (i.e., hard mask plates) 160 as an etch mask. The processing steps described with reference to FIGS. 47A-47D may be performed.

Each patterned portion of the layer stack (112L, 114L, 130L, 144L, 148L) comprises a first magnetic tunnel junction (MTJ) pillar structure 184. A two-dimensional array of first magnetic tunnel junction (MTJ) pillar structures 184 can be formed underneath the two-dimensional array of first selector-containing pillar structures 182. Each contiguous combination of a first selector-containing pillar structure 182 and a first MTJ pillar structure 184 constitutes a first memory cell 180, which can function as a memory cell 180 described with reference to FIG. 2.

The gap g1 (which may be about the same as spacing s1) between neighboring pairs of first electrically conductive plates 160 within each row of first electrically conductive plates 160 may be less than the gap g2 (which may be about the same as spacing s2) between neighboring rows of first electrically conductive plates 160. In this case, the etch rate of the materials of the first magnetic tunnel junction-level (MTJ-level) material layers (112L, 114L, 130L, 144L, 148L) between neighboring rows of first electrically conductive plates 160 can be higher than the etch rate of the materials of the first magnetic tunnel junction-level (MTJ-level) material layers (112L, 114L, 130L, 144L, 148L) between neighboring pairs of first electrically conductive plates 160 within each row of first electrically conductive plates 160 due to the IBE shadowing effect. The first MTJ pillar structures 184 can be formed with tapered sidewalls employing an aspect-ratio-dependent ion beam etch process. The lateral dimensions of the first conductive material plates 160, the first pitch p1', and the second pitch p2' are selected such that portions of the first electrically conductive layer 30L located between neighboring rows of first conductive material plates 160 are removed while portions of the first electrically conductive layer within each row of the first conductive material plates 160 are not removed. In one embodiment, the tapered surfaces of neighboring pairs of first MTJ pillar structures 184 within each row of first MTJ pillar structures 184 arranged along the first horizontal direction hd1 merge above the horizontal plane including the top surface of the first electrically conductive layer 30L, as described above.

The ion bean etch process can anisotropically etch the first magnetic tunnel junction-level (MTJ-level) material layers (112L, 114L, 130L, 144L, 148L) and the first electrically conductive layer 30L such that physically exposed surfaces of remaining portions of the first magnetic tunnel junction-level (MTJ-level) material layers (112L, 114L, 130L, 144L, 148L) are formed with taper angles. The taper angles can be measured with respect to the vertical direction that is perpendicular to the top surface of the substrate 8. In one embodiment, the taper angle may be in a range from 3 degrees to 30 degrees, such as from 6 degrees to 20 degrees, although lesser and greater taper angles may also be employed.

Generally, patterned portions of the first selector-level material layers (150L, 160L) comprise a two-dimensional array of selector-containing pillar structures 182 including a respective selector element 150 and a respective first conductive material plate 160, and patterned portions of the first magnetic tunnel junction-level (MTJ-level) material layers (112L, 114L, 130L, 144L, 148L) comprise a two-dimensional array of first magnetic tunnel junction (MTJ) pillar structures 184. Patterned portions of the first magnetic tunnel junction material layers 130L comprise a two-dimensional array of first magnetic tunnel junctions (MTJs) 130.

In one embodiment, the edges at which a respective pair of tapered sidewalls of the first MTJ pillar structures 184 merge (i.e., are joined to each other) are formed below the horizontal plane including the bottom surfaces of the first free layers 136. In one embodiment, the edges at which a respective pair of tapered sidewalls of the first MTJ pillar structures 184 merge may be formed within the first continuous nonmagnetic tunnel barrier layer 134L, within the first continuous reference layer 132L, or below the first continuous reference layer 132L, as described above with respect to FIGS. 47E to 47G above. Alternatively, in the illustrated example of FIGS. 61A-61D, the edges at which a respective pair of tapered sidewalls of the MTJ pillar structures 184 are not merged above the top surface of the first electrically conductive lines 30.

According to an aspect of the present disclosure, each of the first electrically conductive lines 30 may be patterned with a respective pair of contoured and tapered lengthwise sidewalls that laterally extend along the first horizontal direction hd1. Each of the first electrically conductive lines 30 may be formed with a respective bottom surface having a respective variable width along the second horizontal direction hd2 that varies along the first horizontal direction hd1. In one embodiment shown in FIG. 61D, each of the first electrically conductive lines 30 may comprise a periodic repetition of wider bulging regions w1 and narrower neck regions w2 with a periodicity of the first pitch p1. In one embodiment, each bulging region may have a bottom surface having a uniform radius of curvature (i.e., having a shape of an arc of a circle).

In one embodiment, each of the first electrically conductive lines 30 comprises a pair of contoured lengthwise sidewalls that generally extend along the first horizontal direction hd1 with a lateral undulation along the second horizontal direction hd2, and each of the contoured lengthwise sidewalls comprises curved segments w1 having a uniform radius of curvature at any given height, and pairs of adjoined convex sidewalls adjoined at a respective vertically-extending edge located at a respective neck region w2.

Each vertical stack of a first selector-containing pillar structure 182 and a first MTJ pillar structure 184 constitutes a first memory cell 180. According to an aspect of the present disclosure, each row of first memory cells 180 that are arranged along the first horizontal direction hd1 are merged with each other below the horizontal plane including the bottom surfaces of the first free layers 136 within the respective row of first memory cells 180. Each merged row of first memory cells 180 is herein referred to as first selector-magnetic tunnel junction (selector-MTJ) assembly 180A. The fourth exemplary structure can include rows of first selector-magnetic tunnel junction (selector-MTJ) assemblies 180A located on a respective one of the first electrically conductive lines 30. Each of the selector-MTJ assemblies 180A comprises a respective row of first magnetic tunnel junction (MTJ) pillar structures 184 and a respective row of first selector-containing pillar structures 182 that are arranged along the first horizontal direction hd1. Tapered sidewalls of each neighboring pair of first MTJ pillar structures 184 within the respective row of first MTJ pillar structures 184 are adjoined to each other at a respective edge laterally extending along the second horizontal direction hd2 and located above a horizontal plane including bottom surfaces of the first electrically conductive lines 30.

In one embodiment, the rows of first selector-containing pillar structures 182 are arranged as a two-dimensional periodic array of first selector-containing pillar structures 182 having a first pitch p1' along the first horizontal direction hd1 and having a second pitch p2' long the second horizontal direction hd2. A lateral spacing g1 between neighboring pairs of first selector-containing pillar structures 182 that are laterally spaced apart along the first horizontal direction hd1 is less than a lateral spacing g2 between neighboring pairs of first selector-containing pillar structures 182 that are laterally spaced apart along the second horizontal direction hd2.

In one embodiment, each of the selector-containing pillar structures 182 has an elongated horizontal cross-sectional shape having a greater lateral dimension along the first horizontal direction hd1 than along the second horizontal direction hd2, and the rows of selector-containing pillar structures 182 are arranged as a two-dimensional periodic array of selector-containing pillar structures 182 having the first pitch p1' along the first horizontal direction hd1 and having the second pitch p2 along the second horizontal direction hd2'. In one embodiment, the second pitch p2 is greater than the first pitch p1.

Each of the first MTJ pillar structures 184 comprises a vertical stack including a first reference layer 132, a first tunnel barrier layer 134, and a first free layer 136. First free layers 136 within the respective row of first MTJ pillar structures are laterally spaced apart from each other along the first horizontal direction hd1 and do not contact one another.

In one embodiment, each free layer 136 within the two-dimensional array of MTJ pillar structures 184 has a respective horizontal cross-sectional shape having a same lateral extent along the first horizontal direction hd1 and along the second horizontal direction hd2. In one embodiment, each free layer 136 may have a horizontal cross-sectional shape of a circle.

Figure 62A:
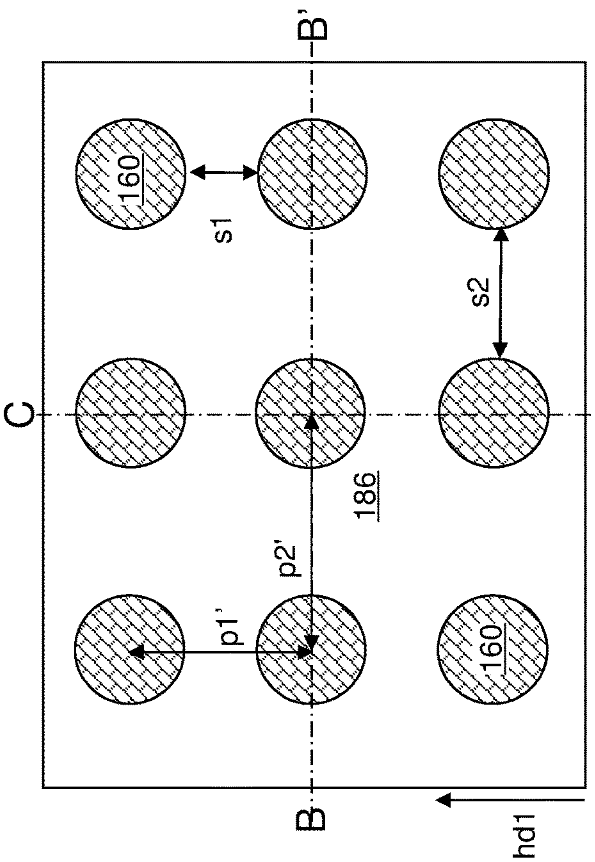
FIGS. 62A-62C are various views of the fourth exemplary structure after formation of a first dielectric matrix layer according to the fourth embodiment of the present disclosure.
Figure 62B:
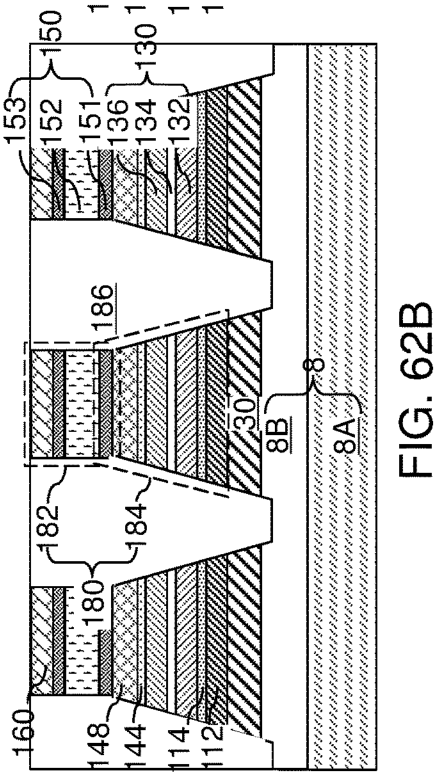
Figure 62C:
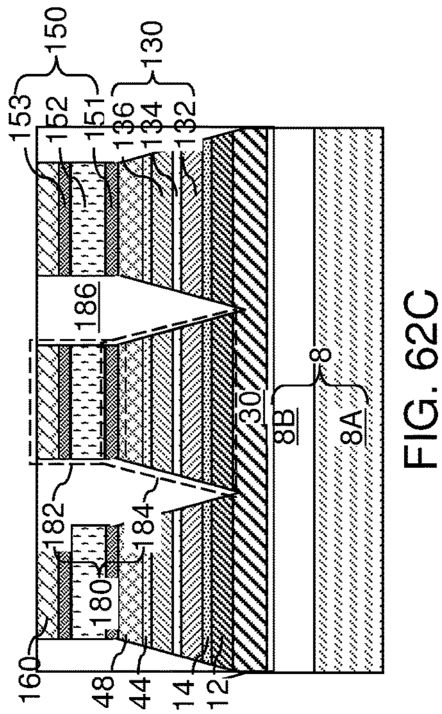

Referring to FIGS. 62A-62C, a dielectric fill material can be deposited in gaps between neighboring pairs of first memory cells 180 to form a dielectric matrix layer, which is herein referred to as a first dielectric matrix layer 186. Excess portions of the dielectric fill material of the first dielectric matrix layer 186 can be removed from above a horizontal plane including top surfaces of the first selector-containing pillar structures 182 by a planarization process such as a chemical mechanical polishing process. A top surfaces of a remaining portion of the first dielectric matrix layer 186 is formed within a horizontal plane including top surfaces of the two-dimensional array of first selector-containing pillar structures 182. In an alternative configuration, the CMP process is continued to also remove the first hardmask plates 160 and to expose the upper surface of the first upper selector electrodes 153, similar to the step shown in FIGS. 9D-9F.

Figure 63A:
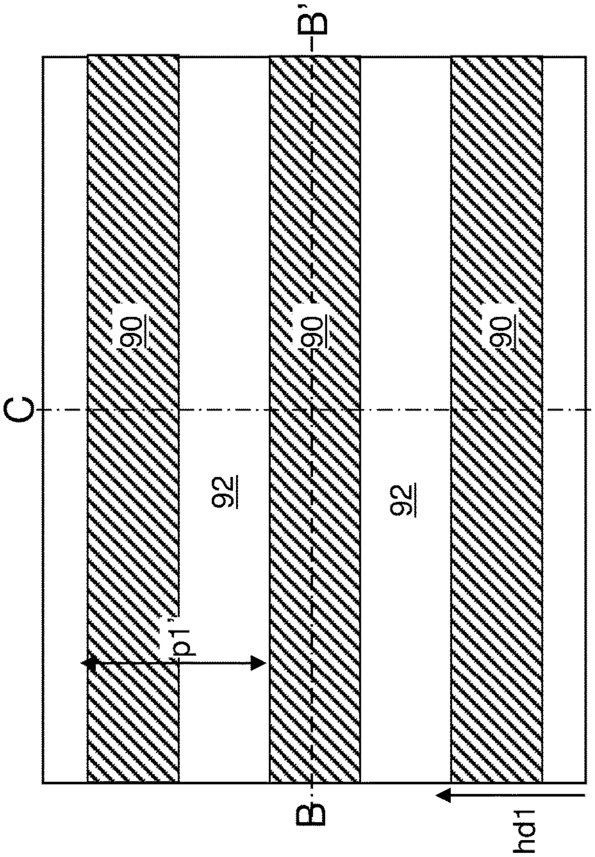
FIGS. 63A-63C are various views of the fourth exemplary structure after formation of second electrically conductive lines according to the fourth embodiment of the present disclosure.
Figure 63B:
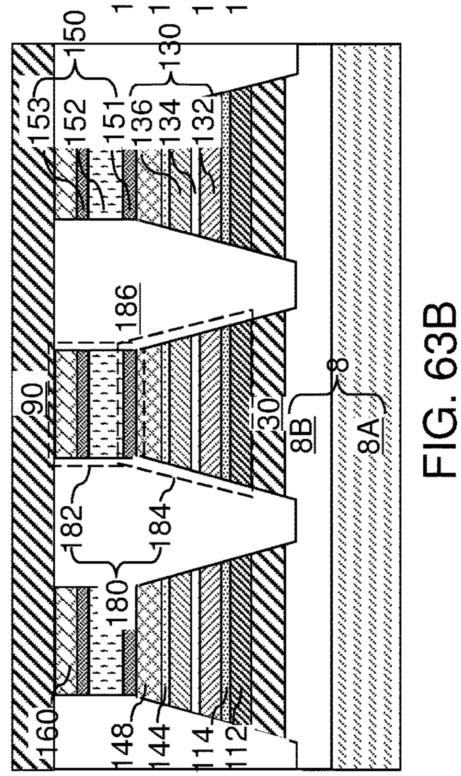
Figure 63C:
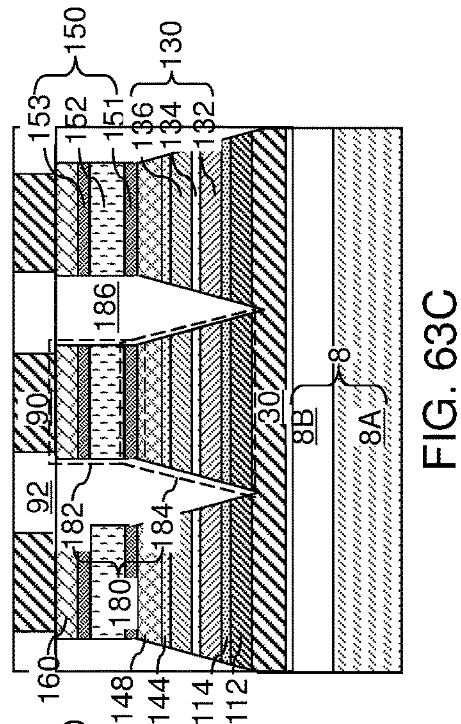

Referring to FIGS. 63A-63C, a line-level dielectric layer 92 can be formed by depositing a dielectric material over the two-dimensional array of first memory cells 180. Line trenches laterally extending along the second horizontal direction hd2 can be formed above each column of first MTJ pillar structures 184. A conductive material can be deposited in the line trenches, and excess portions of the conductive material can be removed from above the horizontal plane including the top surface of the line-level dielectric layer 92. Remaining portions of the conductive material filling the line trenches constitute second electrically conductive lines 90. The second electrically conductive lines 90 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrically conductive lines 90 can be in a range from 20 nm to 100 nm, although lesser and greater thicknesses can also be employed. Alternatively, instead of using the above described damascene process to form the second electrically conductive lines 90, these lines may be formed by a pattern and etch process.

Generally, the height of the edges of the V-shaped indentations in the first selector-MTJ assemblies 180A may be changed as in the alternative configurations of the third exemplary structure. Specifically, the edges of the V-shaped indentations in the first selector-MTJ assemblies 180A may be formed anywhere between the horizontal plane including the top surfaces of the first electrically conductive lines 30 and the horizontal plane including the bottom surfaces of the first free layers 136.

Figure 64A:
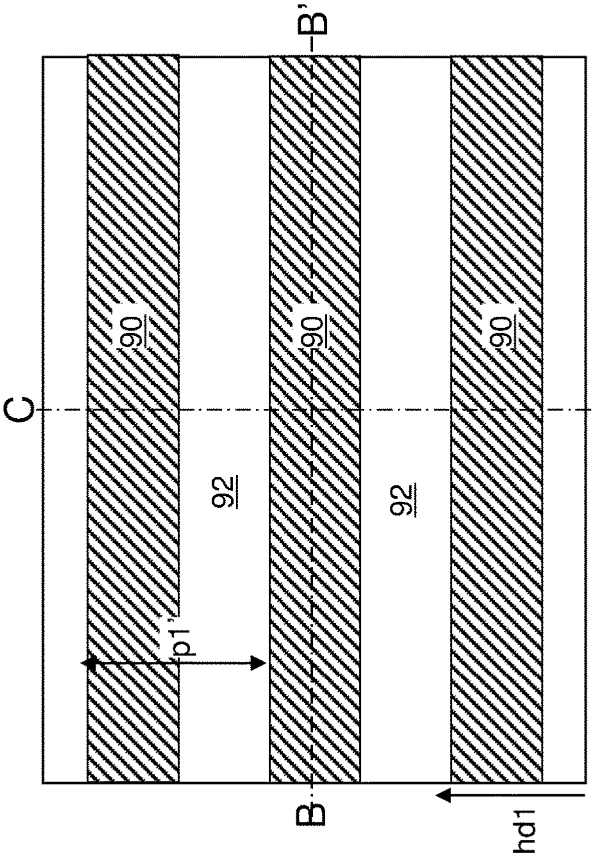
FIGS. 64A-64C are various views of a first alternative configuration of the fourth exemplary structure after formation of fourth electrically conductive lines according to the fourth embodiment of the present disclosure.
Figure 64B:
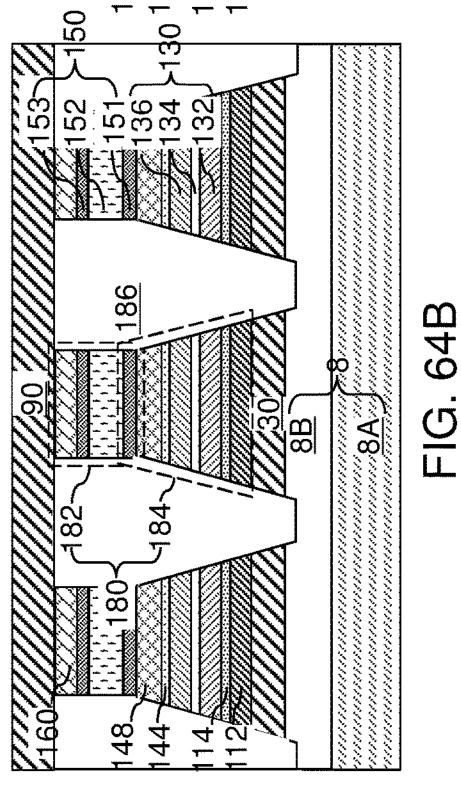
Figure 64C:
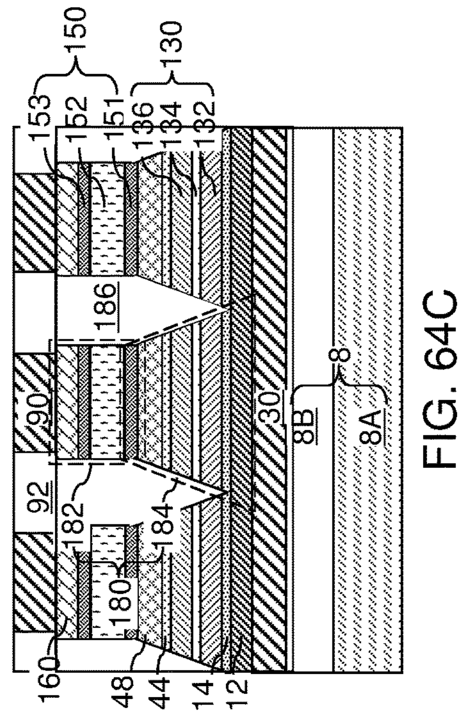

Referring to FIGS. 64A-64C, a first alternative configuration of the fourth exemplary structure can be derived from the fourth exemplary structure illustrated in FIGS. 63A-63C by modifying at least one of the ion beam etch processes that patterns the first MTJ pillar structures 184 and/or the second MTJ pillar structures 284. In one embodiment, a first antiferromagnetic coupling layer 114 is located underneath a first reference layer 132 within each first MTJ pillar structure 184 in a first selector-MTJ assembly 180A. The first antiferromagnetic coupling layers 114 within the respective row of MTJ pillar structures 184 in each first selector-MTJ assembly 180A may be interconnected as a single continuous antiferromagnetic coupling structure, and may extend underneath the respective row of selector-containing pillar structures 182. In one embodiment, the edges at which tapered sidewalls of a respective neighboring pair of MTJ pillar structures 184 are adjoined may be located at V-shaped indentations in a top surface of the single continuous antiferromagnetic coupling structure.

Figure 65A:
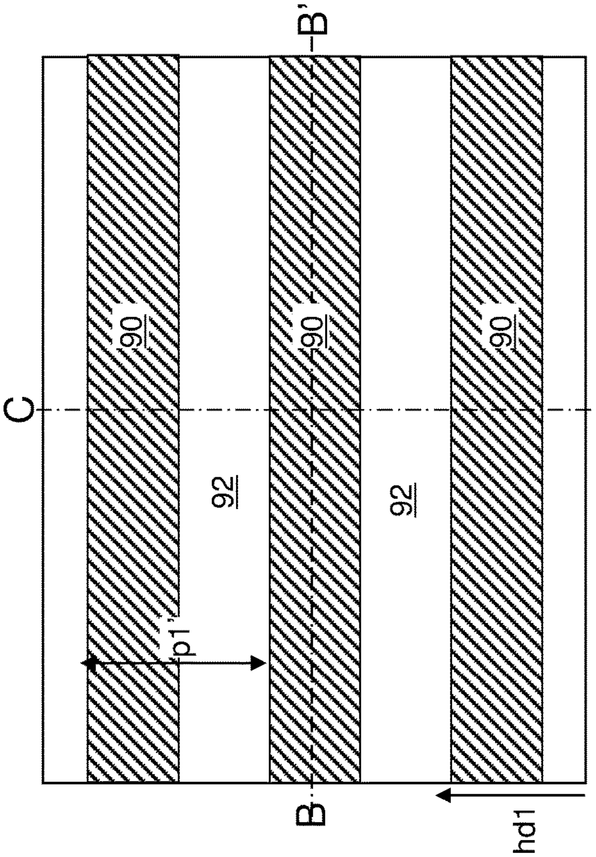
FIGS. 65A-65C are various views of a second alternative configuration of the fourth exemplary structure after formation of fourth electrically conductive lines according to the fourth embodiment of the present disclosure.
Figure 65B:
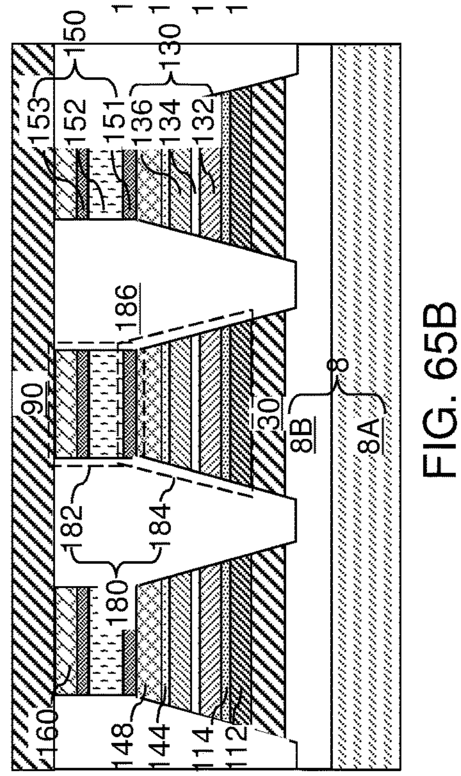
Figure 65C:
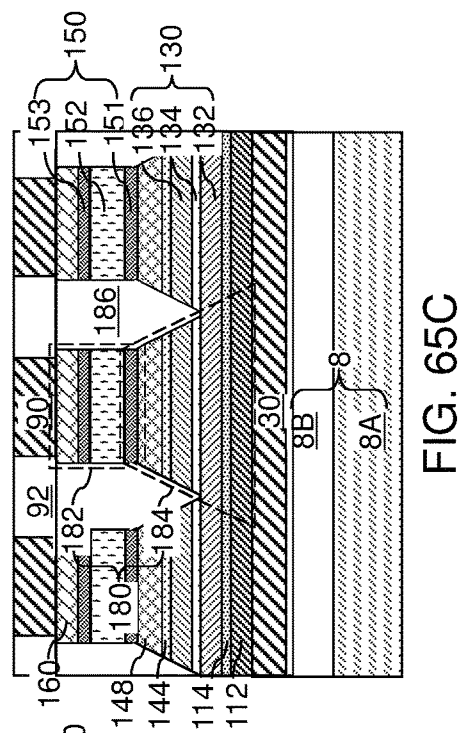

Referring to FIGS. 65A-65C, a second alternative configuration of the fourth exemplary structure can be derived from the fourth exemplary structure illustrated in FIGS. 63A-63C by modifying at least one of the ion beam etch processes that patterns the first MTJ pillar structures 184 and/or the second MTJ pillar structures 284. In one embodiment, the first nonmagnetic tunnel barrier layers 134 within the respective row of first MTJ pillar structures 184 in a first selector-MTJ assembly 180A are merged as a single continuous nonmagnetic tunnel barrier structure underlying the respective row of first selector-containing pillar structures 182. The edges at which tapered sidewalls of a respective neighboring pair of first MTJ pillar structures 184 are adjoined are located at V-shaped indentations in a top surface of the single continuous nonmagnetic tunnel barrier structure.

In other alternative embodiments, the edges at which tapered sidewalls of a respective neighboring pair of first MTJ pillar structures 184 are adjoined are located at V-shaped indentations in a top surface of the single continuous superlattice structure, as described above with respect to FIG. 47E, or in a top surface of the single continuous reference structure, as described above with respect to FIG. 47G.

In the third and fourth embodiments, the bottom electrically conductive lines (e.g., word lines) are formed without an additional lithography step and are self-aligned with the memory bits (e.g., MRAM cells 180). The MRAM/selector film stack may be deposited onto a polished dielectric substrate without potential roughness/topography caused by deposition onto pre-patterned bottom word lines. By using a rectangular lattice, this method can significantly boost the areal density of MRAM die.

Referring collectively to FIGS. 1, 2, 44A-65C, and other related drawings of the instant application, a memory array is provided, which comprises: first electrically conductive lines 30 laterally extending along a first horizontal direction hd1 and laterally spaced apart along a second horizontal direction hd2; rows of selector-magnetic tunnel junction (selector-MTJ) assemblies 180A located on a respective one of the first electrically conductive lines 30, wherein each of the selector-MTJ assemblies 180A comprises a respective row of magnetic tunnel junction (MTJ) pillar structures 184 and a respective row of selector-containing pillar structures 182 that are arranged along the first horizontal direction hd1, and a lateral spacing between neighboring pairs of selector-containing pillar structures 182 that are laterally spaced apart along the first horizontal direction hd1 is less than a lateral spacing between neighboring pairs of selector-containing pillar structures 182 that are laterally spaced apart along the second horizontal direction hd2; and second electrically conductive lines 90 laterally extending along the second horizontal direction hd2 and overlying a respective column of the selector-MTJ assemblies 180A.

In one embodiment, each of the first electrically conductive lines 30 has a respective variable width along the second horizontal direction hd2 that varies along the first horizontal direction hd1.

In one embodiment, each of the selector-MTJ assemblies 180A includes a respective selector-containing pillar structure 182 overlying a respective one of the MTJ pillar structures 184; and the selector-containing pillar structures 182 are arranged as a two-dimensional periodic array of the selector-containing pillar structures having a first pitch (p1 or p1') along the first horizontal direction hd1 and having a second pitch (p2 or p2') along the second horizontal direction hd2.

In the third embodiment, each of the selector-containing pillar structures 182 has a first lateral dimension ld1 along the first horizontal direction hd1 and has a second lateral dimension ld2 along the second horizontal direction hd2 that is less than the first lateral dimension ld1; and the second pitch p2 is the same as the first pitch p1.

In the fourth embodiment, each of the selector-containing pillar structures 182 has a same lateral extent along the second horizontal direction hd2 as along the first horizontal direction hd1; and the second pitch p2' is greater than the first pitch p1'. Each of the selector-containing pillar structures 182 has a circular horizontal cross-sectional shape.

In one embodiment, tapered sidewalls of each neighboring pair of MTJ pillar structures 184 within the respective row of MTJ pillar structures 184 are adjoined to each other at a respective edge located above a horizontal plane including top surfaces of the first electrically conductive lines 30. Each of the MTJ pillar structures 184 comprises a vertical stack including a reference layer 132, a tunnel barrier layer 134, and a free layer 136; and free layers 136 within the respective row of MTJ pillar structures 184 are laterally spaced apart from each other along the first horizontal direction hd1 and do not contact one another.

In one embodiment, reference layers 132 within the respective row of MTJ pillar structures 184 are interconnected as a single continuous reference structure underlying the respective row of selector-containing pillar structures 182. The edges at which tapered sidewalls of a respective neighboring pair of MTJ pillar structures 184 are adjoined are located at V-shaped indentations in a top surface of the single continuous reference structure.

In one embodiment, nonmagnetic tunnel barrier layers 134 within the respective row of MTJ pillar structures 184 are interconnected as a single continuous nonmagnetic tunnel barrier structure underlying the respective row of selector-containing pillar structures 182. The edges at which tapered sidewalls of a respective neighboring pair of MTJ pillar structures 184 are adjoined are located at V-shaped indentations in a top surface of the single continuous non-magnetic tunnel barrier structure.

In one embodiment, a superlattice layer 112 is located underneath the reference layer 132 within each vertical stack, and superlattice layers 112 within the respective row of MTJ pillar structures 184 are interconnected as a single continuous superlattice structure that extends underneath the respective row of selector-containing pillar structures 182. In one embodiment, the edges at which tapered sidewalls of a respective neighboring pair of MTJ pillar structures 184 are adjoined are located at V-shaped indentations in a top surface of the single continuous superlattice structure.

In one embodiment, an antiferromagnetic coupling layer 114 is located underneath the reference layer 132 within each vertical stack, and antiferromagnetic coupling layers 114 within the respective row of MTJ pillar structures 184 are interconnected as a single continuous antiferromagnetic coupling structure that extends underneath the respective row of selector-containing pillar structures 182. The edges at which tapered sidewalls of a respective neighboring pair of MTJ pillar structures 184 are adjoined are located at V-shaped indentations in a top surface of the single continuous antiferromagnetic coupling structure.

In one embodiment, each of the first electrically conductive lines 30 comprises a laterally alternating sequence of uniform thickness segments that underlie a respective one of the MTJ pillar structures and indented segments that includes a V-shaped indentation in a respective top surface.

In the third embodiment, each of the first electrically conductive lines 30 comprises a pair of contoured lengthwise sidewalls that generally extend along the first horizontal direction hd1 with a lateral undulation along the second horizontal direction hd2. Each of the contoured lengthwise sidewalls comprises straight segments laterally extending along the first horizontal direction hd1 and pairs of adjoined convex sidewalls adjoined at a respective vertically-extending edge.

In the fourth embodiment, each of the first electrically conductive lines 30 comprises a periodic repetition of wider bulging regions w1 and narrower neck regions w2; and each bulging region w1 has a bottom surface having a uniform radius of curvature.

Figures 66A, 66B, 66C:
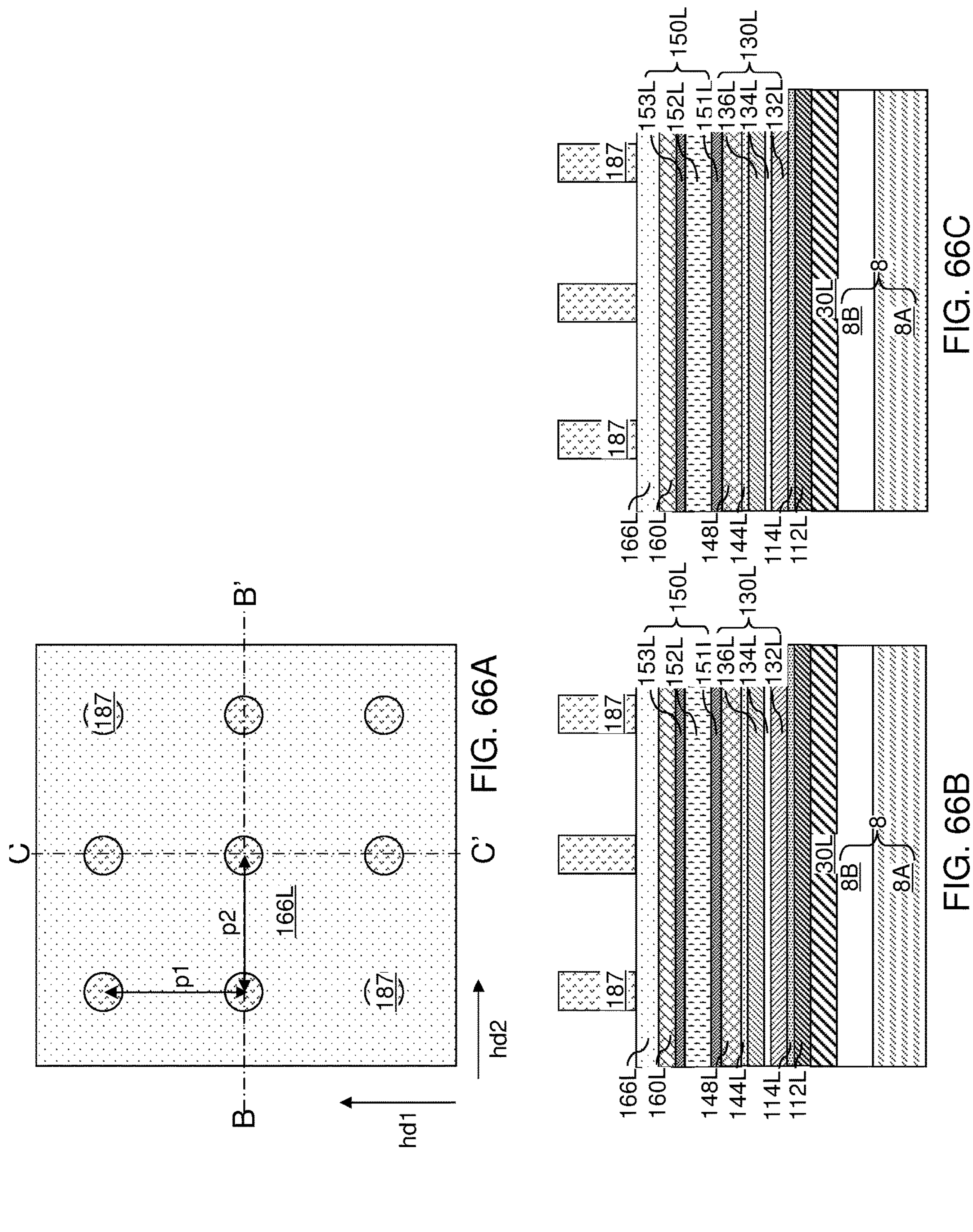
FIGS. 66A-66C are various views of a fifth exemplary structure after formation of a first electrically conductive layer, magnetic tunnel junction material layers, selector-level material layers, and a two-dimensional array of discrete resist material portions according to a fifth embodiment of the present disclosure.

Referring to FIGS. 66A-66C, a fifth exemplary structure according to a fifth embodiment of the present disclosure is illustrated, which can be derived from the fourth exemplary structure illustrated in FIGS. 58A-58C by forming an optional sacrificial capping material layer 166L over the selector-level material layers (150L, 160L). If layer 160L comprises a conductive material layer which remains in the final device, then the sacrificial capping material layer 166L comprises a sacrificial material that may be subsequently employed as hardmask material during a subsequent anisotropic etch process that patterns the first electrically conductive layer 30L. Alternatively, if layer 160L comprises a sacrificial hardmask material, then the sacrificial capping material layer 166L may be omitted. In one embodiment, the sacrificial capping material layer 166L comprises a dielectric material such as silicon oxide, silicon nitride, or a metal oxide (e.g., aluminum oxide). The thickness of the sacrificial capping material layer 166L may be in a range from 3 nm to 100 nm, such as from 10 nm to 30 nm, although lesser and greater thicknesses may also be employed.

A photoresist layer may be applied over the sacrificial capping material layer 166L (if present), and can be lithographically patterned into a two-dimensional array of discrete photoresist material portions 187. The two-dimensional array of discrete photoresist material portions 187 may be formed as a periodic two-dimensional array having a first pitch p1 along a first horizontal direction hd1 and having a second pitch p2 along a second horizontal direction hd2. The second pitch p2 may be the same as, or may be different from, the first pitch p1. Each of the discrete patterned photoresist material portions 187 may have a respective horizontal cross-sectional shape of a rectangle, a rounded rectangle, an oval, or a circle. The dimensions and shapes of the discrete patterned photoresist material portions 187 may be selected to provide a geometry that is conducive to subsequent patterning of the first electrically conductive layer 30L. In one embodiment, each of the discrete patterned photoresist material portions 187 may have a circular horizontal cross-sectional shape or an elongated horizontal cross-sectional shape. The lateral dimensions of each discrete patterned photoresist material portions 187 may be in a range from 3 nm to 300 nm, such as from 10 nm to 100 nm, although lesser and greater lateral dimensions may also be employed. The first pitch p1 and the second pitch p2 may be in a range from 6 nm to 200 nm, such as from 20 nm to 80 nm, although lesser and greater dimensions may also be employed.

Figure 67A:
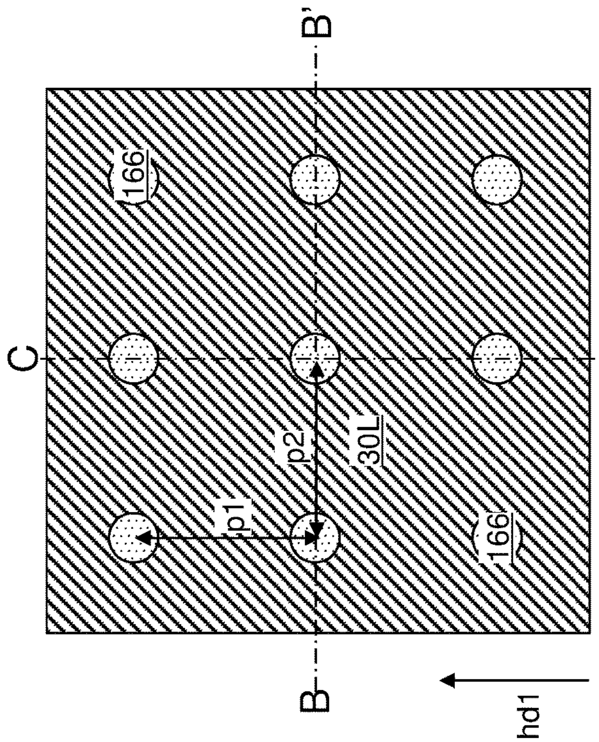
FIGS. 67A-67C are various views of the fifth exemplary structure after formation of a two-dimensional array of memory pillar structures according to a fifth embodiment of the present disclosure.
Figure 67B:
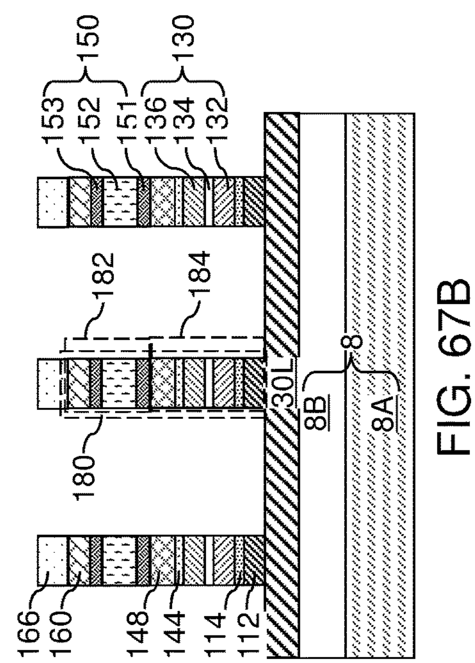
Figure 67C:
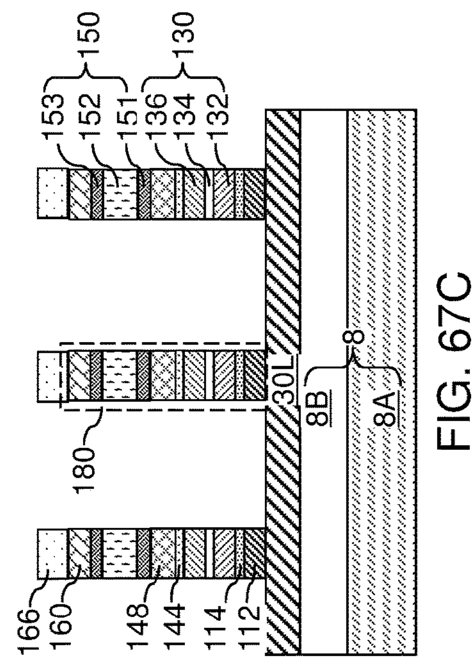

Referring to FIGS. 67A-67C, one or more pattern transfer processes may be performed transfer the pattern in the two-dimensional array of discrete photoresist material portions 187 through the sacrificial capping material layer 166L (if present), the selector-level material layers (150L, 160L), and the magnetic tunnel junction-level (MTJ-level) material layers (112L, 114L, 130L, 144L, 148L). The first electrically conductive layer 30L can be employed as an etch stop material layer. The sacrificial capping material layer 166L may be patterned into a two-dimensional array of sacrificial capping material plates 166. The selector-level material layers (150L, 160L) is patterned into a two-dimensional array of selector-containing pillar structures 182. The MTJ-level material layers (112L, 114L, 130L, 144L, 148L) can be patterned into a two-dimensional array of magnetic tunnel junction (MTJ) pillar structures 184 containing a two-dimensional array of magnetic tunnel junctions 130.

In one embodiment, the two-dimensional array of discrete photoresist material portions 187 may be employed as an etch mask throughout the one or more pattern transfer processes. Alternatively, the two-dimensional array of discrete photoresist material portions 187 may be consumed during the one or more pattern transfer processes, and the two-dimensional array of sacrificial capping material plates 166 may be employed as an etch mask at least during a terminal step of the one or more pattern transfer processes. Yet alternatively, the two-dimensional array of discrete photoresist material portions 187 may be removed after etching a subset of layers within the sacrificial capping material layer 166L, the selector-level material layers (150L, 160L), or the magnetic tunnel junction-level (MTJ-level) material layers (112L, 114L, 130L, 144L, 148L), and the two-dimensional array of sacrificial capping material plates 166 may be employed as an etch mask at least during a terminal step of the one or more pattern transfer processes. In an illustrative example, a reactive ion etch process may be employed to pattern the sacrificial capping material layer 166L and the selector-level material layers (150L, 160L), the two-dimensional array of discrete photoresist material portions 187 may be removed, for example, by ashing, and an ion beam etch process employing the two-dimensional array of sacrificial capping material plates 166 may be performed to pattern the magnetic tunnel junction-level (MTJ-level) material layers (112L, 114L, 130L, 144L, 148L).

Generally, the sacrificial capping material layer 166L can be patterned into sacrificial capping material plates 166 by transferring the pattern in the two-dimensional array of discrete photoresist material portions 187 through the sacrificial capping material layer 166L. The pattern in the two-dimensional array of discrete photoresist material portions 187 can be subsequently transferred through the selector-level material layers (150L, 160L) and the magnetic-tunnel-junction-level material layers (112L, 114L, 130L, 144L, 148L). Remaining portions of the selector-level material layers (150L, 160L) comprise the two-dimensional array of selector-containing pillar structures 182, and remaining portions of the magnetic-tunnel-junction-level material layers (112L, 114L, 130L, 144L, 148L) comprise the magnetic tunnel junction pillar structures 184. The magnetic tunnel junction material layers 130L is patterned into a two-dimensional array of magnetic tunnel junctions 130. Each contiguous combination of a magnetic tunnel junction pillar structure 184 and a selector-containing pillar structure 182 constitutes a memory cell 180. Sidewalls of each component within a memory cell 180 may be vertically coincident among one another. A two-dimensional array of memory cells 180 can be formed over the first electrically conductive layer 30L. Each of the memory cells 180 comprises a vertical stack including a magnetic tunnel junction pillar structure 184 and a selector-containing pillar structure 182.

Figures 68A, 68B, 68C:
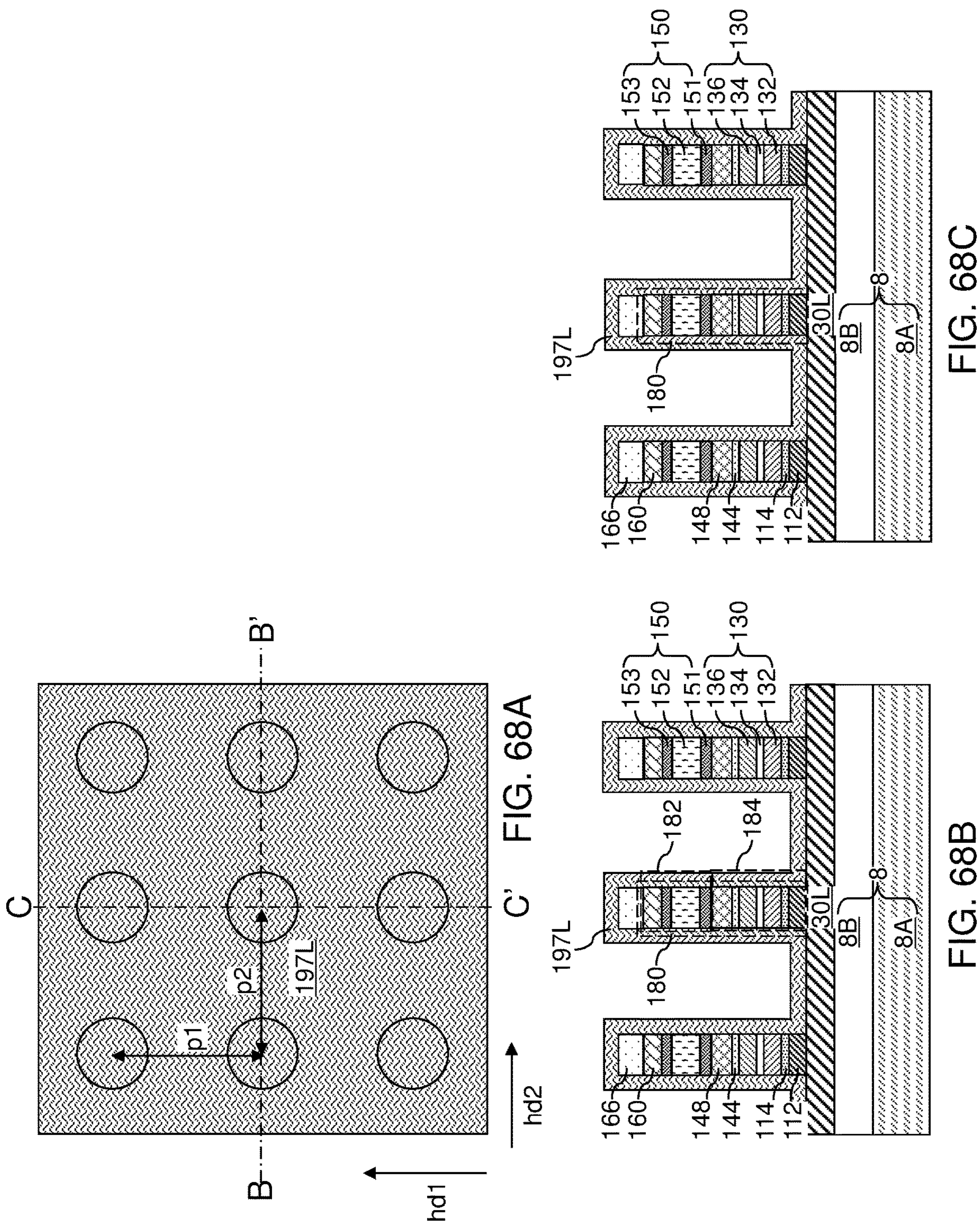
FIGS. 68A-68C are various views of the fifth exemplary structure after formation of a continuous resist layer according to the fifth embodiment of the present disclosure.

Referring to FIGS. 68A-68C, a continuous resist layer 197L can be deposited over the two-dimensional array of memory cells 180 by a conformal deposition process. The conformal deposition process may comprise an atomic layer deposition process or a CVD process. In one embodiment, the continuous resist layer 197L comprises a dry electron beam (e-beam) resist material or a dry extreme ultraviolet (EUV) lithography (e.g., 13.5 nm wavelength lithography) resist that lacks a solvent. In one embodiment, the continuous resist layer 197L comprises a negative resist material, i.e., a resist material that becomes chemical insoluble upon exposure to an electron beam or UV radiation.

In an alternative embodiment, the continuous resist layer 197L comprises, and/or consists essentially of, a hydrogen silsesquioxane-based polymer material. In one embodiment, the continuous resist layer 197L may be composed primarily of, and/or may consist essentially or, and/or may consist of, hydrogen silsesquioxane including a polymerized chain of $[HSiO_{3/2}]_n$, in which n is an integer in a range from 4 to 10,000.

The continuous resist layer 197L comprises a horizontally-extending planar resist layer overlying the first electrically conductive layer 30L, a two-dimensional array of tubular resist portions laterally surrounding the two-dimensional array of memory cells 180, and a two-dimensional array of capping resist portions overlying the two-dimensional array of memory cells 180. The horizontally-extending planar resist layer may have uniform vertical thickness. The uniform thickness of the horizontally-extending planar resist layer may be in a range from 10 nm to 200 nm, although lesser and greater thicknesses may also be employed. In one embodiment, the two-dimensional array of tubular resist portions have a respective lateral thickness between an inner sidewall and an outer sidewall that is in a range from 50% to 100%, such as from 80% to 100%, of the uniform vertical thickness of the horizontally-extending planar resist layer. The two-dimensional array of tubular resist portions are spaced apart and are not in direct contact with each other.

Figure 69A:
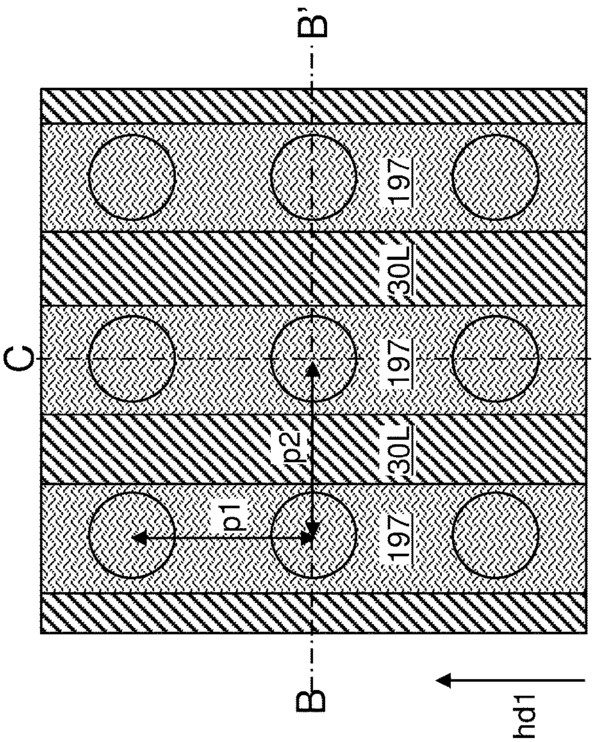
FIGS. 69A-69C are various views of the fifth exemplary structure after patterning the continuous resist layer into discrete resist material portions according to the fifth embodiment of the present disclosure.
Figure 69B:
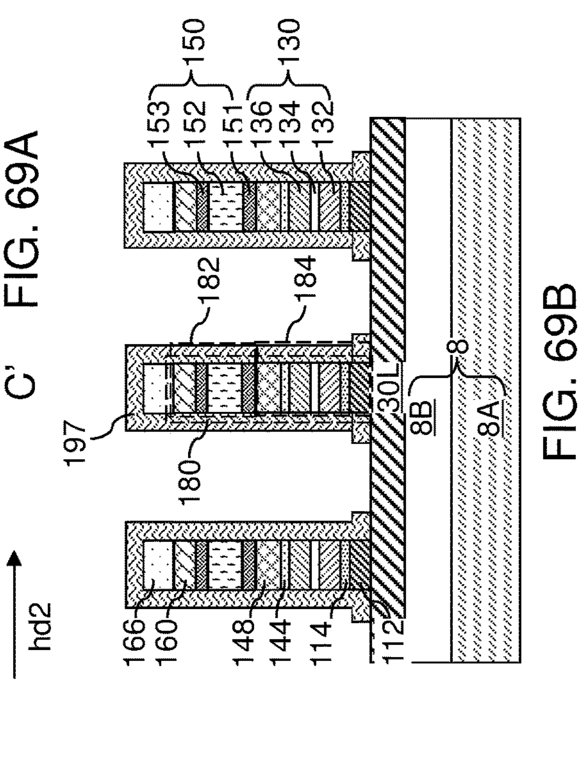
Figure 69C:
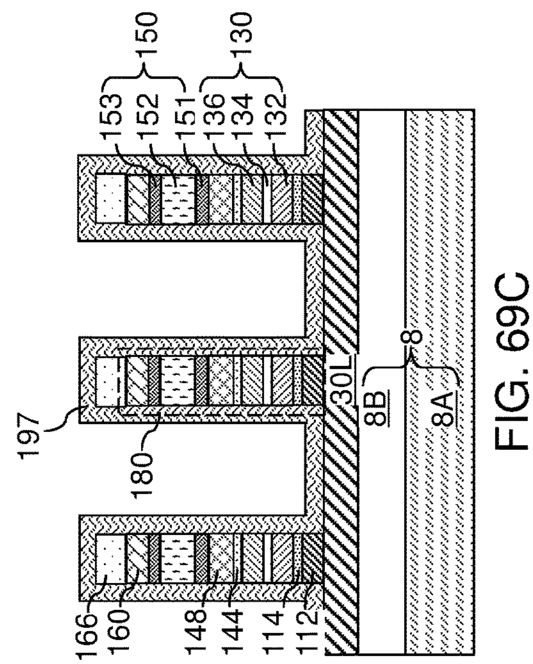

Referring to FIGS. 69A-69C, a lithographic exposure process and a lithographic development process can be performed to pattern the continuous resist layer 197L. The lithographic exposure process may comprise an e-beam exposure or an EUV exposure process. In one embodiment, the continuous resist layer 197L comprises a negative resist material, such as a negative e-beam resist material. The lithographic exposure comprises lithographically exposing the two-dimensional array of tubular resist portions, the two-dimensional array of capping resist portions, and first regions of the horizontally-extending planar resist layer adjoined to a respective one of the tubular resist portions, without lithographically exposing second regions of the horizontally-extending planar resist layer that are subsequently removed during the subsequent development process. In one embodiment, the second regions of the horizontally-extending planar resist layer that are not lithographically exposed, i.e., are not irradiated by UV radiation or an e-beam, may have a pattern of straight line strips that are located between neighboring rows of memory cells 180 arranged along the first horizontal direction hd1. The irradiated regions of the resist layer are cross-linked. The unirradiated second regions of the horizontally-extending planar resist layer that are not irradiated are subsequently removed using a developer, leaving the cross-linked irradiated resist material portions 197 of the resist layer 197L over the memory cells 180.

Generally, the continuous resist layer 197L can be patterned into discrete resist material portions 197 by lithographic exposure and development. In one embodiment, the horizontally-extending planar resist layer is divided into a plurality of horizontally-extending planar resist portions having a respective pair of lengthwise edges laterally extending along a first horizontal direction hd1 and adjoined to a respective set of at least one tubular resist portion within the same discrete resist material portions 197. In one embodiment, the respective set of at least one tubular resist portion within the same discrete resist material portions 197 may include a plurality of tubular resist portions arranged along the first horizontal direction hd1. In one embodiment, the discrete resist material portions 197 can comprise a periodic one-dimensional array of discrete resist material portions 197 that are repeated along the second horizontal direction hd2 with the second pitch p2. The width of each discrete resist material portion 197 along the second horizontal direction hd2 may be uniform or substantially uniform, and may be in a range from 20% to 80%, such as from 40% to 60%, of the second pitch p2.

Figures 70A, 70B, 70C:
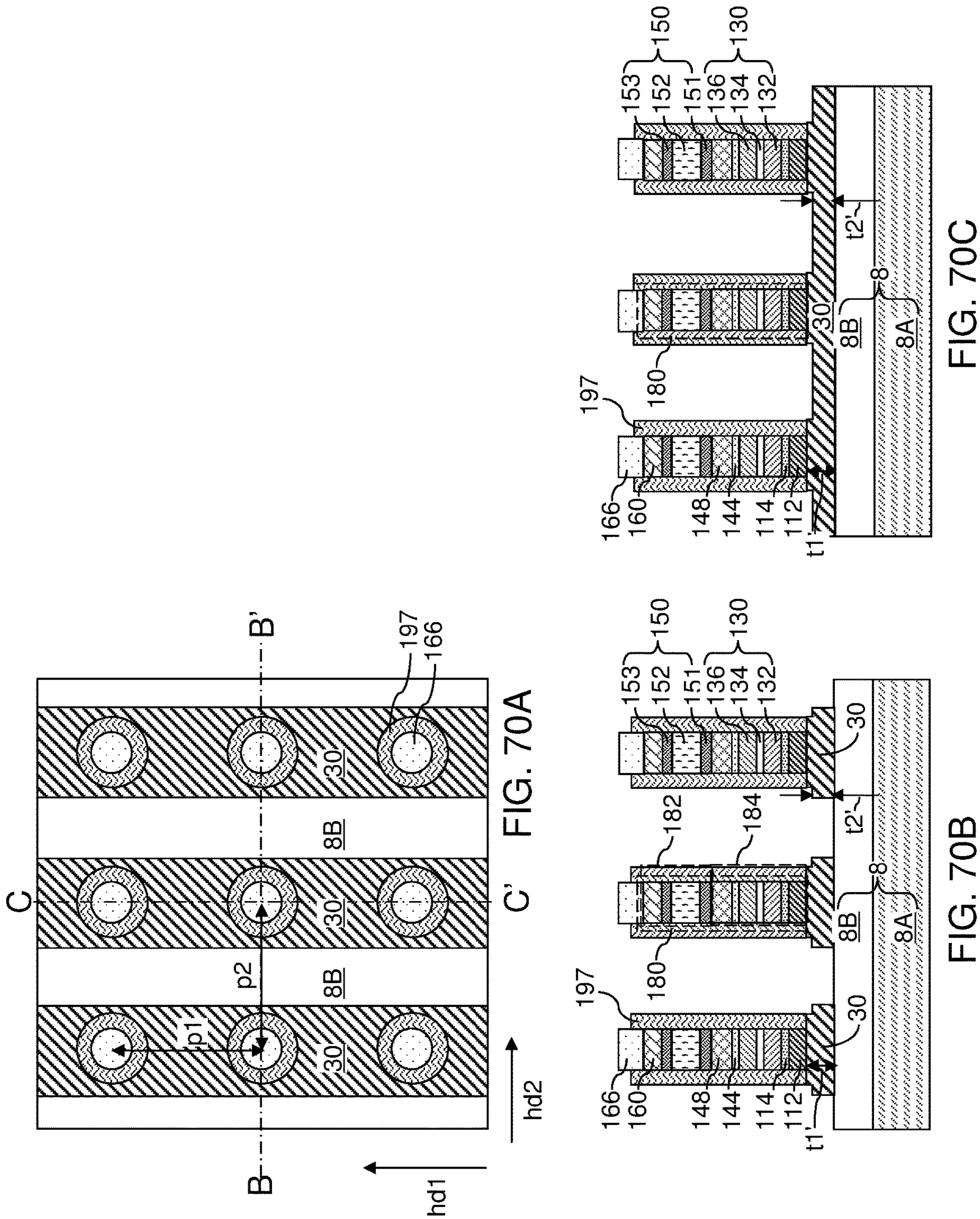
FIGS. 70A-70C are various views of the fifth exemplary structure after patterning the first electrically conductive layer into a plurality of first electrically conductive lines according to the fifth embodiment of the present disclosure.

Referring to FIGS. 70A-70C, an anisotropic etch process can be performed to etch portions of the first electrically conductive layer 30L that are not masked by the discrete resist material portions 197. The first electrically conductive layer 30L can be patterned into a plurality of first electrically conductive lines 30 by etching portions of the first electrically conductive layer 30L that are not covered by the discrete resist material portions 197. In one embodiment, the anisotropic etch process may employ at least one of a reactive ion etch process or an ion beam etch process.

Each of plurality of first electrically conductive lines 30 extends underneath and contacts a respective row of memory cells 180 that are arranged along the first horizontal direction hd1. Horizontally-extending portions of the discrete resist material portions 197 may be collaterally removed during the anisotropic etch process. Thus, the remaining portions of the discrete resist material portions may consist of a two-dimensional array of cylindrical discrete resist material portions 197. In one embodiment, the sacrificial capping material plates 166 can be physically exposed during the anisotropic etch process, and may be employed as protective cover structures that protect the two-dimensional array of memory cells 180.

In one embodiment, the discrete resist material portions 197 have a tubular configuration that laterally surrounds a respective one of the memory cells 180. In one embodiment, portions of the first electrically conductive lines 30 that are not covered by the discrete resist material portions 197 may be recessed relative to portions of the first electrically conductive lines 30 that are covered by the discrete resist material portions 197. In one embodiment, portions of the first electrically conductive lines 30 that are covered by the two-dimensional array of memory cells 180 and the two-dimensional array of discrete resist material portions 197 may have a first thickness t1', and portions of the first electrically conductive lines 30 that are not covered by the two-dimensional array of memory cells 180 and the two-dimensional array of discrete resist material portions 197 may have a second thickness t2' that is less than the first thickness t1'. The difference between the first thickness t1' and the second thickness may be in a range from 0.1 nm to 30 nm, such as from 0.3 nm to 10 nm. In this case, each of the first electrically conductive lines 30 may have a contoured top surface including a plurality of raised horizontal surface segments, a recessed horizontal surface segment, and cylindrical surface segments connecting the plurality of raised horizontal surface segments to the recessed horizontal surface segment.

Figures 71A, 71B, 71C:
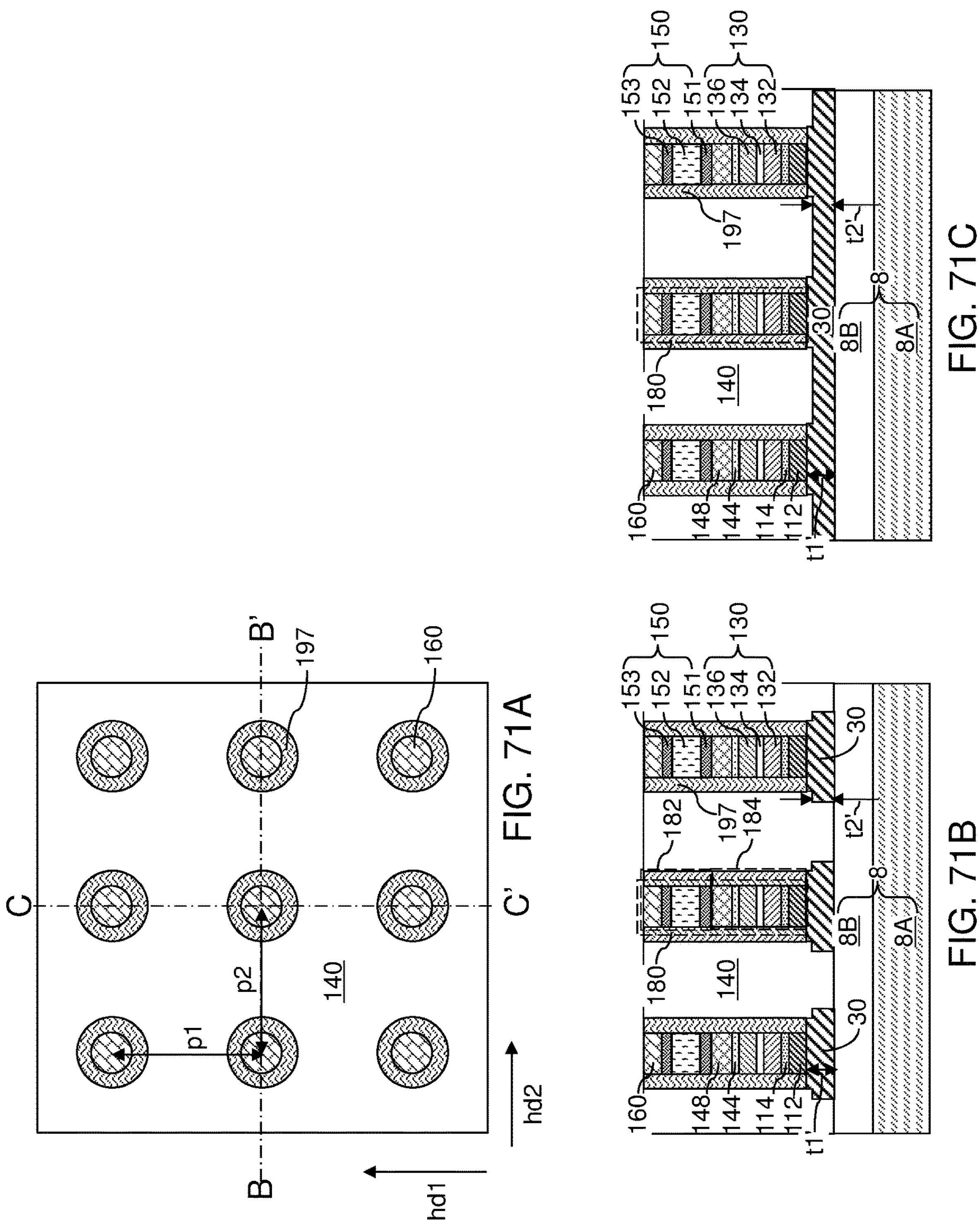
FIGS. 71A-71C are various views of the fifth exemplary structure after formation of a dielectric matrix layer according to the fifth embodiment of the present disclosure.

Referring to FIGS. 71A-71C, a dielectric fill material can be deposited around the two-dimensional array of discrete resist material portions 197. A planarization process, such as a chemical mechanical polishing process can be performed to remove portions of the dielectric fill material from above the horizontal plane including the top surfaces of the memory cells 180. The sacrificial capping material plates 166 can be collaterally removed during the planarization process. Remaining portions of the dielectric fill material constitute a dielectric matrix layer 140. The top surface of the dielectric matrix layer 140 may be formed within the horizontal plane including the top surfaces of the memory cells 180 (such as the top surfaces of the conductive material plates 160).

Generally, in one embodiment, the dielectric matrix layer 140 can be formed around and directly on the discrete resist material portions 197 after patterning the first electrically conductive layer 30L into the plurality of first electrically conductive lines 30. The dielectric matrix layer 140 can be planarized such that a top surface of the dielectric matrix layer 140 is formed within a horizontal plane including top surfaces of the two-dimensional array of memory cells 180. The sacrificial capping material plates 166 can be removed after patterning the first electrically conductive layer 30L into the plurality of first electrically conductive lines 30. After the planarization process that planarizes the dielectric matrix layer 140, the discrete resist material portions 197 may comprise annular top surfaces located within the horizontal plane including the top surface of the two-dimensional array of memory cells 180. As discussed above, the discrete resist material portions 197 may comprise a dry e-beam or EUV resist material.

Figure 72A:
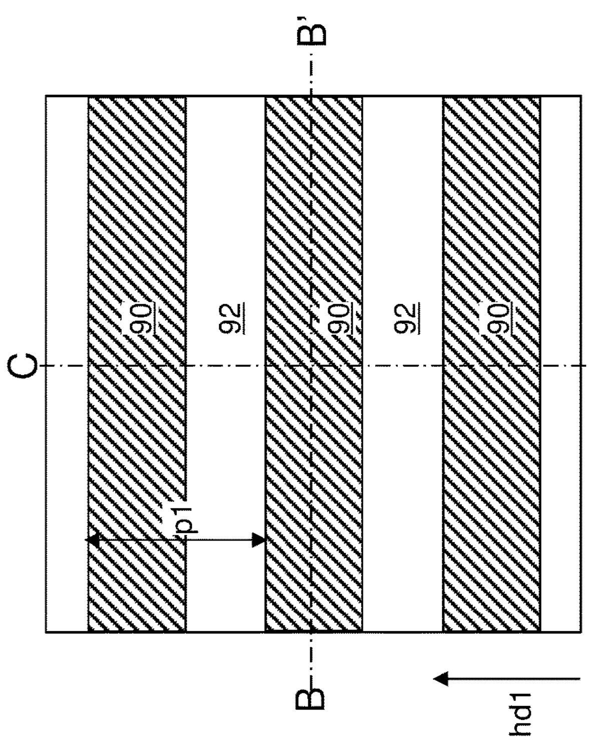
FIGS. 72A-72C are various views of the fifth exemplary structure after formation of second electrically conductive lines according to the fifth embodiment of the present disclosure.
Figure 72B:
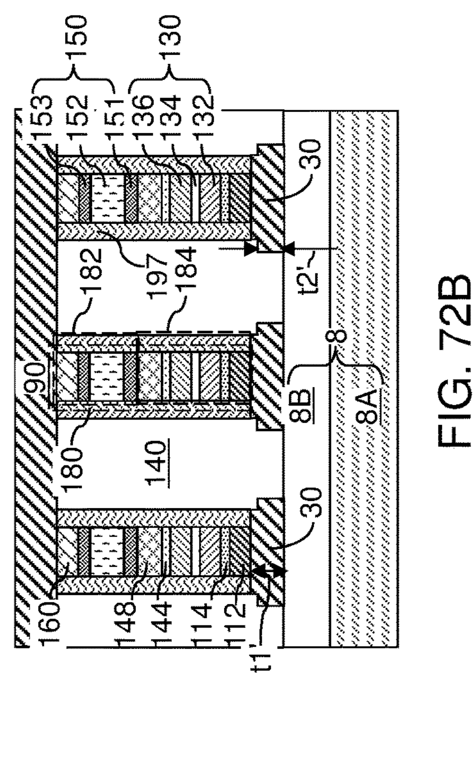
Figure 72C:
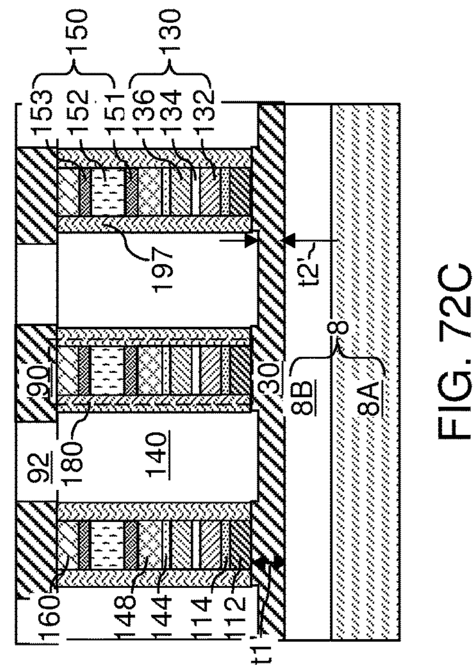

Referring to FIGS. 72A-72C, a dielectric material can be deposited over the two-dimensional array of memory cells 180 to form a line-level dielectric layer 92. Line trenches laterally extending along the second horizontal direction hd2 can be formed through the line-level dielectric layer 92 above each column of memory cells 180 arranged along the second horizontal direction hd2. A conductive material can be deposited in the line trenches, and excess portions of the conductive material can be removed from above the horizontal plane including the top surface of the line-level dielectric layer 92. Remaining portions of the conductive material filling the line trenches constitute second electrically conductive lines 90. The second electrically conductive lines 90 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrically conductive lines 90 can be in a range from 20 nm to 100 nm, although lesser and greater thicknesses can also be employed. Alternatively, instead of using the above described damascene process to form the second electrically conductive lines 90, these lines may be formed by a pattern and etch process.

Generally, the second electrically conductive lines 90 can be formed over the dielectric matrix layer 140 such that each of the second electrically conductive lines 90 contacts top surfaces of a respective subset of the memory cells 180. In one embodiment, each of the second electrically conductive lines 90 contacts top surfaces of a respective column of memory cells 180 that are arranged along a second horizontal direction hd2 that is perpendicular to the first horizontal direction hd1.

Figure 73A:
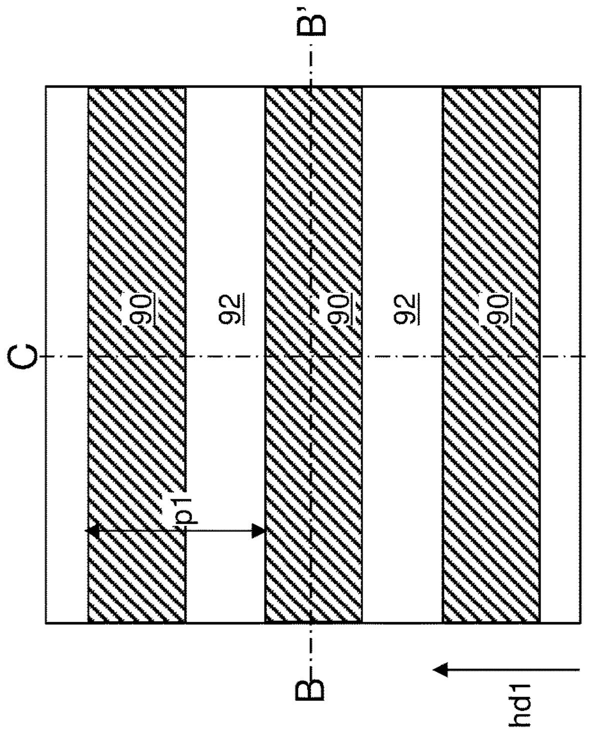
FIGS. 73A-73C are various views of a first alternative configuration of the fifth exemplary structure after formation of second electrically conductive lines according to the fifth embodiment of the present disclosure.
Figure 73B:
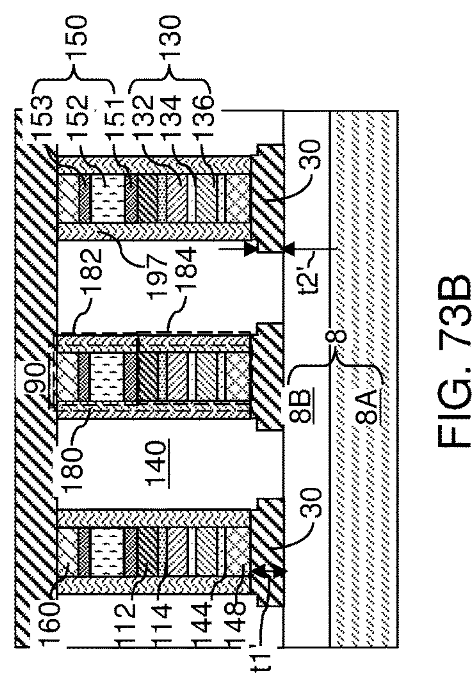
Figure 73C:
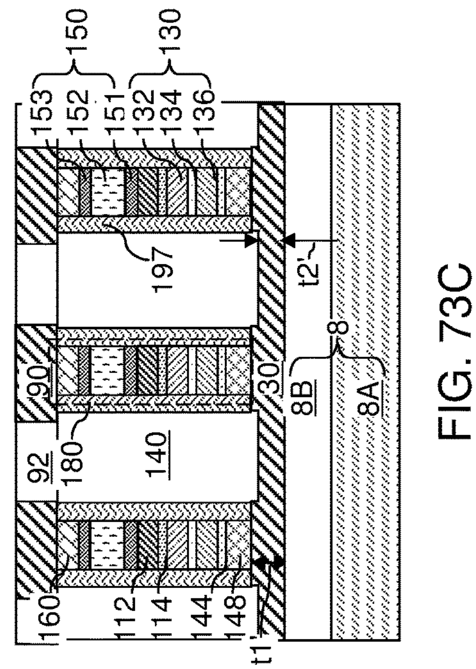

Referring to FIGS. 73A-73C, a first alternative configuration of the fifth exemplary structure can be derived from the fifth exemplary structure illustrated in FIGS. 72A-72C by reversing the order of material portions within each magnetic tunnel junction pillar structure 184.

Figure 74A:
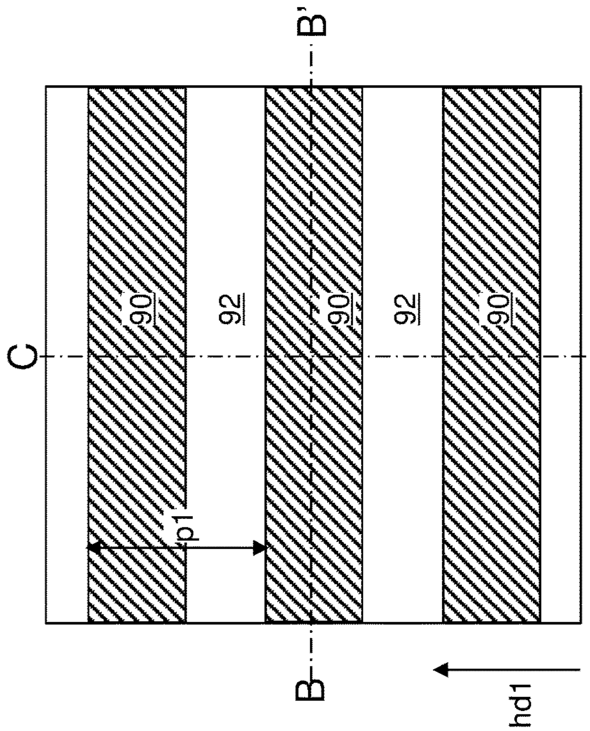
FIGS. 74A-74C are various views of a second alternative configuration of the fifth exemplary structure after formation of second electrically conductive lines according to the fifth embodiment of the present disclosure.
Figure 74B:
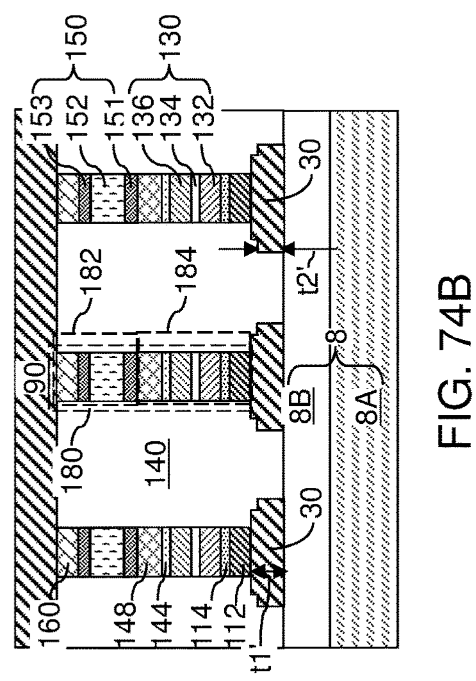
Figure 74C:
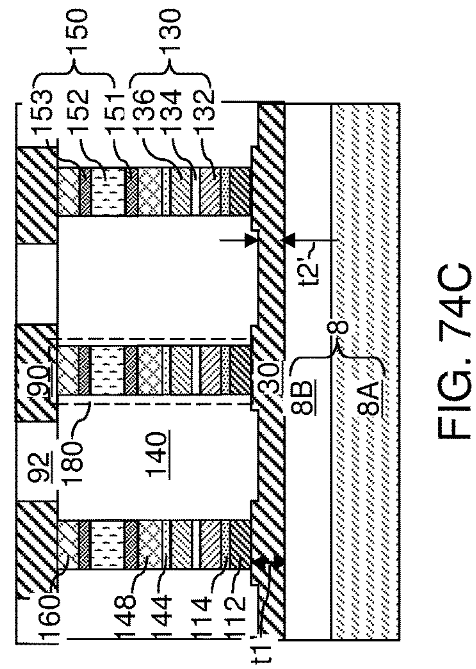

Referring to FIGS. 74A-74C, a second alternative configuration of the fifth exemplary structure can be derived from the fifth exemplary structure illustrated in FIGS. 72A-72C or from the first alternative configuration thereof illustrated in FIGS. 73A-73C by removing the discrete resist material portions 197 after patterning the first electrically conductive layer 30L into the plurality of first electrically conductive lines 30 and prior to formation of the dielectric matrix layer 140. In this embodiment, the dielectric matrix layer 140 contacts the sidewalls of the memory cells 180.

In the first through fifth embodiments, two terminal MRAM memory cells 180, such as STT-MRAM cells are formed. In the sixth embodiment, three terminal MRAM memory cells 180, such as SOT-MRAM cells are formed instead.

Figures 75A, 75B, 75C:
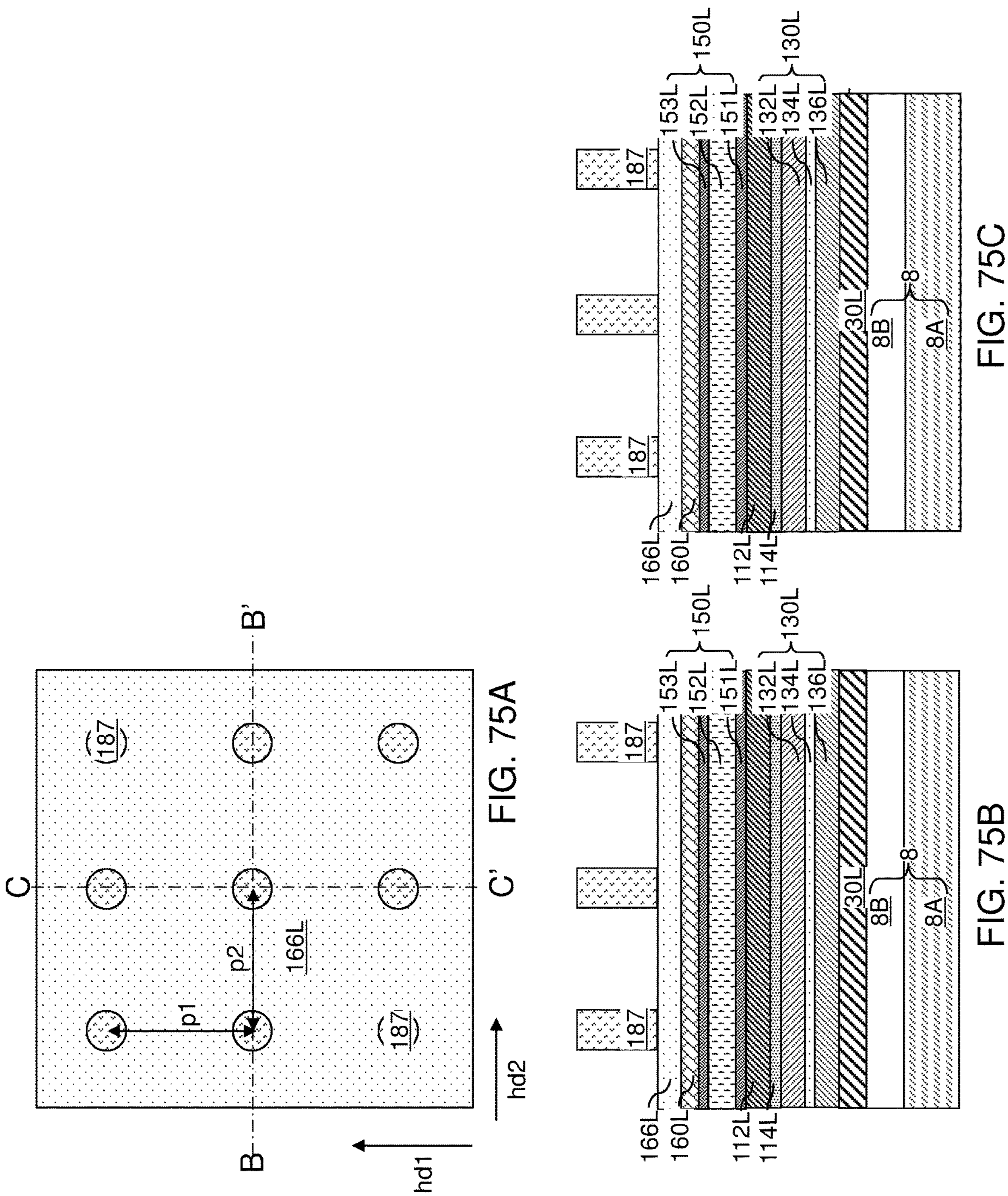
FIGS. 75A-75C are various views of a sixth exemplary structure after formation of a two-dimensional array of discrete patterned resist material portions according to a sixth embodiment of the present disclosure.

Referring to FIGS. 75A-75C, a sixth exemplary structure according to the sixth embodiment of the present disclosure can be derived from the fifth exemplary structure illustrated in FIGS. 66A-66C by modifying the magnetic-tunnel-junction-level material layers (112L, 114L, 130L, 144L, 148L) such that the modified magnetic-tunnel-junction-level material layers (130L, 114L, 112L) includes, from bottom to top, continuous magnetic tunnel junction material layers 130L, a continuous antiferromagnetic coupling layer 114L, and a continuous superlattice layer 112L. Further, the order of layers within the magnetic tunnel junction material layers 130L can be, from bottom to top, a continuous free layer 136L, a continuous nonmagnetic tunnel barrier layer 134L, and a continuous reference layer 132L. In addition, the material of the first electrically conductive layer 30L may be selected to increase the spin-orbit-torque charge-to-spin conversion ratio and to facilitate programming of a free layer in each spin-orbit-torque memory cell to be subsequently formed. Thus, the first electrically conductive layer 30L comprises a nonmagnetic heavy metal SOT layer with strong spin-orbit coupling with and in contact with the continuous free layer 136L. When an electric write current laterally passes through the SOT layer, spin current is generated in a direction perpendicular to the electrical current via the spin Hall effect (SHE). The spin current exerts a torque on the magnetization of the ferromagnetic free layer. Thus, the SOT layer assists in the transition of the magnetization direction in the free layer through the spin Hall effect. The SOT layer is also referred to as metallic assist layer, i.e., a metallic layer that assists the magnetic transition in the free layer. For example, the first electrically conductive layer 30L may comprise, and/or may consist essentially of, a transition metal element or metal alloy having an atomic number greater than 56, and/or greater than 70. The first electrically conductive layer 30L may be made of a material having large spin-orbit coupling strength, such as Pt, Ta, W, Hf, Ir, CuBi, CuIr, AuPt, AuW, PtPd, or PtMgO.

In addition, metal interconnect structures (not shown) for contacting first electrically conductive lines can be embedded in the topmost dielectric material layer within the at least one dielectric material layer 8B. The metal interconnect structures may include contact via structures for contacting two end portions of each electrically conductive layer to be subsequently patterned from the first electrically conductive layer 30L. In other words, a pair of contact via structures can be formed for each first electrically conductive line (i.e., SOT layer) to be subsequently patterned from the first electrically conductive layer 30L. In one embodiment, the contact via structures within each pair of contact via structures may be laterally spaced apart along the first horizontal direction hd1. The pairs of contact via structures may be repeated with the first periodicity of the first pitch p1 along the first horizontal direction hd1, and may be repeated with the second periodicity of the second pitch p2 along the second horizontal direction hd2. The metal interconnect structures including the contact via structures can be employed to provide electrical connection to each of the first electrically conductive lines (i.e., SOT layers) to be subsequently formed.

Figure 76A:
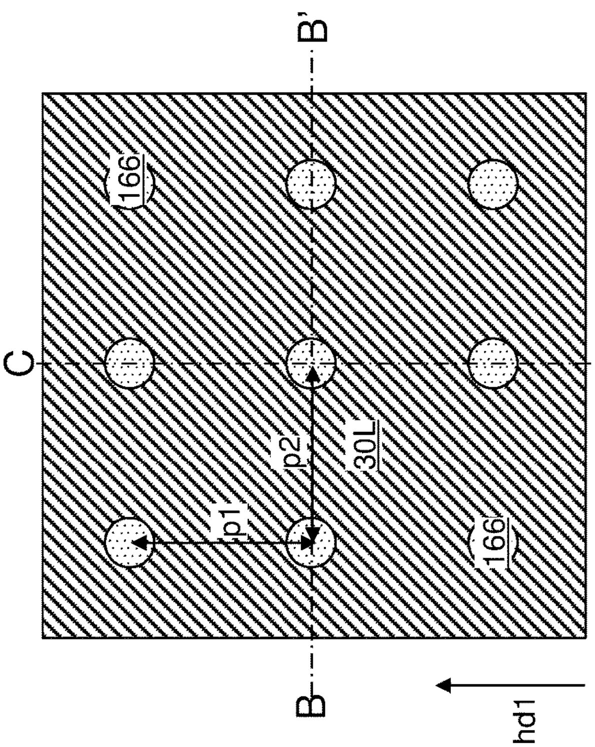
FIGS. 76A-76C are various views of the sixth exemplary structure after formation of a two-dimensional array of memory cells according to the sixth embodiment of the present disclosure.
Figure 76B:
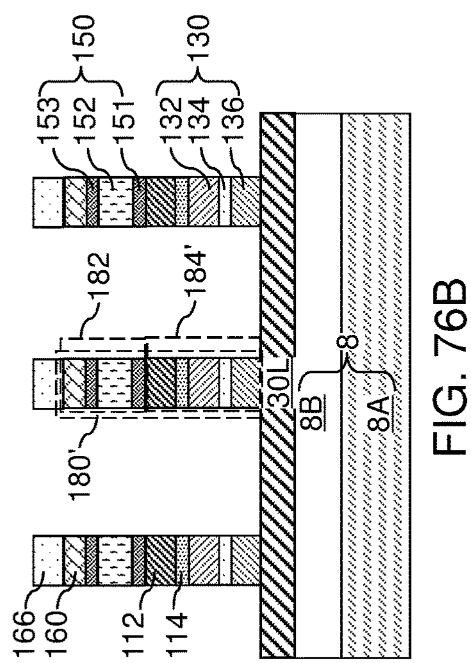
Figure 76C:
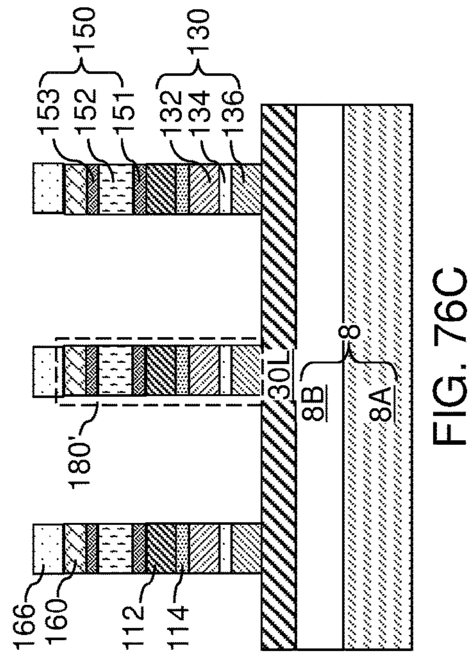

Referring to FIGS. 76A-76C, the processing steps of FIGS. 67A-67C can be performed, with any needed changes, in view of the change in the sequence of the material layers overlying the first electrically conductive layer 30L, to form a two-dimensional periodic array of memory cells 180'. Each memory cell 180' may include a vertical stack of a magnetic tunnel junction pillar structure 184' including a respective magnetic tunnel junction 130, and a selector-containing pillar structure 182. Each magnetic tunnel junction pillar structure 184' can include, from bottom to top, a free layer 136, a nonmagnetic tunnel barrier layer 134, a reference layer 132, an optional antiferromagnetic coupling layer 114, and an optional superlattice layer 112.

Figure 77A:
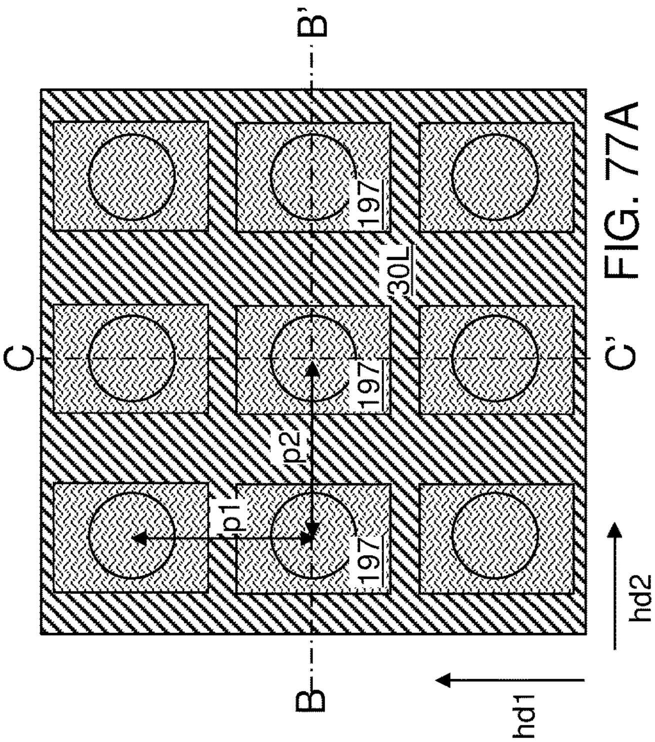
FIGS. 77A-77C are various views of the sixth exemplary structure after formation of a two-dimensional array of discrete resist material portions according to the sixth embodiment of the present disclosure.
Figure 77B:
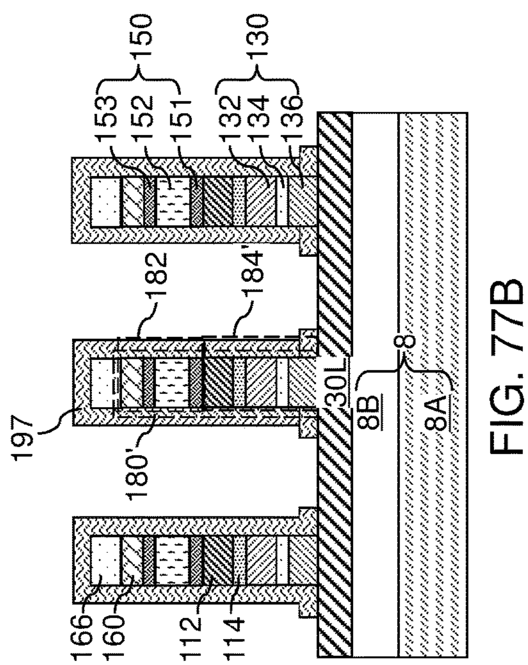
Figure 77C:
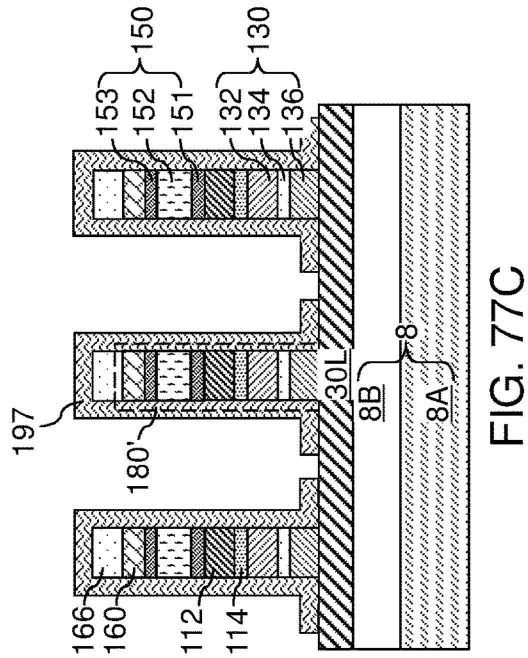

Referring to FIGS. 77A-77C, the processing steps of FIGS. 68A-68C can be performed to form a continuous resist material layer 197L, and the processing steps of FIGS. 69A-69B can be performed with a change in the pattern of lithographic exposure to pattern the continuous resist layer 197L into a plurality of discrete resist material portions 197. According to an aspect of the present disclosure, the plurality of discrete resist material portions 197 can be formed as a two-dimensional periodic array of resist material portions 197.

Specifically, a lithographic exposure process and a lithographic development process can be performed to pattern the continuous resist layer 197L. The lithographic exposure process may comprise an e-beam or EUV exposure process. In one embodiment, the continuous resist layer 197L comprises a negative resist material, such as a negative e-beam resist material. The lithographic exposure comprises lithographically exposing the two-dimensional array of tubular resist portions, the two-dimensional array of capping resist portions, and first regions of the horizontally-extending planar resist layer adjoined to a respective one of the tubular resist portions without lithographically exposing second regions of the horizontally-extending planar resist layer that are subsequently removed during the subsequent development process. In one embodiment, the second regions of the horizontally-extending planar resist layer that are not lithographically exposed, i.e., are not irradiated by UV radiation or an e-beam, may have a grid shaped pattern (i.e., straight line strips that are located between neighboring rows and columns of memory cells 180' arranged along the first horizontal direction hd1 and along the second horizontal direction hd2). The irradiated regions of the resist layer 197L are cross-linked. The unirradiated second regions of the horizontally-extending planar resist layer that are not irradiated are subsequently removed using a developer, leaving the cross-linked irradiated resist material portions 197 of the resist layer 197L over the memory cells 180'.

Generally, the continuous resist layer 197L can be patterned into discrete rectangular resist material portions 197 by lithographic exposure and development. In one embodiment, the horizontally-extending planar resist layer is divided into a plurality of horizontally-extending planar resist portions having a respective pair of lengthwise edges laterally extending along a first horizontal direction hd1 and adjoined to a respective tubular resist portion within the same discrete resist material portions 197. In one embodiment, the discrete resist material portions 197 can comprise a periodic two-dimensional array (such as a rectangular array) of discrete resist material portions 197 that are repeated along the first horizontal direction hd1 with the first pitch p1 and along the second horizontal direction hd2 with the second pitch p2. The length of each discrete resist material portion 197 along the first horizontal direction hd1 may be in a range from 20% to 80%, such as from 40% to 60%, of the first pitch p1. The width of each discrete resist material portion 197 along the second horizontal direction hd2 may be uniform or substantially uniform, and may be in a range from 20% to 80%, such as from 40% to 60%, of the second pitch p2.

Figure 78A:
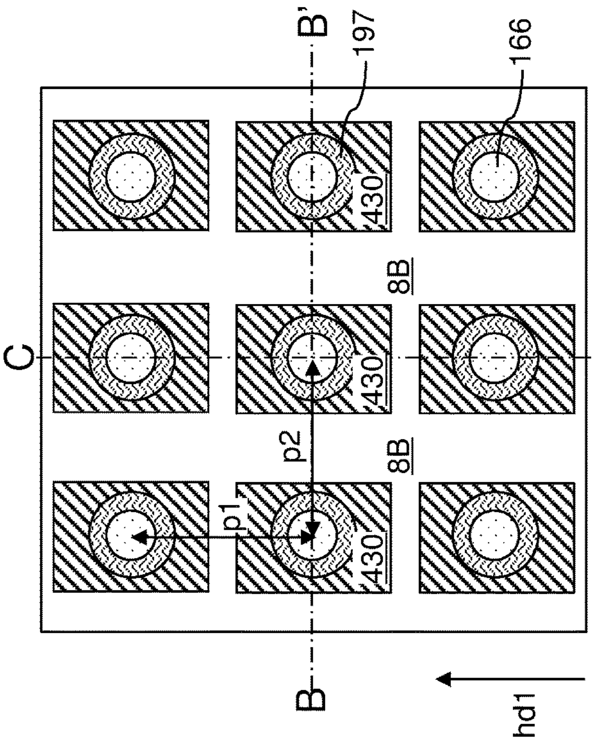
FIGS. 78A-78C are various views of the sixth exemplary after formation of a two-dimensional array of first electrically conductive lines according to the sixth embodiment of the present disclosure.
Figure 78B:
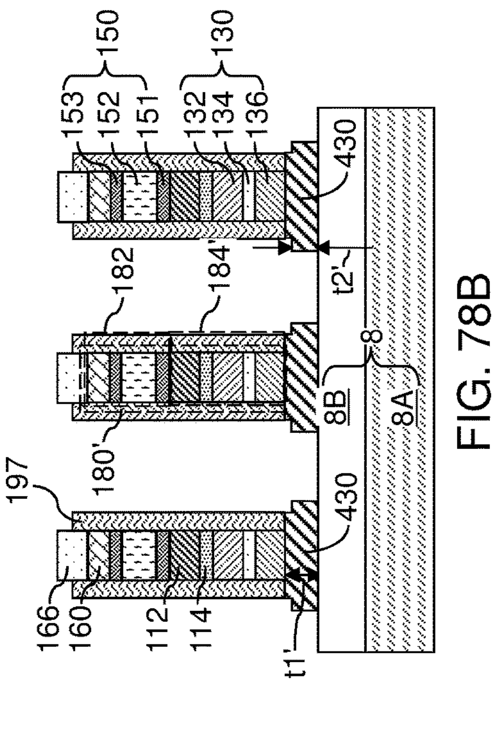
Figure 78C:
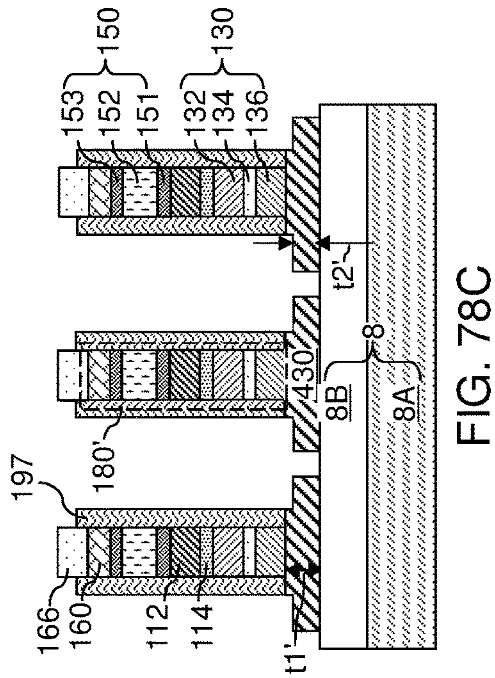

Referring to FIGS. 78A-78C, an anisotropic etch process can be performed to etch portions of the first electrically conductive layer 30L that are not masked by the discrete resist material portions 197. The first electrically conductive layer 30L can be patterned into a plurality of first electrically conductive lines (i.e., SOT layers) 430 by etching portions of the first electrically conductive layer 30L that are not covered by the discrete resist material portions 197. In one embodiment, the anisotropic etch process may employ at least one of a reactive ion etch process and an ion beam etch process.

Each of plurality of first electrically conductive lines 430 is formed underneath and contacts a respective memory cell 180'. Horizontally-extending portions of the discrete resist material portions 197 can be collaterally removed during the anisotropic etch process. Thus, the remaining portions of the discrete resist material portions may consist of a two-dimensional array of cylindrical discrete resist material portions 197. In one embodiment, the sacrificial capping material plates 166 can be physically exposed during the anisotropic etch process, and may be employed as protective cover structures that protect the two-dimensional array of memory cells 180'.

In one embodiment, the first electrically conductive lines 430 may be formed as a two-dimensional periodic array of first electrically conductive lines 430 having a first periodicity of the first pitch p1 along the first horizontal direction hd1 and having a second periodicity of the second pitch p2 along the second horizontal direction hd2. In one embodiment, each of the first electrically conductive lines 430 may have a respective rectangular horizontal cross-sectional shape. The lateral extent of each first electrically conductive line 430 along the first horizontal direction hd1 is less than the first pitch p1, and the lateral extent of each first electrically conductive line 430 along the second horizontal direction hd2 is less than the second pitch p2.

In one embodiment, the discrete resist material portions 197 have a tubular configuration that laterally surrounds a respective one of the memory cells 180'. In one embodiment, portions of the first electrically conductive lines 430 that are not covered by the discrete resist material portions 197 may be recessed relative to portions of the first electrically conductive lines 430 that are covered by the discrete resist material portions 197. In one embodiment, portions of the first electrically conductive lines 430 that are covered by the two-dimensional array of memory cells 180' and the two-dimensional array of discrete resist material portions 197 may have a first thickness t1', and portions of the first electrically conductive lines 430 that are not covered by the two-dimensional array of memory cells 180 and the two-dimensional array of discrete resist material portions 197 may have a second thickness t2' that is less than the first thickness t1'. The difference between the first thickness t1' and the second thickness may be in a range from 0.1 nm to 430 nm, such as from 0.3 nm to 10 nm. In this case, each of the first electrically conductive lines 430 may have a contoured top surface including a raised horizontal surface segment, a recessed horizontal surface segment, and cylindrical surface segments connecting the raised horizontal surface segment to the recessed horizontal surface segment.

Figures 79A, 79B, 79C:
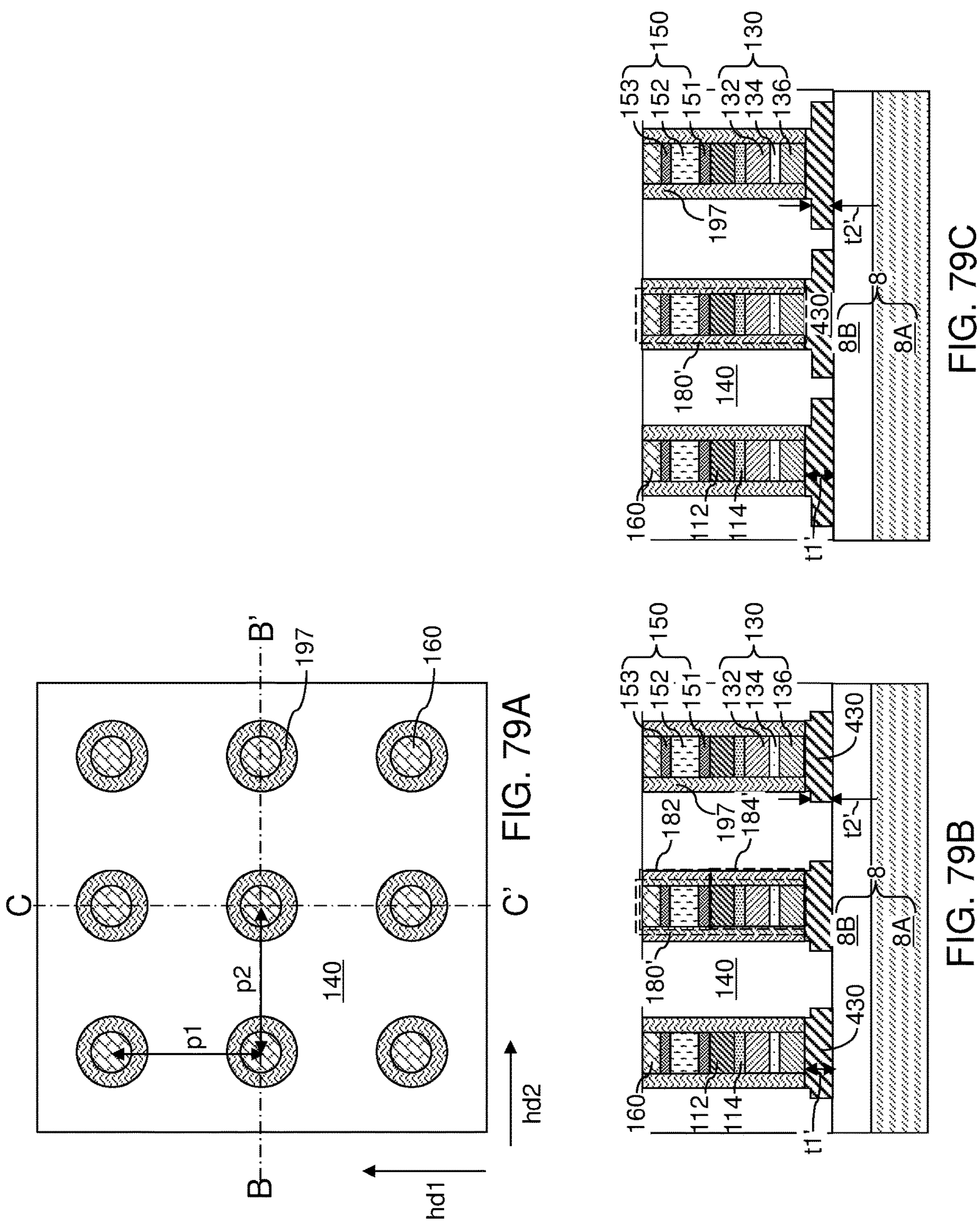
FIGS. 79A-79C are various views of the sixth exemplary structure after formation of a dielectric matrix layer according to the sixth embodiment of the present disclosure.

Referring to FIGS. 79A-79C, a dielectric fill material can be deposited around the two-dimensional array of discrete resist material portions 197. A planarization process such as a chemical mechanical polishing process can be performed to remove portions of the dielectric fill material from above the horizontal plane including the top surfaces of the memory cells 180'. The sacrificial capping material plates 166 can be collaterally removed during the planarization process. Remaining portions of the dielectric fill material constitute a dielectric matrix layer 140. The top surface of the dielectric matrix layer 140 may be formed within the horizontal plane including the top surfaces of the memory cells 180' (such as the top surfaces of the conductive material plates 160).

Generally, the dielectric matrix layer 140 can be formed around and directly on the discrete resist material portions 197 after patterning the first electrically conductive layer 30L into the plurality of first electrically conductive lines 430. The dielectric matrix layer 140 can be planarized such that a top surface of the dielectric matrix layer 140 is formed within a horizontal plane including top surfaces of the two-dimensional array of memory cells 180'. The sacrificial capping material plates 166 can be removed after patterning the first electrically conductive layer 30L into the plurality of first electrically conductive lines 430. After the planarization process that planarizes the dielectric matrix layer 140, the discrete resist material portions 197 may comprise annular top surfaces located within the horizontal plane including the top surface of the two-dimensional array of memory cells 180'. As discussed above, the discrete resist material portions 197 may comprise an e-beam resist material.

Figure 80A:
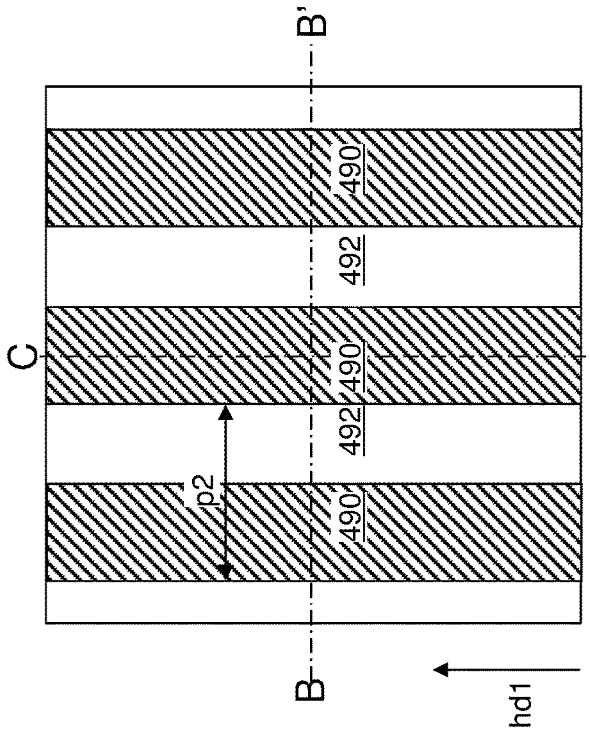
FIGS. 80A-80C are various views of the sixth exemplary structure after formation of second electrically conductive lines according to the sixth embodiment of the present disclosure.
Figure 80B:
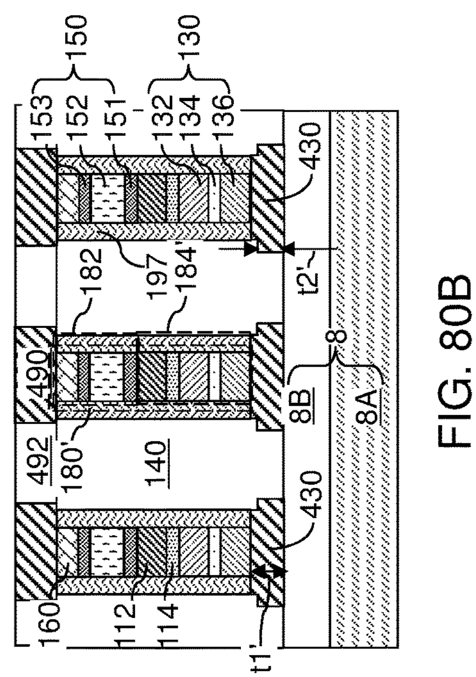
Figure 80C:
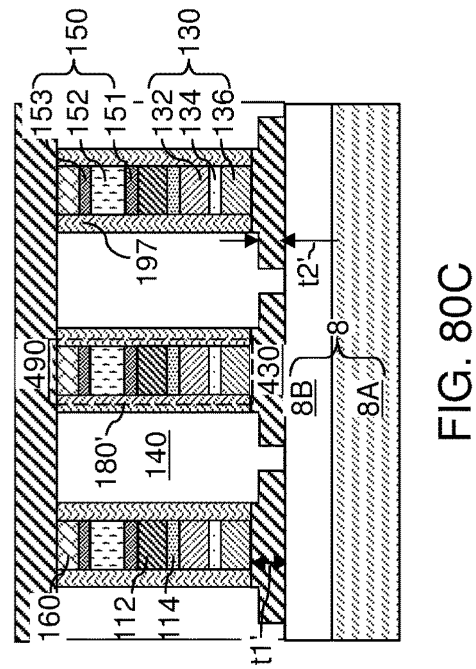

Referring to FIGS. 80A-80C, a dielectric material can be deposited over the two-dimensional array of memory cells 180' to form a line-level dielectric layer 492. Line trenches laterally extending along the first horizontal direction hd1 can be formed through the line-level dielectric layer 492 above each row of memory cells 180 arranged along the first horizontal direction hd1. Alternatively, line trenches laterally extending along the second horizontal direction hd2 can be formed through the line-level dielectric layer 492 above each column of memory cells 180 arranged along the second horizontal direction hd2. A conductive material can be deposited in the line trenches, and excess portions of the conductive material can be removed from above the horizontal plane including the top surface of the line-level dielectric layer 492. Remaining portions of the conductive material filling the line trenches constitute second electrically conductive lines 490. The second electrically conductive lines 490 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrically conductive lines 490 can be in a range from 20 nm to 100 nm, although lesser and greater thicknesses can also be employed. Alternatively, instead of using the above described damascene process to form the second electrically conductive lines 490, these lines may be formed by a pattern and etch process.

Generally, the second electrically conductive lines 490 can be formed over the dielectric matrix layer 140 such that each of the second electrically conductive lines 490 contacts top surfaces of a respective subset of the memory cells 180'. In one embodiment, each of the second electrically conductive lines 490 contacts top surfaces of a respective row of memory cells 180' that are arranged along a first horizontal direction hd1 that is perpendicular to the second horizontal direction hd2. Alternatively, each of the second electrically conductive lines 490 contacts top surfaces of a respective column of memory cells 180' that are arranged along a second horizontal direction hd2 that is perpendicular to the first horizontal direction hd1.

Figures 81A, 81B, 81C:
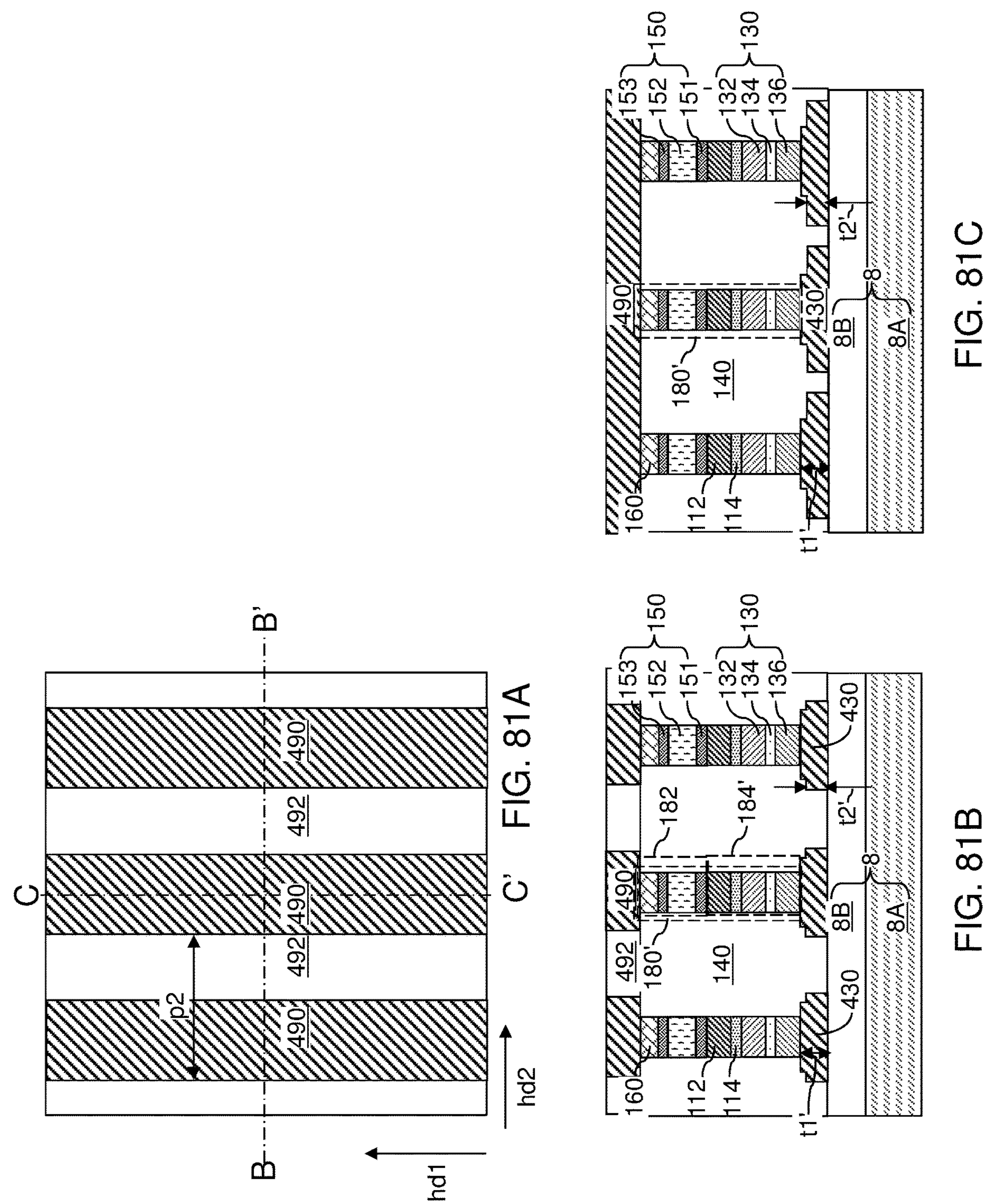
FIGS. 81A-81C are various views of an alternative configuration of the sixth exemplary structure after formation of second electrically conductive lines according to the sixth embodiment of the present disclosure.

Referring to FIGS. 81A-81C, an alternative configuration of the sixth exemplary structure can be derived from the sixth exemplary structure illustrated in FIGS. 80A-80C by removing the discrete resist material portions 197 after patterning the first electrically conductive layer 30L into the plurality of first electrically conductive lines 430 and prior to formation of the dielectric matrix layer 140.

The sixth exemplary structure or alternative configurations thereof may comprise a memory device including a two-dimensional array of spin-orbit-torque (SOT) magnetoresistive random access memory cells 180'.

Figure 82:
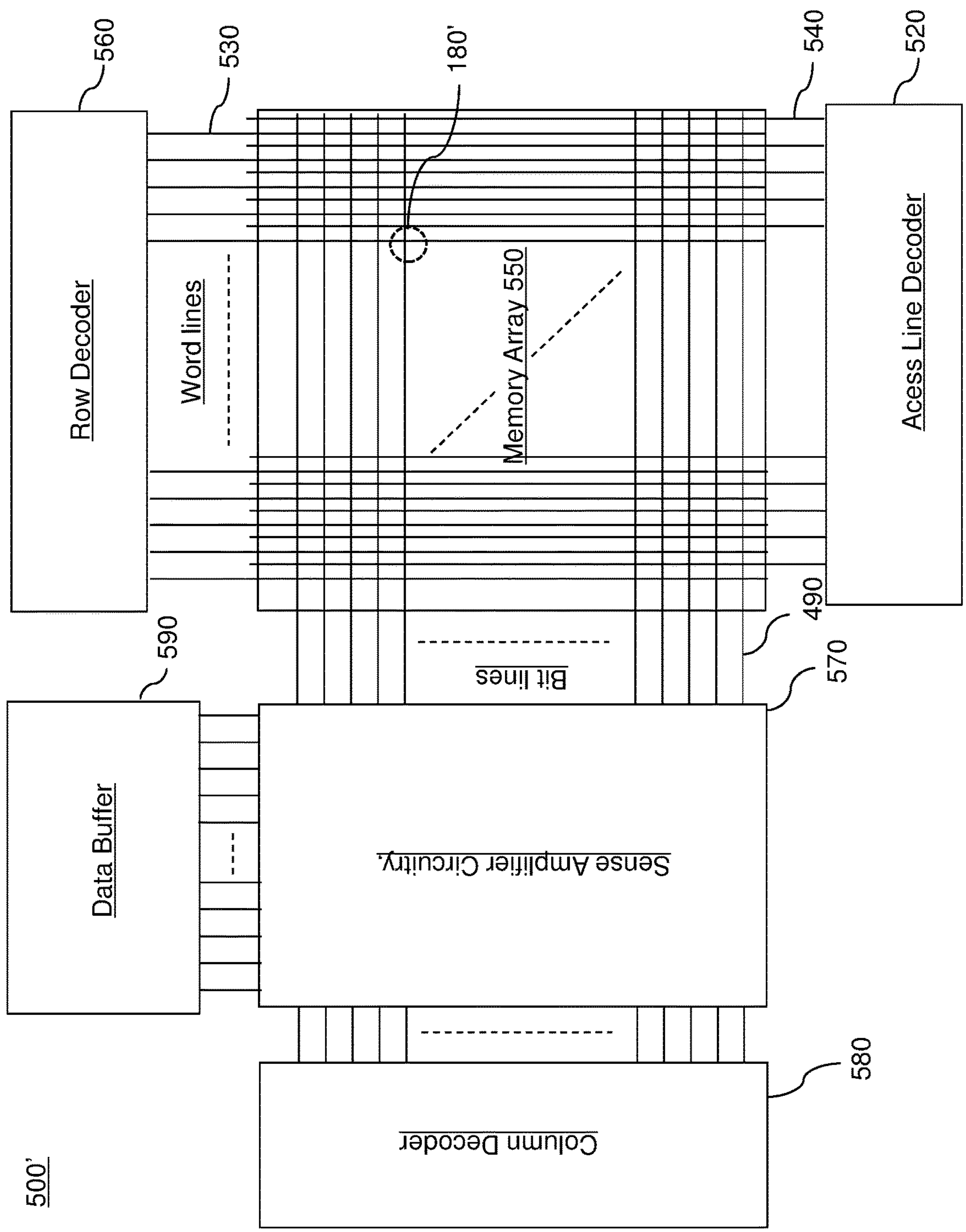
FIG. 82 is a schematic side-cross sectional view of a spin-orbit-torque (SOT) magnetoresistive random access memory (MRAM) cell that incorporates an array of memory cells of the sixth exemplary structure illustrated in FIGS. 78A-78C.

Referring to FIG. 82, a schematic diagram is shown for a magnetoresistive random access memory (MRAM) device 500' including a two-dimensional array of spin-orbit-torque (SOT) magnetoresistive random access memory cells, which may include a two-dimensional array of memory cells 180' of the sixth exemplary structure. The MRAM device 500' includes a memory array region 550 containing an array of memory cells 180' located at intersections of word lines and bit lines.

In one embodiment, the word lines 530 may be electrically connected to first end portions of a respective plurality of first electrically conductive lines (i.e., SOT layers) 430 that are arranged along the first horizontal direction hd1, and the bit lines may comprise second electrically conductive lines 490 laterally extending along the second horizontal direction hd2 and electrically contacting a respective column of memory cells 180'. In this case, access lines 540 may be electrically connected to second end portions of a respective plurality of first electrically conductive lines (i.e., SOT layers) 430 that are arranged along the first horizontal direction hd1, Alternatively, the word lines 530 may be electrically connected to first end portions of a respective plurality of first electrically conductive lines 430 that are arranged along the second horizontal direction hd2, and the bit lines may comprise the second electrically conductive lines 490 laterally extending along the first horizontal direction hd1 and contacting a respective row of memory cells 180'. In this case, the access lines 540 may be electrically connected to second end portions of a respective plurality of first electrically conductive lines 430 that are arranged along the second horizontal direction hd2.

The MRAM device 500' contains a row decoder 560 connected to the word lines 530, sense circuitry 570 (e.g., a sense amplifier and other bit line control circuitry) and a column decoder 580 connected to the bit lines 490, and a data buffer 590 connected to the sense circuitry. In one embodiment, the MRAM device 500' can contain an access line decoder 520 connected to the access lines 540. Generally, each memory cell 180' of the sixth exemplary structure may be configured as a three terminal device in which a word line 530 is electrically connected to a first end of a first electrically conductive line 430, an access line 540 is electrically connected to a second end of the first electrically conductive line 430, and a bit line comprises, or is electrically connected to, a second electrically conductive line 490. During a read operation, the access line may be electrically floating, and a read bias voltage can be applied between the bit line and the word line. During a programming operation, the bit line may be grounded or may be electrically floating, and a programming bias voltage can be applied between the word line and the access line.

In the fifth and sixth embodiments, the number of process steps is reduced by utilizing direct lithography patterning on a non-planarized surface (e.g., a resist layer located over the protruding pillar shaped memory cells). A much thinner resist layer serves as the etching mask for the underlying electrically conductive layer 30L, which significantly decreases the shadowing and loading effects of IBE. The embodiment methods may be carried out using EUV or e-beam lithography, in which flat underlayers are not required. The dry resist layer 197L can be coated by CVD or ALD, and therefore will coat and protect the side walls of the MRAM pillars. The embodiment methods can boost the areal density of a STT-MRAM cross point array or a SOT-MRAM bit array.

Referring collectively to FIGS. 1, 2, and 66A-82 and related drawings, a memory device is provided, which comprises: first electrically conductive lines 30 laterally extending along a first horizontal direction hd1, laterally spaced apart from each other along a second horizontal direction hd2, and located over a substrate 8; a two-dimensional array of memory cells (180 or 180') located over the first electrically conductive lines (30 or 430), wherein each of the memory cells (180 or 180') comprises a vertical stack including a magnetic tunnel junction pillar structure (184 or 184') and a selector-containing pillar structure 182, and each of the first electrically conductive lines (30 or 430) contacts a respective row of memory cells (180 or 180') arranged along the first horizontal direction hd1; discrete resist material portions 197 having a tubular configuration and laterally surrounding a respective one of the memory cells (180 or 180'); second electrically conductive lines (90 or 490) contacting top surfaces of a respective subset of the memory cells (180 or 180'); and a dielectric matrix layer 140 laterally surrounding the two-dimensional array of discrete resist material portions 197.

In one embodiment, the discrete resist material portions 197 comprise annular top surfaces located within the horizontal plane including the top surface of the two-dimensional array of memory cells (180 or 180'). The dielectric matrix layer 140 has a top surface located within a horizontal plane including top surfaces of the two-dimensional array of memory cells, and contacts the second electrically conductive lines (90 or 490). The discrete resist material portions 197 comprise a dry e-beam resist material or a dry EUV resist material.

Figure 83A:
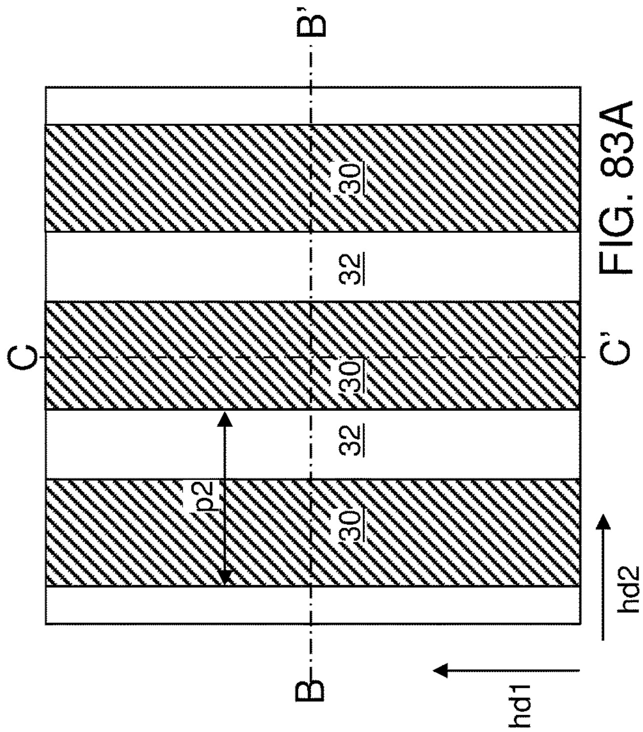
FIGS. 83A-83C are various views of a seventh exemplary structure after formation of first electrically conductive lines according to a seventh embodiment of the present disclosure.
Figure 83B:
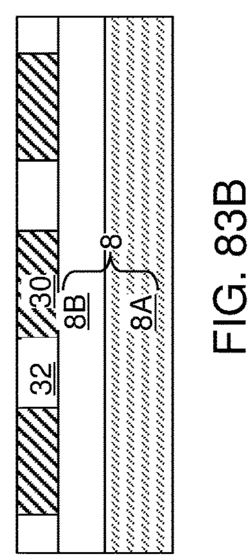
Figure 83C:
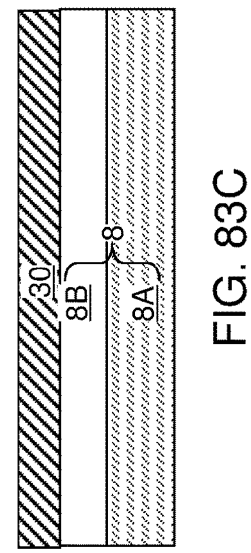

Referring to FIGS. 83A-83C, a seventh exemplary structure according to a seventh embodiment of the present disclosure is illustrated, which comprises a substrate 8 that may be the same as, or may be similar to, the substrate 8 described above. A first line-level dielectric layer 32 can be deposited over the substrate 8, and line trenches laterally extending along the first horizontal direction hd1 can be formed through the first line-level dielectric layer 32. A conductive material can be deposited in the line trenches, and excess portions of the conductive material can be removed from above the horizontal plane including the top surface of the first line-level dielectric layer 32. Remaining portions of the conductive material filling the line trenches constitute first electrically conductive lines 30. The first electrically conductive lines 30 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the first electrically conductive lines 30 can be in a range from 20 nm to 100 nm, although lesser and greater thicknesses can also be employed. The first electrically conductive lines 30 laterally extend along the first horizontal direction hd1, and are laterally spaced apart among one another along a second horizontal direction hd2. The first electrically conductive lines 30 may be formed as a one-dimensional periodic array of first electrically conductive lines 30 having a second pitch p2 along the second horizontal direction hd2. In one embodiment, the remaining portions of the first line-level dielectric layer 32 may comprise first dielectric rails laterally extending along the first horizontal direction hd1, and interlaced with the first electrically conductive lines 30 along the second horizontal direction hd2. Alternatively, instead of using the above described damascene process to form the first electrically conductive lines 32, these lines may be formed by a pattern and etch process.

Figures 84A, 84B, 84C:
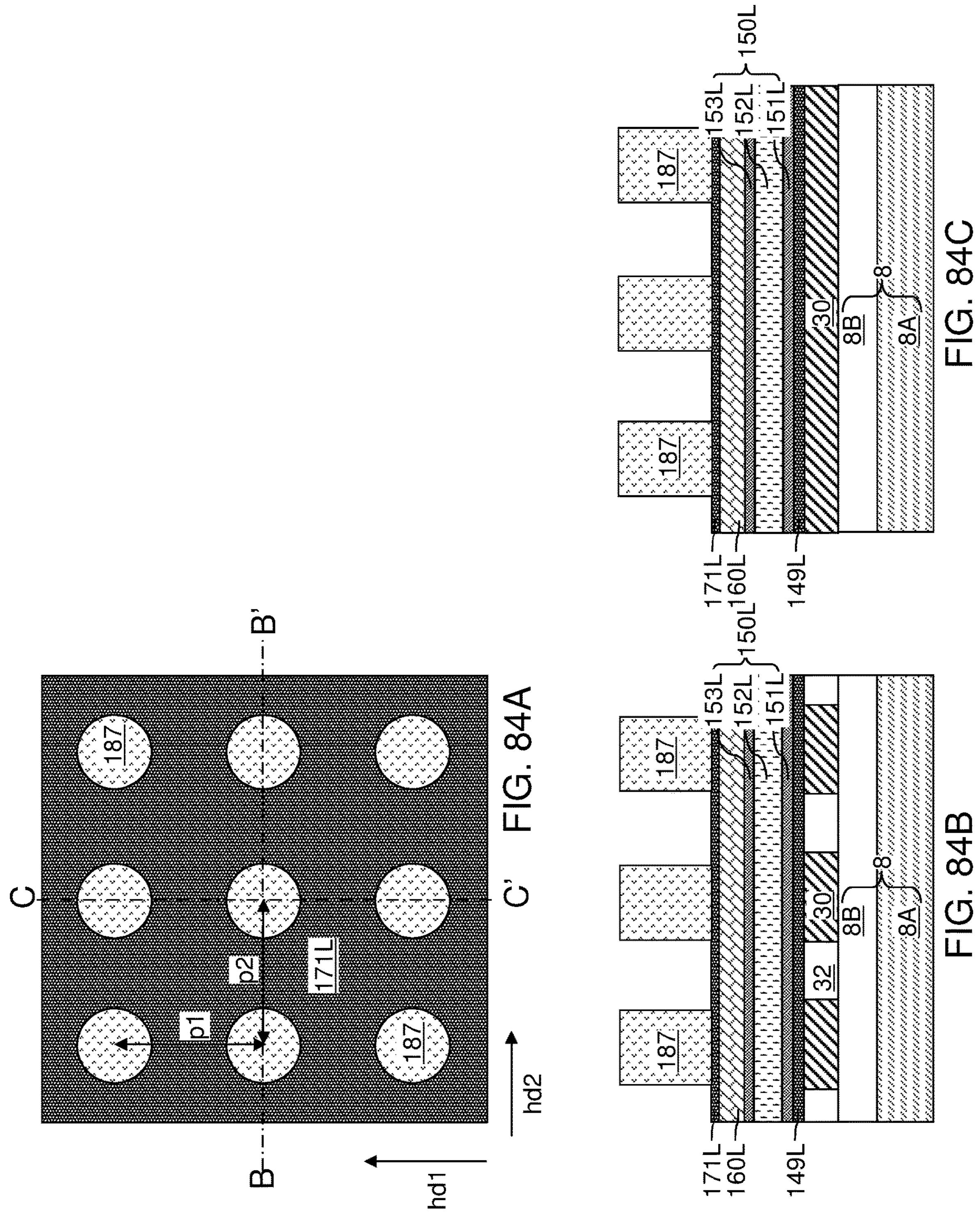
FIGS. 84A-84C are various views of the seventh exemplary structure after formation of selector-level material layers, an optional first image transfer assist layer, and a two-dimensional array of first patterned resist material portions according to the seventh embodiment of the present disclosure.

Referring to FIGS. 84A-84C, an optional metallic adhesion layer 149L, selector-level material layers (150L, 160L), and an optional first image transfer assist layer 171L can be formed over the first electrically conductive lines 30. The optional metallic adhesion layer 149L comprises a metallic material that promotes adhesion of the selector-level material layers (150L, 160L). For example, the optional metallic adhesion material layer 149L may comprise an electrically conductive metal or metal alloy, such as Ta, Ti, TaN, TiN, or WN. The selector-level material layers (150L, 160L) may be the same as in the previously described embodiments. In one embodiment, the selector-level material layers (150L, 160L) may comprise a layer stack of selector material layers 150L and a conductive material layer 160L. The conductive material layer 160L includes a nonmagnetic conductive material, which may comprise, for example, TiN, TaN, WN, MoN, W, Ru, Mo, Nb, Ti, Ta, or a combination thereof.

The optional first image transfer assist layer 171L includes a material that can provide a high etch resistance for an anisotropic etch process to be subsequently employed with respect to the material of the conductive material layer 160L, thereby enabling high etch selectivity for the etch process that patterns the conductive material layer 160L. For example, the optional first image transfer assist layer 171L may comprise a metal, such as Cr or Ru. The thickness of the first image transfer assist layer 171L may be in a range from 1 nm to 30 nm, such as from 2 nm to 10 nm, although lesser and greater thicknesses may also be employed.

A resist layer can be deposited over the optional first image transfer assist layer 171L and/or the conductive material layer 160L, and can be lithographically patterned to form a two-dimensional array of first discrete patterned resist material portions 187. The two-dimensional array of first discrete patterned resist material portions 187 can be a periodic two-dimensional array having a first pitch p1 along a first horizontal direction hd1 and having a second pitch p2 along a second horizontal direction hd2. Each of the first discrete patterned resist material portions 187 may have a respective horizontal cross-sectional shape of a rectangle, a rounded rectangle, an oval, or a circle.

Figures 85A, 85B, 85C:
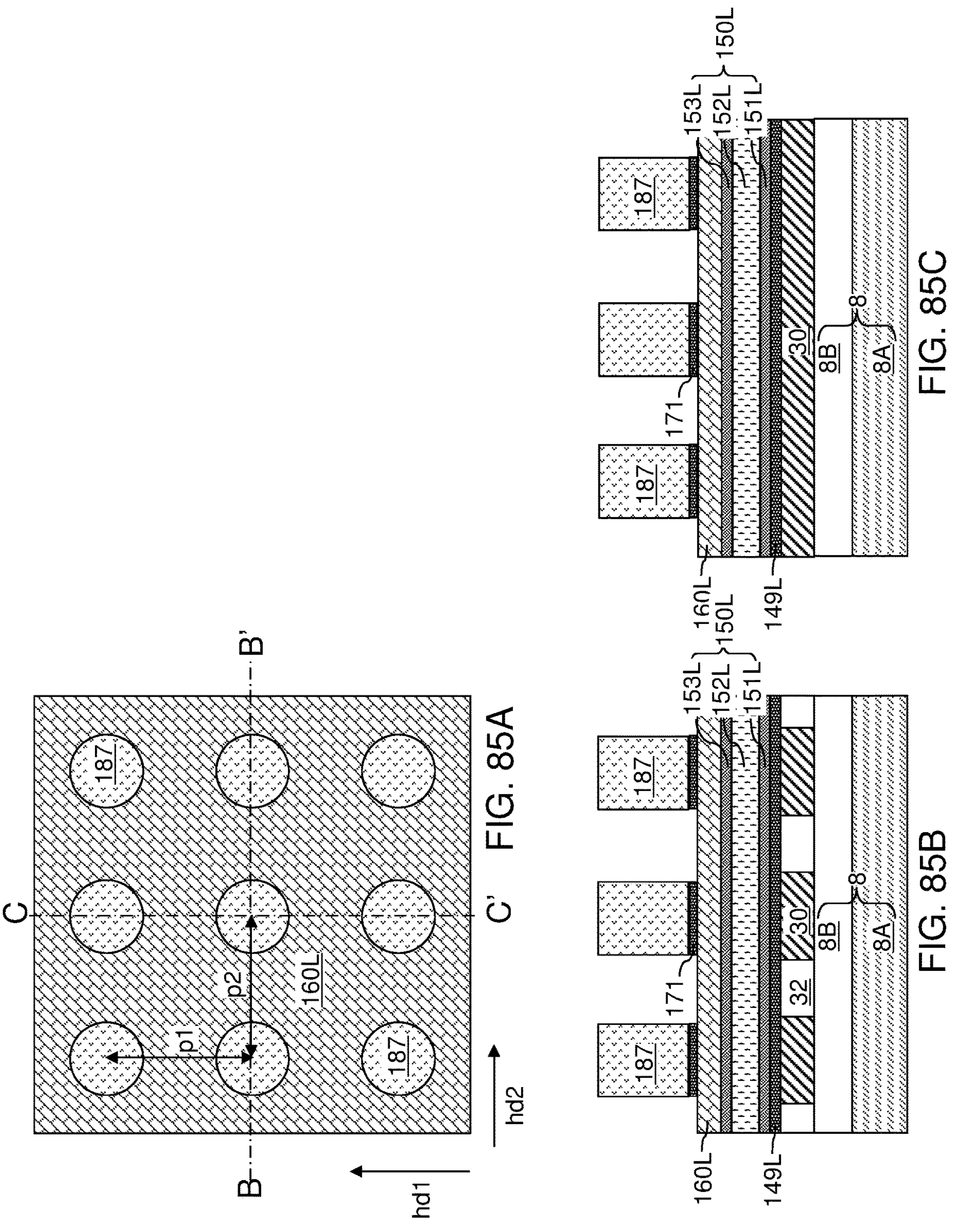
FIGS. 85A-85C are various views of the seventh exemplary structure after formation of optional first etch mask plates according to the seventh embodiment of the present disclosure.

Referring to FIGS. 85A-85C, an etch process can be performed to transfer the pattern in the two-dimensional array of first discrete patterned resist material portions 187 through the optional first image transfer assist layer 171L. The optional first image transfer assist layer 171L can be patterned into a two-dimensional array of first etch mask plates 171 having the same pattern as the two-dimensional array of first discrete patterned resist material portions 187. The etch process may comprise an anisotropic etch process such as a reactive ion etch process.

Figure 86A:
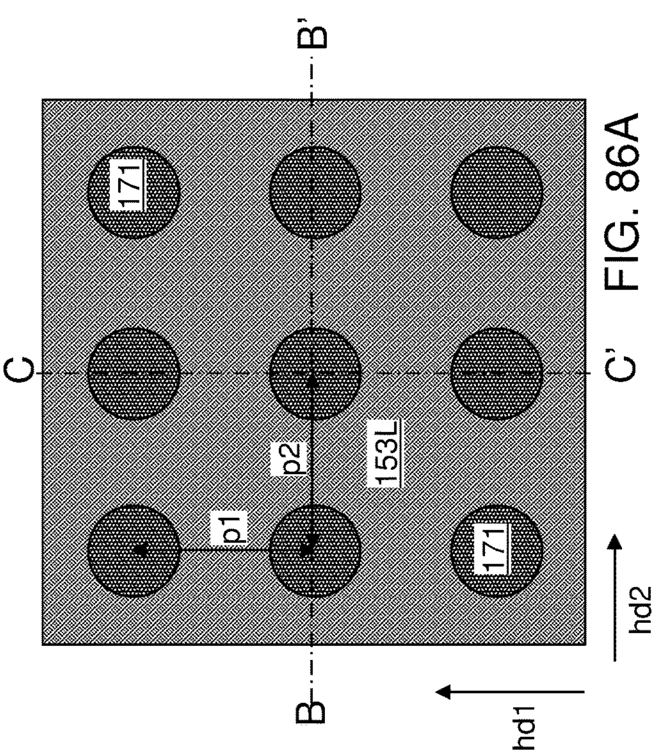
FIGS. 86A-86C are various views of the seventh exemplary structure after formation of conductive material plates according to the seventh embodiment of the present disclosure.
Figure 86B:
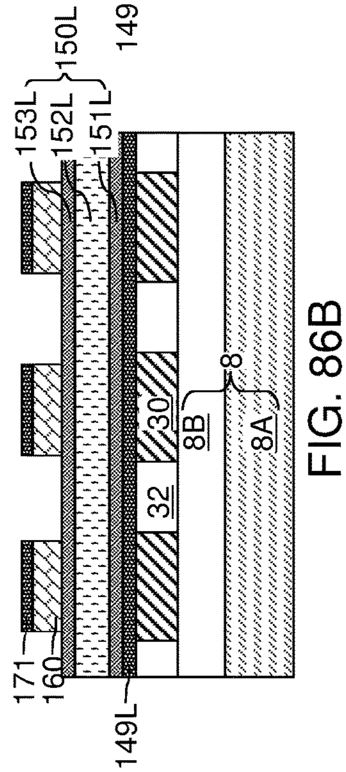
Figure 86C:
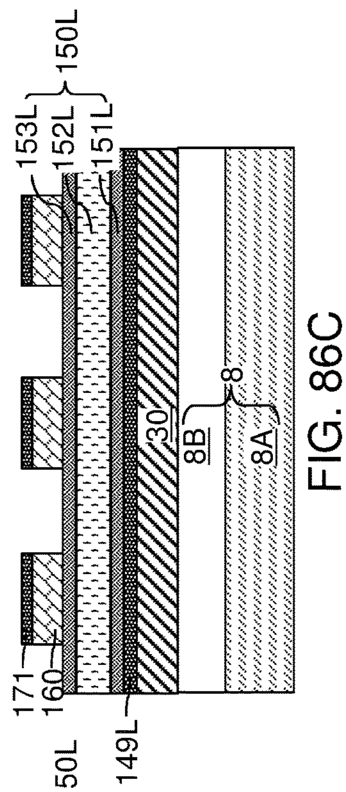

Referring to FIGS. 86A-86C, an anisotropic etch process can be performed to transfer the pattern in the two-dimensional array of first discrete patterned resist material portions 187 through the conductive material layer 160L. The conductive material layer 160L can be patterned into a two-dimensional array of conductive material plates 160 having the same pattern as the two-dimensional array of first discrete patterned resist material portions 187. Optionally, the two-dimensional array of first discrete patterned resist material portions 187 may be removed, for example, by ashing.

Figure 87C:
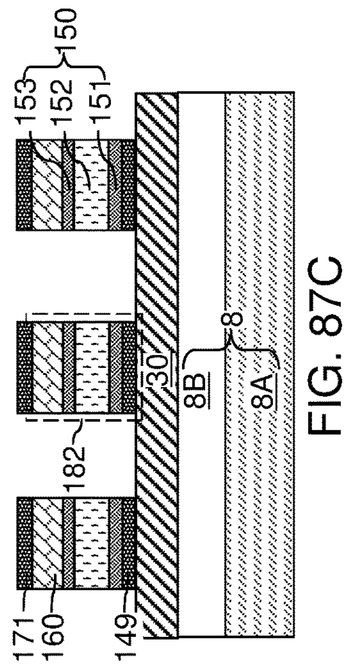
FIGS. 87A-87C are various views of the seventh exemplary structure after formation of a two-dimensional array of selector-containing pillar structures according to the seventh embodiment of the present disclosure.
Figure 87A:
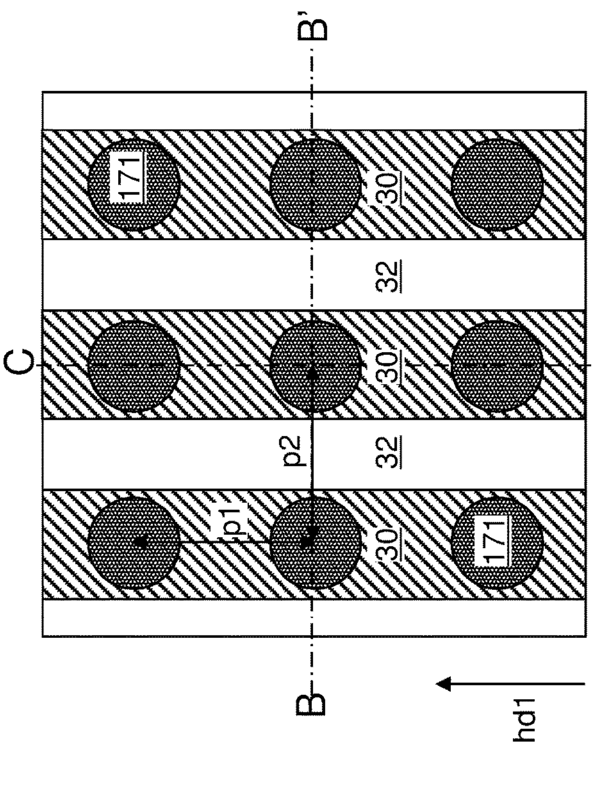
Figure 87B:
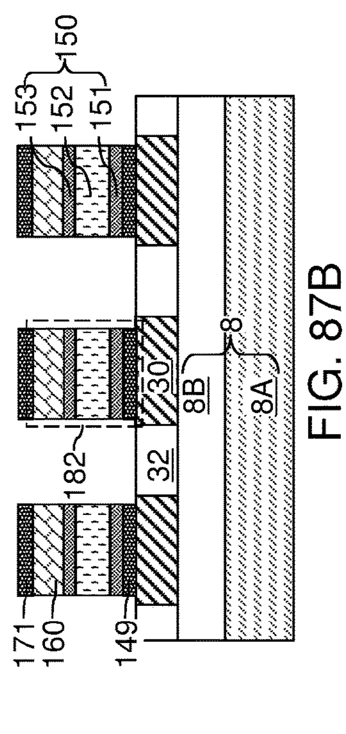

Referring to FIGS. 87A-87C, another anisotropic etch process can be performed to transfer the pattern in the two-dimensional array of first etch mask plates 171 and the two-dimensional array of conductive material plates 160 through the selector material layers 150L and the optional metallic adhesion layer 149L. The selector material layers 150L are patterned into selector elements 150. Each selector element 150 may include a vertical stack of a lower selector electrode 151, a non-Ohmic material plate 152, and an upper selector electrode 153. The optional metallic adhesion layer 149L may be patterned into a two-dimensional array of metallic adhesion plates 149. Vertical sidewalls of structural elements within each vertical stack of a metallic adhesion plate 149, a selector element 150, a conductive material plate 160, and a first etch mask plate 171 may be vertically coincident. In one embodiment, the first etch mask plates 171 may be collaterally consumed during the anisotropic etch process that patterns the selector elements 150.

A two-dimensional array of selector-containing pillar structures 182 can be formed over the first electrically conductive lines 30. Each selector-containing pillar structure 182 can include, from bottom to top, a metallic adhesion plate 149, a selector element 150, and a conductive material plate 160, and may optionally include a first etch mask plate 171. Each row of the selector-containing pillar structures 182 that is arranged along the first horizontal direction hd1 may be formed on a top surface of a respective one of the first electrically conductive lines 30. Each of the first electrically conductive lines 30 contacts a respective row of selector-containing pillar structures 182 of the two-dimensional array of selector-containing pillar structures 182.

Figure 88A:
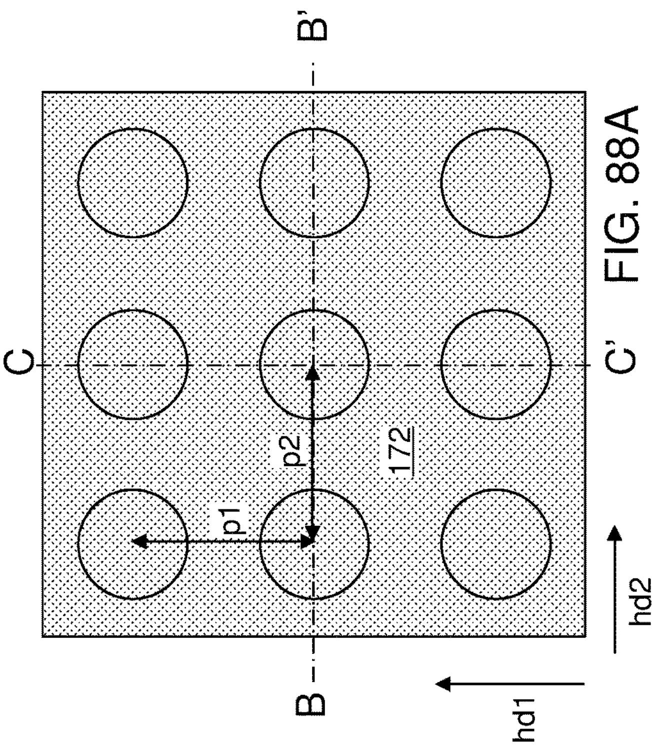
FIGS. 88A-88C are various views of the seventh exemplary structure after formation of a protective dielectric liner according to the seventh embodiment of the present disclosure.
Figure 88B:
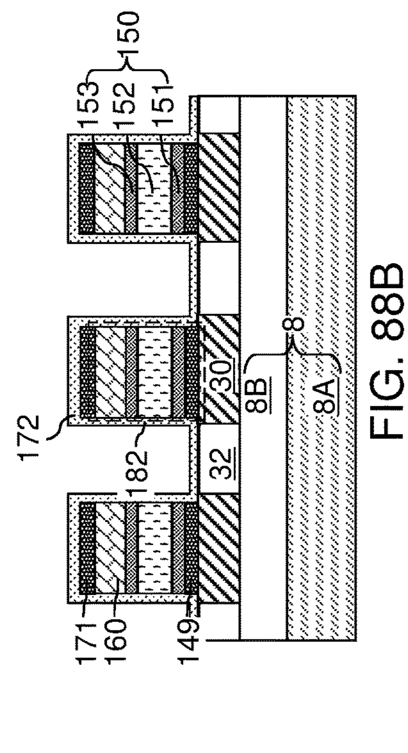
Figure 88C:
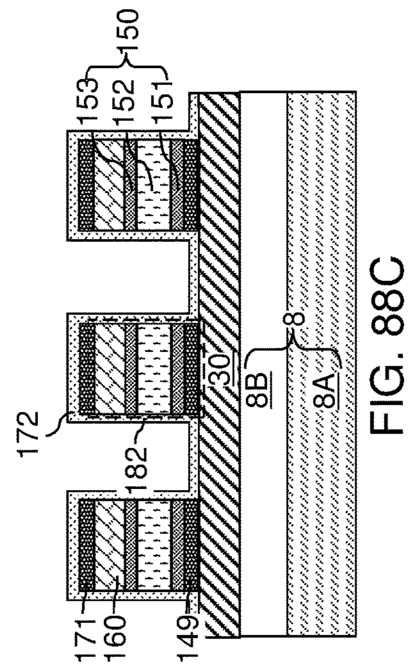

Referring to FIGS. 88A-88C, a protective dielectric liner 172 can be deposited over the two-dimensional array of selector-containing pillar structures 182. The protective dielectric liner 172 includes a dielectric material that can prevent or reduce lateral diffusion of the non-Ohmic material plates 152. In one embodiment, the protective dielectric liner 172 may comprise, and/or may consist essentially of, a dielectric material selected from silicon nitride, silicon oxynitride, silicon carbide nitride (i.e., silicon carbonitride) or a metal oxide, such as aluminum oxide, hafnium oxide or tantalum oxide. The protective dielectric liner 172 may be deposited by a conformal deposition process, such as a chemical vapor deposition process or an atomic layer deposition process. The thickness of the protective dielectric liner 172 may be in a range from 0.5 nm to 20 nm, such as from 2 nm to 10 nm, although lesser and greater thicknesses may also be employed.

The protective dielectric liner 172 comprises a horizontally-extending portion contacting top surfaces of the first electrically conductive lines 30 and the first line-level dielectric layer 32, a two-dimensional array of tubular dielectric liner portions laterally surrounding the two-dimensional array of selector-containing pillar structures 182, and a two-dimensional array of horizontal dielectric capping portions overlying the two-dimensional array of selector-containing pillar structures 182. The horizontally-extending portion of the protective dielectric liner 172 is adjoined to a bottom periphery of each of the tubular dielectric liner portions of the protective dielectric liner 172. The two-dimensional array of horizontal dielectric capping portions is adjoined to a top periphery of a respective one of the tubular dielectric liner portions of the protective dielectric liner 172.

The horizontally-extending portion of the protective dielectric liner 172 contacts top surfaces of the first electrically conductive lines 30 within a horizontal plane including interfaces between the first electrically conductive lines 30 and the two-dimensional array of selector-containing pillar structures 182. The first dielectric rails (which are portions of the first line-level dielectric layer 32 located between neighboring pairs of first electrically conductive lines 30, laterally extend along the first horizontal direction hd1, and are interlaced with the first electrically conductive lines 30 along the second horizontal direction hd2) contact a bottom surface of the horizontally-extending portion of the protective dielectric liner 172.

Figure 89A:
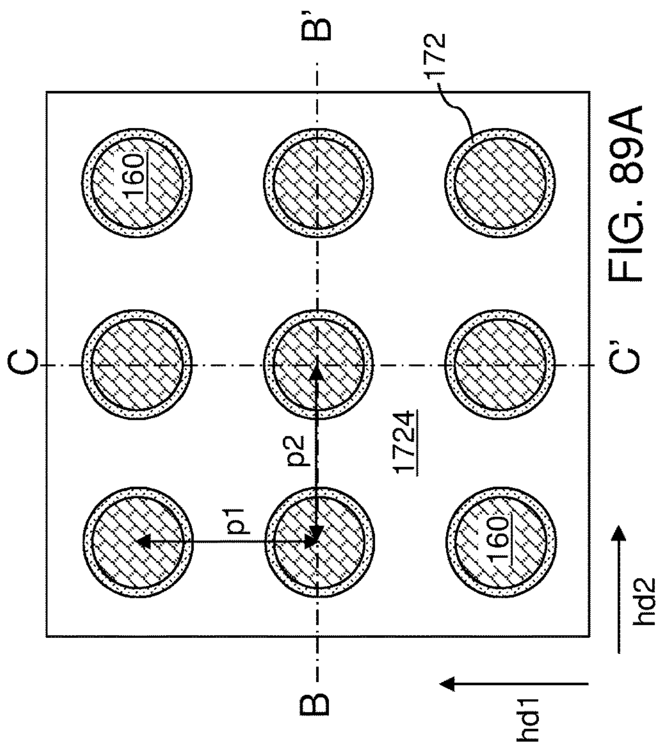
FIGS. 89A-89C are various views of the seventh exemplary structure after formation of a selector-level dielectric matrix layer according to the seventh embodiment of the present disclosure.
Figure 89B:
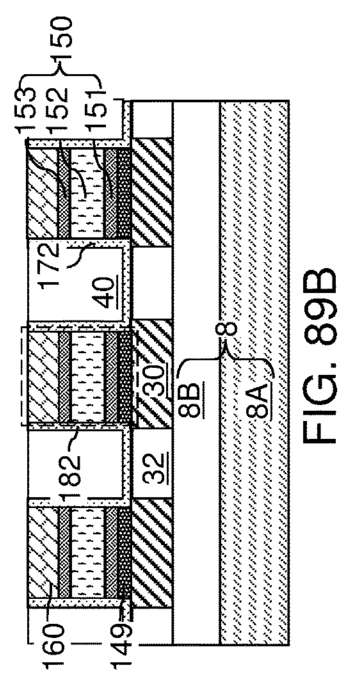
Figure 89C:
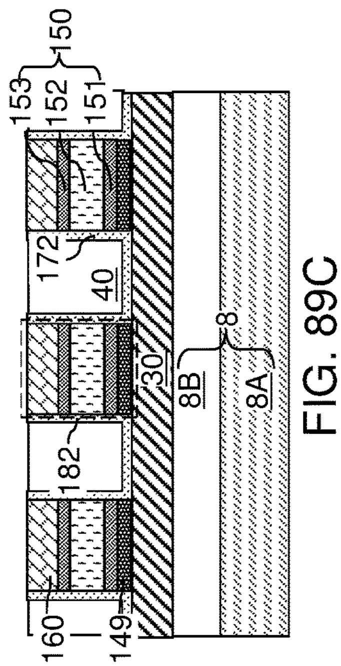

Referring to FIGS. 89A-89C, a dielectric fill material, such as silicon oxide can be deposited around the protective dielectric liner 172. In one embodiment, the dielectric fill material may comprise a different material from the material of the protective dielectric liner 172. Excess portions of the dielectric fill material can be removed from above the horizontal plane including the top surfaces of the conductive material plates 160 by a planarization process such as a chemical mechanical polishing process. Remaining portions of the dielectric fill material constitute a dielectric matrix layer, which is herein referred to as a selector-level dielectric matrix layer 40. Thus, the selector-level dielectric matrix layer 40 is formed over the protective dielectric liner 172. The sacrificial capping material plates 166 and portions of the protective dielectric liner 172 that overlies the horizontal plane including the top surfaces of the conductive material plates 160 can be collaterally removed during the planarization process that planarizes the selector-level dielectric matrix layer 40. Generally, the selector-level dielectric matrix layer 40 and the protective dielectric liner 172 can be planarized by removing portions of the selector-level dielectric matrix layer 40 and the protective dielectric liner 172 from above the horizontal plane including top surfaces of the two-dimensional array of selector-containing pillar structures 182. The selector-level dielectric matrix layer 40 laterally surrounds the two-dimensional array of tubular dielectric liner portions of the protective dielectric liner 172, and overlies the horizontally-extending portion of the protective dielectric liner 172.

Figure 90A:
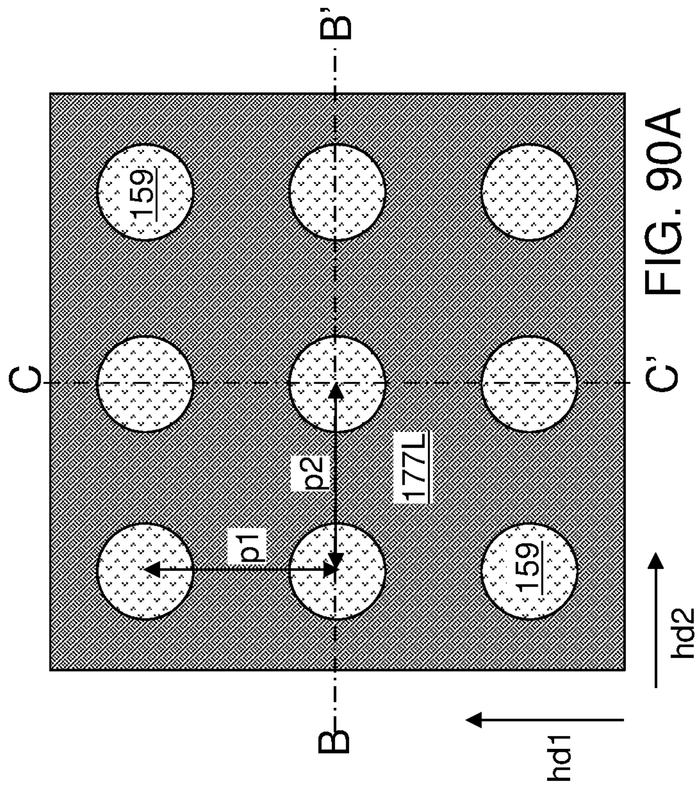
FIGS. 90A-90C are various views of the seventh exemplary structure after formation of magnetic tunnel junction material layers, an optional an optional patterning film, and an optional second image transfer assist layer according to the seventh embodiment of the present disclosure.
Figure 90C:
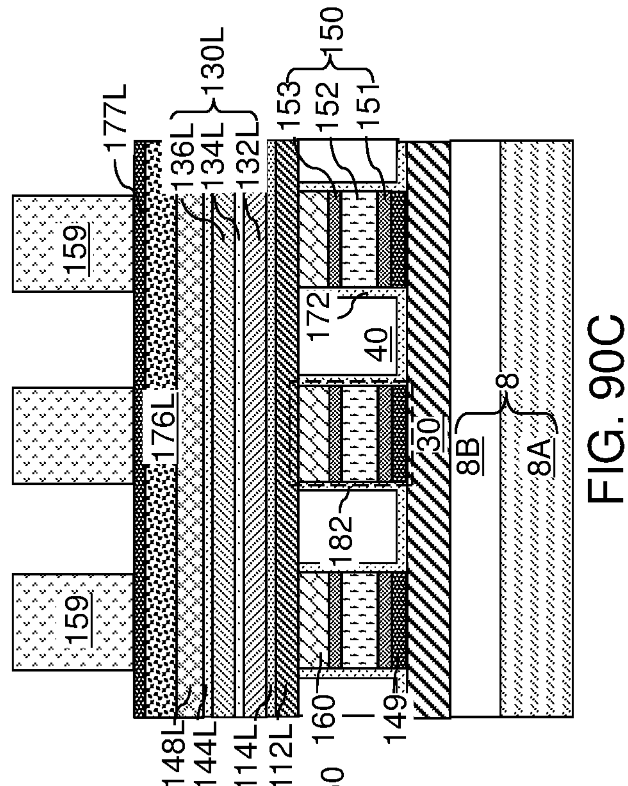
Figure 90B:
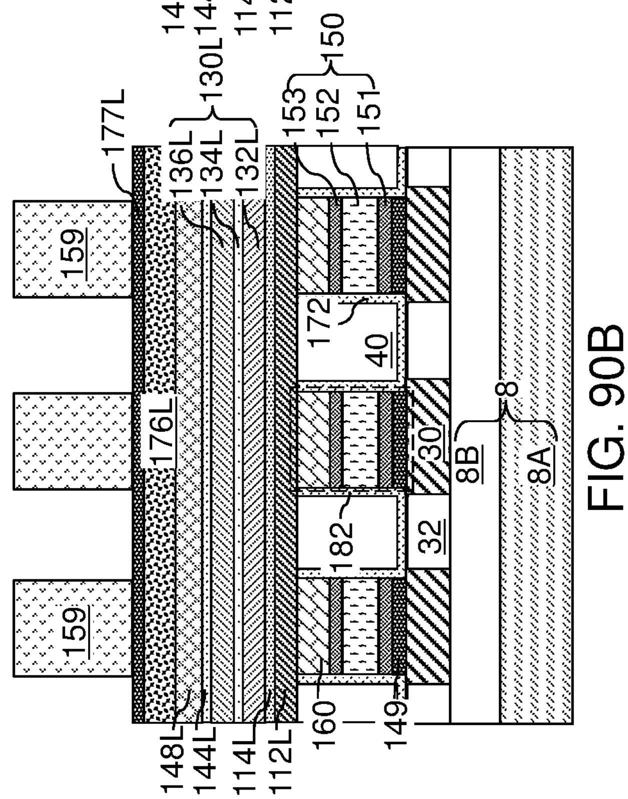

Referring to FIGS. 90A-90C, the processing steps of FIGS. 10A-10C can be performed to form magnetic tunnel junction-level (MTJ-level) material layers (112L, 114L, 130L, 144L, 148L). The magnetic tunnel junction-level (MTJ-level) material layers (112L, 114L, 130L, 144L, 148L) can be the same as the first magnetic tunnel junction-level (MTJ-level) material layers (112L, 114L, 130L, 144L, 148L) described with reference to FIGS. 10A-10C. The MTJ-level material layers (112L, 114L, 130L, 144L, 148L) continuous magnetic tunnel junction (MTJ) material layers 130L, which include a layer stack containing a continuous reference layer 132L, a continuous nonmagnetic tunnel barrier layer 134L, and a continuous free layer 136L.

An optional patterning film 176L and/or an optional second image transfer assist layer 177L can be formed over the MTJ-level material layers (112L, 114L, 130L, 144L, 148L). The optional patterning film 176L may comprise a carbon-based material that can enhance pattern fidelity during subsequent anisotropic etch processes. For example, the optional patterning film 176L may be composed primarily of amorphous carbon or diamond-like carbon. The optional second image transfer assist layer 177L includes a material that can provide a high etch resistance for an anisotropic etch process to be subsequently employed with respect to the material of the patterning film 176L and/or with respect to the material of the metallic capping layer 148L in case the patterning film 176L is not employed. For example, the optional second image transfer assist layer 177L may comprise a metal, such as Cr or Ru. The thickness of the second image transfer assist layer 177L may be in a range from 1 nm to 30 nm, such as from 2 nm to 10 nm, although lesser and greater thicknesses may also be employed.

A two-dimensional array of second discrete patterned resist material portions 159 can be formed over the MTJ-level material layers (112L, 114L, 130L, 144L, 148L), the optional patterning film 176L, and the optional second image transfer assist layer 177L. Each of the second discrete patterned resist material portions 159 has an areal overlap with a respective underlying one of the selector-containing pillar structures 182. The two-dimensional array of second discrete patterned resist material portions 159 can be formed as a periodic array having the first pitch p1 along the first horizontal direction hd1 and having the second pitch p2 along the second horizontal direction hd2. The horizontal cross-sectional shapes of the second discrete patterned resist material portions 159 can be the same as, or can be different from, the horizontal cross-sectional shapes of the first selector-containing pillar structures 182. In one embodiment, the area of each second discrete patterned resist material portions 159 may be located entirely within the area of a respective underlying selector-containing pillar structure 182 in a plan view (such as a top-down view). Alternatively, the area of each second discrete patterned resist material portions 159 may coincide within the area of a respective underlying selector-containing pillar structure 182 in the plan view. Yet alternatively, the area of each second discrete patterned resist material portions 159 may include all of, and may be greater than, the area of a respective underlying selector-containing pillar structure 182 in the plan view. In one embodiment, the lateral dimension of each of the second discrete patterned resist material portions 159 along the first horizontal direction hd1 may be the same as the lateral dimension of each of the second discrete patterned resist material portions 159 along the second horizontal direction hd2. In one embodiment, each of the second discrete patterned resist material portions 159 may have a respective horizontal cross-sectional shape of a circle.

Figure 91A:
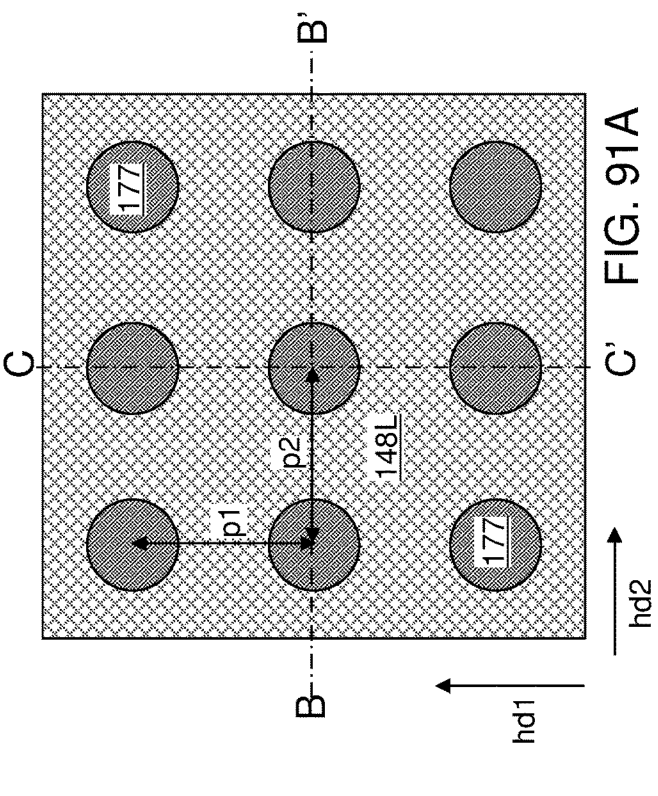
FIGS. 91A-91C are various views of the seventh exemplary structure after formation of optional second etch mask plates and patterning plates according to the seventh embodiment of the present disclosure.
Figure 91B:
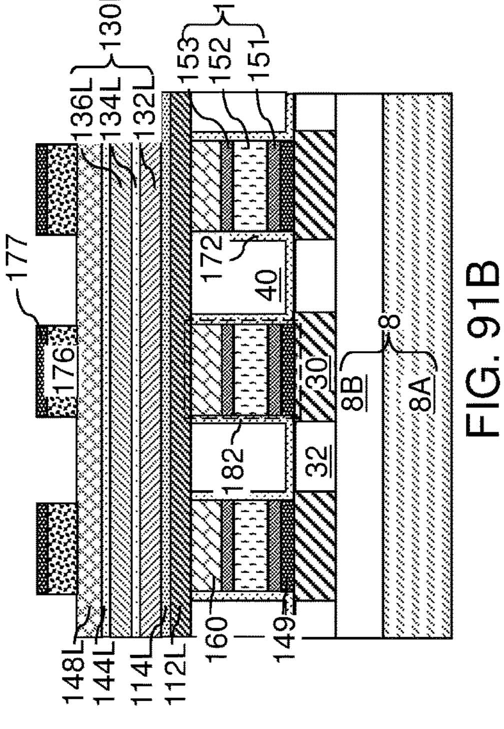
Figure 91C:
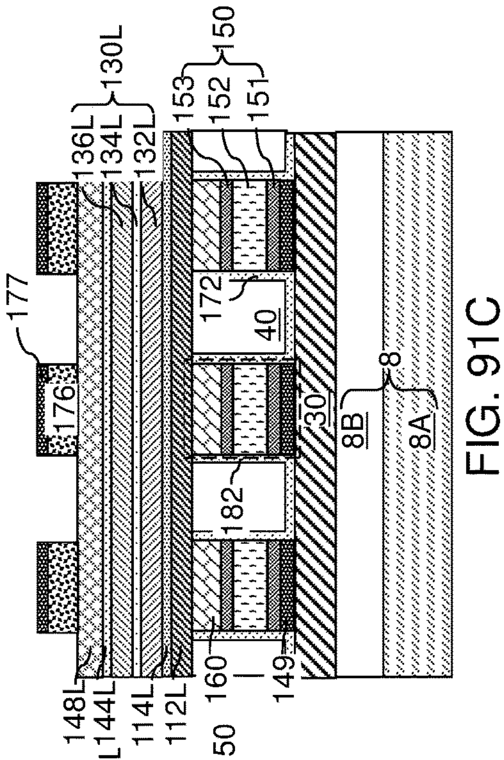

Referring to FIGS. 91A-91C, the pattern in the two-dimensional array of second discrete patterned resist material portions 159 can be transferred through the second image transfer assist layer 177L and the patterning film 176L by performing an anisotropic etch process such as a reactive ion etch process. The second image transfer assist layer 177L can be divided into a two-dimensional array of second etch mask plates 177. The patterning film 176L can be divided into a two-dimensional array of patterning film plates 176. The two-dimensional array of second discrete patterned resist material portions 159 can be subsequently removed, for example, by ashing. A two-dimensional array of discrete masking structures (i.e., hardmask structures) (176, 177) can be formed. Each discrete masking structure (176, 177) may comprise a patterning film plate 176 and/or a second etch mask plate 177.

Figures 92A, 92B, 92C:
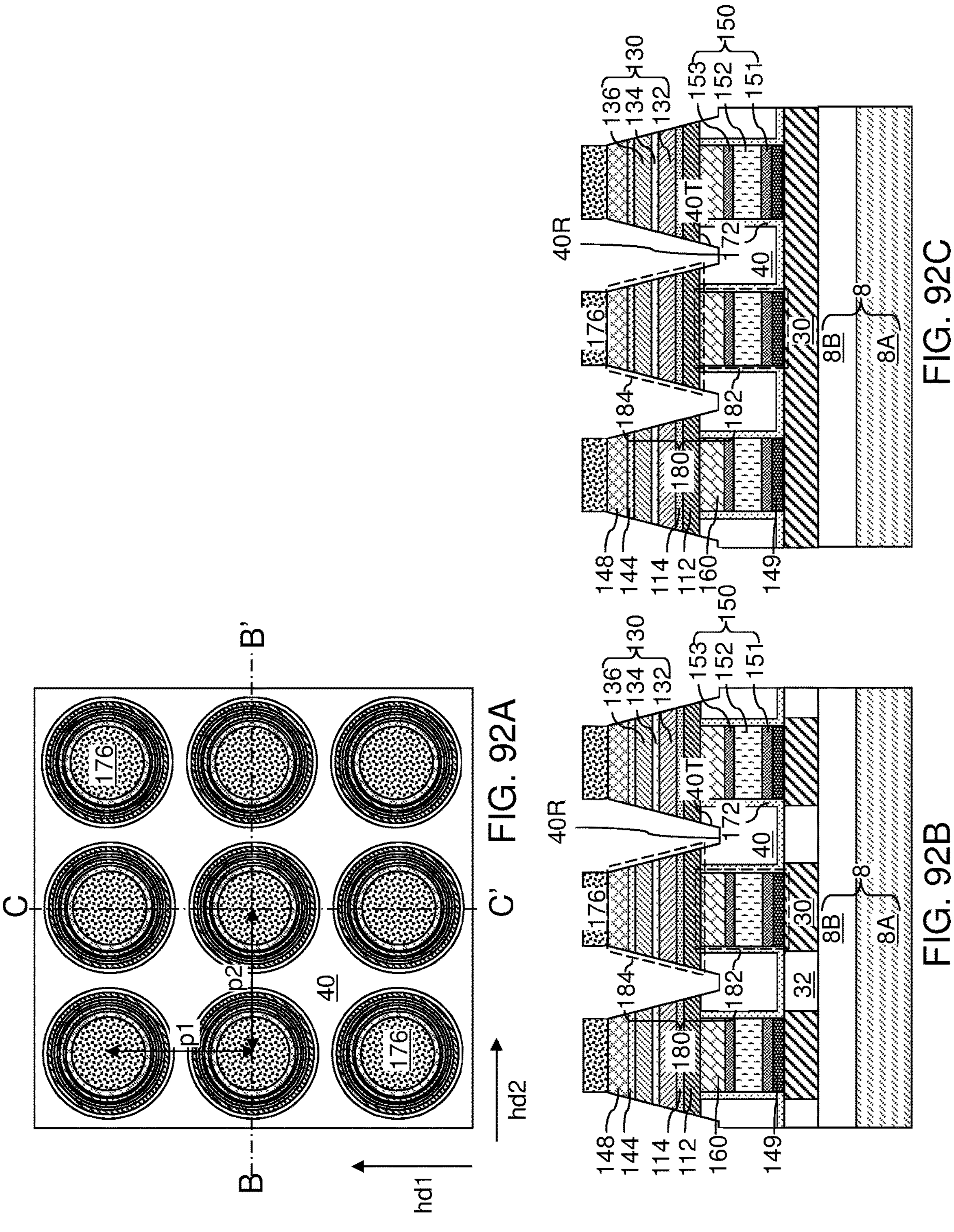
FIGS. 92A-92C are various views of the seventh exemplary structure after formation of a two-dimensional array of magnetic tunnel junction (MTJ) pillar structures according to the seventh embodiment of the present disclosure.

Referring to FIGS. 92A-92C, an anisotropic etch process can be performed to transfer the pattern in the two-dimensional array of discrete masking structures (176, 177) through the MTJ-level material layers (112L, 114L, 130L, 144L, 148L). The anisotropic etch process may comprise an ion beam etch (i.e., ion milling) process. The MTJ-level material layers (112L, 114L, 130L, 144L, 148L) can be patterned into a two-dimensional array of magnetic tunnel junction (MTJ) pillar structures 184. According to an aspect of the present disclosure, physically exposed surfaces of the MTJ pillar structures 184 are formed with taper angles. The taper angles can be measured with respect to the vertical direction that is perpendicular to the top surface of the substrate 8. In one embodiment, the taper angle may be in a range from 3 degrees to 30 degrees, such as from 6 degrees to 20 degrees, although lesser and greater taper angles may also be employed.

Generally, the layer stack including the MTJ-level material layers (112L, 114L, 130L, 144L, 148L) can be patterned into the two-dimensional array of magnetic tunnel junction pillar structures 184 by anisotropically etching the layer stack employing the two-dimensional array of discrete masking structures (176, 177) as an etch mask. The two-dimensional array of magnetic tunnel junction pillar structures 184 can be formed above the two-dimensional array of selector-containing pillar structures 182. The MTJ-level material layers (112L, 114L, 130L, 144L, 148L) can be patterned such that each of the magnetic tunnel junction pillar structures 184 is formed with a respective tapered sidewall such that bottoms of the magnetic tunnel junction pillar structures 184 are wider than the tops of the magnetic tunnel junction pillar structures 184. The total thickness of the MTJ-level material layers (112L, 114L, 130L, 144L, 148L) and the taper angle can be selected such that each of the magnetic tunnel junction pillar structures 184 has a respective bottom surface having a periphery that is laterally offset outward from a periphery of a top surface of a respective underlying selector-containing pillar structure 182 within the two-dimensional array of selector-containing pillar structures 182.

In one embodiment, the anisotropic etch process may collaterally etch portions of the selector-level dielectric matrix layer 40 during and/or after formation of the two-dimensional array of magnetic tunnel junction pillar structures 184. A recessed horizontal surface 40R of the selector-level dielectric matrix layer 40 may be formed, which can be adjoined to annular tapered sidewall segments 40T of the selector-level dielectric matrix layer 40. In one embodiment, each selector-containing pillar structure 182 within the two-dimensional array of selector-containing pillar structures 182 has a respective top surface that contacts a bottom surface of a respective overlying magnetic tunnel junction pillar structure 184 within the two-dimensional array of magnetic tunnel junction pillar structures 184. In one embodiment, a periphery of the respective top surface of the selector-containing pillar structures 182 can be laterally offset inward from and does not contact a periphery of the bottom surface of the respective overlying magnetic tunnel junction pillar structure 184. The metal layers at the base of the MTJ pillar structures 184 are electrically separated from neighboring MTJ pillar structures 184 of adjacent MRAM memory cells (i.e., bits).

Due to the tapered profile ion beam etching creates at the base of the MTJ pillar structures 184, the selector-containing pillar structures 182 are located beneath the MTJ pillar structures 184, which means they are protected from damage during the ion beam etching. Thus, the selector elements 150 are protected from the ions that are employed during the ion beam etching process employed to pattern the MTJ pillar structures 184 by the protective dielectric layer 172, by the conductive material plates 160 and by portions of the selector-level dielectric matrix layer 40. Furthermore, once the MTJ pillar structures 184 are etched through, the etching continues into a dielectric material of the dielectric matrix layer 40 rather than into metal, which reduces the potential for shunting the MTJ pillar structures 184 due to metal redeposition.

In one embodiment, each tubular dielectric liner portion within the two-dimensional array of tubular dielectric liner portions of the protective dielectric liner 172 may have an annular top surface that contacts a bottom surface of a respective overlying magnetic tunnel junction pillar structure 184 within the two-dimensional array of magnetic tunnel junction pillar structures 184. In one embodiment, an outer periphery of the annular top surface of each tubular dielectric liner portion of the protective dielectric liner 172 is laterally offset inward from and does not contact a periphery of the bottom surface of the respective overlying magnetic tunnel junction pillar structure 184. Generally, sidewalls of the two-dimensional array of magnetic tunnel junction pillar structures 184 may have a greater taper angle relative to a vertical direction than sidewalls of the two-dimensional array of selector-containing pillar structures 182.

In one embodiment, the selector-level dielectric matrix layer 40 can have a contoured top surface that includes a two-dimensional array of annular horizontal surface segments in contact with bottom surfaces of the two-dimensional array of magnetic tunnel junction pillar structures 184, a continuous recessed surface 40R located below a horizontal plane including the bottom surfaces of the two-dimensional array of magnetic tunnel junction pillar structures 184, and a two-dimensional array of annular tapered surface segments 40T connecting outer peripheries of the annular horizontal surface segments to the continuous recessed surface 40R. In one embodiment, the continuous recessed surface 40R is laterally spaced from the protective dielectric liner 172 by portions of the selector-level dielectric matrix layer 40 that contact the bottom surfaces of the two-dimensional array of magnetic tunnel junction pillar structures 184.

Figure 93A:
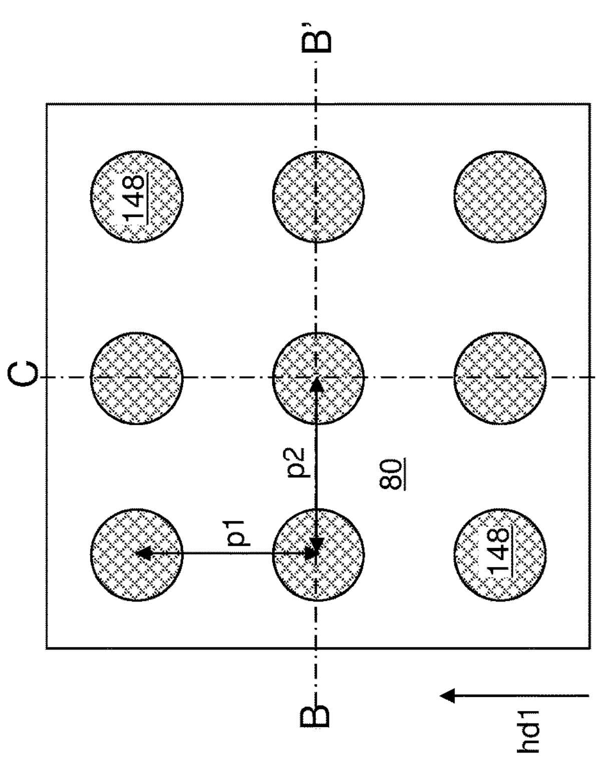
FIGS. 93A-93C are various views of the seventh exemplary structure after formation of a magnetic-tunnel-junction-level (MTJ-level) dielectric matrix layer according to the seventh embodiment of the present disclosure.
Figure 93B:
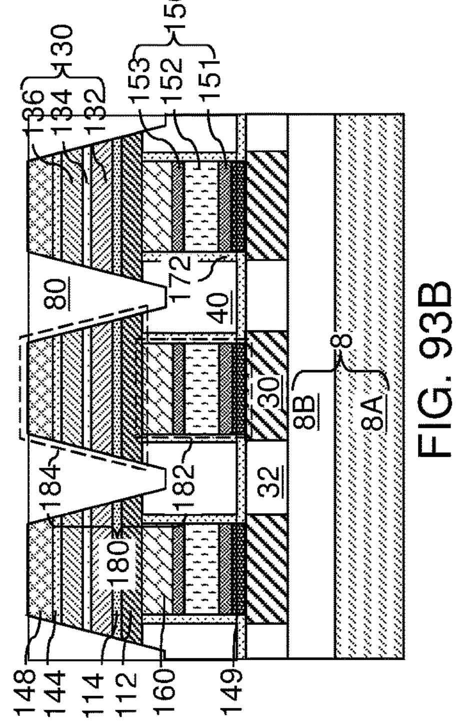
Figure 93C:
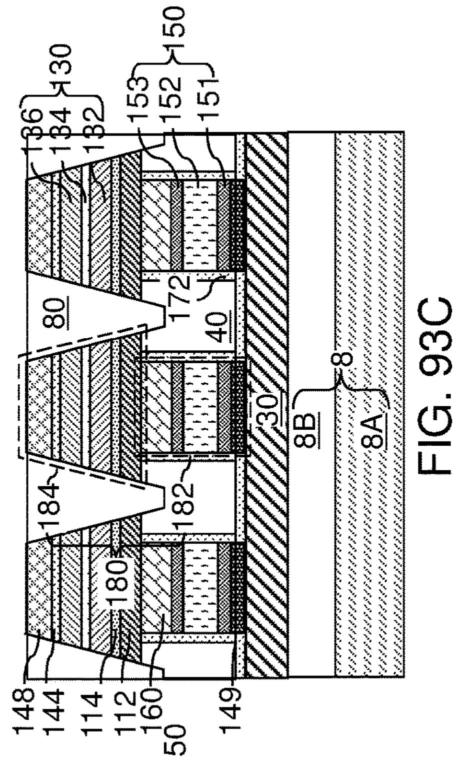

Referring to FIGS. 93A-93C, a dielectric fill material can be deposited in the gaps between neighboring pairs of the MTJ pillar structures 184, and can be subsequently planarized to remove portions of the dielectric fill material from above the horizontal plane including the top surfaces of the MTJ pillar structures 184. The remaining portions of the dielectric fill material comprises a dielectric matrix layer, which is herein referred to as a magnetic-tunnel-junction-level (MTJ-level) dielectric matrix layer 80. The MTJ-level dielectric matrix layer 80 laterally surrounds the two-dimensional array of magnetic tunnel junction pillar structures 184, and overlies the selector-level dielectric matrix layer 40. The MTJ-level dielectric matrix layer 80 comprises downward-protruding portions that extend downward below a horizontal plane including bottom surfaces of the two-dimensional array of magnetic tunnel junction pillar structures 184, and have tapered surfaces contacting the selector-level dielectric matrix layer 40.

Figures 94A, 94B, 94C:
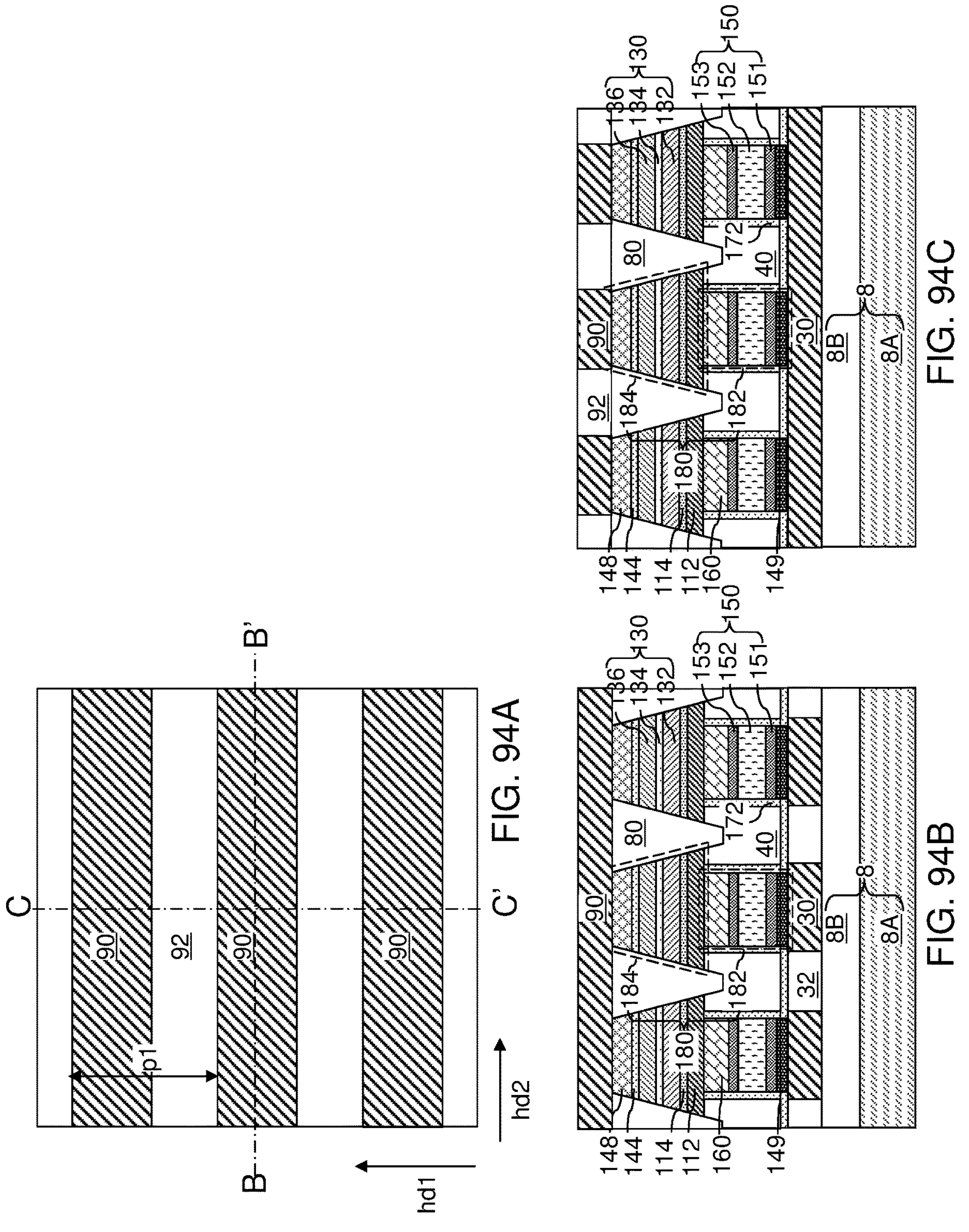
FIGS. 94A-94C are various views of the seventh exemplary structure after formation of second electrically conductive lines according to the seventh embodiment of the present disclosure.

Referring to FIGS. 94A-94C, a dielectric material can be deposited over the two-dimensional array of MTJ pillar structures 184 to form a second line-level dielectric layer 92. Line trenches laterally extending along the second horizontal direction hd2 can be formed through the second line-level dielectric layer 92 above each column of MTJ pillar structures 184 arranged along the second horizontal direction hd2. A conductive material can be deposited in the line trenches, and excess portions of the conductive material can be removed from above the horizontal plane including the top surface of the second line-level dielectric layer 92. Remaining portions of the conductive material filling the line trenches constitute second electrically conductive lines 90. The second electrically conductive lines 90 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrically conductive lines 90 can be in a range from 20 nm to 100 nm, although lesser and greater thicknesses can also be employed. Alternatively, instead of using the above described damascene process to form the second electrically conductive lines 490, these lines may be formed by a pattern and etch process.

Referring to FIGS. 1, 2, and 83A-94C and related drawings, a memory device is provided, which comprises: first electrically conductive lines 30 laterally extending along a first horizontal direction hd1 and laterally spaced apart from each other along a second horizontal direction hd2; a two-dimensional array of selector-containing pillar structures 182 located over the first electrically conductive lines 30, wherein each of the first electrically conductive lines 30 contacts a respective row of selector-containing pillar structures 182 of the two-dimensional array of selector-containing pillar structures 182; a protective dielectric liner 172 comprising a two-dimensional array of tubular dielectric liner portions laterally surrounding the two-dimensional array of selector-containing pillar structures 182; a two-dimensional array of magnetic tunnel junction pillar structures 184 located above the two-dimensional array of selector-containing pillar structures 182; and second electrically conductive lines 90 laterally extending along the second horizontal direction hd2, laterally spaced apart from each other along the first horizontal direction hd1, and located over the two-dimensional array of magnetic tunnel junction pillar structures 184.

In one embodiment, each selector-containing pillar structure 182 within the two-dimensional array of selector-containing pillar structures 182 has a respective top surface that contacts a bottom surface of a respective overlying magnetic tunnel junction pillar structure 184 within the two-dimensional array of magnetic tunnel junction pillar structures 184; and a periphery of the respective top surface is laterally offset inward from and does not contact a periphery of the bottom surface of the respective overlying magnetic tunnel junction pillar structure 184.

In one embodiment, the protective dielectric liner 172 further comprises a horizontally-extending portion adjoined to a bottom periphery of each of the tubular dielectric liner portions; and each tubular dielectric liner portion within the two-dimensional array of tubular dielectric liner portions of the protective dielectric liner 172 has an annular top surface that contacts a bottom surface of a respective overlying magnetic tunnel junction pillar structure 184 within the two-dimensional array of magnetic tunnel junction pillar structures 184.

In one embodiment, the protective dielectric liner 172 does not surround the magnetic tunnel junction pillar structures 184; and an outer periphery of the annular top surface of each tubular dielectric liner portion is laterally offset inward from and does not contact a periphery of the bottom surface of the respective overlying magnetic tunnel junction pillar structure 184.

In one embodiment, the memory device comprises a selector-level dielectric matrix layer 40 laterally surrounding the two-dimensional array of tubular dielectric liner portions and overlying the horizontally-extending portion of the protective dielectric liner. In one embodiment, a contoured top surface of the selector-level dielectric matrix layer 40 comprises: a two-dimensional array of annular horizontal surface segments in contact with bottom surfaces of the two-dimensional array of magnetic tunnel junction pillar structures 184; a continuous recessed surface 40R located below a horizontal plane including the bottom surfaces of the two-dimensional array of magnetic tunnel junction pillar structures 184; and a two-dimensional array of annular tapered surface segments 40T connecting outer peripheries of the annular horizontal surface segments to the continuous recessed surface 40R.

In one embodiment, the continuous recessed surface 40R is laterally spaced from the protective dielectric liner 172 by portions of the selector-level dielectric matrix layer 40 that contact the bottom surfaces of the two-dimensional array of magnetic tunnel junction pillar structures 184. A magnetic-tunnel-junction-level (MTJ-level) dielectric matrix layer 80 may laterally surround the two-dimensional array of magnetic tunnel junction pillar structures 184, and may overlie the selector-level dielectric matrix layer 40. In one embodiment, the MTJ-level dielectric layer 80 comprises downward-protruding portions that extend downward below a horizontal plane including bottom surfaces of the two-dimensional array of magnetic tunnel junction pillar structures 184 and have tapered surfaces contacting the selector-level dielectric matrix layer 40.

In one embodiment, sidewalls of the two-dimensional array of magnetic tunnel junction pillar structures 184 have a greater taper angle relative to a vertical direction than sidewalls of the two-dimensional array of selector-containing pillar structures 182.

In one embodiment, the horizontally-extending portion of the protective dielectric liner 172 contacts top surfaces of the first electrically conductive lines 30 within a horizontal plane including interfaces between the first electrically conductive lines 30 and the two-dimensional array of selector-containing pillar structures 182.

In one embodiment, the memory device comprises first dielectric rails (which are portions of the first line-level dielectric layer 32) laterally extending along the first horizontal direction hd1, interlaced with the first electrically conductive lines 30 along the second horizontal direction hd2, and contacting a bottom surface of the horizontally-extending portion of the protective dielectric liner 172. In one embodiment, the protective dielectric liner 172 comprises a dielectric material selected from silicon nitride, silicon oxynitride, silicon carbide nitride or metal oxide.

A method of forming a memory device according to the seventh embodiment includes forming a two-dimensional array of selector-containing pillar structures 182 over first electrically conductive lines 30 which extend in a first horizontal direction hd1; depositing a layer stack 130L including a continuous reference layer 132L, a continuous nonmagnetic tunnel barrier layer 134L, and a continuous free layer 136L over the two-dimensional array of selector-containing pillar structures 182; patterning the layer stack 130L into a two-dimensional array of magnetic tunnel junction pillar structures 184; and forming second electrically conductive lines 90 over the two-dimensional array of magnetic tunnel junction pillar structures 184.

In one embodiment, the method also includes depositing a protective dielectric liner 172 over the two-dimensional array of selector-containing pillar structures 182 prior to depositing the layer stack 130L. The method may also include forming a selector-level dielectric matrix layer 40 over the protective dielectric liner 172, wherein the layer stack 130L is deposited above the selector-level dielectric matrix layer 40.

In one embodiment, the method also includes planarizing the selector-level dielectric matrix layer and the protective dielectric liner by removing portions of the selector-level dielectric matrix layer and the protective dielectric liner from above a horizontal plane including top surfaces of the two-dimensional array of selector-containing pillar structures prior to depositing the layer stack.

In one embodiment, the method also includes forming a two-dimensional array of discrete masking structures (176, 177) over the layer stack 130L; and anisotropically etching the layer stack 130L by ion beam etching using the two-dimensional array of discrete masking structures as an etch mask to pattern the layer stack 130L into the two-dimensional array of magnetic tunnel junction pillar structures 184.

The various embodiments of the present disclosure may be employed to provide a magnetoresistive memory array including a two-dimensional array of memory cells (180 or 180') with enhanced performance and/or with cost-effective manufacturing processing sequences.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:

forming a first electrically conductive layer over a substrate;

forming a two-dimensional array of memory cells over the first electrically conductive layer, wherein each of the memory cells comprises a vertical stack including a magnetic tunnel junction pillar structure and a selector-containing pillar structure;

coating a continuous resist layer over the two-dimensional array of memory cells such that the continuous resist layer comprises a horizontally-extending planar resist layer overlying the first electrically conductive layer, a two-dimensional array of tubular resist portions laterally surrounding the two-dimensional array of memory cells, and a two-dimensional array of capping resist portions overlying the two-dimensional array of memory cells;

patterning the continuous resist layer into discrete resist material portions by lithographic exposure and development, wherein the horizontally-extending planar resist layer is divided into a plurality of horizontally-extending planar resist portions having a respective pair of lengthwise edges laterally extending along a first horizontal direction and adjoined to a respective set of at least one tubular resist portion; and patterning the first electrically conductive layer into a plurality of first electrically conductive lines by etching portions of the first electrically conductive layer that are not covered by the discrete resist material portions.

2. The method of claim 1, wherein the two-dimensional array of tubular resist portions are spaced apart and are not in direct contact with each other.

3. The method of claim 1, wherein:

the horizontally-extending planar resist layer has a uniform vertical thickness; and the two-dimensional array of tubular resist portions have a respective lateral thickness between an inner sidewall and an outer sidewall that is in a range from 50% to 100% of the uniform vertical thickness of the horizontally-extending planar resist layer.

4. The method of claim 1, wherein:

the coating the continuous resist layer comprises coating the continuous resist layer by atomic layer deposition or by chemical vapor deposition; and the continuous resist layer comprises a dry electron beam resist material or a dry extreme ultraviolet resist material.

5. The method of claim 1, wherein the continuous resist layer comprises a hydrogen silsesquioxane-based polymer material.

6. The method of claim 1, wherein:

the lithographic exposure comprises lithographically exposing the two-dimensional array of tubular resist portions, the two-dimensional array of capping resist portions, and first regions of the horizontally-extending planar resist layer adjoined to a respective one of the tubular resist portions without lithographically exposing second regions of the horizontally-extending planar resist layer; and the portions of the first electrically conductive layer that are not covered by the discrete resist material portions are etched by at least one of a reactive ion etch process or an ion beam etch process.

7. The method of claim 6, further comprising removing the second regions of the horizontally-extending planar resist layer during a development step.

8. The method of claim 1, further comprising:

forming magnetic tunnel junction material layers and selector-level material layers over the first electrically conductive layer;

forming a two-dimensional array of discrete resist material portions over the selector-level material layers; and transferring a pattern in the two-dimensional array of discrete resist material portions through the selector-level material layers and the magnetic tunnel junction material layers, wherein remaining portions of the selector-level material layers comprise the two-dimensional array of selector-containing pillar structures, and remaining portions of the magnetic tunnel junction material layers comprise the magnetic tunnel junction pillar structures.

9. The method of claim 8, further comprising:

forming a sacrificial capping material layer over the selector-level material layers, wherein the two-dimensional array of discrete resist material portions is formed over the sacrificial capping material layers;

patterning the sacrificial capping material layer into sacrificial capping material plates by transferring the pattern in the two-dimensional array of discrete resist material portions through the sacrificial capping material layer; and removing the sacrificial capping material plates after patterning the first electrically conductive layer into the plurality of first electrically conductive lines.

10. The method of claim 1, further comprising:

removing the discrete resist material portions after patterning the first electrically conductive layer into the plurality of first electrically conductive lines; and forming a dielectric matrix layer around the two-dimensional array of memory cells.

11. The method of claim 10, further comprising:

planarizing the dielectric matrix layer such that a top surface of the dielectric matrix layer is formed within a horizontal plane including top surfaces of the two-dimensional array of memory cells; and forming second electrically conductive lines over the dielectric matrix layer, wherein each of the second electrically conductive lines contacts a respective subset of the memory cells.

12. The method of claim 1, further comprising:

forming a dielectric matrix layer around and directly on the discrete resist material portions after patterning the first electrically conductive layer into the plurality of first electrically conductive lines;

planarizing the dielectric matrix layer such that a top surface of the dielectric matrix layer is formed within a horizontal plane including top surfaces of the two-dimensional array of memory cells; and forming second electrically conductive lines over the dielectric matrix layer, wherein each of the second electrically conductive lines contacts a respective subset of the memory cells.

13. The method of claim 1, wherein:

each of plurality of first electrically conductive lines extends underneath and contacts a respective row of memory cells that are arranged along the first horizontal directions among the two-dimensional array of memory cells; and the memory device comprises a two-dimensional array of spin-transfer-torque magnetoresistive random access memory cells.

14. The method of claim 13, further comprising forming second electrically conductive lines over the two-dimensional array of memory cells, wherein each of the second electrically conductive lines contacts top surfaces of a respective column of memory cells that are arranged along a second horizontal direction that is perpendicular to the first horizontal direction.

15. The method of claim 1, wherein:

the plurality of first electrically conductive lines comprises a two-dimensional array of spin-orbit-torque SOT layers; and each of the plurality of first electrically conductive lines contacts only one memory cell of the two-dimensional array of memory cells.

16. The method of claim 15, further comprising forming second electrically conductive lines over the two-dimensional array of memory cells, wherein each of the second electrically conductive lines contacts top surfaces of a respective row of memory cells that are arranged along the first horizontal direction.

17. The method of claim 15, wherein the memory device comprises a two-dimensional array of spin-orbit-torque magnetoresistive random access memory cells.

18. A memory device comprising:

first electrically conductive lines laterally extending along a first horizontal direction, laterally spaced apart from each other along a second horizontal direction, and located over a substrate;

a two-dimensional array of memory cells located over the first electrically conductive lines, wherein each of the memory cells comprises a vertical stack including a magnetic tunnel junction pillar structure and a selector-containing pillar structure, and each of the first electrically conductive lines contacts a respective row of memory cells arranged along the first horizontal direction;

discrete resist material portions having a tubular configuration and laterally surrounding a respective one of the memory cells;

second electrically conductive lines contacting top surfaces of a respective subset of the memory cells; and a dielectric matrix layer laterally surrounding the two-dimensional array of discrete resist material portions.

19. The memory device of claim 18, wherein:

the discrete resist material portions comprise annular top surfaces located within the horizontal plane including the top surface of the two-dimensional array of memory cells;

the dielectric matrix layer has a top surface located within a horizontal plane including top surfaces of the two-dimensional array of memory cells, and contacts the second electrically conductive lines; and the discrete resist material portions comprise a dry electron beam resist material.

20. The memory device of claim 18, wherein:

the discrete resist material portions comprise annular top surfaces located within the horizontal plane including the top surface of the two-dimensional array of memory cells;

the dielectric matrix layer has a top surface located within a horizontal plane including top surfaces of the two-dimensional array of memory cells, and contacts the second electrically conductive lines; and the discrete resist material portions comprise a dry extreme ultraviolet resist material.

* * * * *